US011024549B2

(12) United States Patent
Liaw

(10) Patent No.: US 11,024,549 B2
(45) Date of Patent: Jun. 1, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 41 days.

(21) Appl. No.: 16/256,534

(22) Filed: Jan. 24, 2019

(65) Prior Publication Data

US 2020/0105616 A1 Apr. 2, 2020

Related U.S. Application Data

(60) Provisional application No. 62/738,750, filed on Sep. 28, 2018.

(51) Int. Cl.

*H01L 21/8238* (2006.01)
*H01L 21/311* (2006.01)
*H01L 29/78* (2006.01)
*H01L 27/092* (2006.01)
*H01L 29/66* (2006.01)

(52) U.S. Cl.

CPC ................ *H01L 21/823821* (2013.01); *H01L 21/31144* (2013.01); *H01L 21/823814* (2013.01); *H01L 21/823878* (2013.01); *H01L 27/0924* (2013.01); *H01L 29/66545* (2013.01); *H01L 29/66795* (2013.01); *H01L 29/785* (2013.01)

(58) Field of Classification Search

CPC ....... H01L 21/823821; H01L 21/31144; H01L 21/823814; H01L 21/823878; H01L 27/0924; H01L 29/66545; H01L 29/66795; H01L 29/785
USPC .......................................................... 257/288
See application file for complete search history.

(56) References Cited

U.S. PATENT DOCUMENTS 9,105,490 B2 8/2015 Wang et al.
9,236,267 B2 1/2016 De et al.
9,236,300 B2 1/2016 Liaw
9,406,804 B2 8/2016 Huang et al.
9,443,769 B2 9/2016 Wang et al.
9,520,482 B1 12/2016 Chang et al.
9,548,366 B1 1/2017 Ho et al.
9,576,814 B2 2/2017 Wu et al.
9,831,183 B2 11/2017 Lin et al.
9,859,386 B2 1/2018 Ho et al.
2012/0199888 A1* 8/2012 Dai ...................... H01L 29/045 257/288
2014/0273368 A1* 9/2014 Hung ............. H01L 21/823814 438/230
2015/0084101 A1* 3/2015 Adam ............ H01L 21/823431 257/288

(Continued)

*Primary Examiner* — Dzung Tran
(74) *Attorney, Agent, or Firm* — Maschoff Brennan

(57) ABSTRACT

A semiconductor device includes a substrate, a dielectric fin, a gate, and a high-k dielectric layer. The dielectric fin is above the substrate and extending along a first direction. The gate is above the substrate and extends in a second direction that intersects the first direction. The high-k dielectric layer is vertically above the dielectric fin. The gate is over a sidewall and a bottom surface of the high-k dielectric layer.

20 Claims, 124 Drawing Sheets

(56) References Cited

U.S. PATENT DOCUMENTS

| | | | | |
|---|---|---|---|---|
| 2015/0132908 | A1* | 5/2015 | Jeong | H01L 29/66545 438/283 |
| 2016/0005617 | A1* | 1/2016 | Wu | H01L 21/31144 438/702 |
| 2017/0133379 | A1* | 5/2017 | Kim | H01L 29/161 |
| 2018/0138092 | A1* | 5/2018 | Lee | H01L 21/823437 |

* cited by examiner

B-B

C-C

B-B

C-C

D-D

B-B

C-C

D-D

B-B

C-C

D-D

B-B

C-C

D-D

B-B

C-C

B-B

C-C

C-C

B-B

C-C

D-D

C-C

D-D

B-B

C-C

B-B

C-C

B-B

C-C

D-D

B-B

D-D

B-B

C-C

D-D

B-B

C-C

D-D

B-B

D-D

D-D

B-B

C-C

D-D

B-B

C-C

D-D

B-B

D-D

B-B

D-D

E-E

B-B

SEMICONDUCTOR DEVICE AND MANUFACTURING METHOD THEREOF

PRIORITY CLAIM AND CROSS-REFERENCE

This application claims priority to U.S. Provisional Application Ser. No. 62/738,750, filed Sep. 28, 2018, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 to FIG. 11 and FIG. 12A to FIG. 35A illustrate a method for manufacturing a semiconductor device at various stages in accordance with some embodiments of the present disclosure.

FIG. 12B to FIG. 35B illustrate cross-sectional views along line B-B in FIG. 12A to FIG. 35A respectively.

FIG. 12C to FIG. 35C illustrate cross-sectional views along line C-C in FIG. 12A to FIG. 35A respectively.

FIG. 12D to FIG. 35D illustrate cross-sectional views along line D-D in FIG. 12A to FIG. 35A respectively.

DETAILED DESCRIPTION

Figure 1:
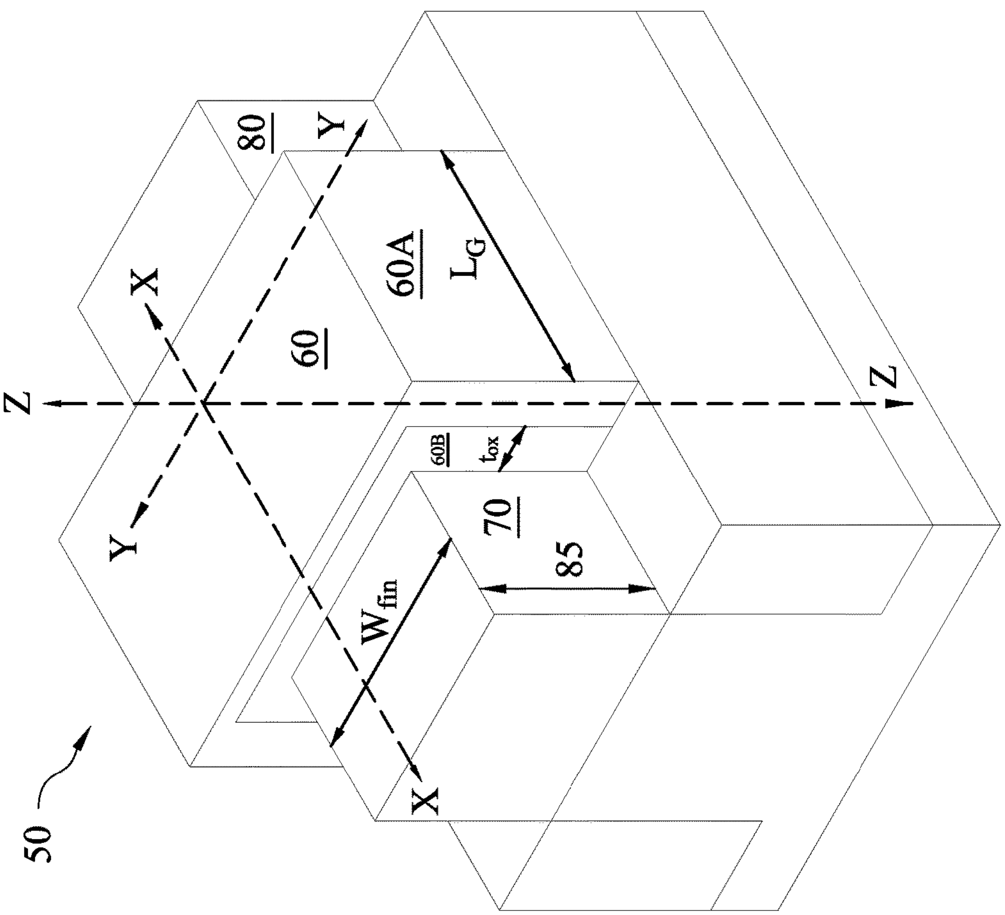
FIG. 1 is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode 60A and a gate dielectric layer 60B. The gate dielectric layer 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 2:
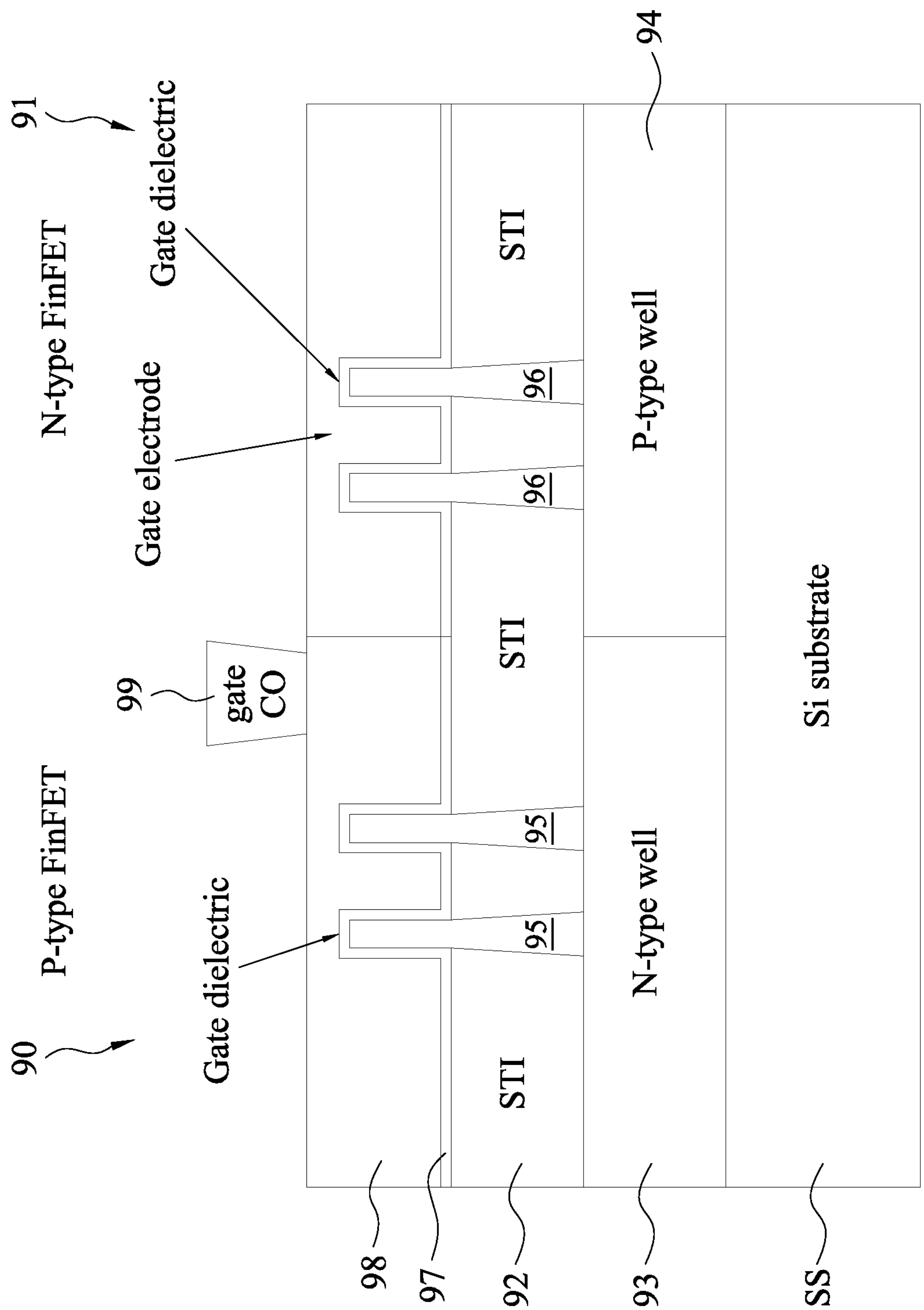
FIG. 2 illustrates a cross-sectional view of FinFET transistors in a CMOS configuration.

FIG. 2 illustrates a diagrammatic cross-sectional side view of FinFET transistors in a CMOS configuration. The CMOS FinFET includes a substrate SS, for example a silicon substrate. An N-type well 93 and a P-type well 94 are formed in the substrate SS. A dielectric isolation structure 92 such as a shallow trench isolation (STI) is formed over the N-type well 93 and the P-type well 94. A P-type FinFET 90 is formed over the N-type well 93, and an N-type FinFET 91 is formed over the P-type well 94. The P-type FinFET 90 includes fins 95 that protrude upwardly out of the STI 92, and the N-type FinFET 91 includes fins 96 that protrude upwardly out of the STI 92. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric 97 is formed over the fins 95-96 and over the STI 92, and a gate electrode 98 is formed over the gate dielectric 97. In some embodiments, the gate dielectric 97 includes a high-k dielectric material, and the gate electrode 98 includes a metal gate electrode, such as aluminum and/or other refractory metals. In some other embodiments, the gate dielectric 97 may include SiON, and the gate electrode 98 may include polysilicon. A gate contact 99 is formed on the gate electrode 98 to provide electrical connectivity to the gate.

FinFET devices offer several advantages over planar Metal-Oxide Semiconductor Field Effect Transistor (MOSFET) devices. These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, FinFET fabrication methods may still have challenges, such as lack of optimization for forming isolation structures that isolate neighboring circuit cells. For example, one or more dielectric dummy gates are formed in fins to isolate neighboring circuit cells. Fabrication of the dielectric dummy gates includes etching openings in the fins, followed by filling the openings with a dielectric material. However, if the fins are formed of silicon germanium (SiGe) for strain effect enhancement, etching the openings in the fins would break up the fins, which in turn would lead to reduced strain. For another example, one or more isolation gates are formed to wrap around fins and applied with a controlled voltage (e.g., Vdd or Vss) to isolate neighboring circuit cells. Fabrication of the isolation gates is free from etching openings in the fins and thus would prevent the strain loss. However, fabrication of the isolation gates involves an additional gate cut process (e.g. breaking up a continuous isolation gate across the P-type and N-type wells using an etching process) to separate the isolation gate in the N-well from the isolation gate in the P-well, which in turn would frustrate scaling down capability of FinFETs. Therefore, the present disclosure describes one or more FinFET cells that have reduced strain loss in SiGe fins and are fabricated without the additional gate cut process to separate the isolation gate in the N-well from the isolation gate in the P-well, as discussed in more detail below.

Figure 3:
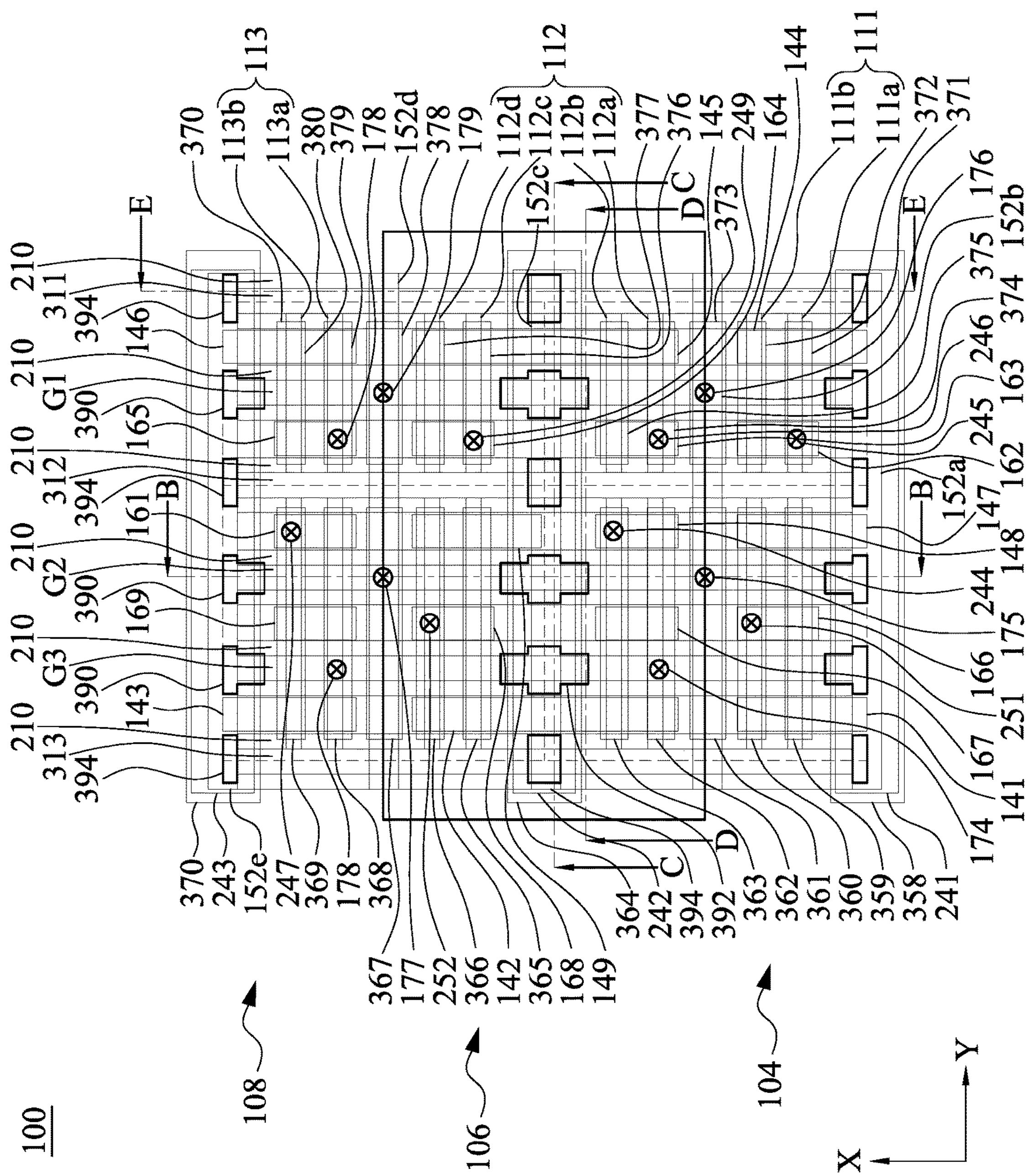
FIG. 3 illustrates a layout of a semiconductor device having a plurality of Fin Field-effect Transistors (FinFETs) in accordance with some embodiments.

FIG. 3 illustrates a top view of a layout 100 of a semiconductor device shown in FIG. 4 to FIG. 36C having a plurality of Fin Field-effect Transistors (FinFETs) according to some embodiments of the present disclosure. A layout 100 includes a plurality of P-type wells 104 and 108 and an N-type well 106, a plurality of active area regions 111, 112, and 113, a plurality of dielectric fins 152*a*, 152*b*, 152*c*, 152*d*, and 152*e*, a plurality of dummy gates 311, 312, and 313, a plurality of gate electrodes G1, G2, and G3, a plurality of gate vias 174, 175, 176, 177, 178, and 179, a plurality of gate spacers 210, a plurality of source contacts 141, 142, 143, 144, 145, and 146, a plurality of source vias 241, 242, and 243, a plurality of drain contacts 147, 148, 149, 161, 162, 163, 164, and 165, a plurality of drain vias 244, 245, 246, 247, 248, and 249, a plurality of source/drain contacts 166, 167, 168, and 169, a plurality of source/drain vias 251 and 252, a plurality of conductive lines 358-380, a plurality of dielectric plugs 390, 392, and 394.

As shown in FIG. 3, the P-type wells 104 and 108 are on opposite sides of the N-type well 106 which divide the semiconductor device into separate regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. In the example configuration in FIG. 3, the N-type well 106 is a region for forming p-channel metal-oxide semiconductor (PMOS) transistors, and the P-type wells 104 and 108 are regions for forming n-channel metal-oxide semiconductor (NMOS) transistors. The described conductivity of the well regions 104, 106, and 108 herein is an example. Other arrangements are within the scope of various embodiments.

According to the various aspects of the present disclosure, the active area regions 111, 112, and 113 extend along a first direction of the layout 100, e.g., the Y direction. In some embodiments, the active area regions 111, 112, and 113 are also referred to as oxide-definition (OD) regions. Example materials of the active area regions 111, 112, and 113 include, but are not limited to, semiconductor materials doped with various types of p-dopants and/or n-dopants. In some embodiments, the active area regions 111, 112, and 113 include dopants of the same type. In some embodiments, one of the active area regions 111, 112, and 113 includes dopants of a type different from a type of dopants of another one of the active area regions 111, 112, and 113. The active area regions 111, 112, and 113 are isolated from each other by one or more isolation structures as described herein. The active area regions 111, 112, and 113 are within corresponding well regions. For example, the active area region 111 and 113 are within the well regions 104 and 108 which are P-well regions in some embodiments, and the active area region 112 is within a well region 106 which is a N-well region in some embodiments.

Each of the active area regions 111, 112, and 113 includes one or more semiconductor fins to form FinFETs. For example, the active area region 111 includes two semiconductor fins 111*a* and 111*b*, the active area region 112 includes four semiconductor fins 112*a*, 112*b*, 112*c*, and 112*d*, and the active area region 113 includes two semiconductor fins 113*a* and 113*b*. The semiconductor fins 111*a*, 111*b*, 112*a*, 112*b*, 112*c*, 112*d*, 113*a*, and 113*b* are isolated from each other by one or more isolation structures as described herein. Other numbers of fins in each of the active area regions 111, 112, and 113 are within the scope of various embodiments. The described FinFET configuration is an example. Other arrangements are within the scope of various embodiments. For example, in some embodiments, the active area regions 111, 112, and 113 do not include fins and are configured for forming planar MOSFET transistors.

According to the various aspects of the present disclosure, the dielectric fins 152*a*, 152*b*, 152*c*, 152*d*, and 152*e* extend along the first direction of the layout 100, e.g., the Y direction and are parallel to the active area regions 111, 112, or 113 between abutted circuit cells to provide electrical isolation between the abutted circuit cells. In this context, the dielectric fin is a fin that does not act as a fin of a transistor. The dielectric fins 152*a*, 152*b*, 152*c*, 152*d*, and 152*e* are each located on a border between two abutted circuit cells. The dielectric fins 152*a*, 152*b*, 152*c*, 152*d*, and 152*e* are vertically above corresponding well regions. For example, the dielectric fins 152*a* and 152*e* are vertically above the well regions 104 and 108 which are P-well regions in some embodiments, the dielectric fins 152*c* is vertically above a well region 106 which is a N-well region in some embodiments, and the dielectric fins 152*b* and 152*d* are vertically above junctions of the well regions 104, 106, and 108 which are the N-well and P-well regions in some embodiments. Some of the semiconductor fins 111*a*, 111*b*, 112*a*, 112*b*, 112*c*, 112*d*, 113*a*, and 113*b* are isolated from each other by one or more isolation structures, such as the dielectric fins 152*a*, 152*b*, 152*c*, 152*d*, or 152*e*.

According to the various aspects of the present disclosure, the dielectric plugs 390, 392, and 394 are located above and straddle the dielectric fins 152*a*, 152*c*, and 152*e* to provide electrical isolation between the abutted circuit cells. Specifically, the dielectric plugs 390 are located within the gate electrodes of the PMOS metal gate electrodes, dielectric plugs 392 are located within the NMOS metal gate electrodes, and dielectric plugs 394 are located within the dummy gate. The dielectric plugs 390, 392, and 394 are each located on a border between two abutted circuit cells. The dielectric plugs 390, 392, and 394 comprise one or more dielectric materials.

The gate electrodes G1, G2, and G3 extend along a second direction of the layout 100, e.g., the X direction, across the active area regions 111, 112, and 113 and intersect. Example materials of the gate electrodes G1, G2, and G3 include, but are not limited to, polysilicon and metal. Other materials are within the scope of various embodiments. The gate electrodes G1, G2, and G3 and the corresponding active area regions 111, 112, and 113 form one or more transistors in the layout 100. For example, in the example configuration in FIG. 3, a transistor is formed by the gate electrode G1 and the active area region 111. One of a drain or a source (referred to herein as "source/drain") of the transistor is defined by a region of the active area region 111 on one side (e.g., the upper side in FIG. 3) of the gate electrode G1. The other source/drain of the transistor is defined by another region of the active area region 111 on the opposite side (e.g., the lower side in FIG. 3) of the gate electrode G1. One or more of the gate electrodes G1, G2, and G3 are coupled to other circuitry of the semiconductor device by corresponding gate vias. For example, gate vias 174, 175, 176, 177, 178, and 179 are configured on the corresponding gate electrodes G1, G2, and G3 for coupling the corresponding gate electrodes G1, G2, and G3 to other circuitry. The active area regions 111, 112, and 113 terminate in the dummy gates 311 and 313. For example, the fin 111*a* terminates at an end thereof in the gate electrodes 311 and terminates at another end thereof in the gate electrodes 313. In the example configuration in FIG. 3, the ends of the fins 111*a*, 111*b*, 112*a*, 112*b*, 112*c*, 112*d*, 113*a*, and 113*b* are under the gate electrodes 311 and 313.

According to the various aspects of the present disclosure, the dummy gates 311, 312 and 313 are located above the P-type well and N-type well regions between abutted circuit cells to provide electrical isolation between the abutted circuit cells. In this context, the dummy gate is a gate that does not act as a gate of a transistor. The dummy gates 311, 312, 313 are each located on a border between two abutted circuit cells. The dummy gates 311, 312, and 313 comprise one or more dielectric materials. Example dielectric materials of the dummy gates 311, 312, and 313 include, but are not limited to, silicon-based dielectric materials, such as $SiO_2$, SiON, $Si_3N_4$, SiOCN, the like, or combinations thereof.

The gate spacers 210 are at least arranged along sides of the corresponding gate electrodes G1, G2, G3 and the corresponding dummy gates 311, 312, and 313. For example, the gate spacer 210 is arranged along longitudinal sides of the gate electrode G1 or the dummy gates 311 in the X direction. The gate spacers 210 include one or more dielectric materials for electrically isolating the corresponding gate electrodes from unintended electrical contact. Example dielectric materials of the gate spacers 210 include, but are not limited to, silicon nitride, oxynitride and silicon carbide. In some embodiments, one or more of the gate spacers 210 have a tapered profile as described herein.

The gate vias 174, 175, 176, 177, 178, and 179 overlap the corresponding active area regions 111, 112, and 113. For example, the gate via 174 overlaps the fins 112*a*. In other words, the gate via 174 has a vertical projection projected on the fins 112*a* where are acted as a channel region. In some embodiments, the gate vias 174, 175, 176, 177, 178, and 179 are in a circle shape. For example, the length ratio of longer side to short side of at least one of the gate vias 174, 175, 176, 177, 178, and 179 is less than 1.2. The gate vias 174, 175, 176, 177, 178, and 179 are configured to electrically couple the underlying gate electrodes G1, G2, and G3 of the corresponding transistors with each other or with other circuitry of the semiconductor device. For example, the gate vias 174 is between the source/drain contacts 142 and 167. Example materials of the gate vias 174, 175, 176, 177, 178, and 179 include Ti, TiN, TaN, Co, Ru, Pt, W, Al, Cu, or any combinations thereof.

The source contacts 141, 142, 143, 144, 145, 146, 147, and 149 overlap and are across the corresponding active area regions 111, 112, and 113. In some embodiments, the source contacts 141, 142, 143, 144, 145, 146, 147, and 149 extend along the second direction of the layout 100, e.g., the X direction. In some embodiments, the source contacts 141, 142, 143, 144, 145, 146, 147, and 149 are in a slot shape and may be also refer to as in a line shape. For example, the length ratio of longer side to short side of at least one of the source contact 141, 142, 143, 144, 145, 146, 147, and 149 is larger than about 2. For example, the source contacts 141, 144, and 147 overlap the active area region 111, the source contacts 142, 145, and 149 overlap the active area region 112, and the source contacts 143 and 146 overlap the active area region 113. The source contacts 141, 152, 153, 154, 145, 146, 147, and 149 are configured to electrically couple the underlying source/drains of the corresponding transistors with each other or with other circuitry of the semiconductor device. Example materials of the source contacts 141, 142, 143, 144, 145, 146, 147, and 149 include Ti, TiN, TaN, Co, Ru, Pt, W, Al, Cu, or any combinations thereof. In some embodiments, the source contacts 141, 142, 143, 144, 145, 146, 147, and 149 can be formed by self-aligned contact process.

Figure 41:
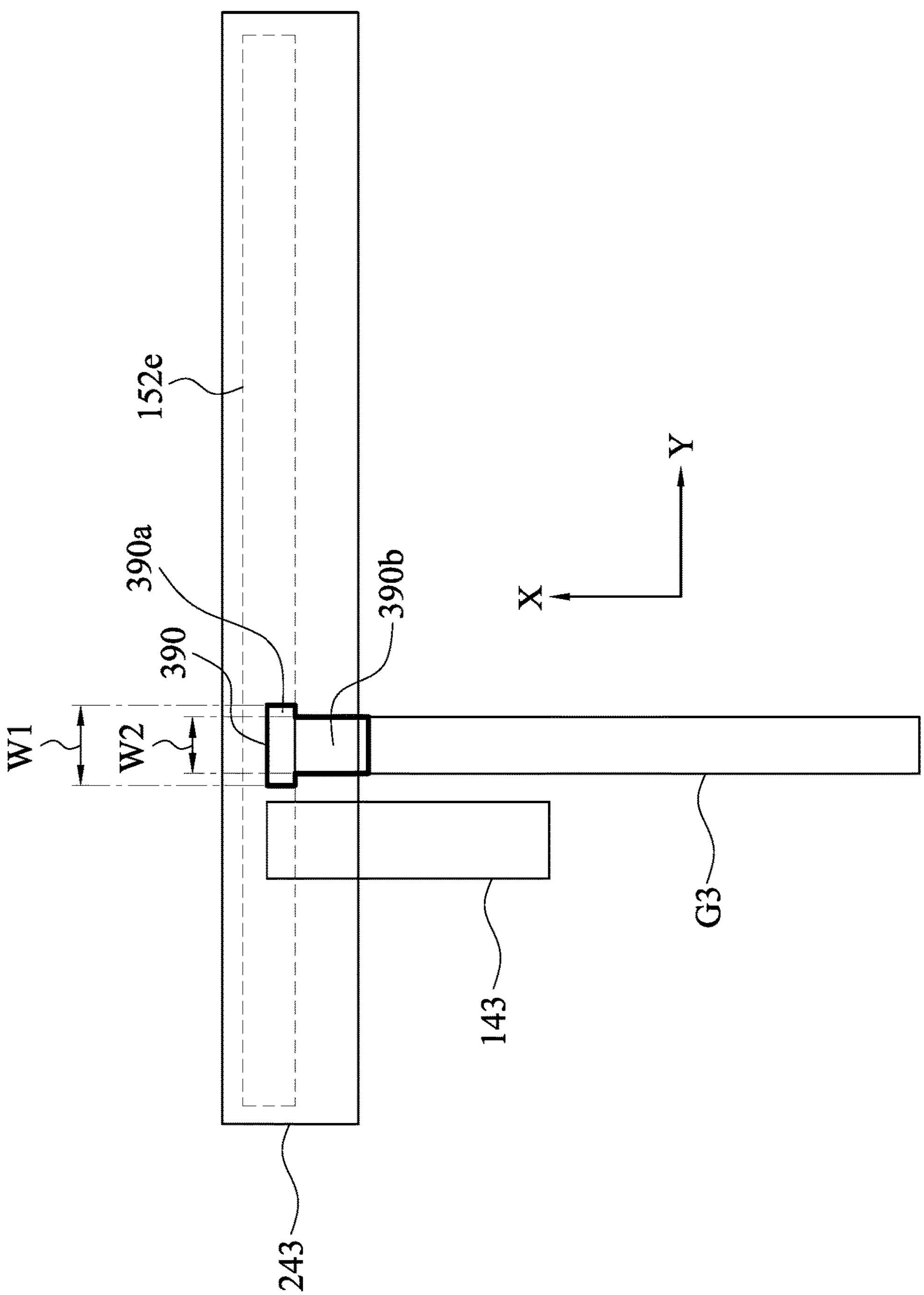
FIG. 41 illustrates partial elements in the layouts shown in FIG. 3 and FIG. 38.

The source vias 241, 242, and 243 extend along the first direction of the layout 100, e.g., the Y direction, and are parallel to the active area regions 111, 112, or 113. In some embodiments, the source vias 241, 242, and 243 are in a slot shape and may be also referred to as in a line shape. For example, the length ratio of longer side to short side of at least one of the source contact source vias 241, 242, and 243 is larger than about 2. In some embodiments, the source vias 241, 242, and 243 are parallel to each other. Reference is made to FIG. 41. FIG. 41 illustrates the source contact 143, the gate electrode G3, the dielectric plug 390, and the source via 243 in the layout shown in FIG. 3 and FIG. 38. For example, as shown in FIG. 41, the source contact 143 is along longitudinal sides of the gate electrode G3. The source via 243 overlaps the source contact 143, the dielectric plugs 390, and the gate electrode G3. A longitudinal side of the source via 243 is perpendicular to an extending direction of the source contact 143 and the gate electrode G3.

As shown in FIG. 41, the dielectric plug 390 has a first portion 390*a* landing on the dielectric fin 152*e* and has a second portion 390*b* landing on the gate electrode G3. The second portion 390*b* of the dielectric plug 390 protrudes from the first portion 390*a* and extends pass a longitudinal side of the source via 243. The first portion 390*a* of the dielectric plug 390 has a width W1 wider than a width W2 of the second portion 390*b* thereof. The dielectric plug 390 is spaced apart from the source contact 143. A distance between the first portion 390*a* of the dielectric plug 390 and the source contact 143 is less than a distance between the second portion 390*b* of the dielectric plug 390 and the source contact 143.

In FIG. 3, the source vias 241, 242, and 243 overlap, are in contact with the corresponding source contacts 141, 142, 143, 144, 145, 146, 147, and 149, and are connected to the corresponding conductive lines 358, 364, and 370. Furthermore, the source vias 241, 242, and 243 are in contact with top surfaces of the corresponding dielectric plugs 390, 392, and 394, pass through a plurality of the corresponding dielectric plugs 390, 392, and 394, and are spaced apart from the gate electrodes G1, G2, and G3 by the corresponding dielectric plugs 390 and 392.

For example, the source via 241 is in contact with the top surfaces of the dielectric plugs 390 and 394 and passes through the plurality of the dielectric plugs 390 and 394. The source via 242 is in contact with the top surfaces of the dielectric plugs 392 and 394 and passes through the plurality of the dielectric plugs 392 and 394. The source via 243 is in contact with the top surfaces of the dielectric plugs 390 and 394 and passes through the plurality of the dielectric plugs 390 and 394.

Example materials of the source vias 241, 242, and 243 include Ti, TiN, TaN, Co, Ru, Pt, W, Al, Cu, or any combinations thereof. In some embodiments, the source vias 241, 242, and 243 each passes through the gate electrodes G1, G2, and G3.

In FIG. 3, the drain contacts 148, 161, 162, 163, 164, 165, 166, and 168 overlap and are across the corresponding active area regions 111, 112, and 113. In some embodiments, the drain contacts 148, 161, 162, 163, 164, 165, 166, and 168 extend along the second direction of the layout 100, e.g., the X direction. In some embodiments, the drain contacts 148, 161, 162, 163, 164, 165, 166, and 168 are in a slot shape and may be also refer to as in a line shape. For example, the length ratio of longer side to short side of at least one of the drain contact 148, 161, 162, 163, 164, 165, 166, and 168 is larger than about 2. For example, the drain contacts 162 and 166 overlap the active area region 111, the drain contacts 148, 163, 164, 168 overlap the active area region 112, and the drain contacts 161 and 165 overlap the active area region 113. The drain contacts 148, 161, 162, 163, 164, 165, 166, and 168 are configured to electrically couple the underlying drains of the corresponding transistors with each other or with other circuitry of the semiconductor device. Example materials of the drain contacts 148, 161, 162, 163, 164, 165, 166, and 168 include Ti, TiN, TaN, Co, Ru, Pt, W, Al, Cu, or any combinations thereof. In some embodiments, the drain contacts 148, 161, 162, 163, 164, 165, 166, and 168 can be formed by self-aligned contact process.

The drain vias 244, 245, 246, 247, 248, 249, 251, and 252 overlap and are in contact with the corresponding drain contacts 148, 161, 162, 163, 164, and 165 and are connected to the corresponding conductive lines 363, 369, 371, 374, 376, and 379. The drain vias 244, 245, 246, 247, 248, 249, 251, and 252 are in a circle shape. For example, the length ratio of longer side to short side of at least one of the drain vias 244, 245, 246, 247, 248, 249, 251, and 252 is less than 1.2. In some embodiment, top surfaces of the drain vias 244, 245, 246, 247, 248, 249, 251, and 252 are coplanar with top surfaces of the source vias 241, 242, and 243. In some embodiment, at least one of the source vias 241, 242, and 243 has a dimension greater than that of at least one of the drain vias 244, 245, 246, 247, 248, 249, 251, and 252. Example materials of the drain vias 244, 245, 246, 247, 248, 249, 251, and 252 include Ti, TiN, TaN, Co, Ru, Pt, W, Al, Cu, or any combinations thereof.

The source/drain contacts 167 and 169 overlap and are across the corresponding active area region 112 and 113. In some embodiments, the source/drain contacts 167 and 169 extend along the second direction of the layout 100, e.g., the X direction. In some embodiments, the source/drain contacts 167 and 169 are in a slot shape and may be also refer to as in a line shape. For example, the length ratio of longer side to short side of at least one of the source/drain contacts 167 and 169 is larger than about 2. For example, the source/drain contact 167 overlaps the active area region 112 and the source/drain contact 169 overlaps the active area region 113. The source/drain contacts 167 and 169 are configured to electrically couple the underlying source/drains of the corresponding transistors with each other or with other circuitry of the semiconductor device. Example materials of the source/drain contacts 167 and 169 include Ti, TiN, TaN, Co, Ru, Pt, W, Al, Cu, or any combinations thereof.

The conductive lines 358-380 extend along the Y direction of the layout 100. In some embodiments, the conductive lines 358-380 are in a first interconnection layer of the layout 100, such as a first metal layer. The conductive line 358 overlaps and is electrically connected to the source contacts 141, 144, and 147 through the source via 241, the conductive line 364 overlaps and is electrically connected to the source contacts 142, 149, and 145 through the source via 242, and the conductive lines 370 overlaps and is electrically connected to the source contacts 143 and 146 through the source via 243. In some embodiments, the conductive line 358 overlaps and is electrically connected to the source contacts 141, 144, and 147 through the source via 241, the conductive line 364 overlaps and is electrically connected to the source contacts 142, 149, and 145 through the source via 242, and the conductive lines 370 overlaps and is electrically connected to the source contacts 143 and 146 through the source via 243. In some embodiments, the conductive line 360, 363, 366, 369, 371, 374, 376, and 379 are electrically connected to the corresponding drain vias 244, 245, 246, 247, 248, 249, 251, and 252 and overlap the corresponding semiconductor fins 111*a*, 111*b*, 112*a*, 112*b*, 112*c*, 112*d*, 113*a*, and 113*b*.

In some embodiments, the layout 100 is represented by a plurality of masks generated by one or more processors and/or stored in one or more non-transitory computer-readable media. Other formats for representing the layout 100 are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

For example, the layout 100 is presented by at least one first mask corresponding to the active area regions 111, 112, and 113, at least one second mask corresponding to the dielectric fins 152*a*, 152*b*, 152*c*, 152*d*, and 152*e*, at least one third mask corresponding to the dummy gate 311, 312, and 313, at least one fourth mask corresponding to the gate electrode G1, G2, and G3, at least one fifth mask corresponding to the dielectric plugs 390, 392, and 394, at least one sixth mask corresponding to the gate spacers 210, at least one seventh mask corresponding to the source contacts 141, 142, 143, 144, 145, and 146, at least one eighth mask corresponding to the source vias 241, 242, and 243, at least one ninth mask corresponding to the source vias drain contacts 147, 148, 149, 161, 162, 163, 164, and 165, at least one tenth mask corresponding to the source vias drain contacts drain vias 244, 245, 246, 247, 248, and 249, at least one eleventh mask corresponding to the source/drain contacts 166, 167, 168, and 169, at least one twelf mask corresponding to the source/drain vias 251 and 252, at least one thirteenth mask corresponding to the conductive lines 358-380, and at least one fourteenth mask corresponding to the conductive lines 358-380.

Figure 35A:
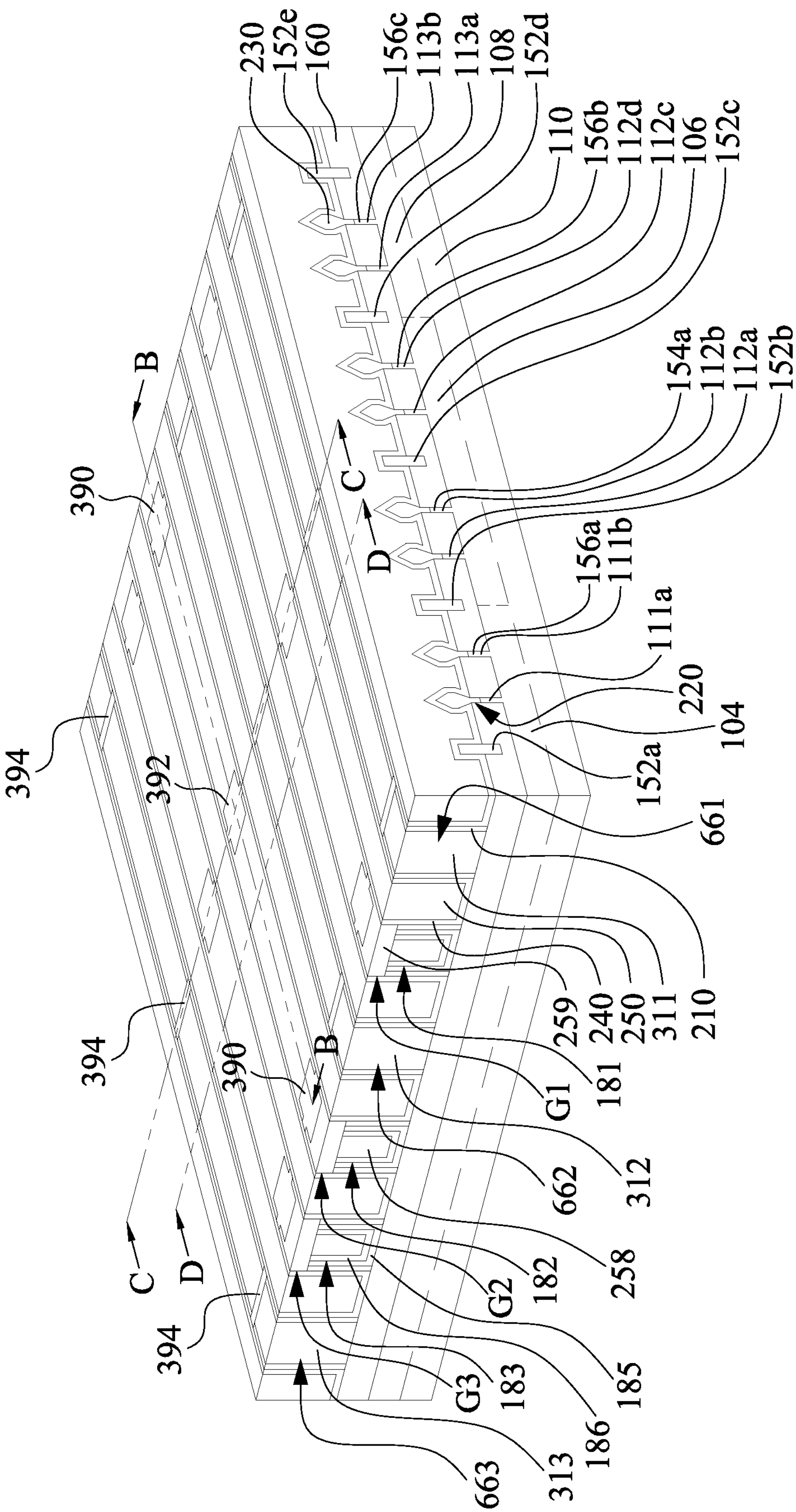
Figure 35B:
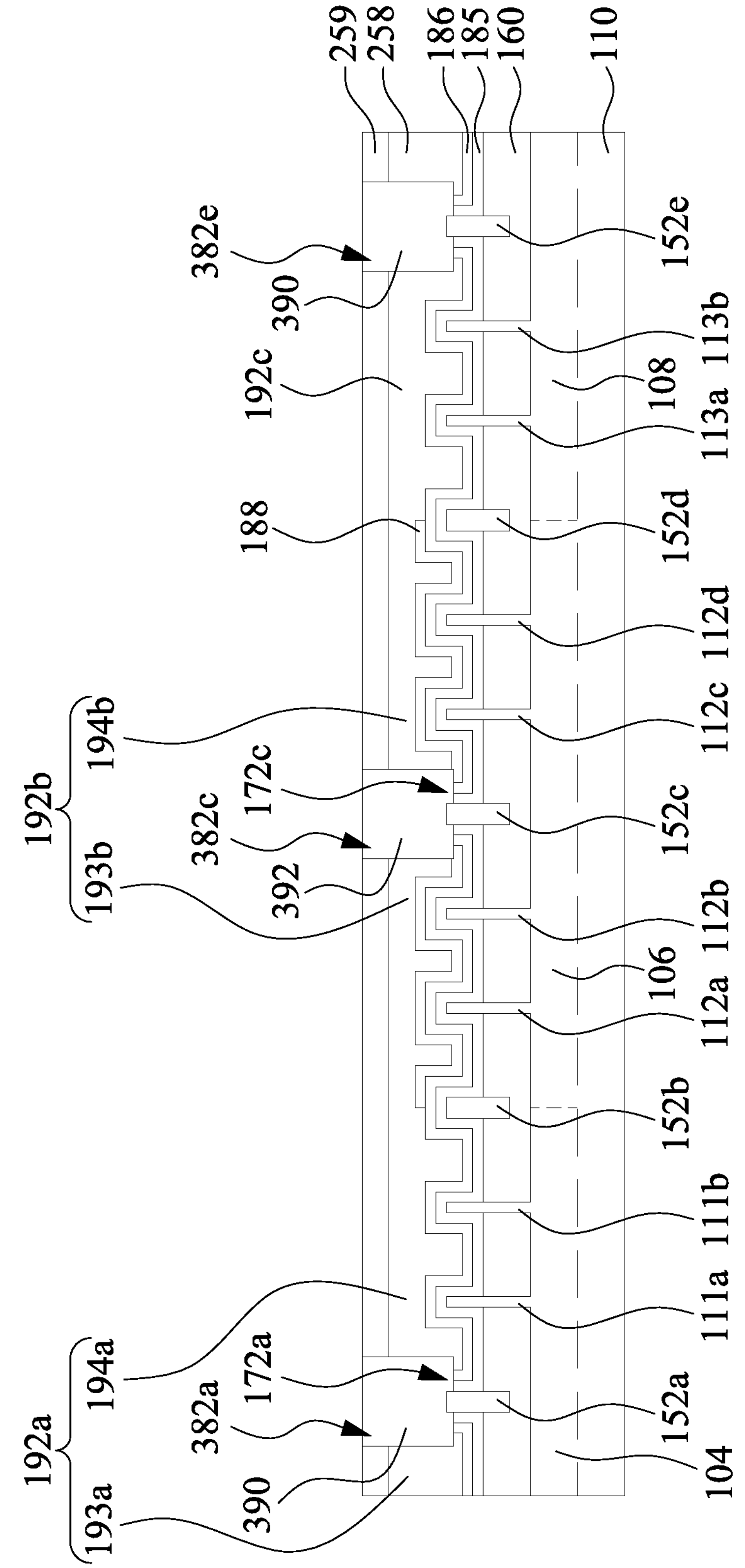
Figure 35C:
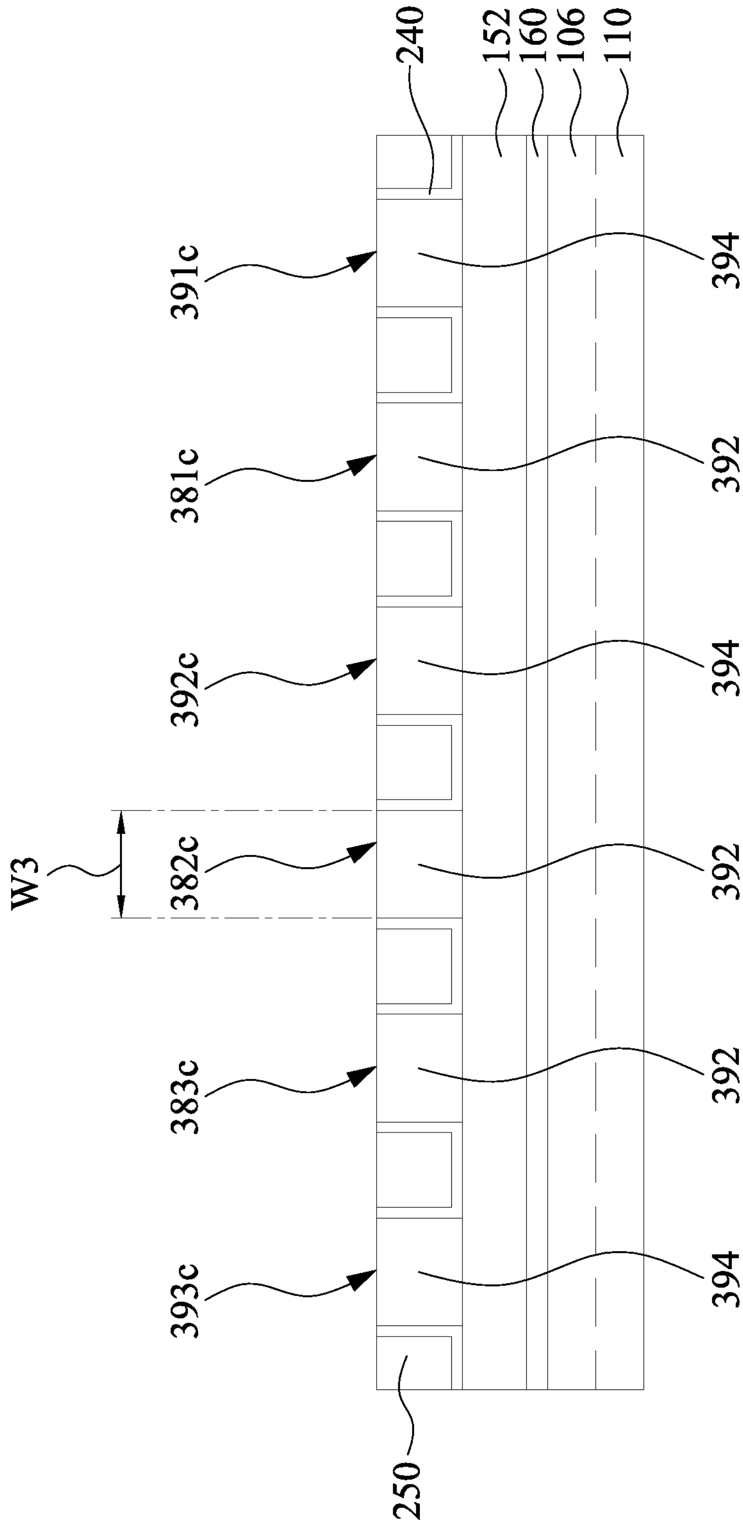
Figure 35D:
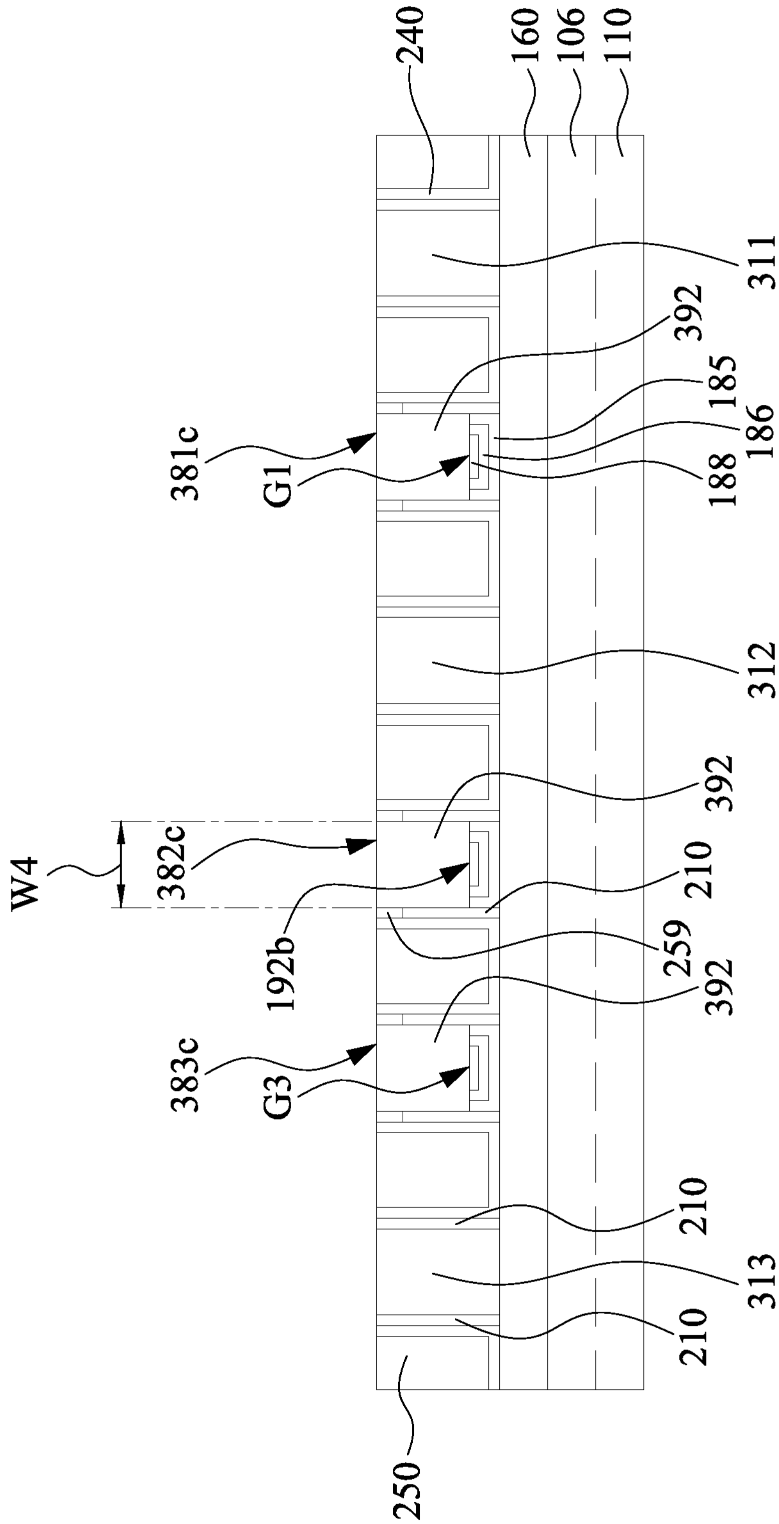
Figure 35E:
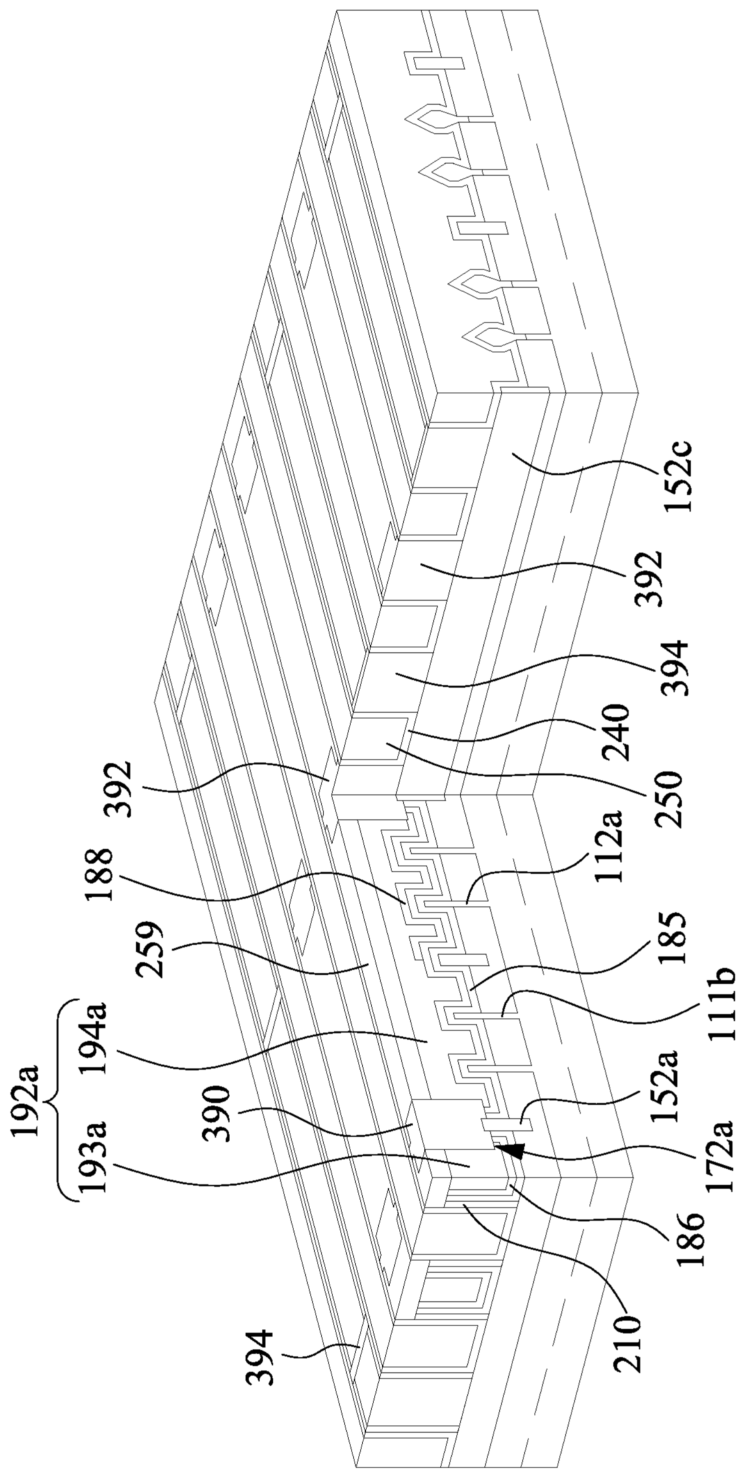
FIG. 35E illustrates a stereoscopic perspective view of FIG. 35A.
Figure 36A:
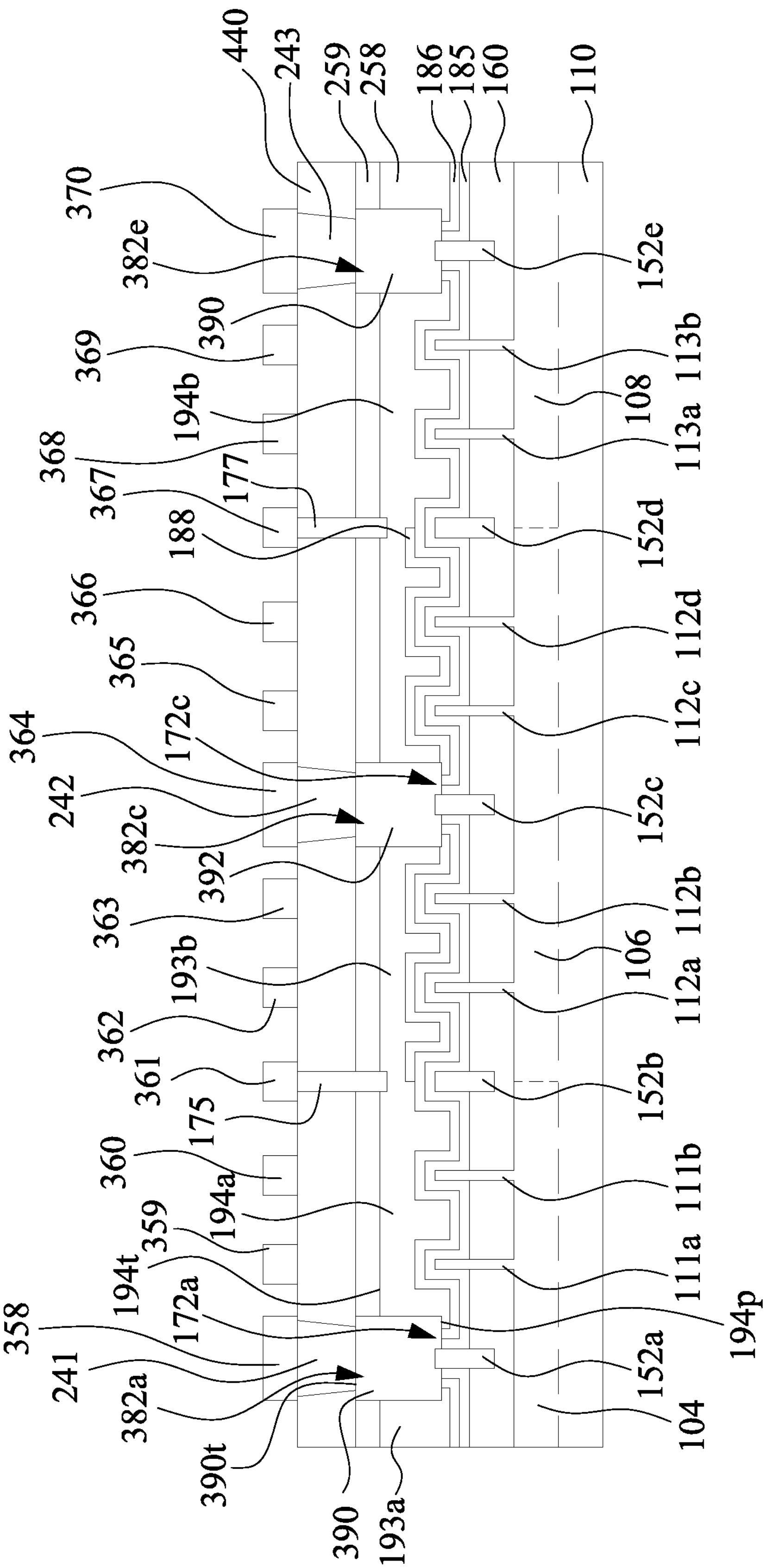
FIG. 36A to FIG. 36C illustrate cross-sectional views corresponding to the line B-B, line C-C, and line D-D as illustrated in FIG. 35B to FIG. 35D respectively for manufacturing the semiconductor device at a stage in accordance with some embodiments of the present disclosure.
Figure 36B:
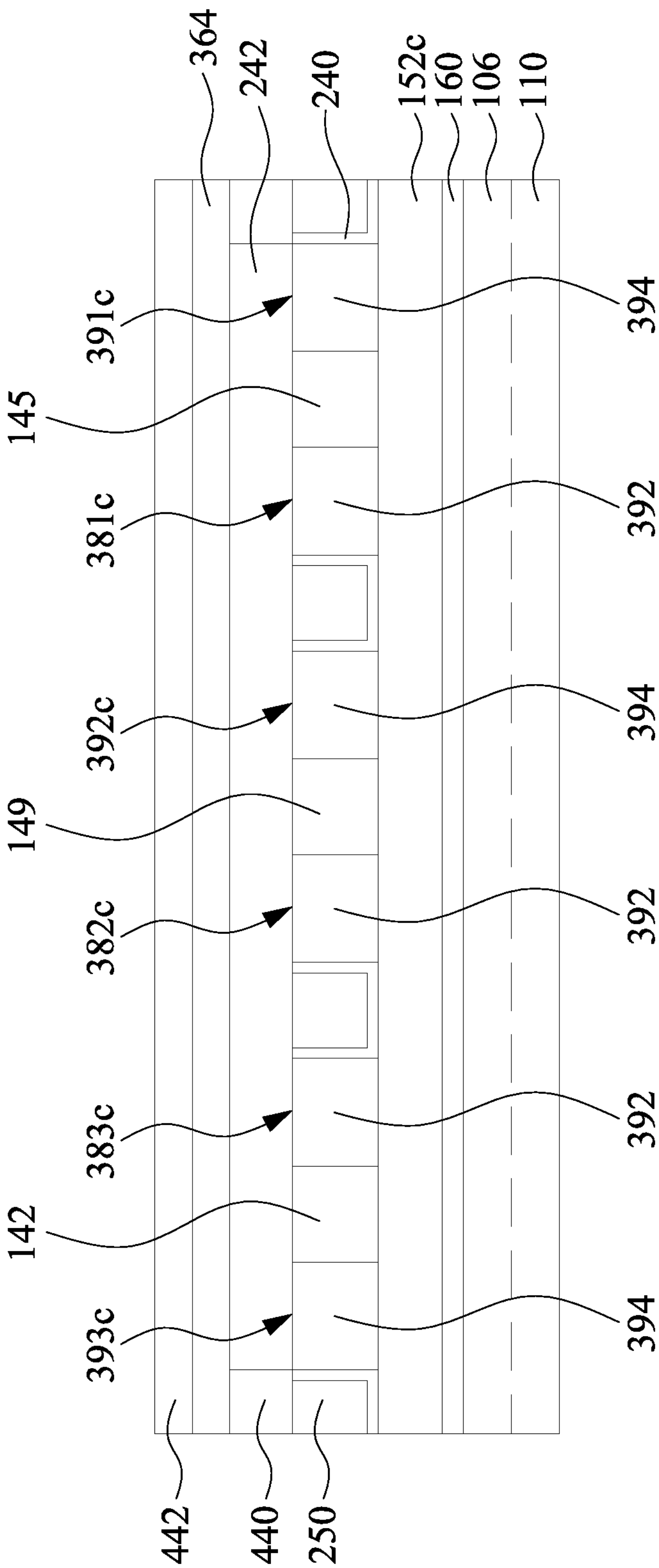
Figure 36C:
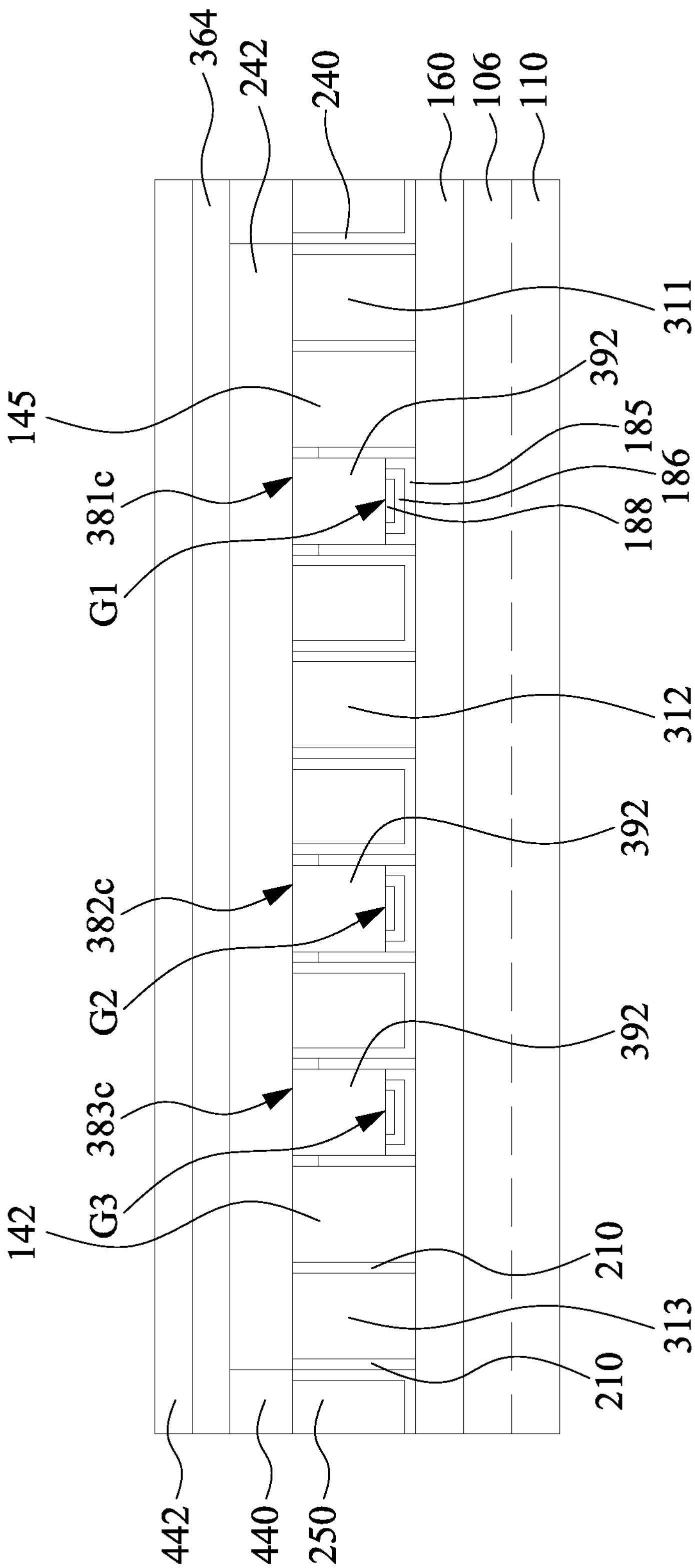

FIG. 4 to FIG. 11 and FIG. 12A to FIG. 35A illustrate a method for manufacturing a semiconductor device at various stages in accordance with some embodiments of the present disclosure. FIG. 12B to FIG. 35B illustrate cross-sectional views along line B-B in FIG. 12A to FIG. 35A respectively. FIG. 12C to FIG. 35C illustrate cross-sectional views along line C-C in FIG. 12A to FIG. 35A respectively. FIG. 12D to FIG. 35D illustrate cross-sectional views along line D-D in FIG. 12A to FIG. 35A respectively. FIG. 34E illustrates cross-sectional views along line E-E in FIG. 34A. FIG. 35E illustrates a stereoscopic perspective view of FIG. 35A. FIG. 36A to FIG. 36C illustrate cross-sectional views corresponding to the line B-B, line C-C, and line D-D as illustrated in FIG. 35B to FIG. 35D respectively for manufacturing the semiconductor device at a stage in accordance with some embodiments of the present disclosure.

Figure 4:
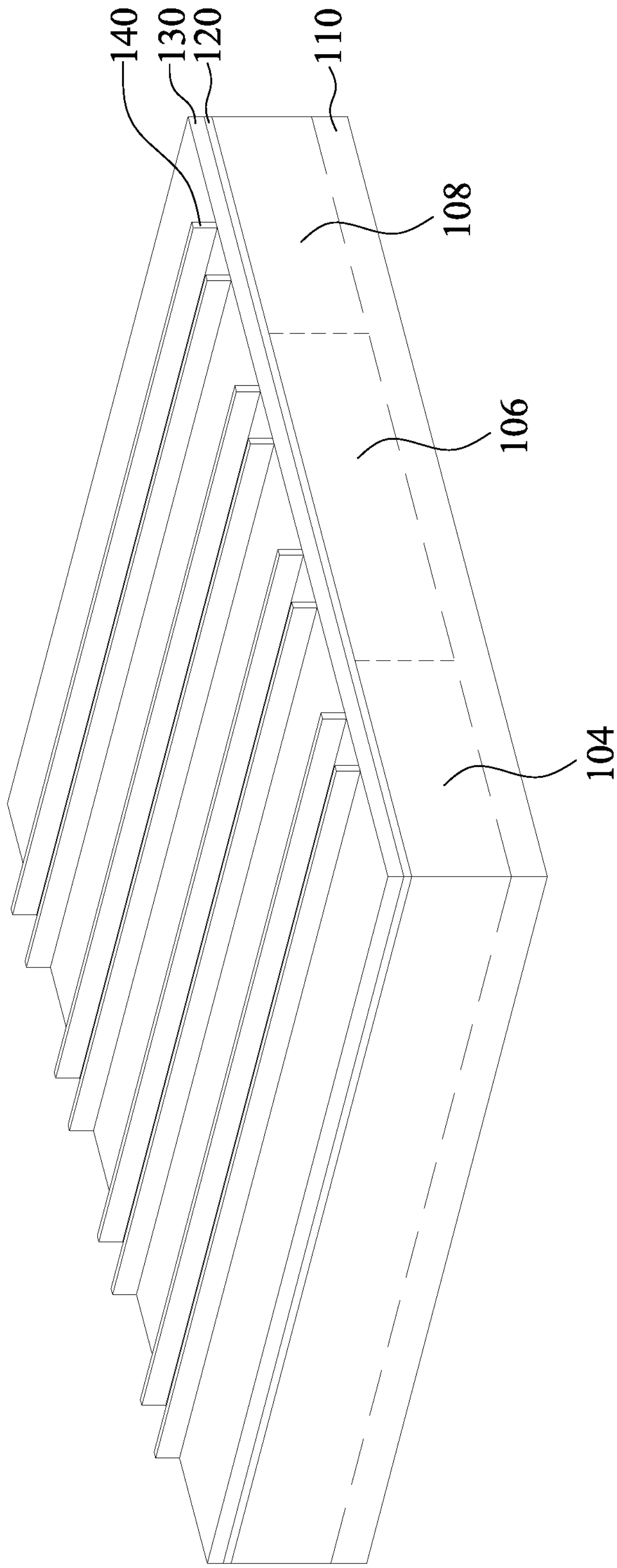

Reference is made to FIG. 4. A substrate 110 is illustrated, and it may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

P-type wells 104 and 108 and an N-type well 106 between the P-type wells 104 and 108 are formed in the substrate 110. A pad layer 120 and a mask layer 130 are formed over the substrate 110. The pad layer 120 may be a thin film comprising silicon oxide formed using, for example, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, for example, using low-pressure chemical vapor deposition (LPCVD) or plasma enhanced chemical vapor deposition (PECVD). The mask layer 130 is used as a hard mask during subsequent photolithography processes. A photo-sensitive layer 140 is formed on the mask layer 130 and is then patterned, forming openings in the photo-sensitive layer 140, so that some regions of the mask layer 130 are exposed.

Figure 5:
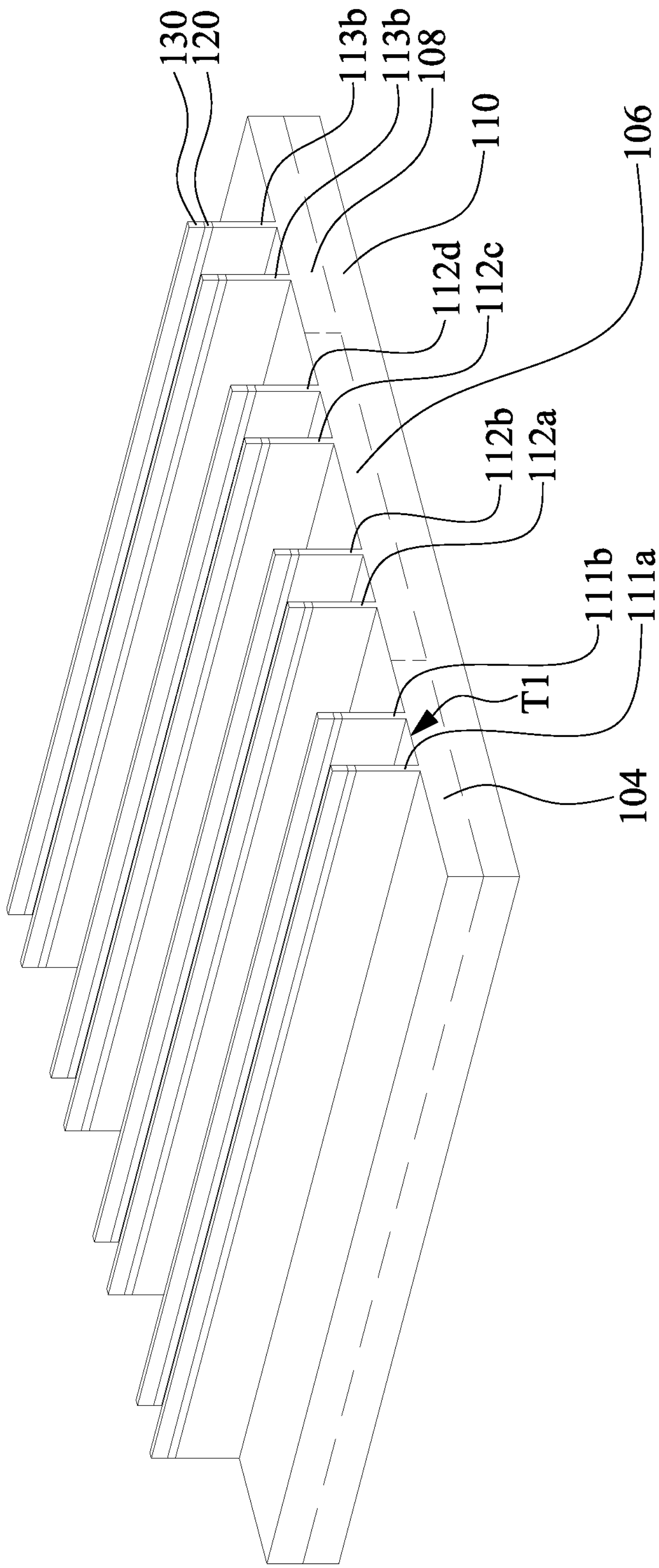

Reference is made to FIG. 5. The mask layer 130 and pad layer 120 are etched through the photo-sensitive layer 140, exposing underlying P-type wells 104 and 108 and N-type well 106. The exposed P-type wells 104 and 108 and N-type well 106 are then etched, forming trenches T1. A portion of the substrate 110 between neighboring trenches T1 can be referred to as semiconductor fins 111*a*, 111*b*, 112*a*, 112*b*, 112*c*, 112*d*, 113*a*, and 113*b* but, the numbers of the semiconductor fins 111*a*, 111*b*, 112*a*, 112*b*, 112*c*, 112*d*, 113*a*, and 113*b* are not limited thereto. In some embodiments, any suitable number can be used in the layout. As shown in FIG. 5, the semiconductor fins 111*a*, 111*b*, 113*a*, and 113*b* are formed in the P-type wells 104 and 108 and the semiconductor fins 112*a*, 112*b*, 112*c*, and 112*d* are formed in the N-type well 106. The trenches T1 may be trench strips that are substantially parallel to each other. Similarly, the semiconductor fins 111*a*, 111*b*, 112*a*, 112*b*, 112*c*, 112*d*, 113*a*, and 113*b* are substantially parallel to each other. After etching the substrate 110, the photo-sensitive layer 140 as shown in FIG. 4 is removed. Next, a cleaning step may be performed to remove a native oxide of the semiconductor substrate 110. The cleaning may be performed using diluted hydrofluoric (HF) acid, for example. In some embodiments, the semiconductor fins 112*a*, 112*b*, 112*c*, 112*d* can include SiGe, and the Ge atomic concentration can be in a range from about 10% to about 40%.

In some embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 6:
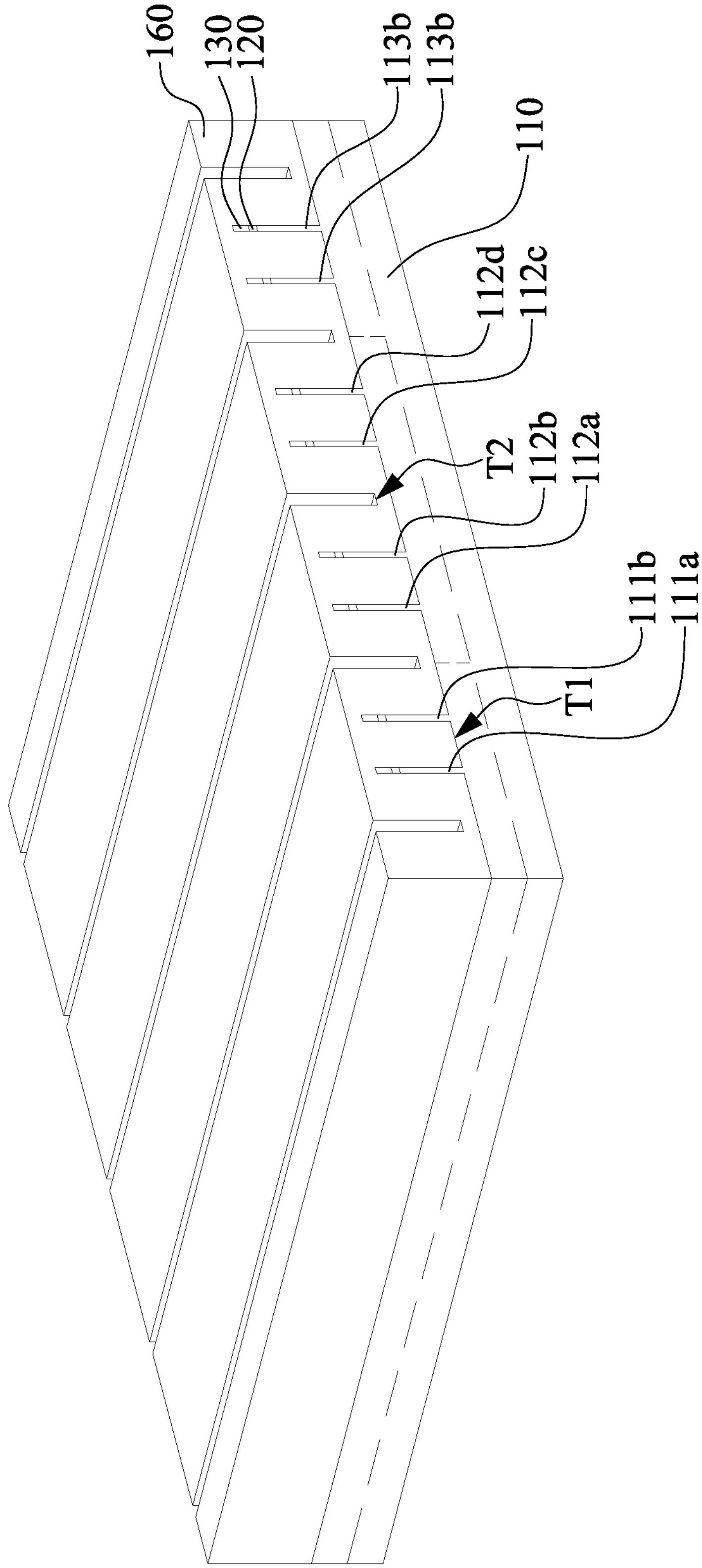

Reference is made to FIG. 6. An isolation layer 160 is formed over the substrate 110. In some embodiments, the isolation layer 160 is formed to conformally cover the semiconductor fins 111*a*, 111*b*, 112*a*, 112*b*, 112*c*, 112*d*, 113*a*, and 113*b* by suitable deposition process, such as atomic layer deposition (ALD). Thus, plural trenches T2 are formed in the isolation layer 160 and between the corresponding semiconductor fins. For example, some trenches T2 each is formed between the fins 111*b* and 112*a*, between 112*b* and 112*c*, or between 112*d* and 113*a*.

In some embodiments, if two adjacent fins are too close, the isolation layer 160 may be filled in the space between the fins. For example, in FIG. 6, since the semiconductor fins 111*a* and 111*b* are close enough, the isolation layer 160 is filled in the space between the adjacent semiconductor fins 111*b* and 112*a*. That is, no trench is formed between the semiconductor fins 111*a* and 111*b*. In some embodiments, a thickness of the isolation layer 160 is in a range from about 5 nm to about 40 nm.

In some embodiments, the isolation layer 160 in the trenches Ti can be referred to as a shallow trench isolation (STI) structure. In some embodiments, the isolation layer 160 is made of silicon oxide, silicon nitride, silicon oxynitride, fluoride-doped silicate glass (FSG), or other low-K dielectric materials. In some embodiments, the isolation layer 160 may be formed using a high-density-plasma (HDP) chemical vapor deposition (CVD) process, using silane ($SiH_4$) and oxygen ($O_2$) as reacting precursors. In some other embodiments, the isolation layer 160 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation layer 160 may be formed using a spin-on-dielectric (SOD) process, such as hydrogen silsesquioxane (HSQ) or methyl silsesquioxane (MSQ). Other processes and materials may be used. In some embodiments, the isolation layer 160 can have a multi-layer structure, for example, a thermal oxide liner layer with silicon nitride formed over the liner. Thereafter, a thermal annealing may be optionally performed to the isolation layer 160.

Figure 7:
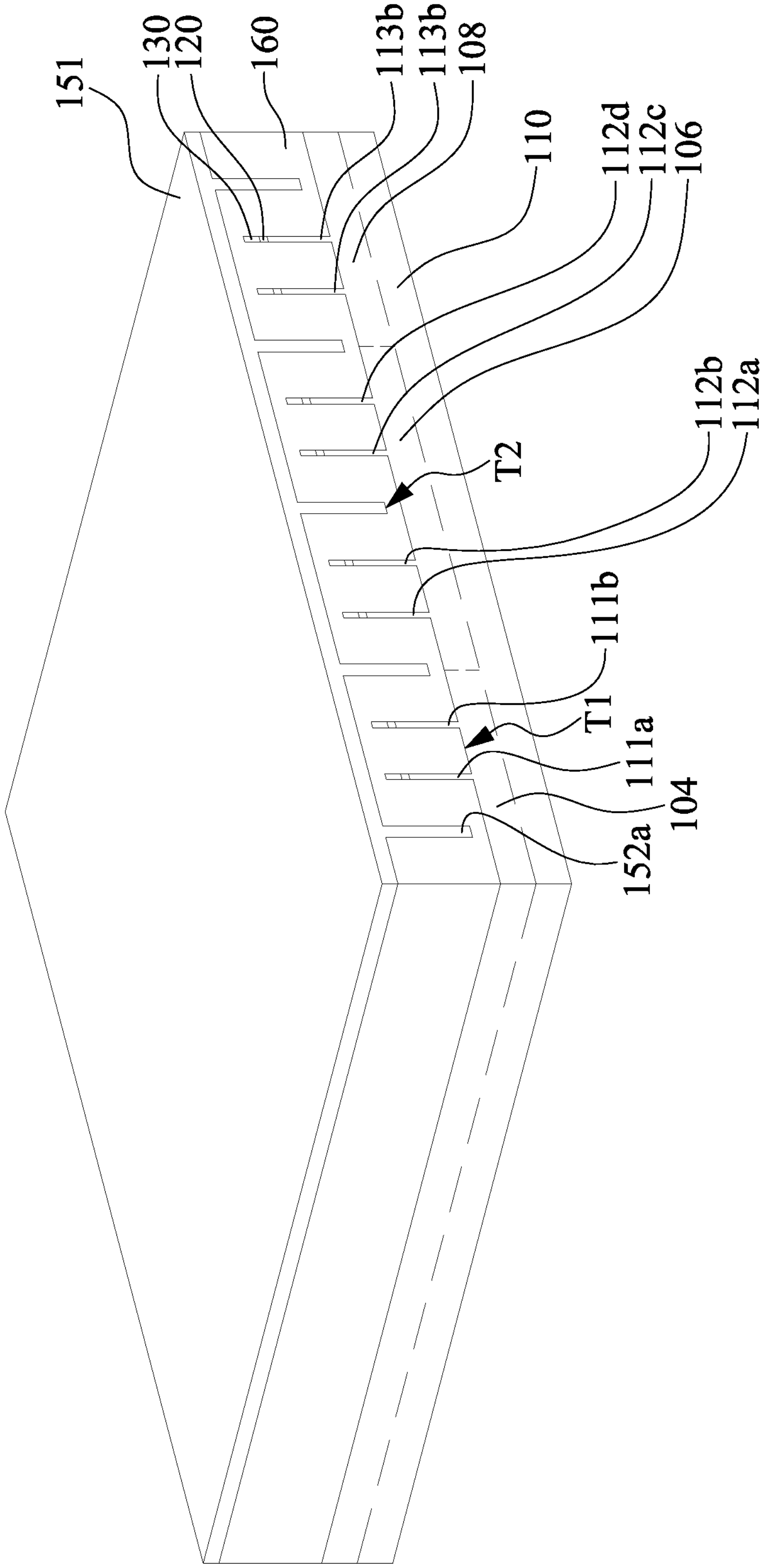

Reference is made to FIG. 7. A dielectric fin layer 151 is formed over the substrate 110 and covers the isolation layer 160. Further, the dielectric fin layer 151 is filled in the trenches T2 of the isolation layer 160. In some embodiments, the dielectric fin layer 151 may include metal oxides, such as $HfO_2$, $ZrO_2$, $HfAlO_x$, $HfSiO_x$ and the like and may be formed by methods utilized to form such a layer, such as CVD, plasma enhanced CVD, sputter, and other methods known in the art.

In some embodiments, the dielectric fin layer 151 can include a single dielectric layer or multiple dielectric layers. In some embodiments, the dielectric fin layer 151 includes Carbon content oxide, Nitrogen content oxide, metal oxide dielectric, or combinations thereof. In some embodiments, the dielectric fin layer 151 can include $SiO_2$, SiOC, SiON, SiOCN, or combinations thereof. In some embodiments, the dielectric fin layer can include Hf oxide (e.g., $HfO_2$), Ta oxide (e.g., $Ta_2O_5$), Ti oxide (e.g., $TiO_2$), Zr oxide (e.g., $ZrO_2$), Al oxide (e.g., $Al_2O_3$), Y oxide (e.g., $Y_2O_3$), or combinations thereof. In some embodiments, the dielectric fin layer 151 may be made from other high-k materials other than metal dielectric materials.

Figure 8:
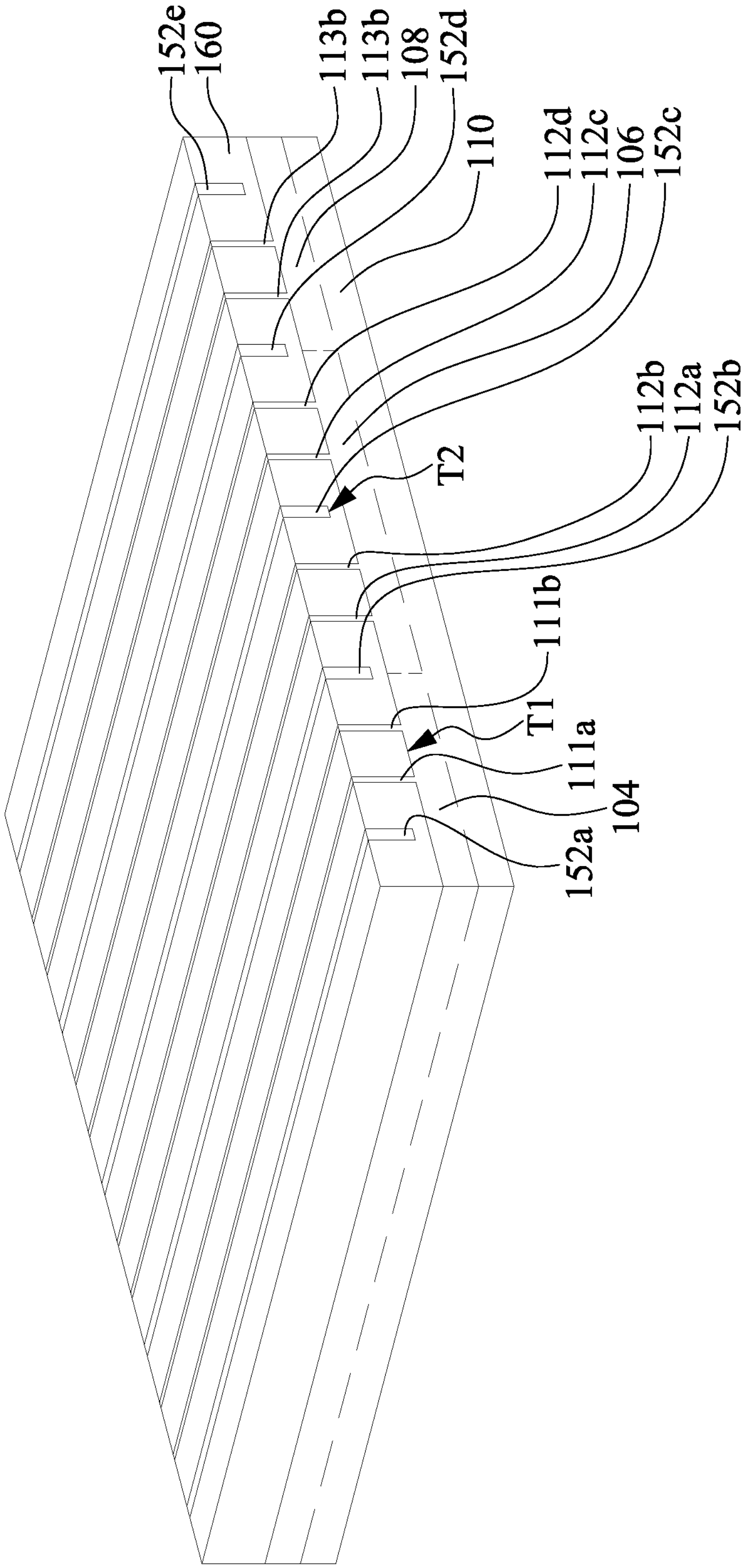

Reference is made to FIG. 8. A planarization process such as chemical mechanical polish (CMP) is performed to remove the excessive isolation layer 160 and dielectric fin layer 151 as shown in FIG. 7 until the semiconductor fins 111*a*, 111*b*, 112*a*, 112*b*, 112*c*, 112*d*, 113*a*, and 113*b* are exposed, and further to form dielectric fins 152*a*, 152*b*, 152*c*, 152*d*, and 152*e*. The dielectric fins 152*a*, 152*b*, 152*c*, 152*d*, and 152*e* cover the isolation layer 160 underneath. In some embodiments, the dielectric fins 152*a*, 152*b*, 152*c*, 152*d*, and 152*e* cover are on the substrate 110 and parallel to the semiconductor fins 111*a*, 111*b*, 112*a*, 112*b*, 112*c*, 112*d*, 113*a*, and 113*b*.

Specifically, the CMP process is then performed to remove the excess isolation layer 160 outside the trenches T1, and the resulting structure is shown in FIG. 8. In some embodiments, the planarization process may also remove the mask layer 130 and the pad layer 120 shown in FIG. 7, such that top surfaces of the semiconductor fins 111*a*, 111*b*, 112*a*, 112*b*, 112*c*, 112*d*, 113*a*, and 113*b* are exposed. In some other embodiments, the planarization process stops when the mask layer 130 is exposed. In such embodiments, the mask layer 130 may act as the CMP stop layer in the planarization. If the mask layer 130 and the pad layer 120 are not removed by the planarization process, the mask layer 130, if formed of silicon nitride, may be remove by a wet process using hot $H_3PO_4$, and the pad layer 120, if formed of silicon oxide, may be removed using diluted HF.

Figure 9:
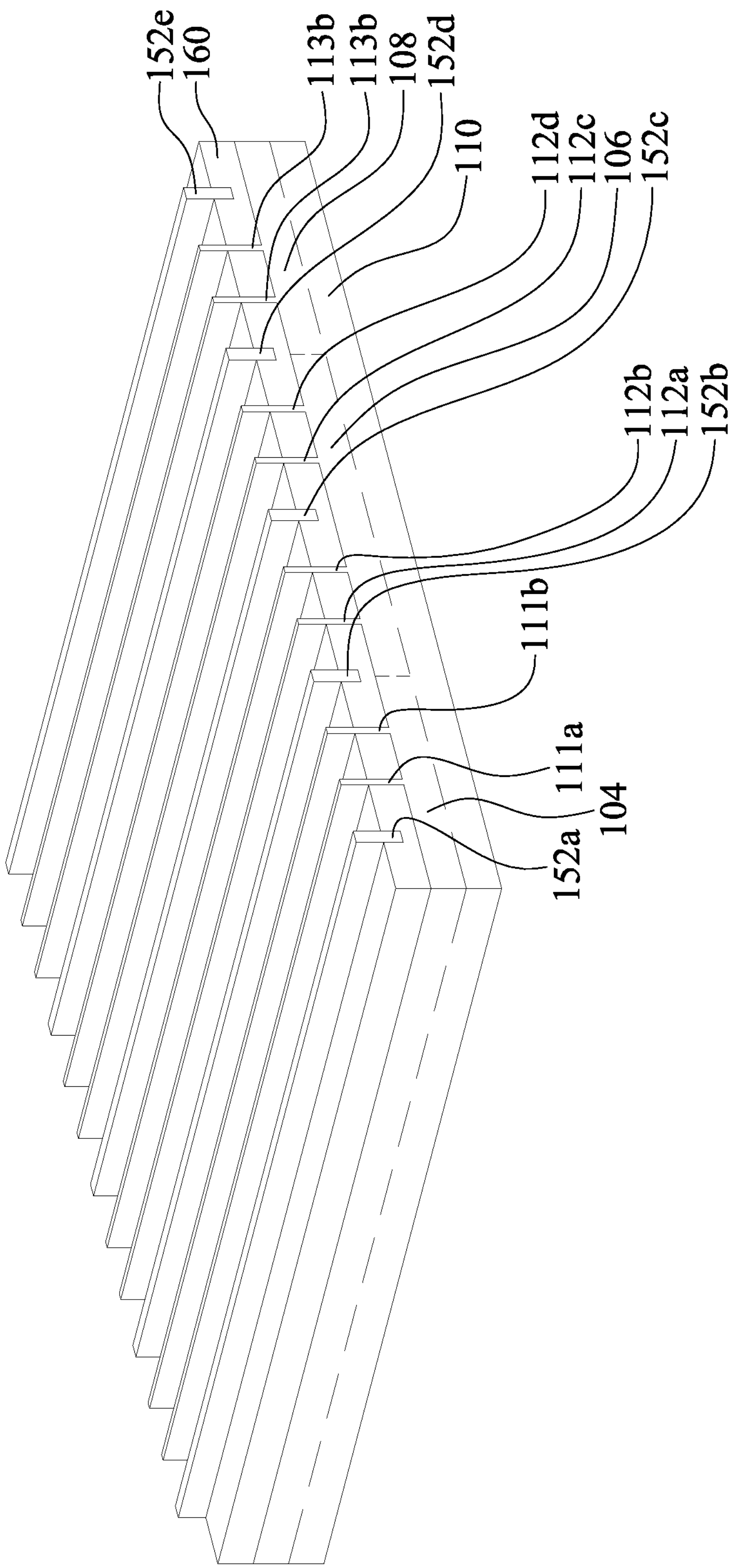

Next, as shown in FIG. 9, the isolation layer 160 is recessed, for example, through an etching operation, wherein diluted HF, SiCoNi (including HF and $NH_3$), or the like, may be used as the etchant. After recessing the isolation layer 160, portions of the semiconductor fins 111*a*, 111*b*, 112*a*, 112*b*, 112*c*, 112*d*, 113*a*, and 113*b* are higher than a top surface of the isolation layer 160, and hence the portions of the semiconductor fins 111*a*, 111*b*, 112*a*, 112*b*, 112*c*, 112*d*, 113*a*, and 113*b* protrude above the isolation layer 160. In the meantime, portions of the dielectric fins 152*a*, 152*b*, 152*c*, 152*d*, and 152*e* are higher than the top surface of the isolation layer 160 from about 30 nm to about 80 nm, and hence these portions of the dielectric fins 152*a*, 152*b*, 152*c*, 152*d*, and 152*e* protrude above the isolation layer 160.

It is understood that the processes described above are some examples of how semiconductor fins 111*a*, 111*b*, 112*a*, 112*b*, 112*c*, 112*d*, 113*a*, and 113*b* and the STI structure are formed. In other embodiments, an isolation layer 160 can be formed over a top surface of the substrate 110; trenches can be etched through the dielectric layer; homoepitaxial structures can be epitaxially grown in the trenches; and the isolation layer can be recessed such that the homoepitaxial structures protrude from the dielectric layer to form fins. In still other embodiments, heteroepitaxial structures can be used for the fins. For example, at least one of the semiconductor fins 111*a*, 111*b*, 112*a*, 112*b*, 112*c*, 112*d*, 113*a*, and 113*b* can be recessed, and a material different from the recessed semiconductor fins 111*a*, 111*b*, 112*a*, 112*b*, 112*c*, 112*d*, 113*a*, and 113*b* may be epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. In some embodiments, at least one of the semiconductor fins 111*a*, 111*b*, 112*a*, 112*b*, 112*c*, 112*d*, 113*a*, and 113*b* may include silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 10:
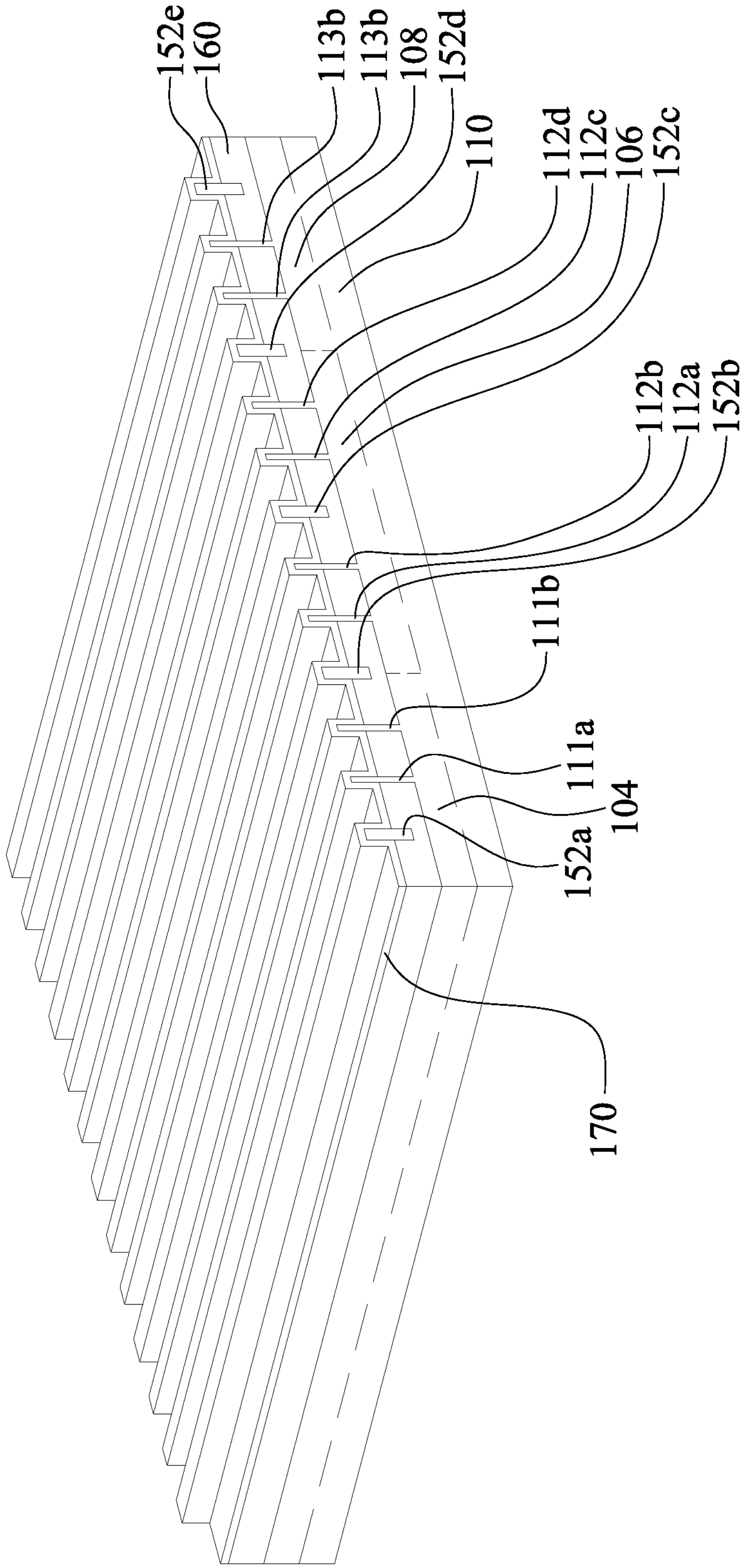

Reference is made to FIG. 10. A gate dielectric layer 170 is blanket formed over the substrate 110 to cover the semiconductor fins 111*a*, 111*b*, 112*a*, 112*b*, 112*c*, 112*d*, 113*a*, and 113*b* and the isolation layer 160. In some embodiments, the gate dielectric layer 170 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HMO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 170 is an oxide layer. The gate dielectric layer 170 may be formed by a deposition processes, such as chemical vapor deposition (CVD), physical vapor deposition (PVD), atomic layer deposition (ALD), plasma enhanced CVD (PECVD) or other suitable techniques.

Figure 11:
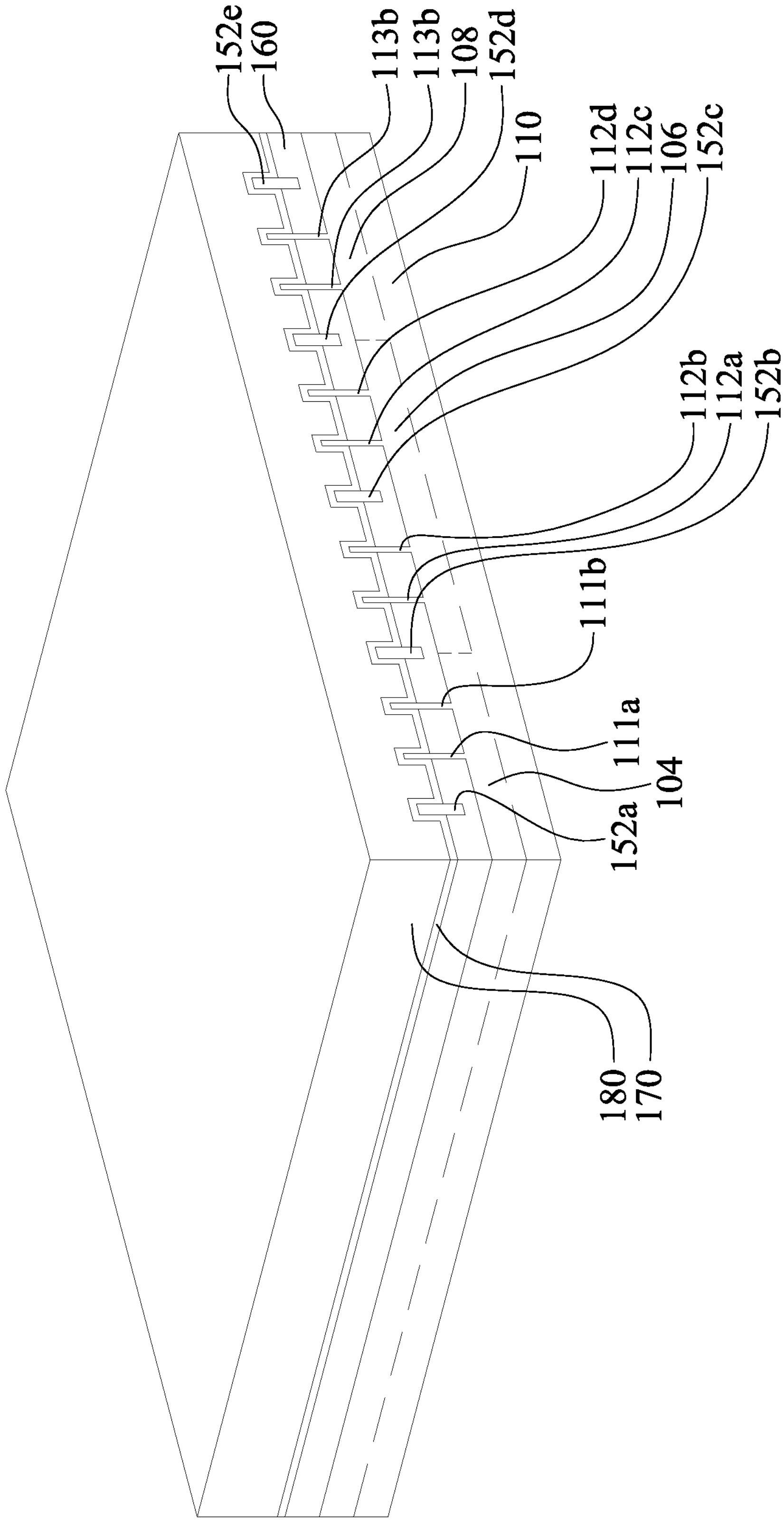

Reference is made to FIG. 11. After the gate dielectric layer 170 is formed, a dummy gate electrode layer 180 is formed over the gate dielectric layer 170. In some embodiments, the dummy gate electrode layer 180 may include polycrystalline-silicon (poly-Si), poly-crystalline silicon-germanium (poly-SiGe), metallic nitrides, metallic silicides, metallic oxides, or metals. In some embodiments, the dummy gate electrode layer 180 includes a metal-containing material such as TiN, TaN, TaC, Co, Ru, Al, combinations thereof, or multi-layers thereof. The dummy gate electrode layer 180 may be deposited by CVD, physical vapor deposition (PVD), sputter deposition, or other techniques suitable for depositing conductive materials.

Reference is made to FIG. 12A to FIG. 13D. The dummy gate electrode layer 180 and the gate dielectric layer 170 are patterned to form dummy gate structures in accordance with some embodiments. For example, a patterned mask 190 is formed over a portion of the dummy gate electrode layer 180, as shown in FIG. 12A to FIG. 12D. The mask 190 may be a hard mask for protecting the underlying dummy gate electrode layer 180 and the gate dielectric layer 170 against subsequent etching process. The patterned mask 190 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 12A:
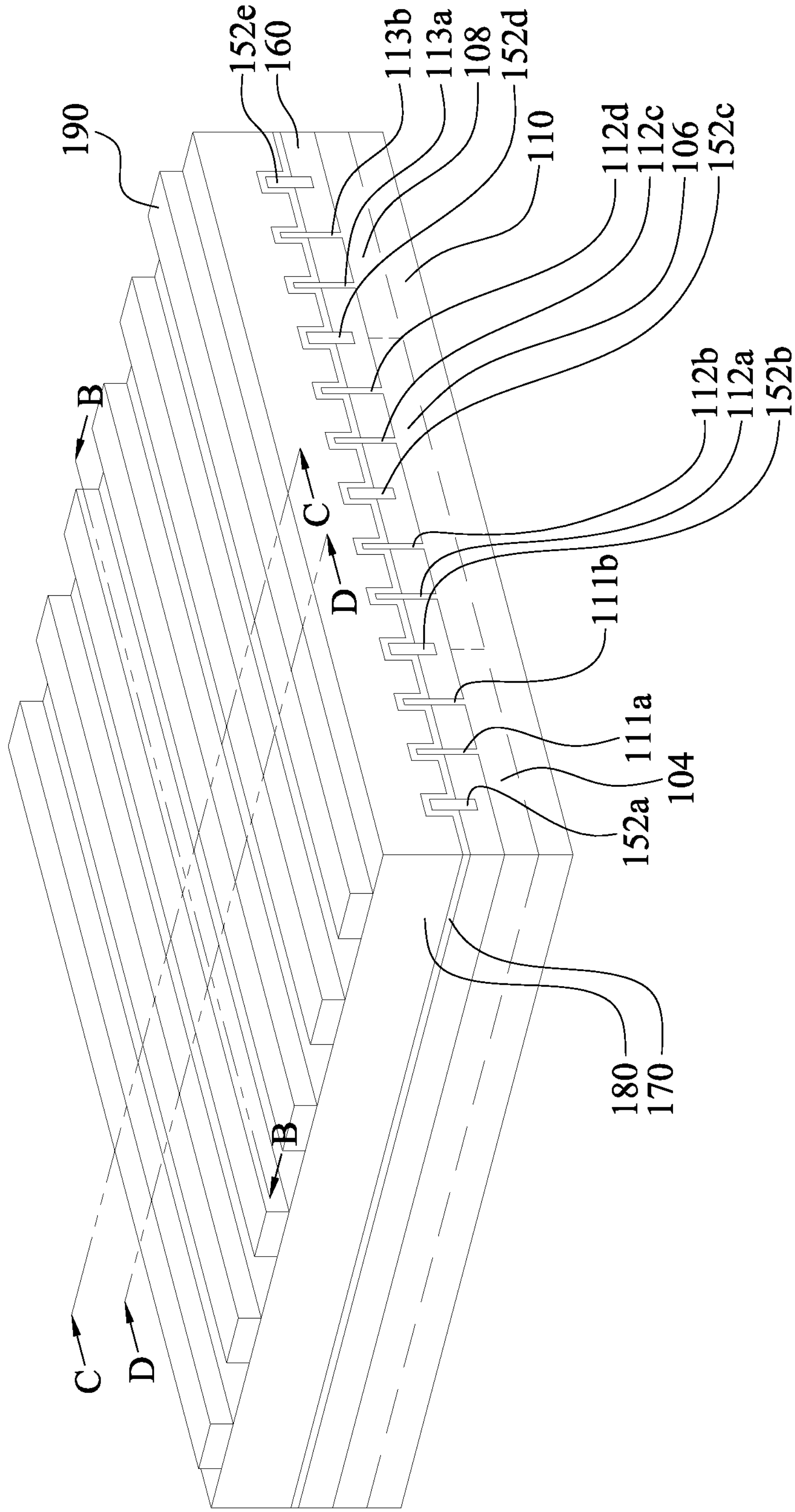
Figure 12B:
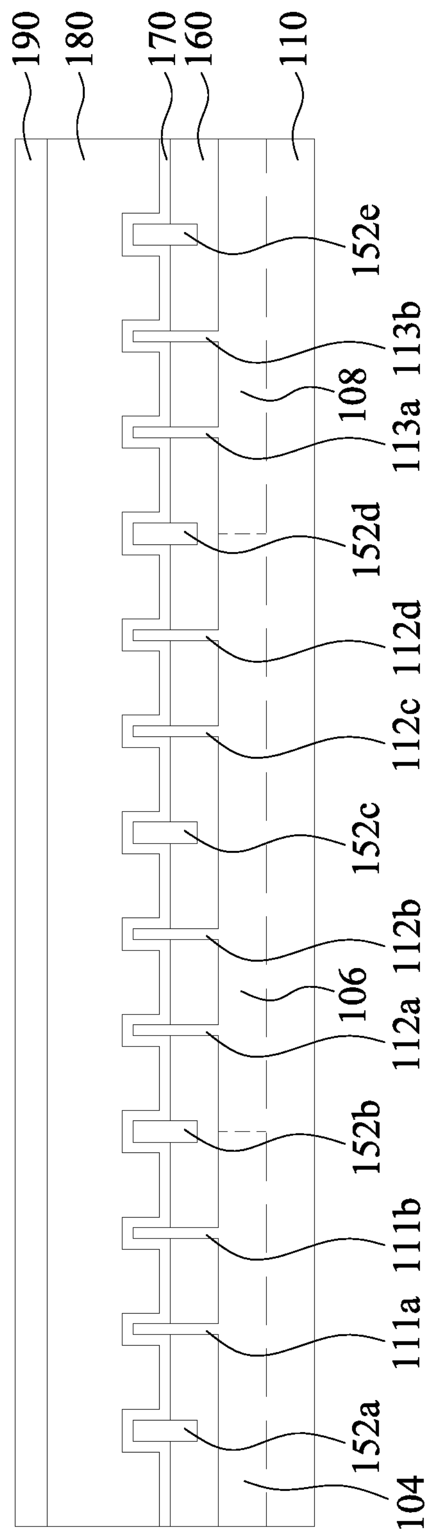
Figure 12C:
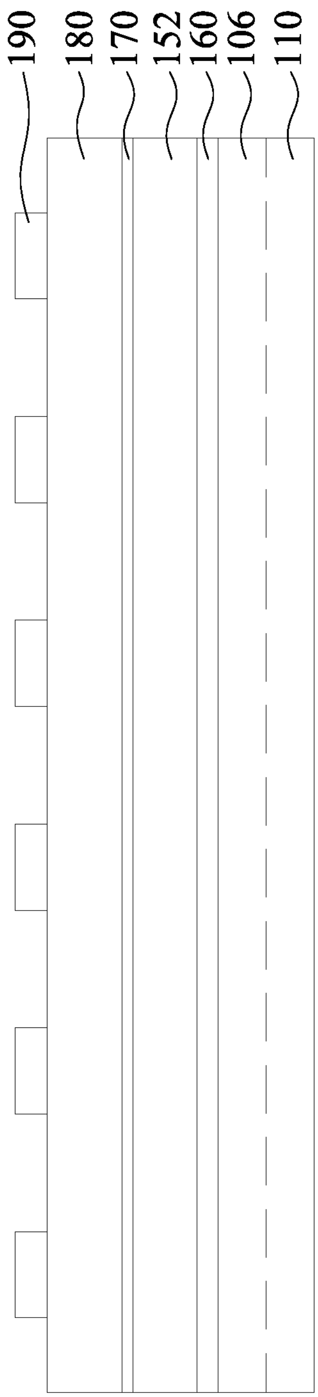
Figure 12D:
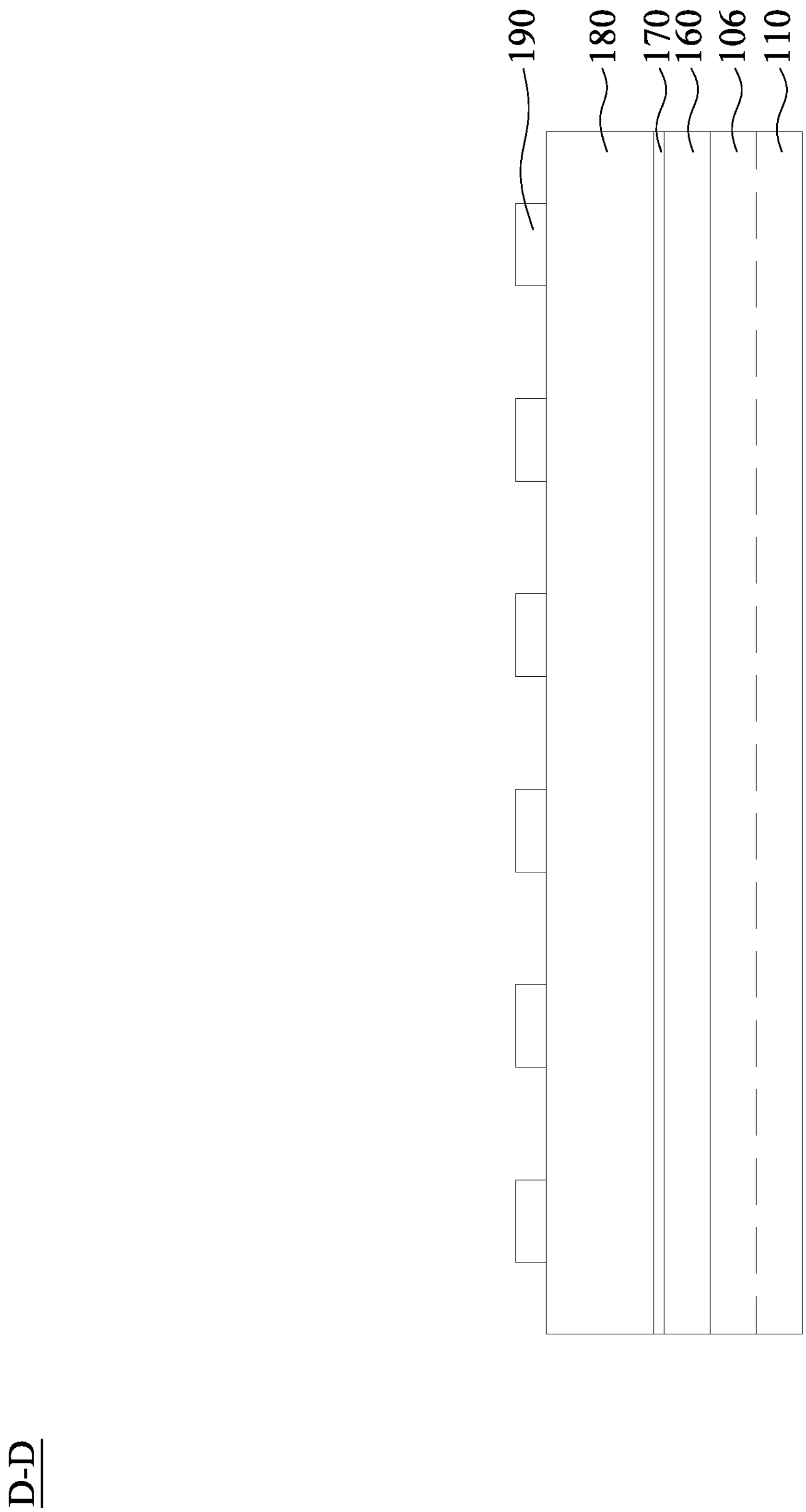
Figure 13A:
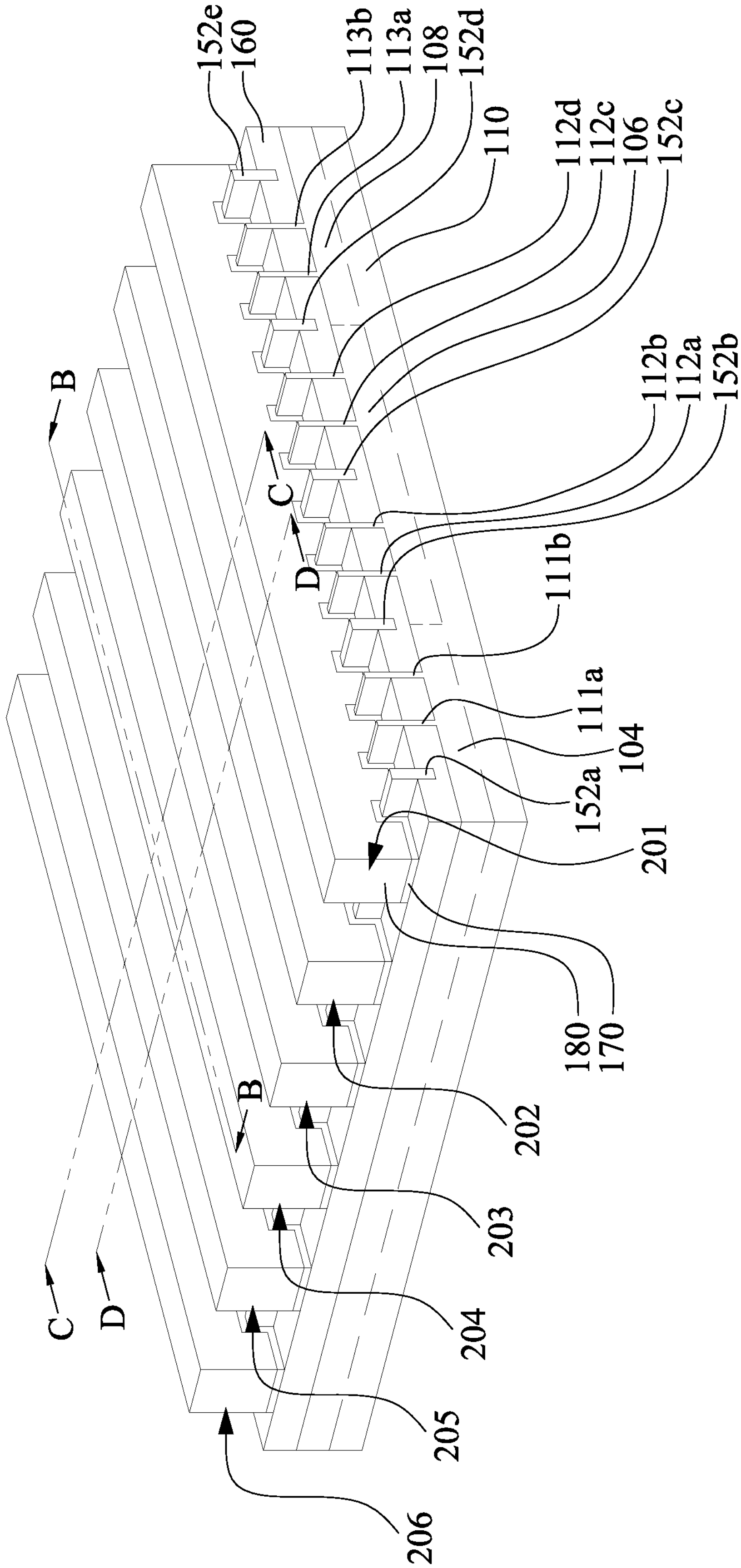
Figure 13B:
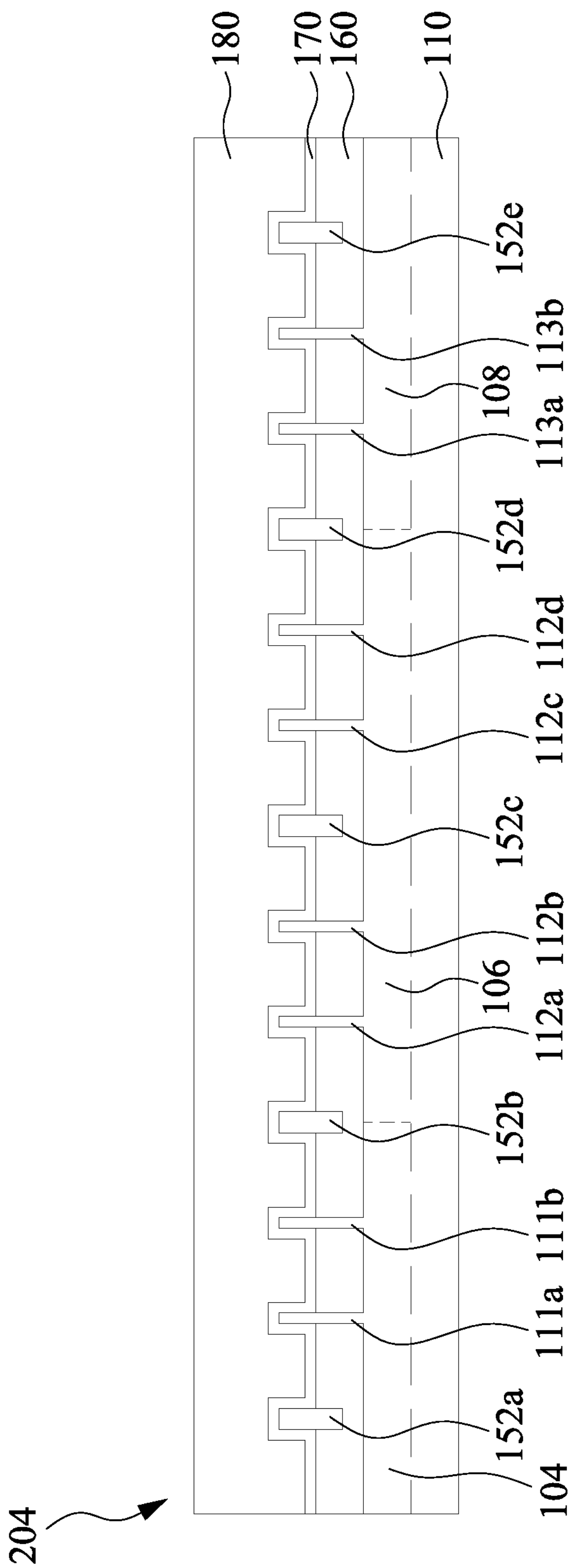
Figure 13C:
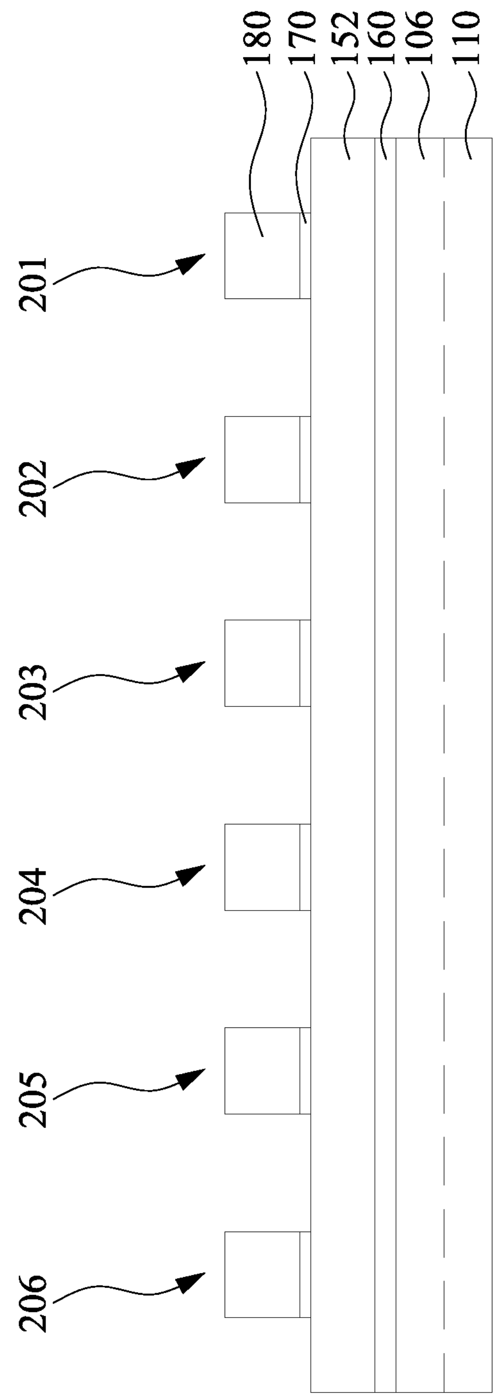
Figure 13D:
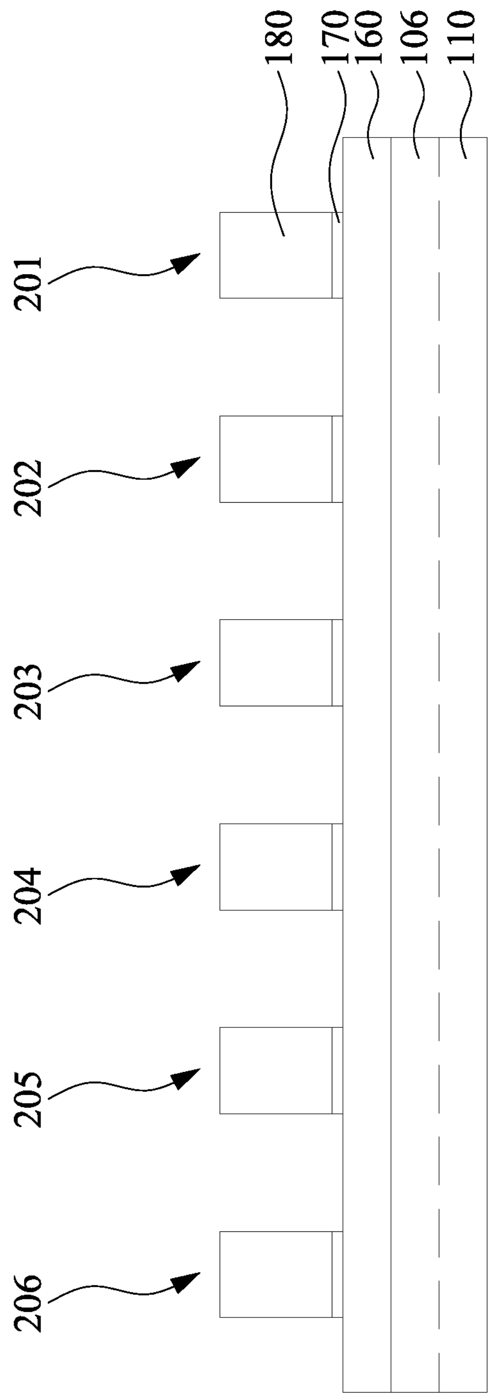
Figure 14A:
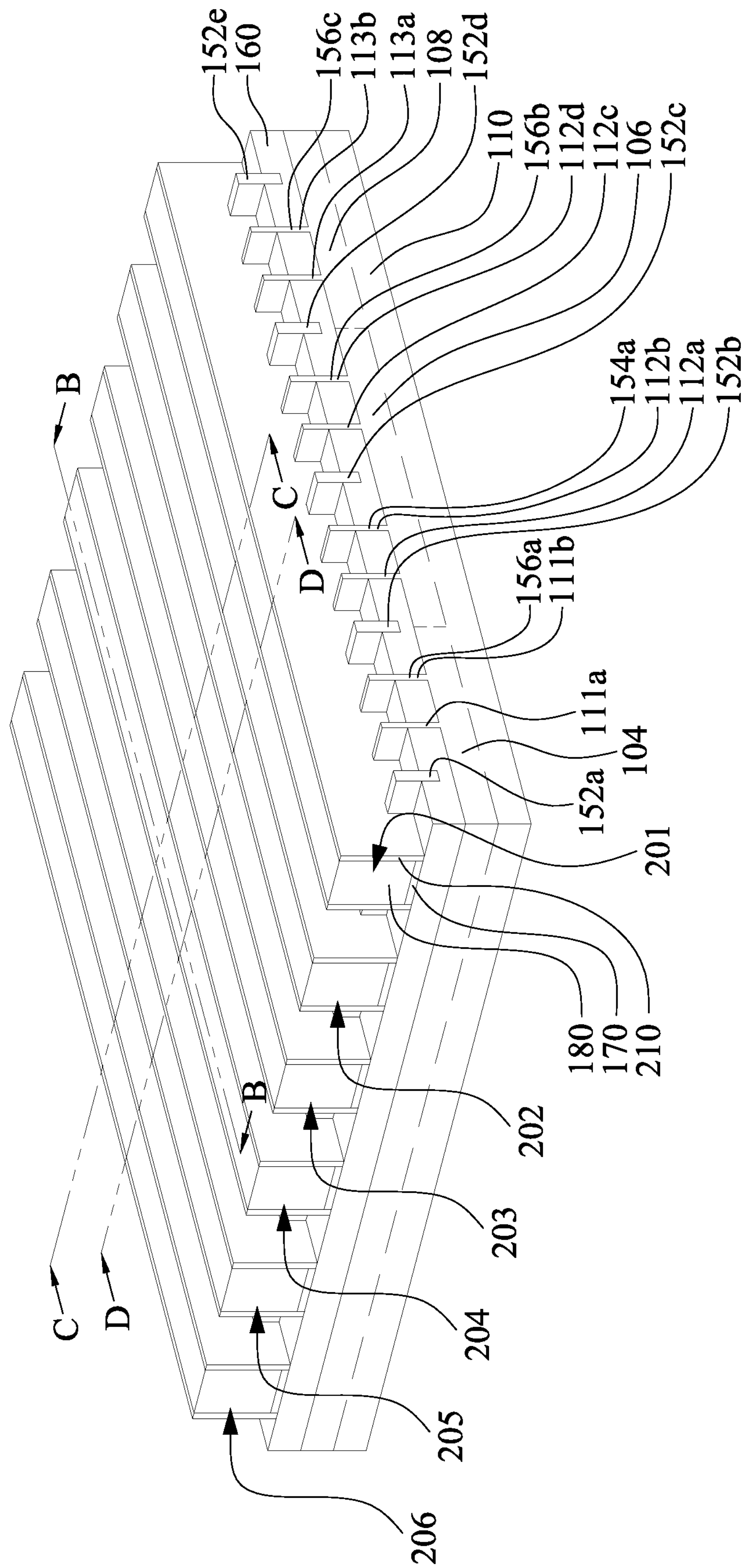
Figure 14B:
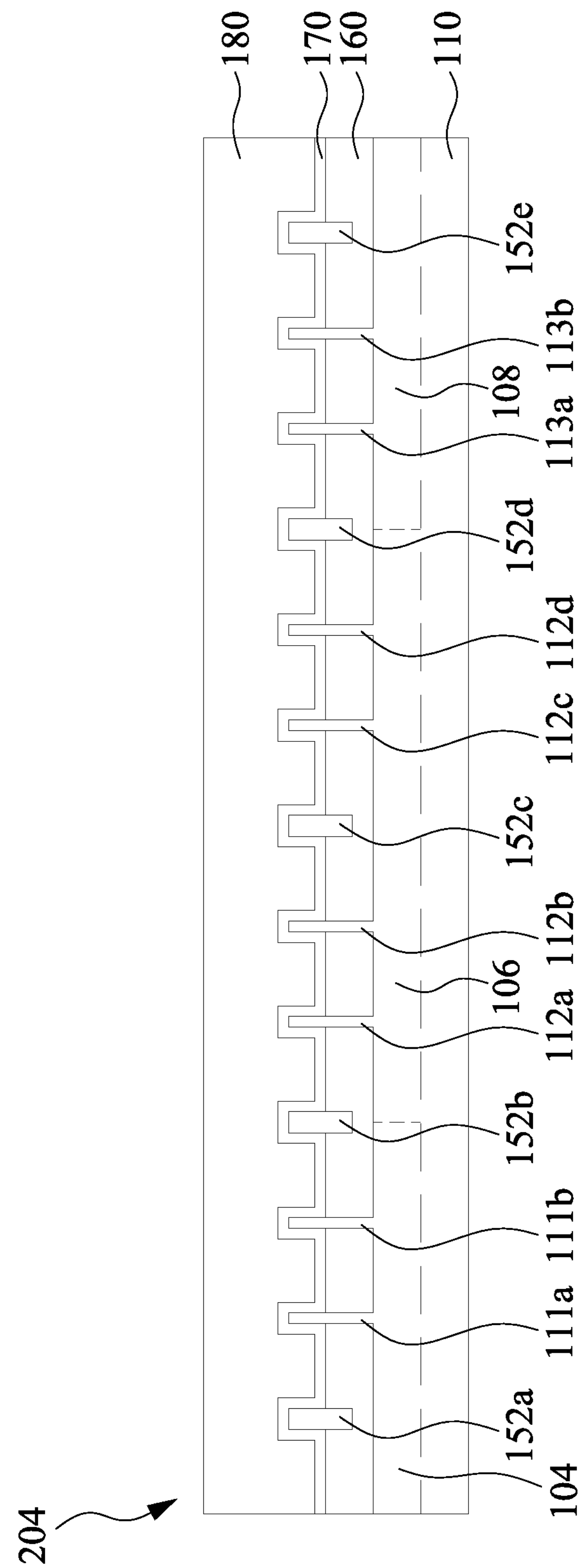
Figure 14C:
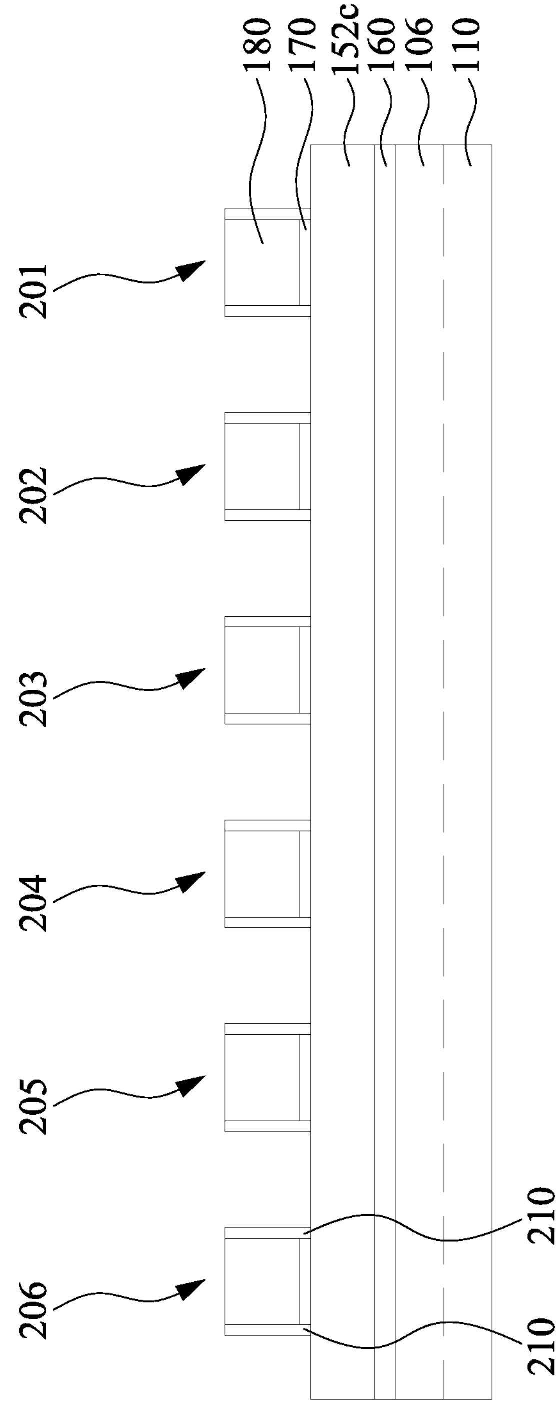
Figure 14D:
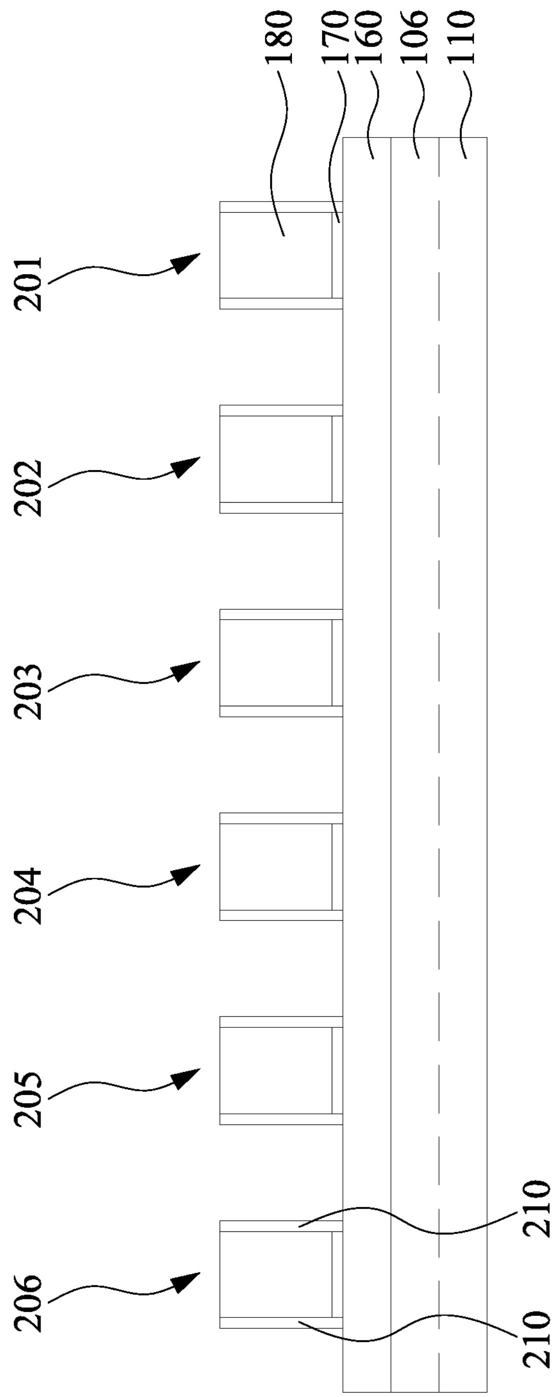

An etching process is performed to form dummy gate structures 201, 202, 203, 204, 205, and 206 shown in FIG. 13A wrapping the semiconductor fins 111*a*, 111*b*, 112*a*, 112*b*, 112*c*, 112*d*, 113*a*, and 113*b* using the patterned mask 190 as an etching mask, and the patterned mask 190 shown in FIG. 12A is removed after the etching. The resulting structure is shown in FIG. 13A to FIG. 13D. Each dummy gate structure 201, 202, 203, 204, 205, and 206 includes patterned gate dielectric layer 170 and dummy gate electrode layer 180 over the patterned gate dielectric layer 170. The dummy gate structures 201, 202, 203, 204, 205, and 206 have substantially parallel longitudinal axes that are substantially perpendicular to longitudinal axes of the semiconductor fins 111*a*, 111*b*, 112*a*, 112*b*, 112*c*, 112*d*, 113*a*, and 113*b*, as illustrated in FIG. 13A. The dummy gate structures 201, 202, 203, 204, 205, and 206 will be replaced with a replacement gate structure using a "gate-last" or replacement-gate process.

Reference is made to FIG. 14A to FIG. 14D. Gate spacers 210 are formed on opposite sidewalls of the dummy gate structures 201, 202, 203, 204, 205, and 206. In some embodiments, the gate spacers 210 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 210 may include a single layer or multilayer structure made of different dielectric materials. The method of forming the gate spacers 210 includes blanket forming dielectric layers on the structure shown in FIG. 13A to FIG. 13D using, for example, CVD, PVD or ALD, and then performing an etching process such as anisotropic etching to remove horizontal portions of the dielectric layer. The remaining portions of the dielectric layer on sidewalls of the dummy gate structures 201, 202, 203, 204, 205, and 206 can serve as the gate spacers 210. In some embodiments, the gate spacers 210 may be used to offset subsequently formed doped regions, such as source/drain regions. The gate spacers 210 may further be used for designing or modifying the source/drain region profile.

Figure 15A:
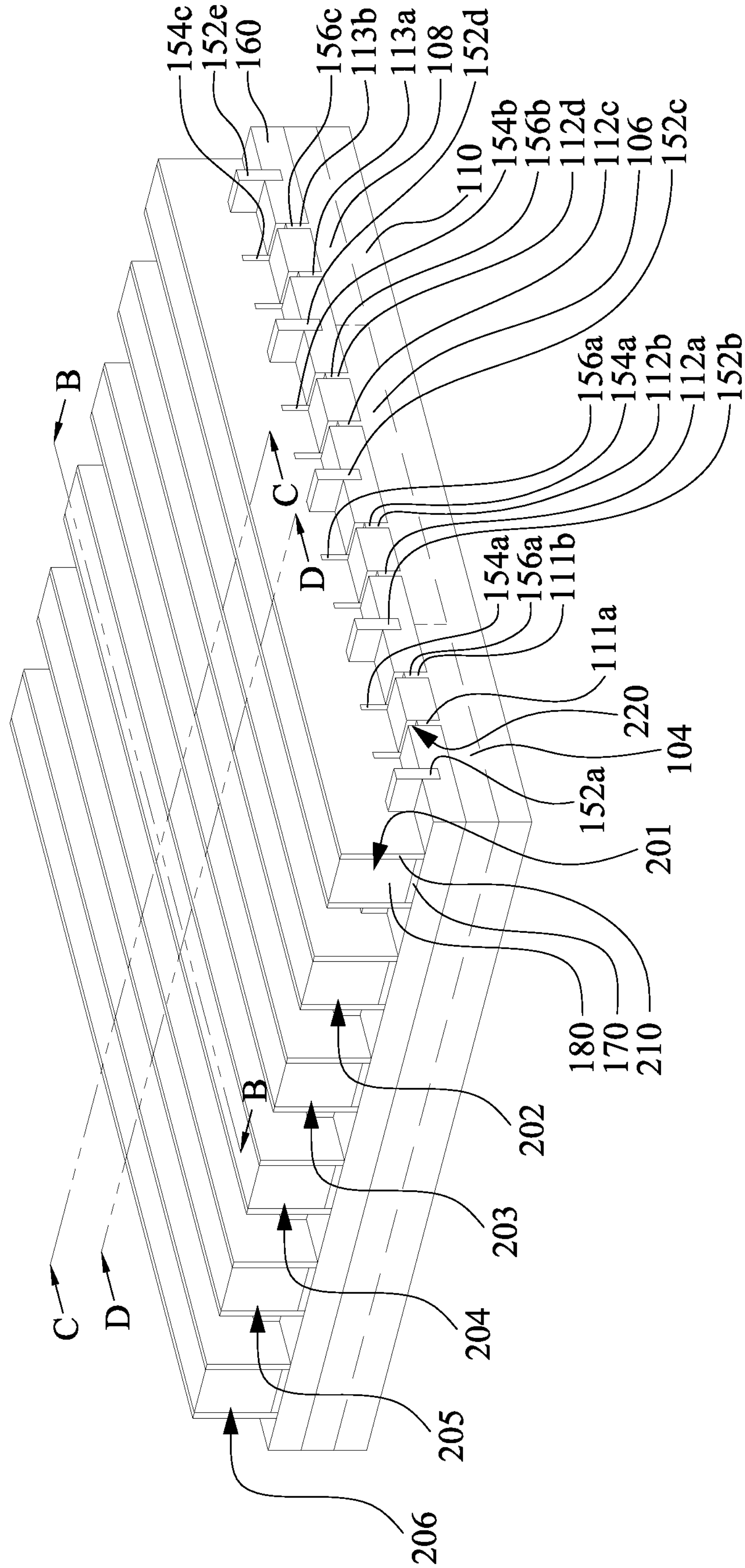
Figure 15B:
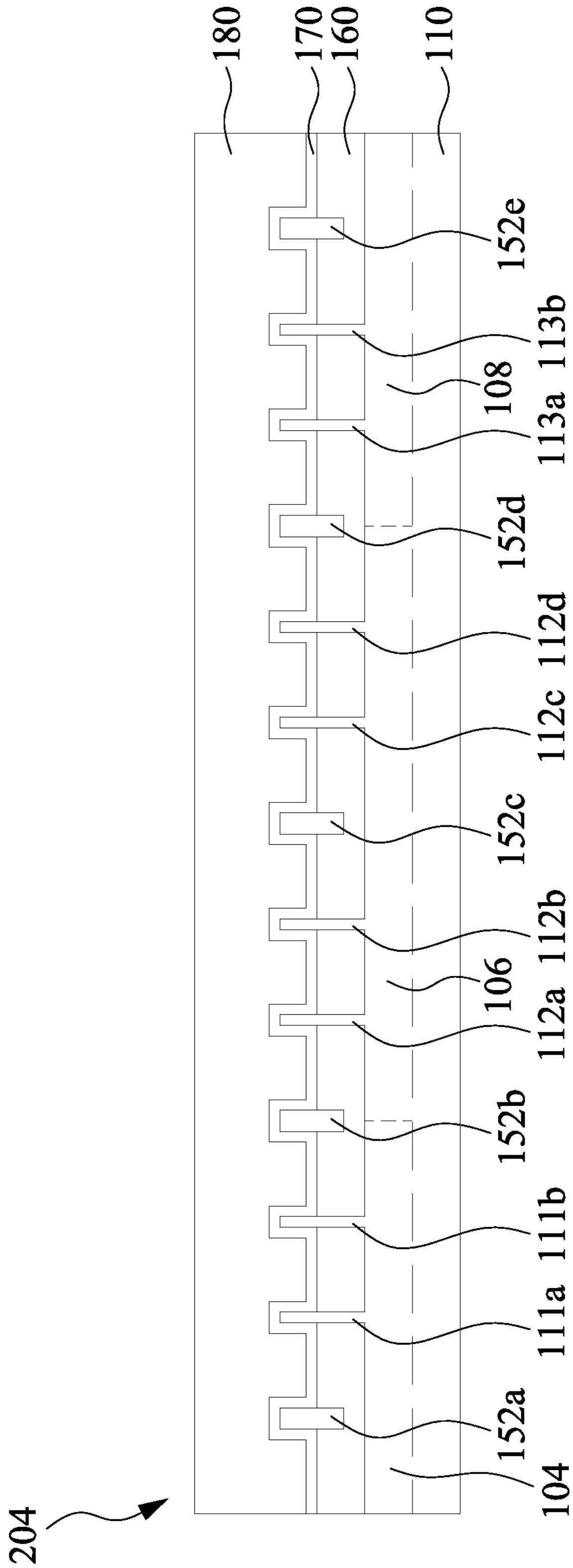
Figure 15C:
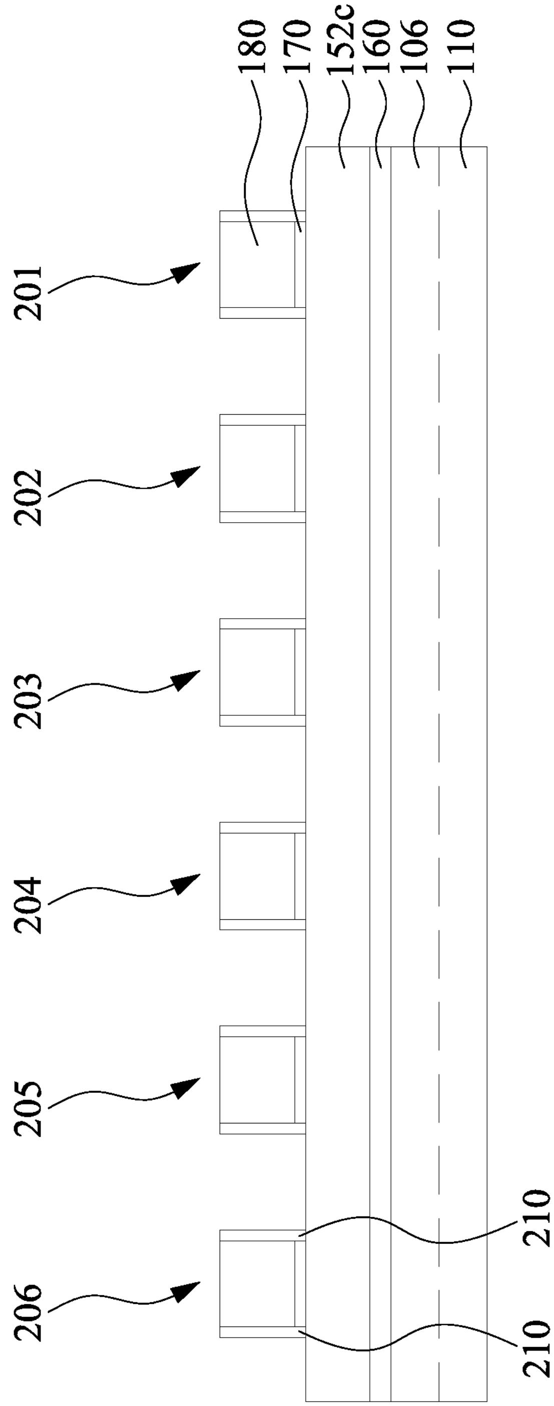
Figure 15D:
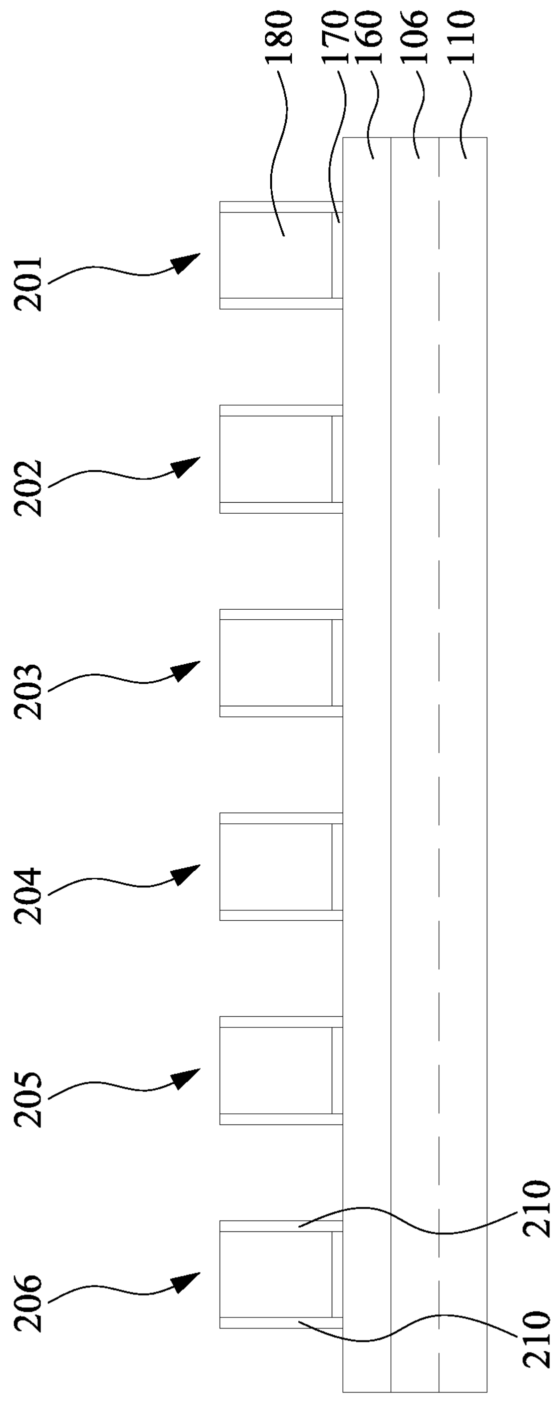
Figure 16A:
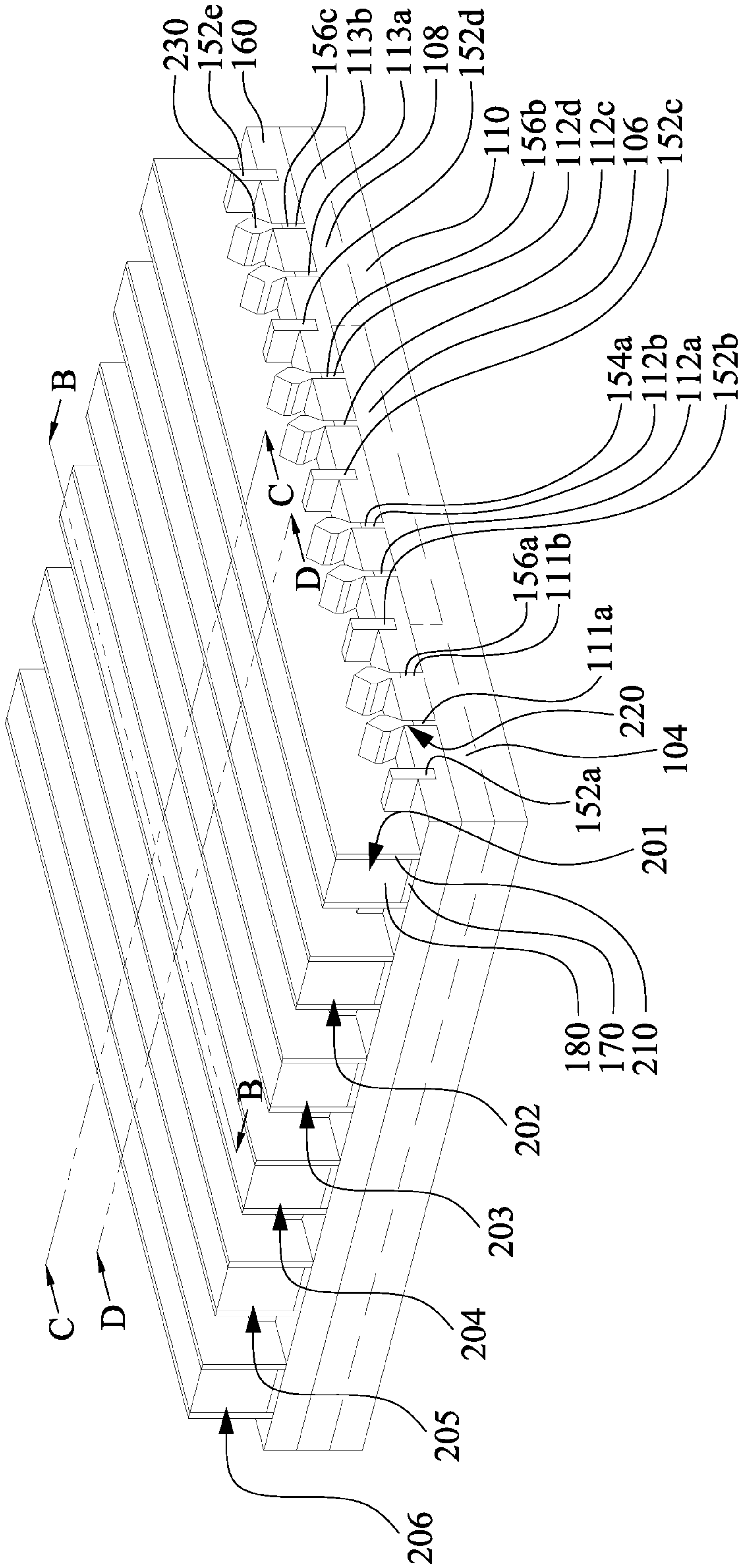
Figure 16B:
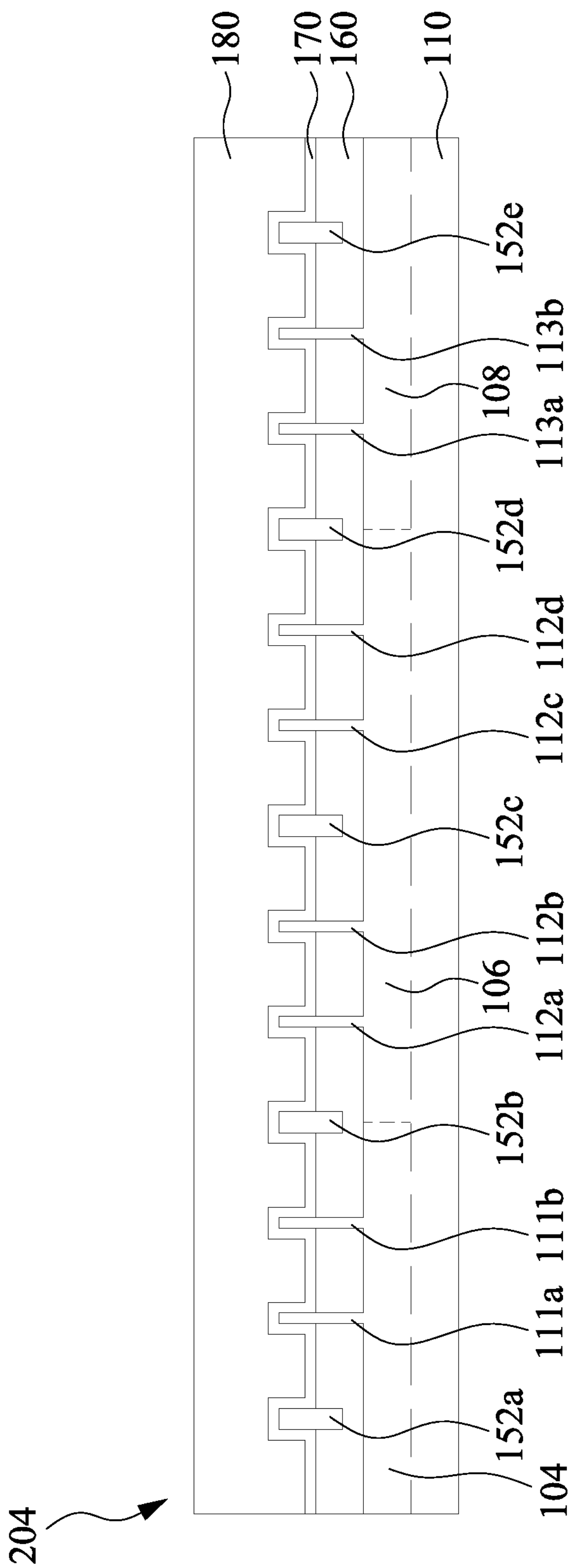
Figure 16C:
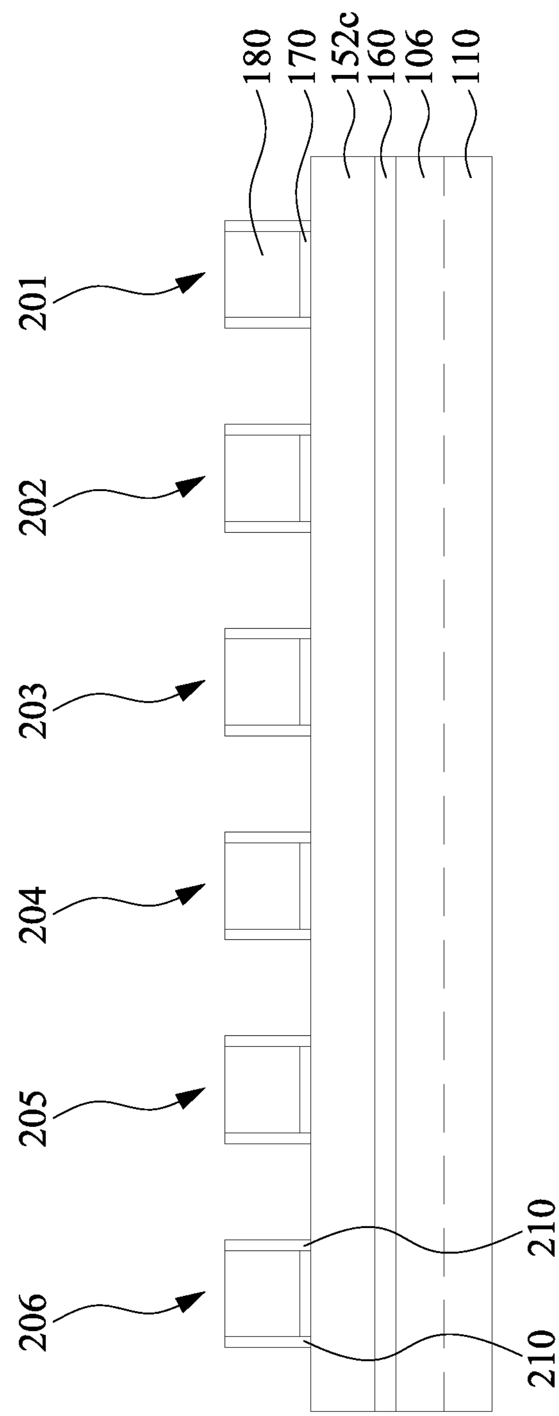
Figure 16D:
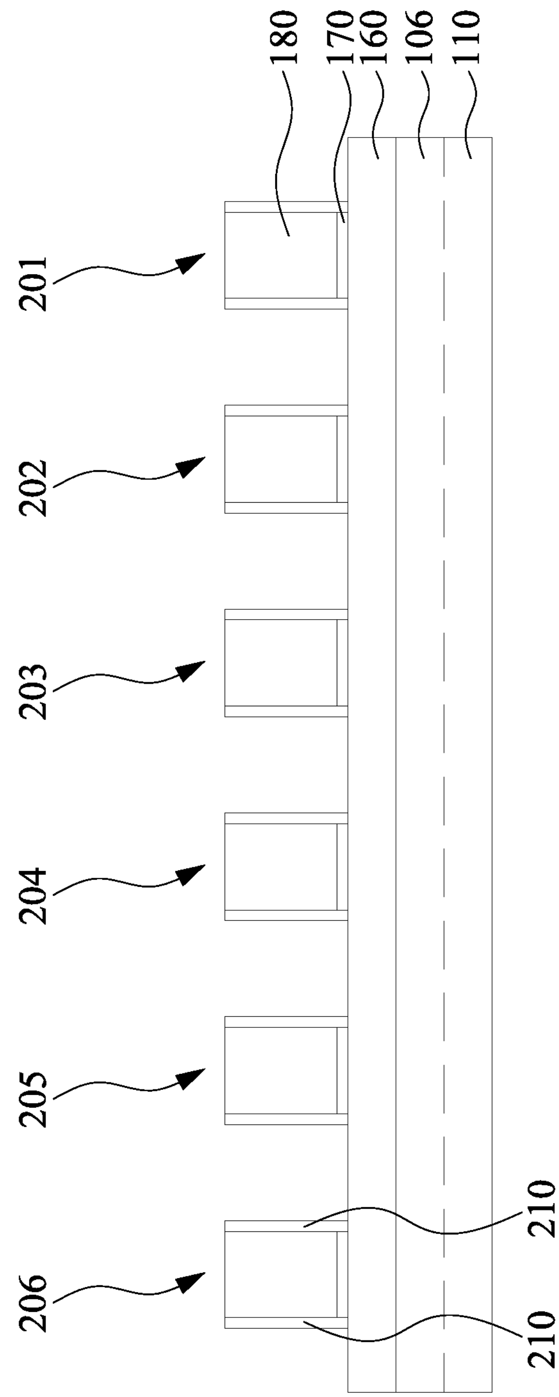
Figure 17A:
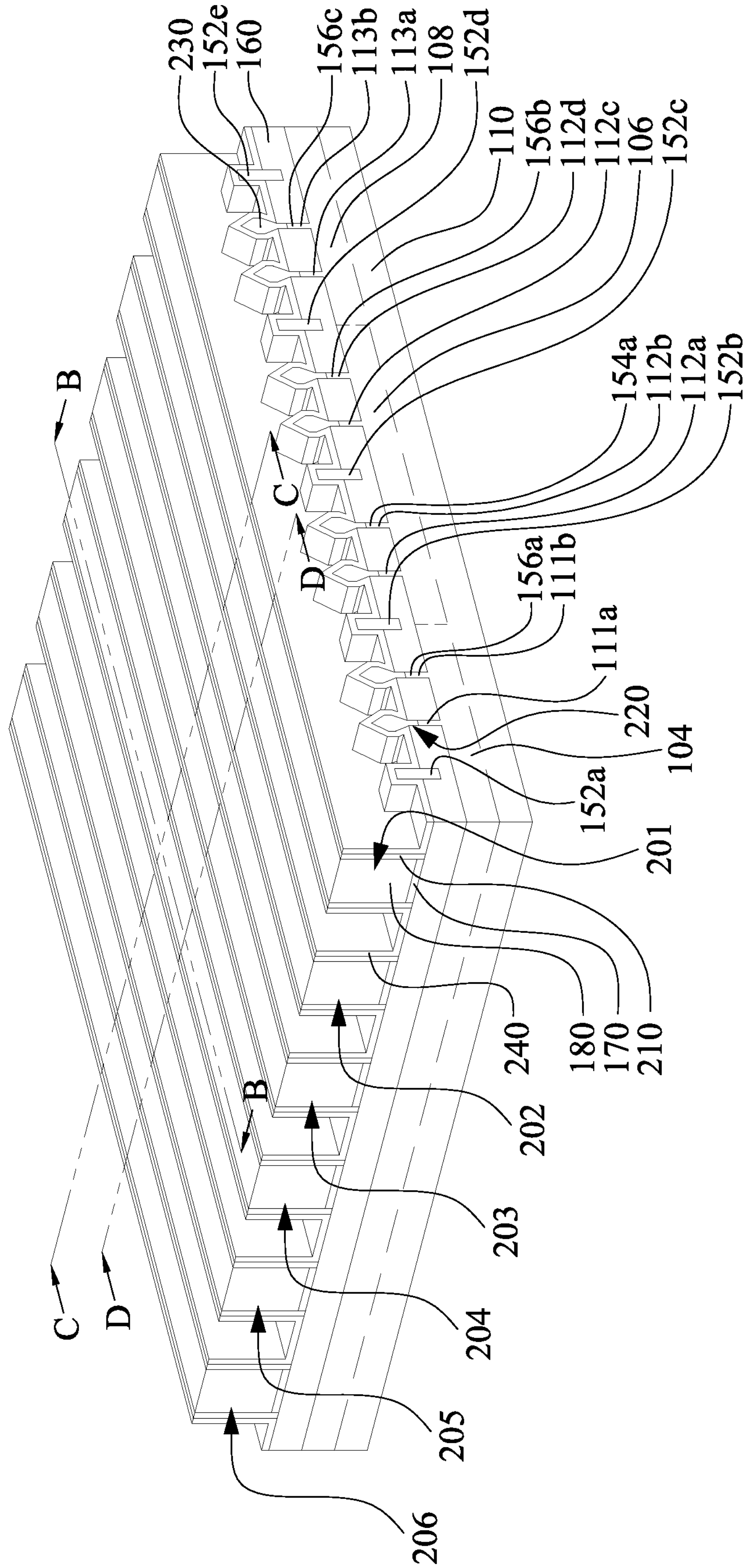
Figure 17B:
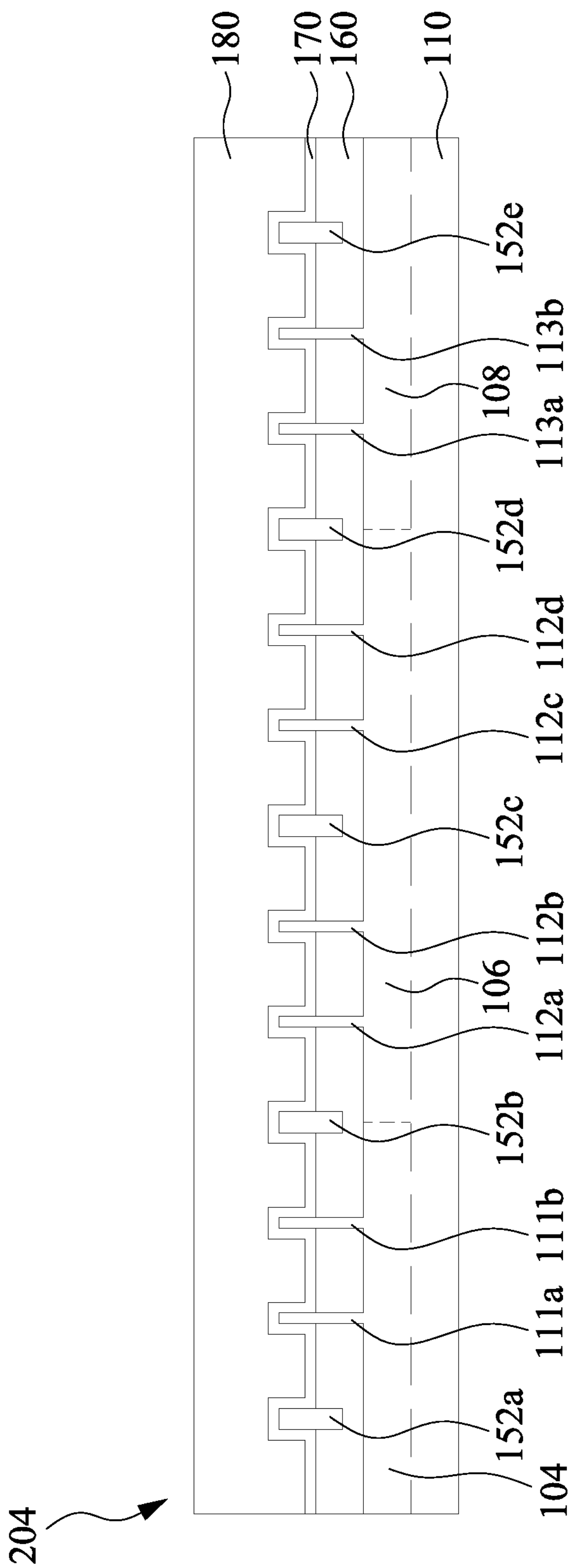
Figure 17C:
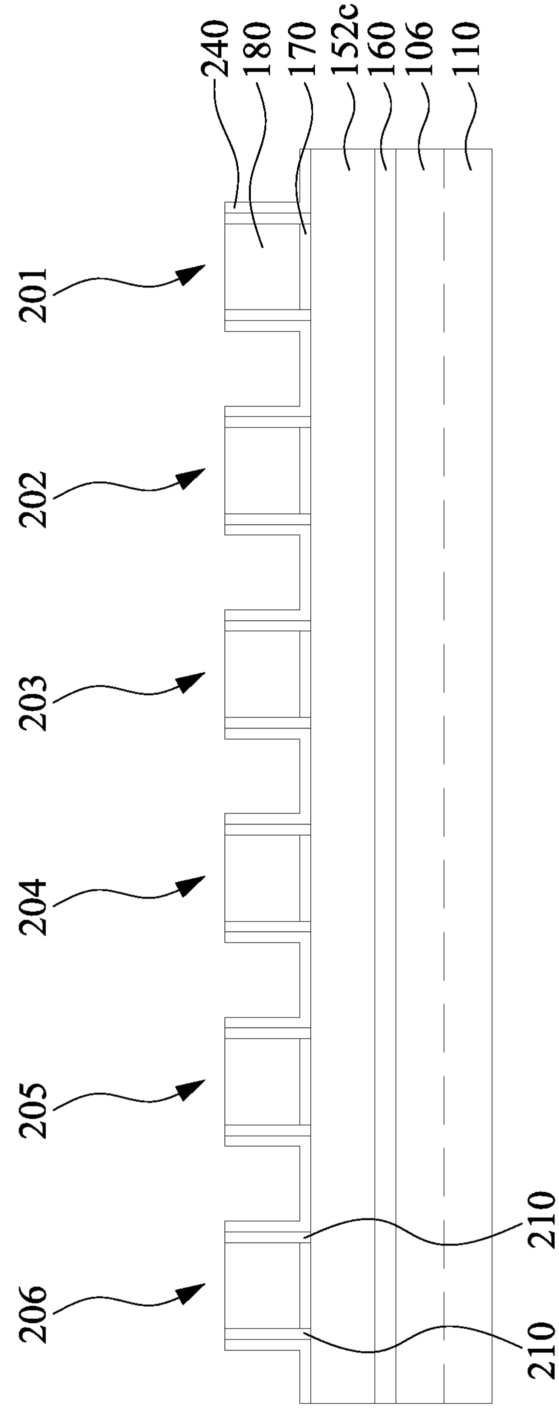
Figure 17D:
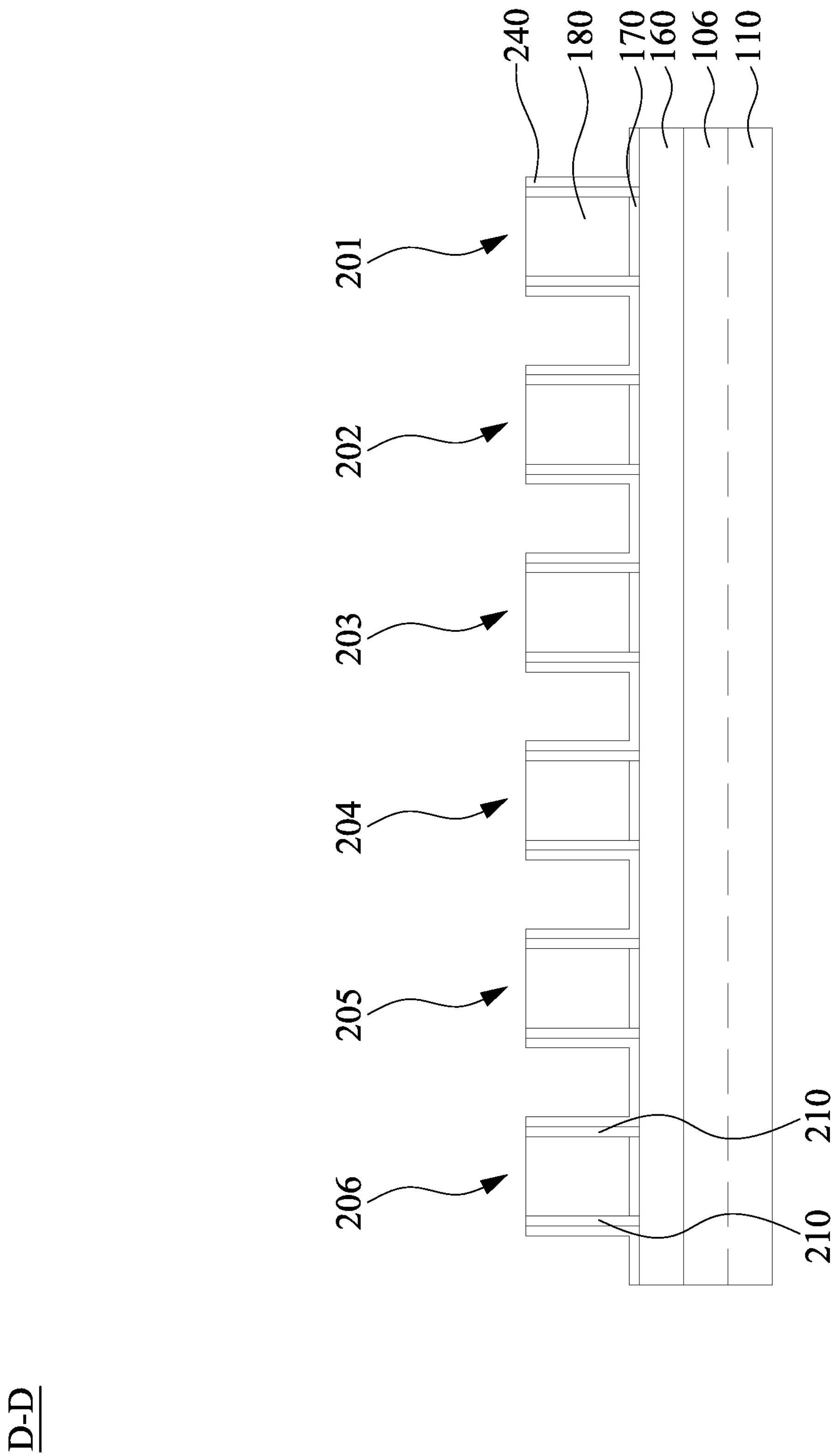
Figure 18A:
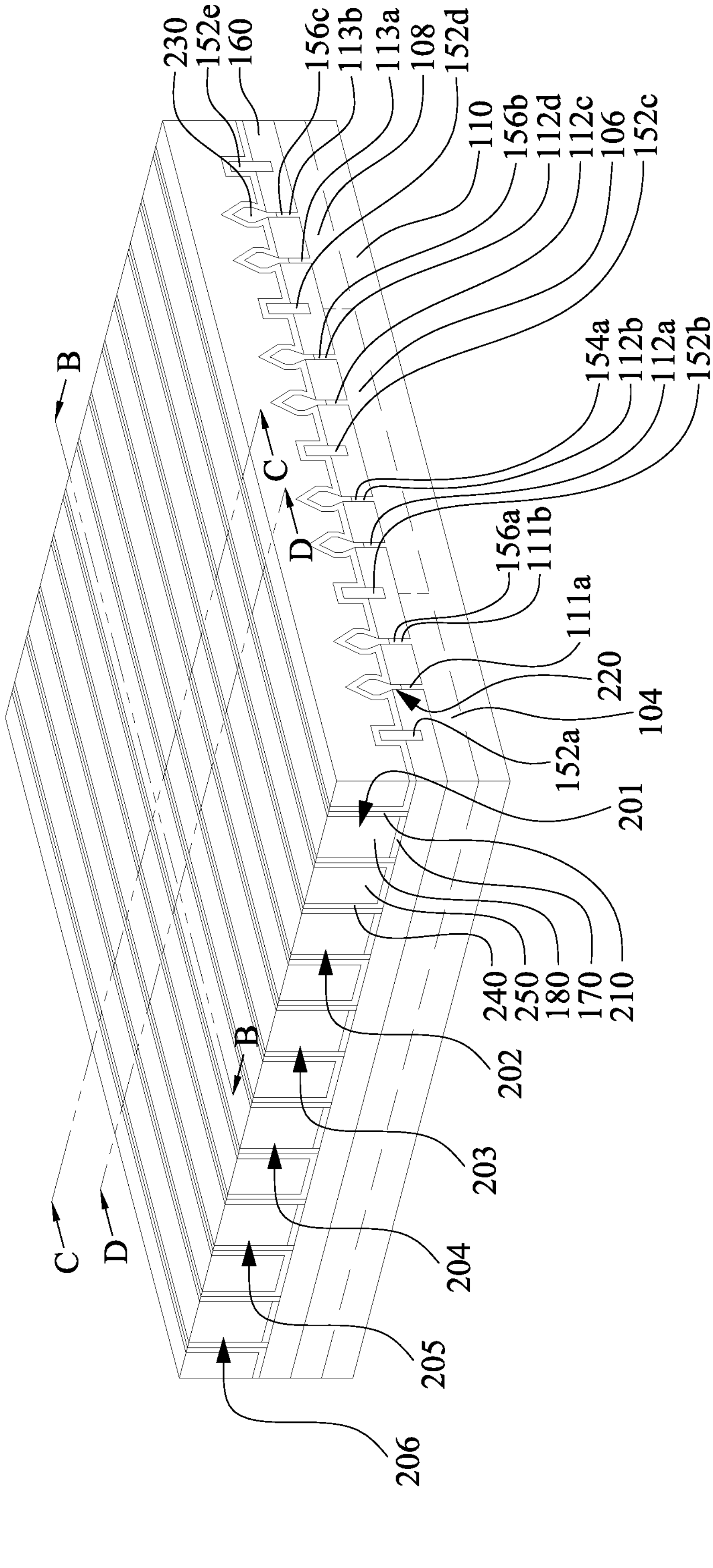
Figure 18B:
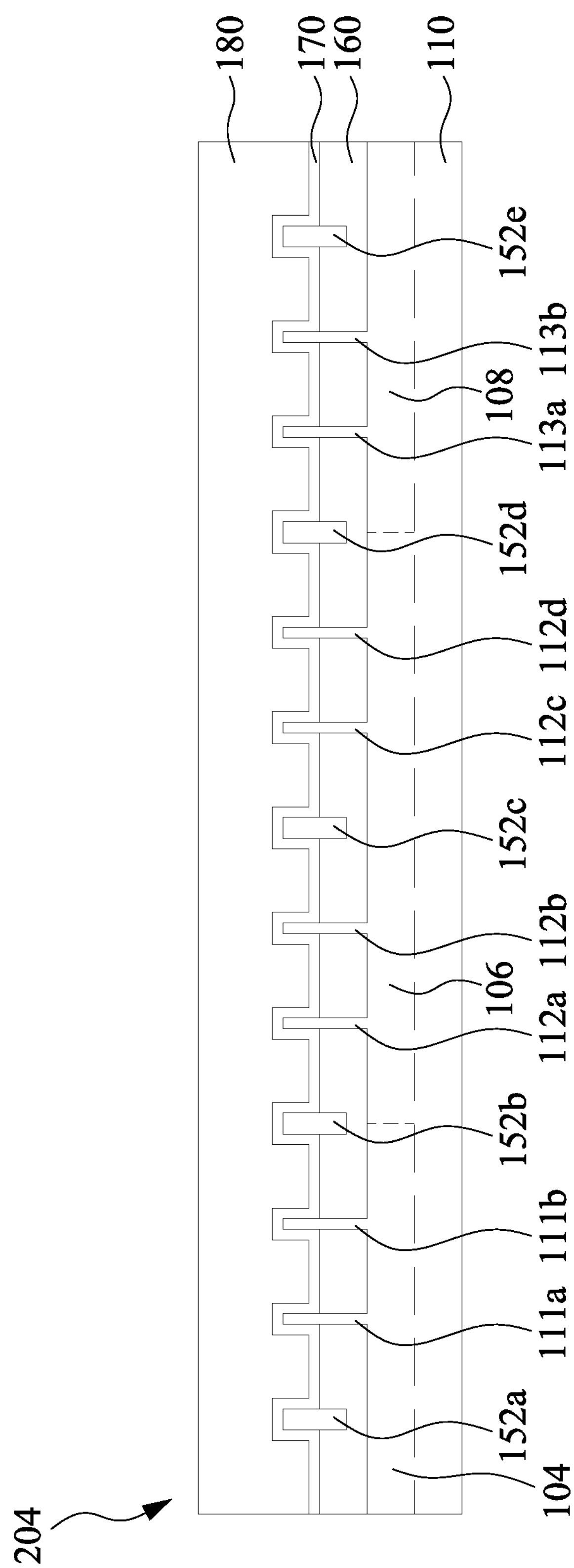
Figure 18C:
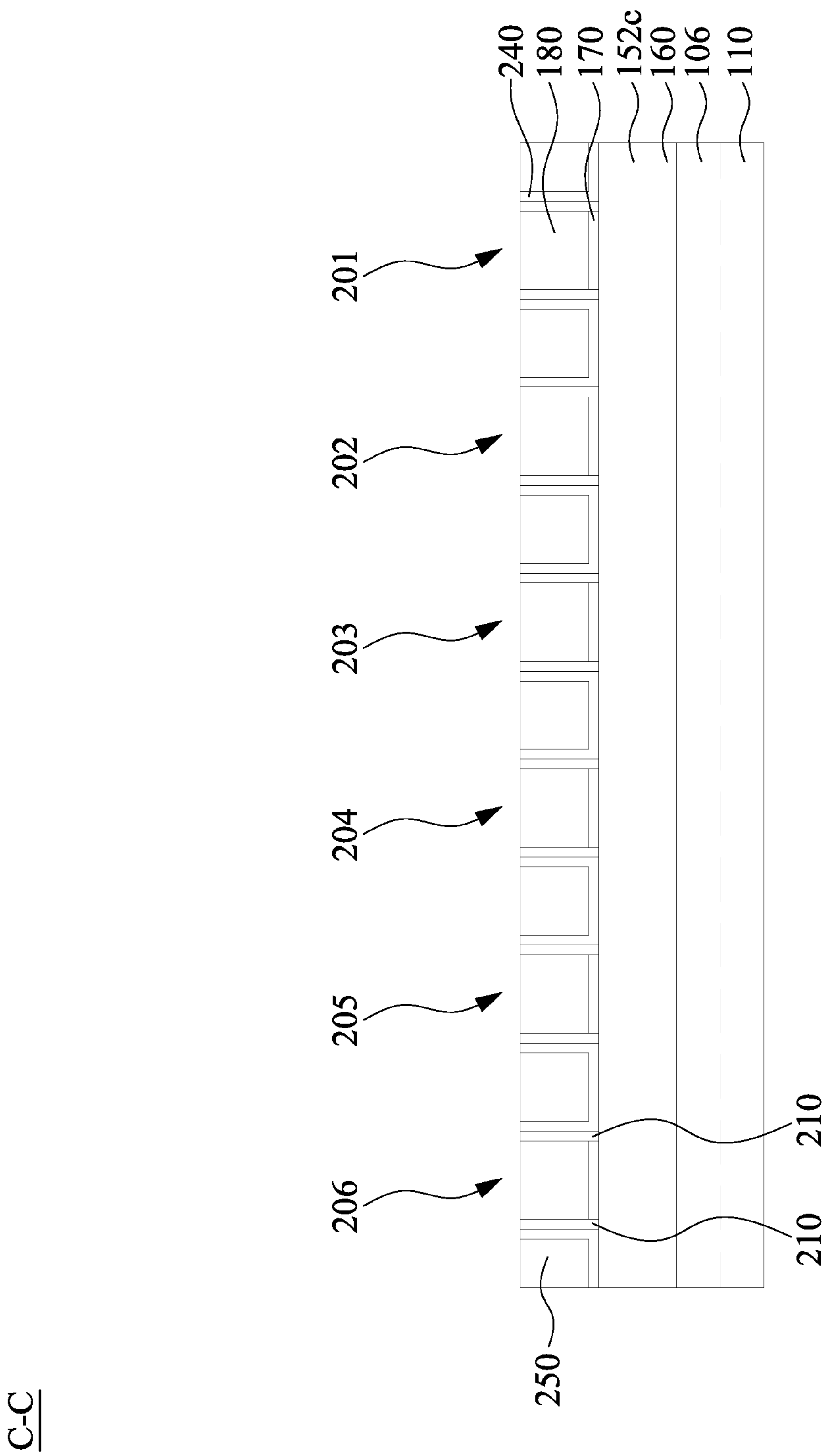
Figure 18D:
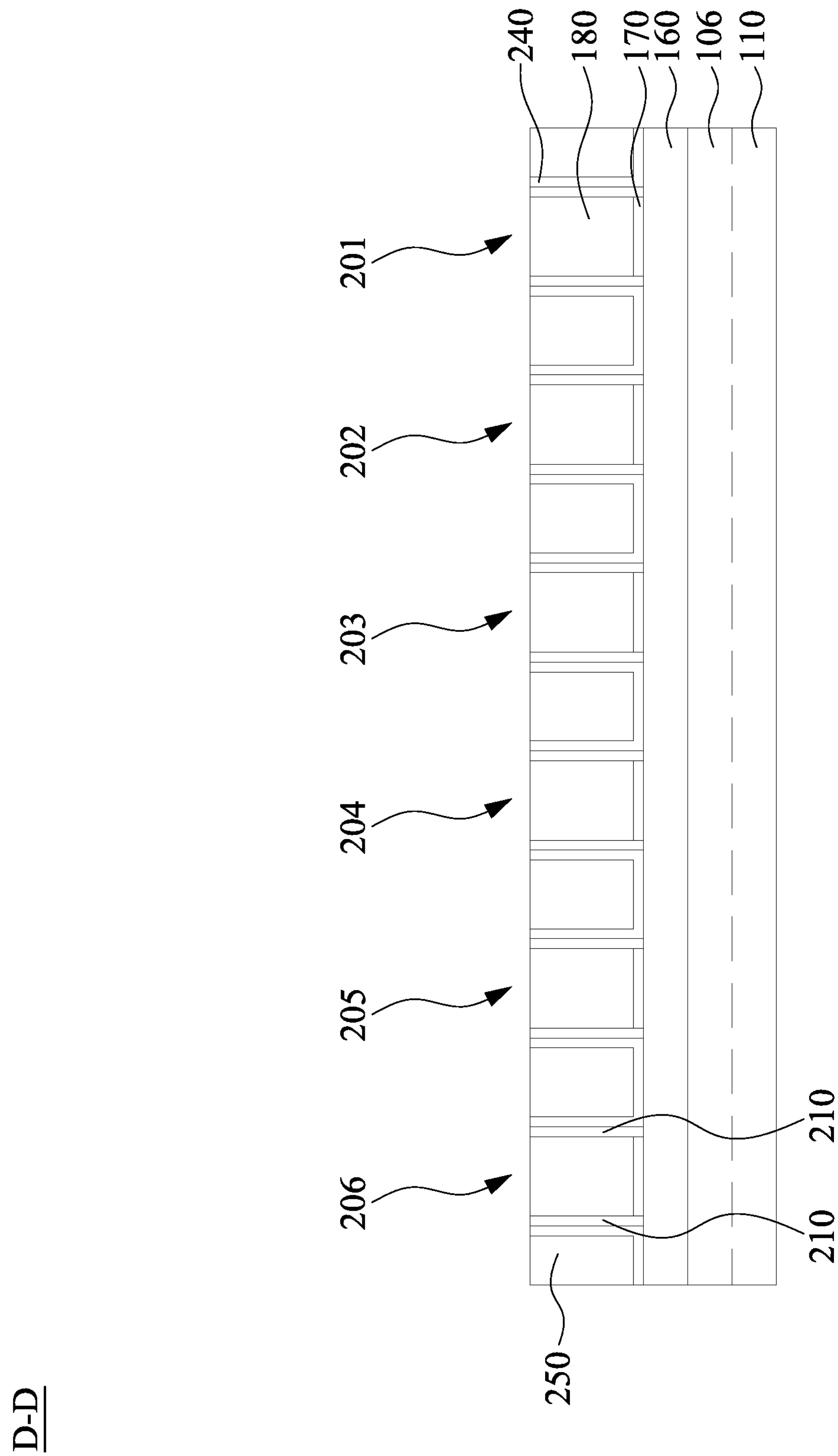

Reference is made to FIG. 15A to FIG. 15D. Portions of the semiconductor fins 111*a*, 111*b*, 112*a*, 112*b*, 112*c*, 112*d*, 113*a*, and 113*b* not covered by the dummy gate structures 201, 202, 203, 204, 205, and 206 and the gate spacers 210 are respectively partially removed (or partially recessed) to form recesses 220. As shown in FIG. 15A, the remaining semiconductor fins 111*a* and 111*b* each may have a protruding portion 154*a* and an embedded portion 156*a* after this removal. The remaining semiconductor fins 113*a* and 113*b* each may have a protruding portion 154*c* and an embedded portion 156*c* after this removal. The remaining semiconductor fins 112*a*, 112*b*, 112*c*, and 112*d* each may have a protruding portion 154*b* and an embedded portion 156*b* after this removal. The embedded portions 156*a*, 156*b*, and 156*c* are embedded in the isolation layer 160 and are exposed by the recesses 220. The protruding portions 154*a*, 154*b*, and 154*c* protrude from the embedded portions 156*a*, 156*b*, and 156*c*, respectively. The dummy gate structures 201, 202, 203, 204, 205, and 206 wrap the protruding portions 154*a*, 154*b*, and 154*c*, and hence the protruding portions 154*a*, 154*b*, and 154*c* can act as channel regions of transistors. The embedded portions 156*a*, 156*b*, and 156*c* spaced apart from the dummy gate structures 201, 202, 203, 204, 205, and 206 can act as source/drain regions of transistors.

Formation of the recesses 220 shown in FIG. 15A may include a dry etching process, a wet etching process, or combination dry and wet etching processes. This etching process may include reactive ion etch (RIE) using the dummy gate structures 201, 202, 203, 204, 205, and 206 and gate spacers 210 as masks, or by any other suitable removal process. After the etching process, a pre-cleaning process may be performed to clean the recesses 220 with hydrofluoric acid (HF) or other suitable solution in some embodiments.

Reference is made to FIG. 16A to FIG. 16D. Epitaxial source/drain structures 230 are respectively formed in the recesses 220. The epitaxial source/drain structures 230 may be formed using one or more epitaxy or epitaxial (epi) processes, such that Si features, Ge features, SiGe features, SiGeC features, silicon phosphate (SiP) features, silicon carbide (SiC) features and/or other suitable features can be formed in a crystalline state on the embedded portions 156*a*, 156*b*, and 156*c* of the semiconductor fins 111*a*, 111*b*, 112*a*, 112*b*, 112*c*, 112*d*, 113*a*, and 113*b* as shown in FIG. 15A. In some embodiments, lattice constants of the epitaxial source/drain structures 230 are different from that of the semiconductor fins 111*a*, 111*b*, 112*a*, 112*b*, 112*c*, 112*d*, 113*a*, and

113*b*, so that the channel region between the epitaxial source/drain structures 230 can be strained or stressed by the epitaxial source/drain structures 230 to improve carrier mobility of the semiconductor device and enhance the device performance.

Specifically, the electron mobility increases and the hole mobility decreases when the tensile strain is applied in the channel region, and the electron mobility decreases and the hole mobility increases when the compress strain is applied in the channel region. Therefore, an n-type transistor with a stressor configured to provide tensile strain in the channel region would be beneficial, and a p-type transistor with a stressor configured to provide compress strain in the channel region would be beneficial as well. For example, in some embodiments where two source/drain structures 230 are used to form an n-type transistor, the source/drain structures 230 can act as stressors including, for example, SiP, SiC or SiCP, which is able to induce tensile strain to an n-type channel; in some embodiments where two source/drain structures 230 are used to form a p-type transistor, the source/drain structures 230 may include stressors including SiGe, which is able to induce compress strain to a p-type channel.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 111*a*, 111*b*, 112*a*, 112*b*, 112*c*, 112*d*, 113*a*, and 113*b* (e.g., silicon, silicon germanium, silicon phosphate, or the like). The epitaxial source/drain structures 230 may be in-situ doped. The doping species include p-type dopants, such as boron or $BF_2$; n-type dopants, such as phosphorus or arsenic; and/or other suitable dopants including combinations thereof. If the epitaxial source/drain structures 230 are not in-situ doped, a second implantation process (i.e., a junction implant process) is performed to dope the epitaxial source/drain structures 230. One or more annealing processes may be performed to activate the epitaxial source/drain structures 230. The annealing processes include rapid thermal annealing (RTA) and/or laser annealing processes.

Reference is made to FIG. 17A to 18D. A contact etch stop layer (CESL) 240 shown in FIG. 17A to 17D is blanket formed on the structure shown in FIG. 16A to FIG. 16D, and then, an interlayer dielectric (ILD) layer 250 shown in FIG. 18A to 18D is formed on the CESL 240. Afterwards, a CMP process may be optionally performed to remove excessive material of the ILD layer 250 and the CESL 240 to expose the dummy gate structures 201, 202, 203, 204, 205, and 206. The CMP process may planarize a top surface of the ILD layer 250 with top surfaces of the dummy gate structures 201, 202, 203, 204, 205, and 206, gate spacers 210 and the CESL 240 in some embodiments. The CESL 240 includes silicon nitride, silicon oxynitride or other suitable materials. The CESL 240 can be formed using, for example, plasma enhanced CVD, low pressure CVD, ALD or other suitable techniques. The ILD layer 250 may include a material different from the CESL 240. In some embodiments, the ILD layer 250 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 250 may be formed using, for example, CVD, ALD, spin-on-glass (SOG) or other suitable techniques.

Reference is made to FIG. 19A to FIG. 20D. The gate dielectric layer 170 and the dummy gate electrode layer 180 in the dummy gate structure 201, 203, and 206 are removed. As shown in FIG. 19A to FIG. 19D, a photoresist layer 650 is deposited over the substrate 110 by a suitable process, such as spin-on coating. The photoresist layer 650 is patterned to form openings 651, 652, and 653 to expose the dummy gate electrode layer 180 in the dummy gate structure 201, 203, and 206 where the dielectric dummy gates are to be formed, and the dummy gate structure 202, 204, and 205 remain covered by the photoresist layer 650.

Figure 19A:
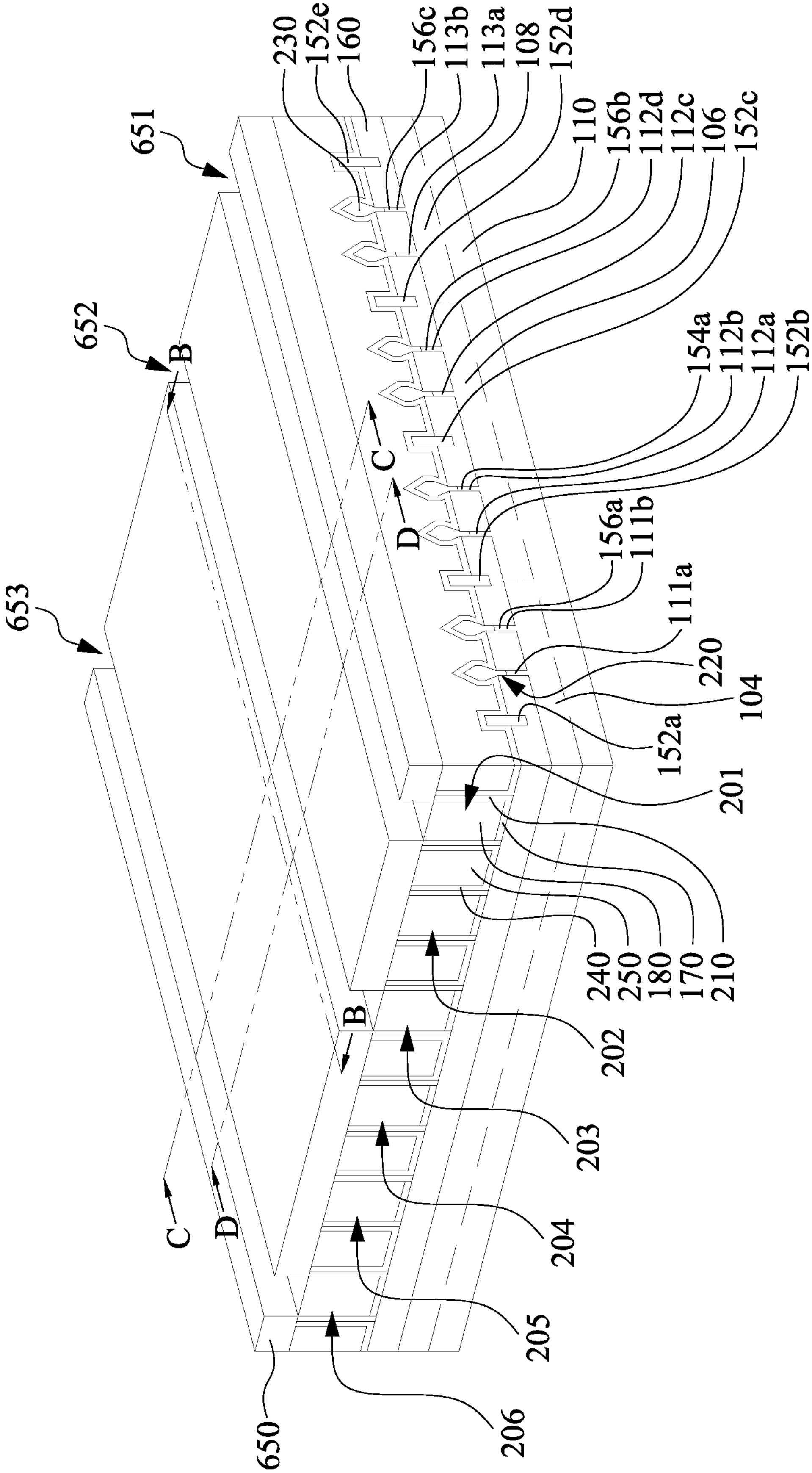
Figure 19B:
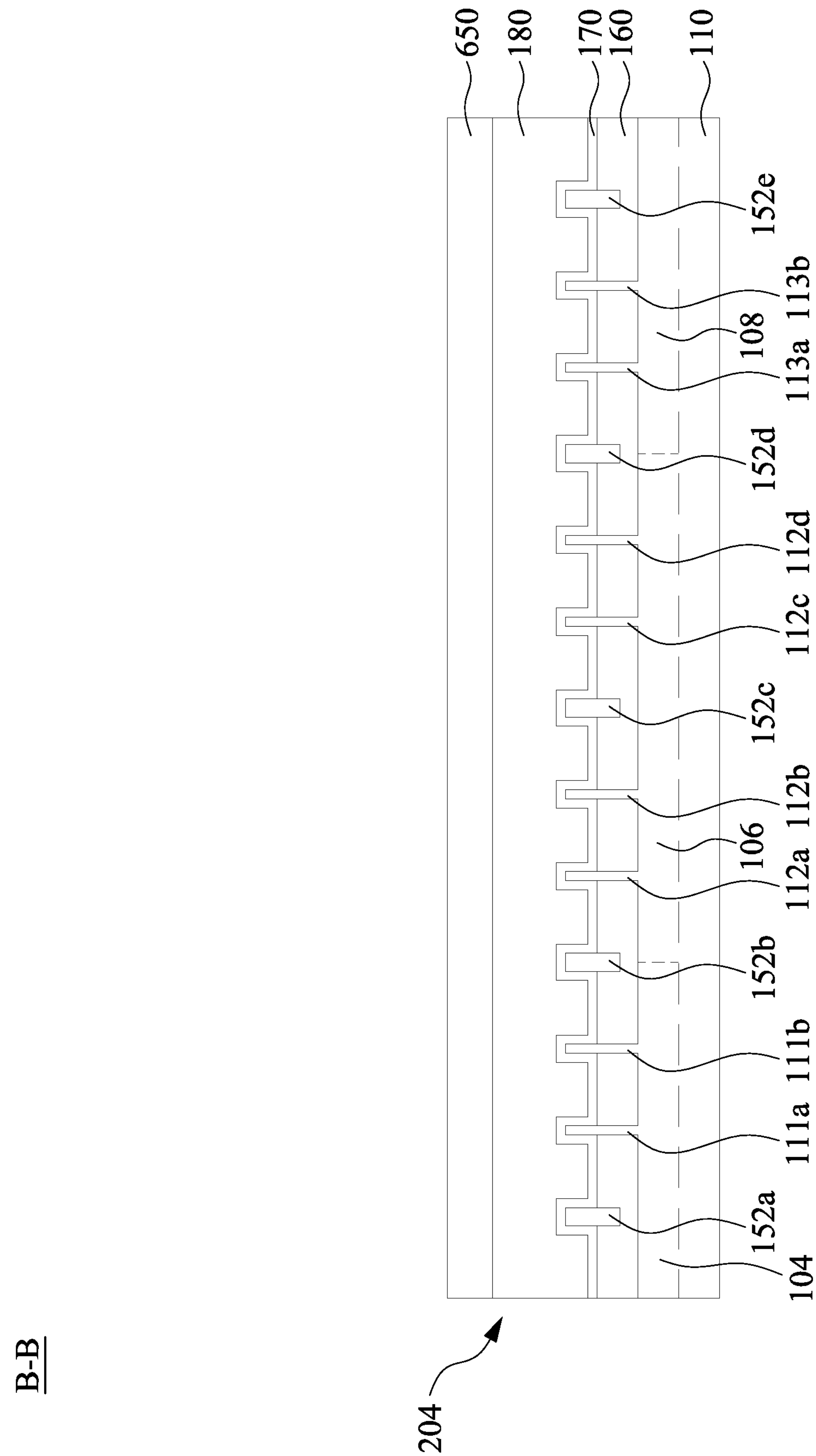
Figure 19C:
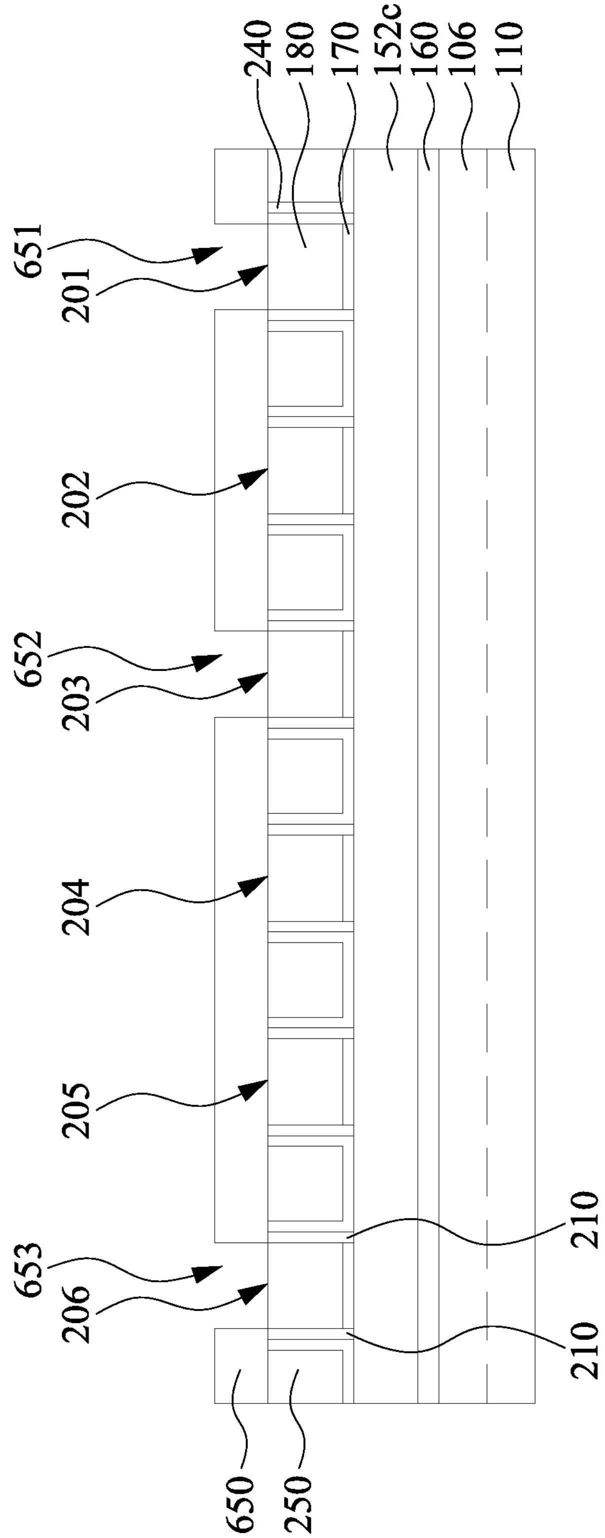
Figure 19D:
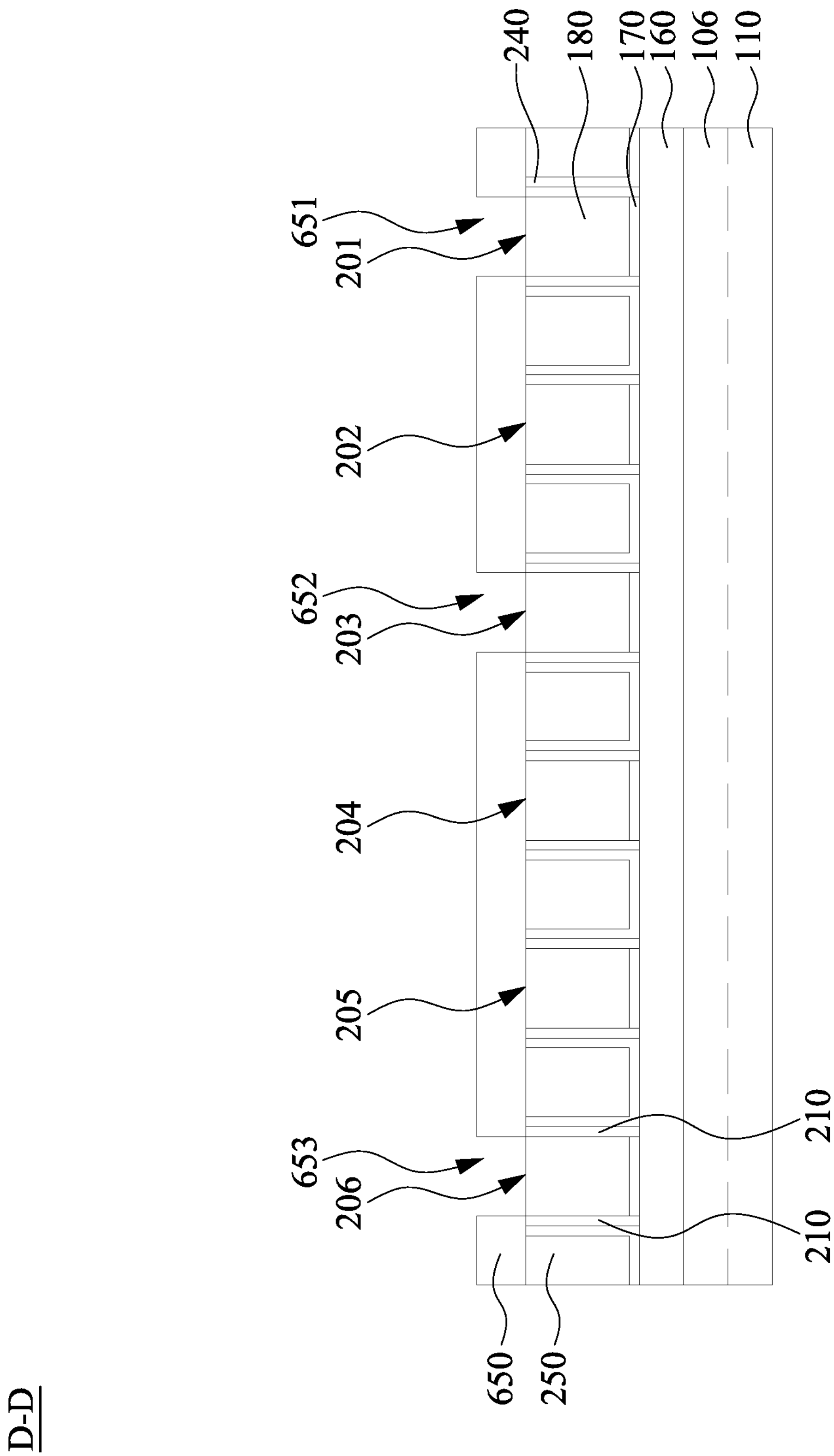
Figure 20A:
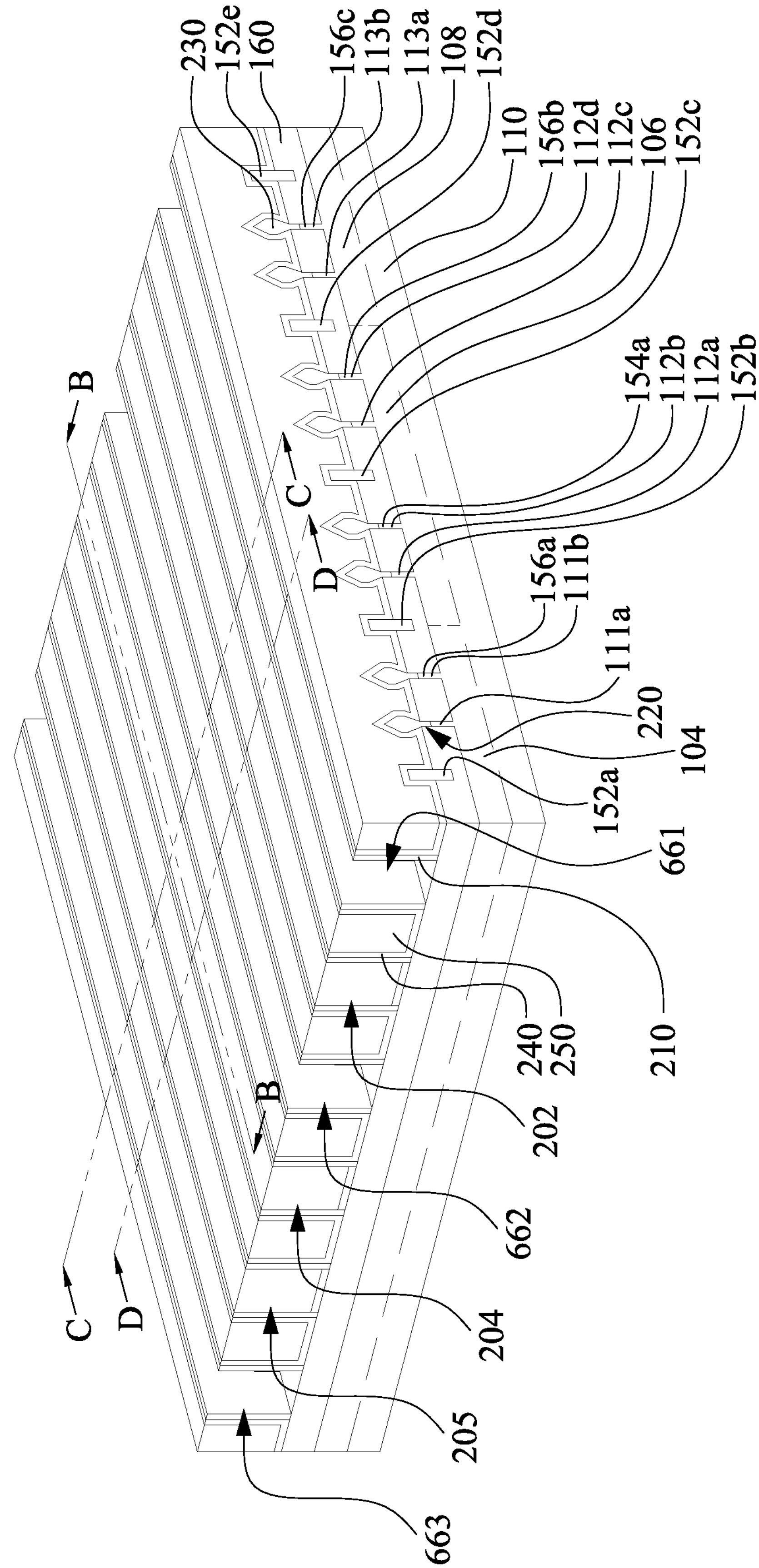
Figure 20B:
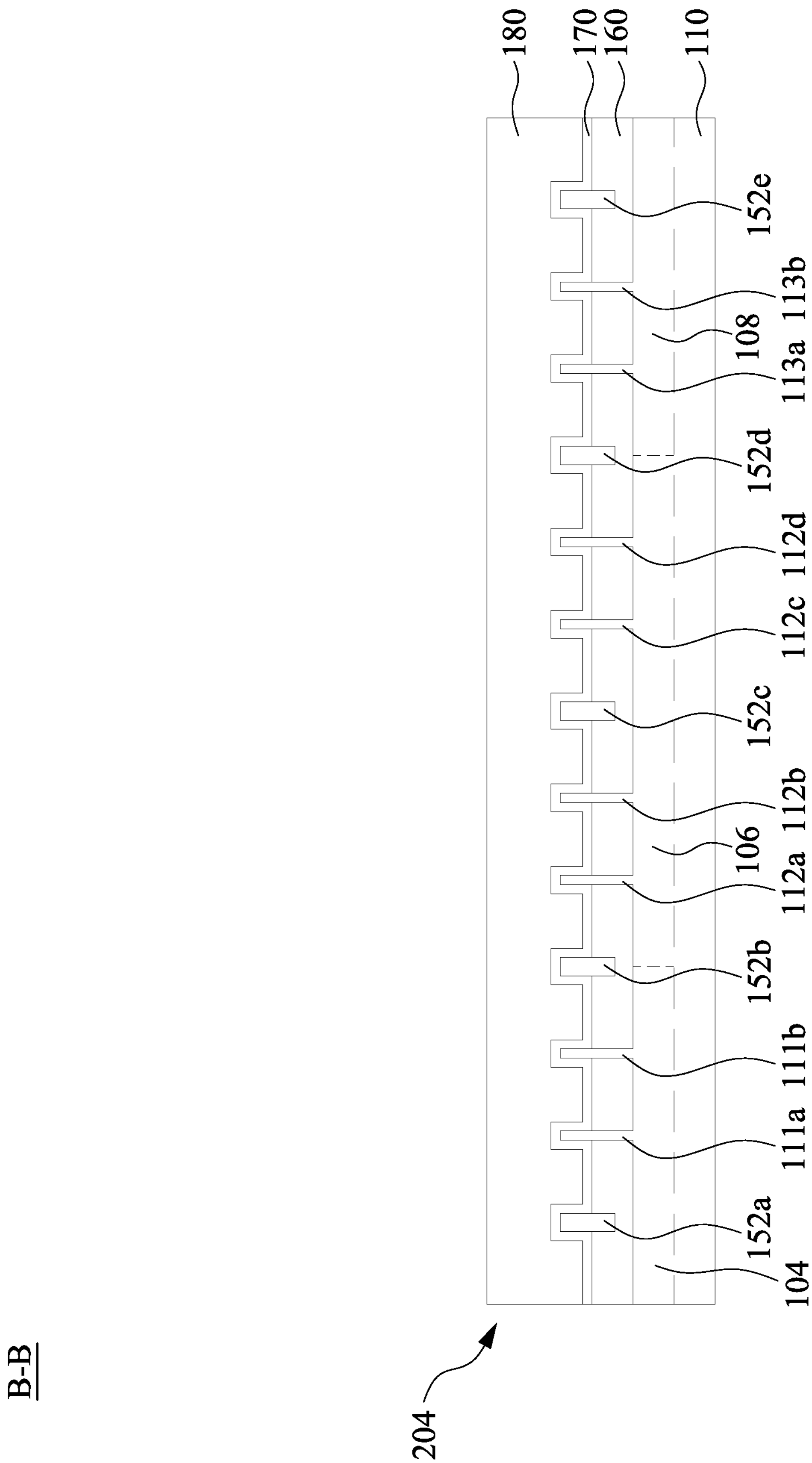
Figure 20C:
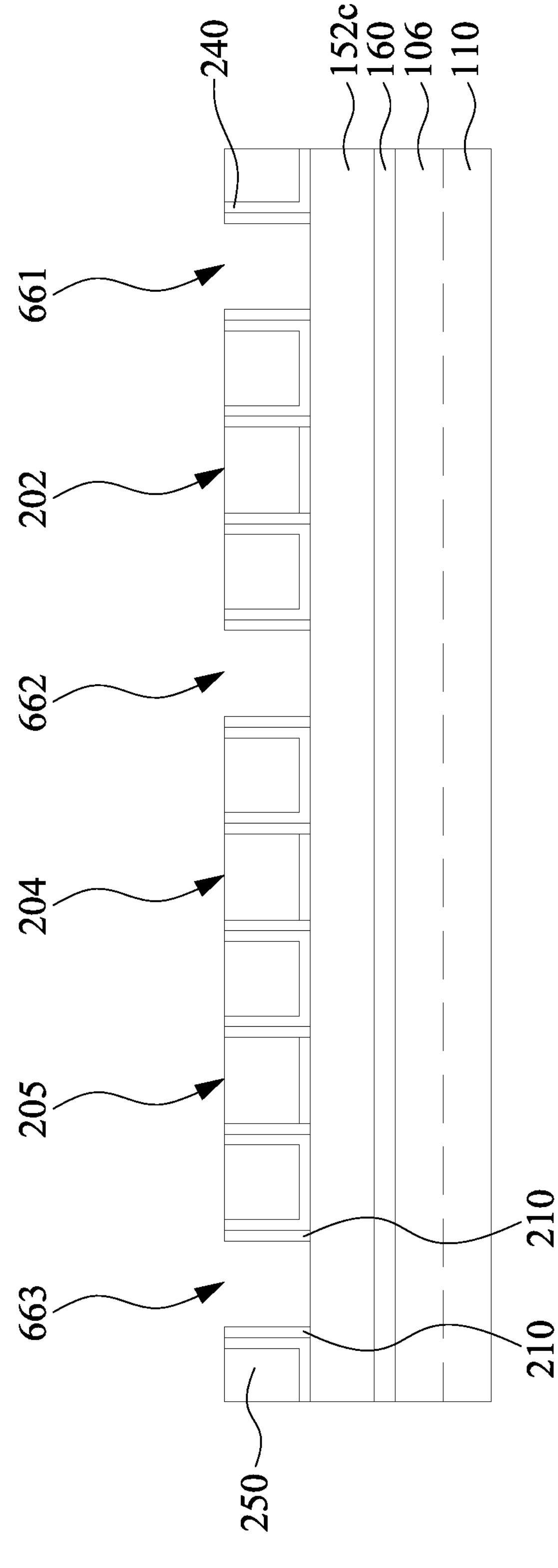
Figure 20D:
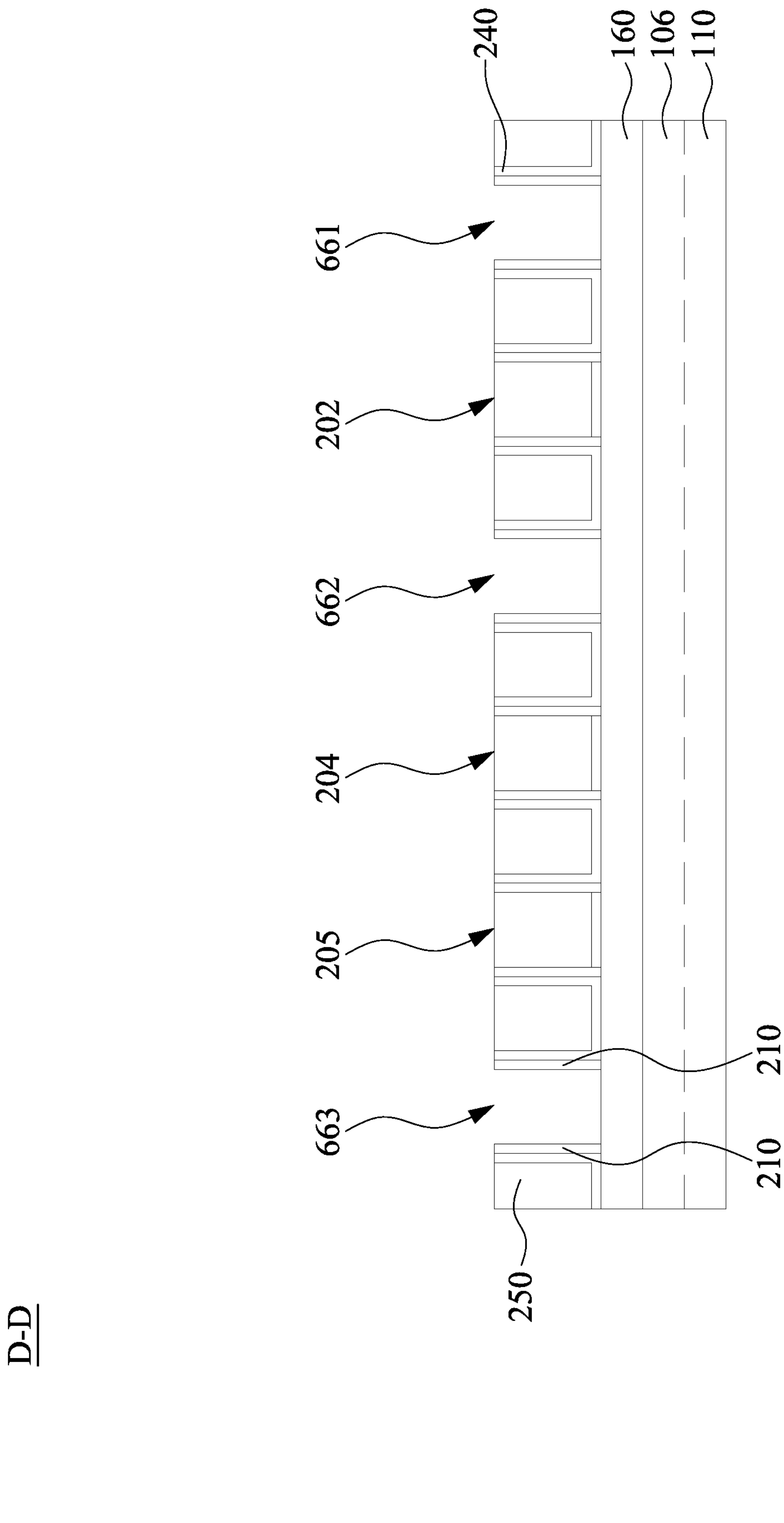
Figure 21A:
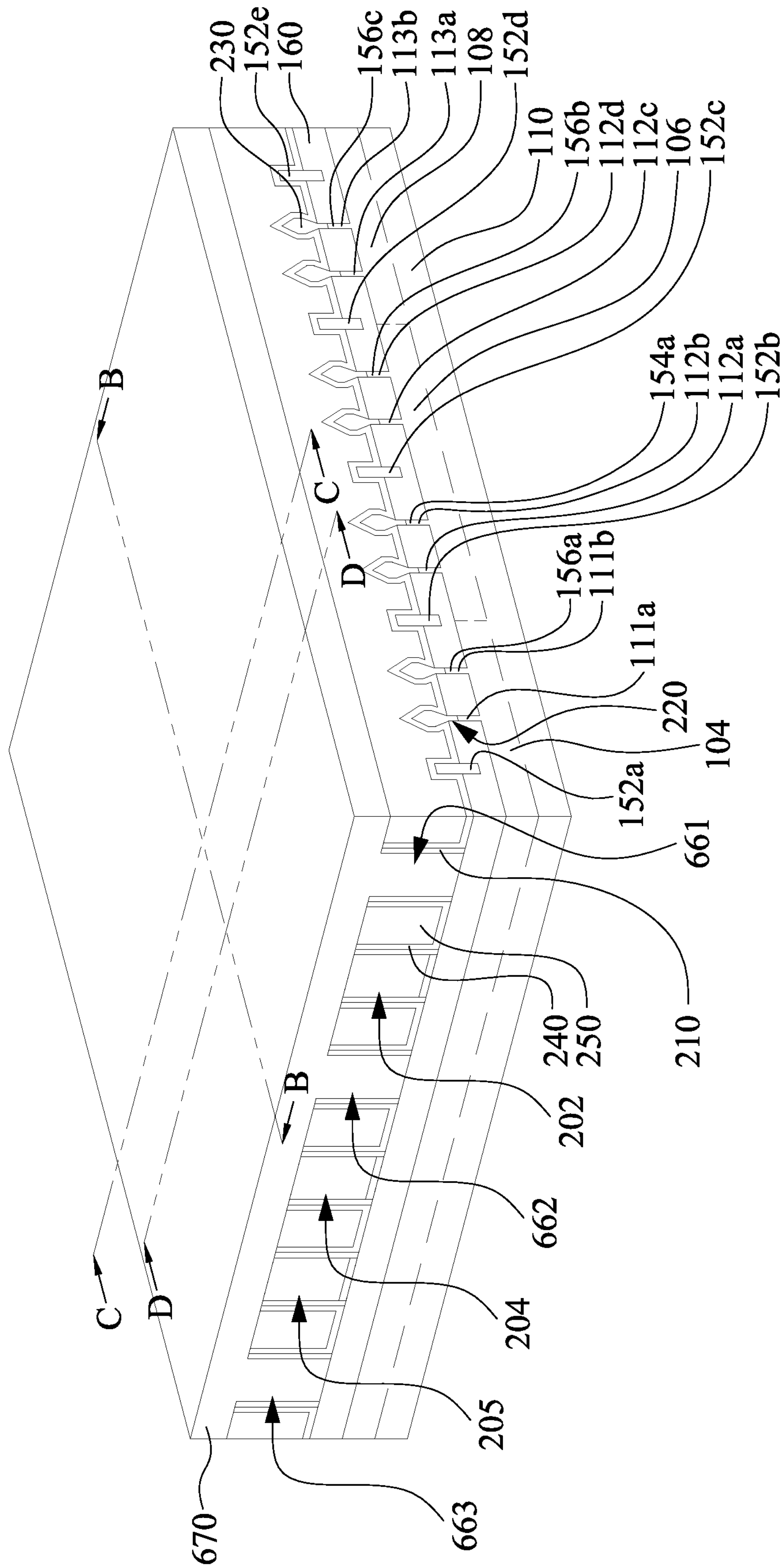
Figure 21B:
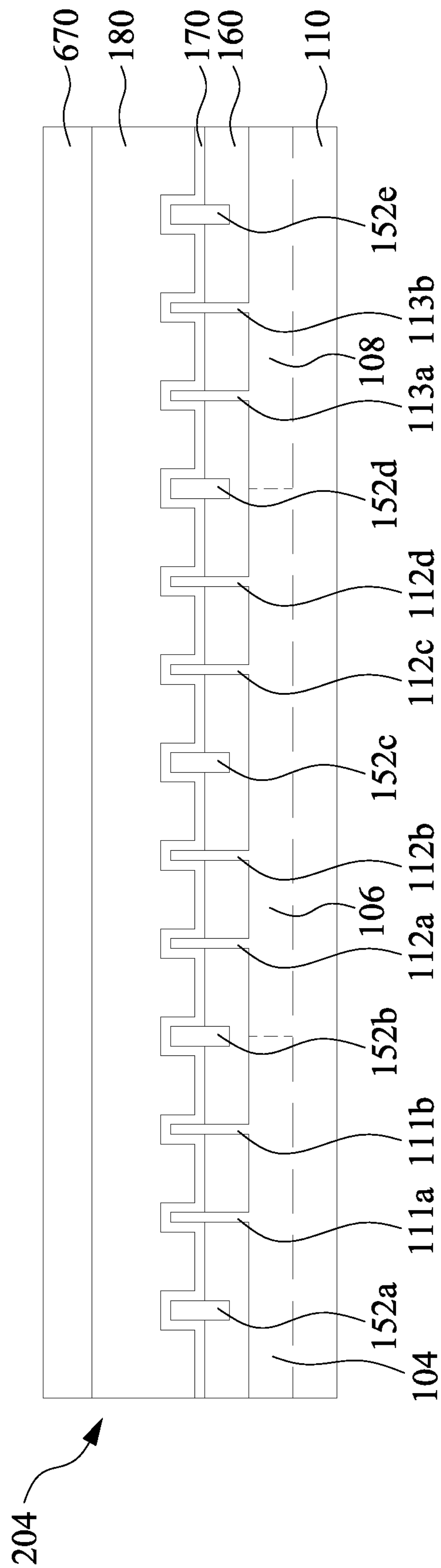
Figure 21C:
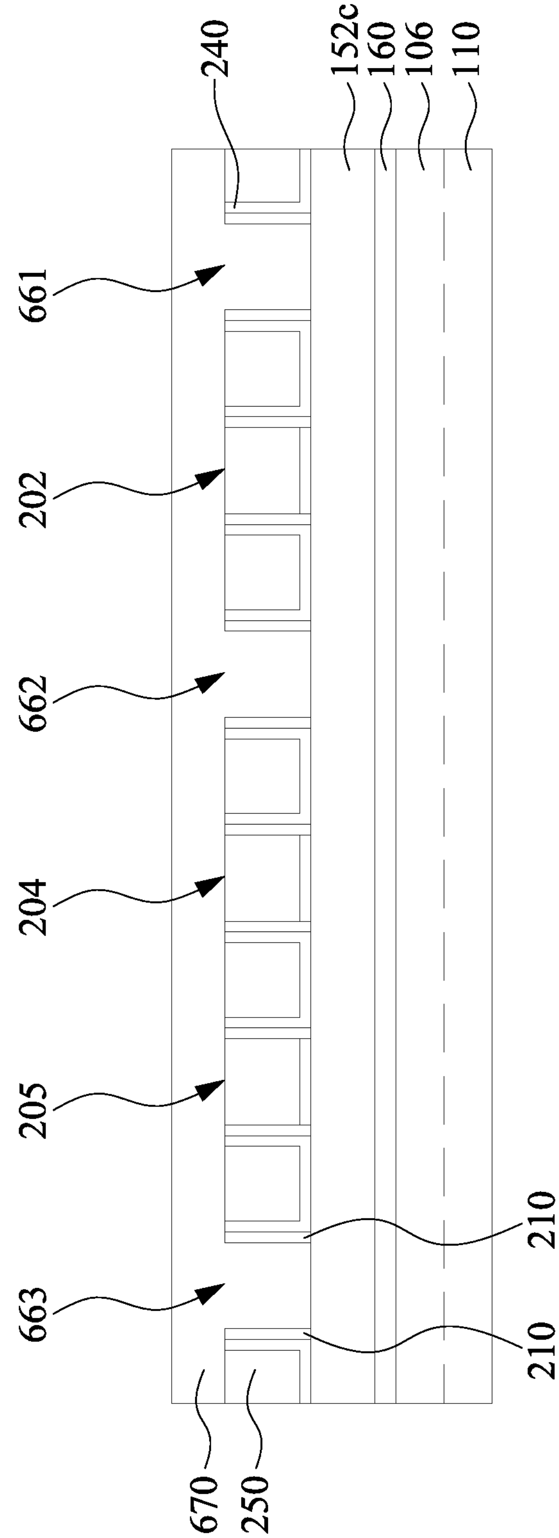
Figure 21D:
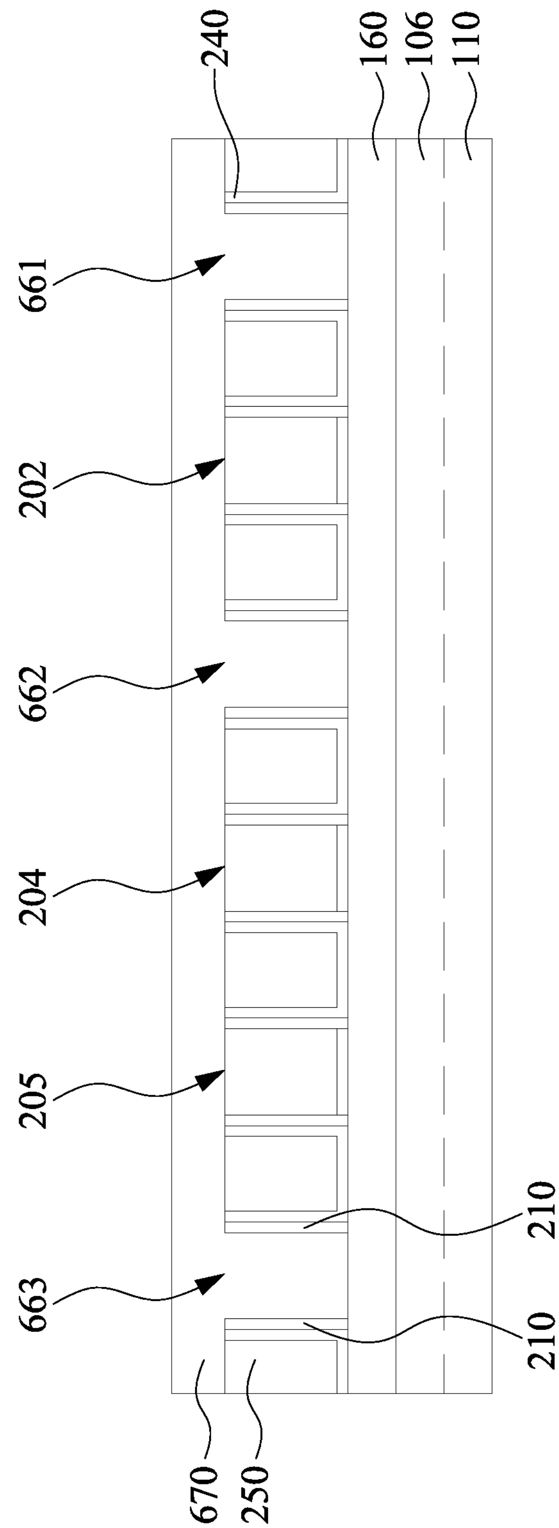
Figure 22A:
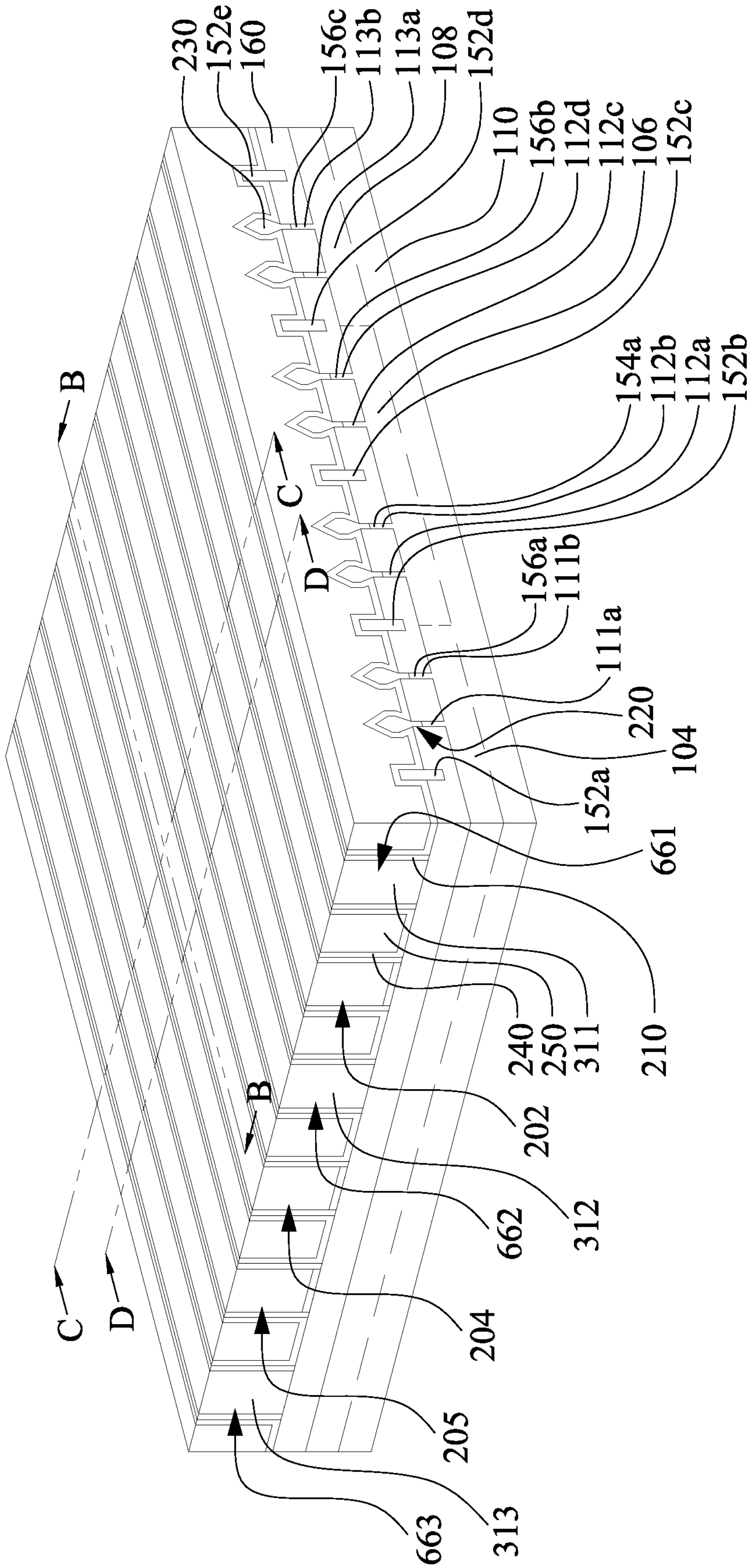
Figure 22B:
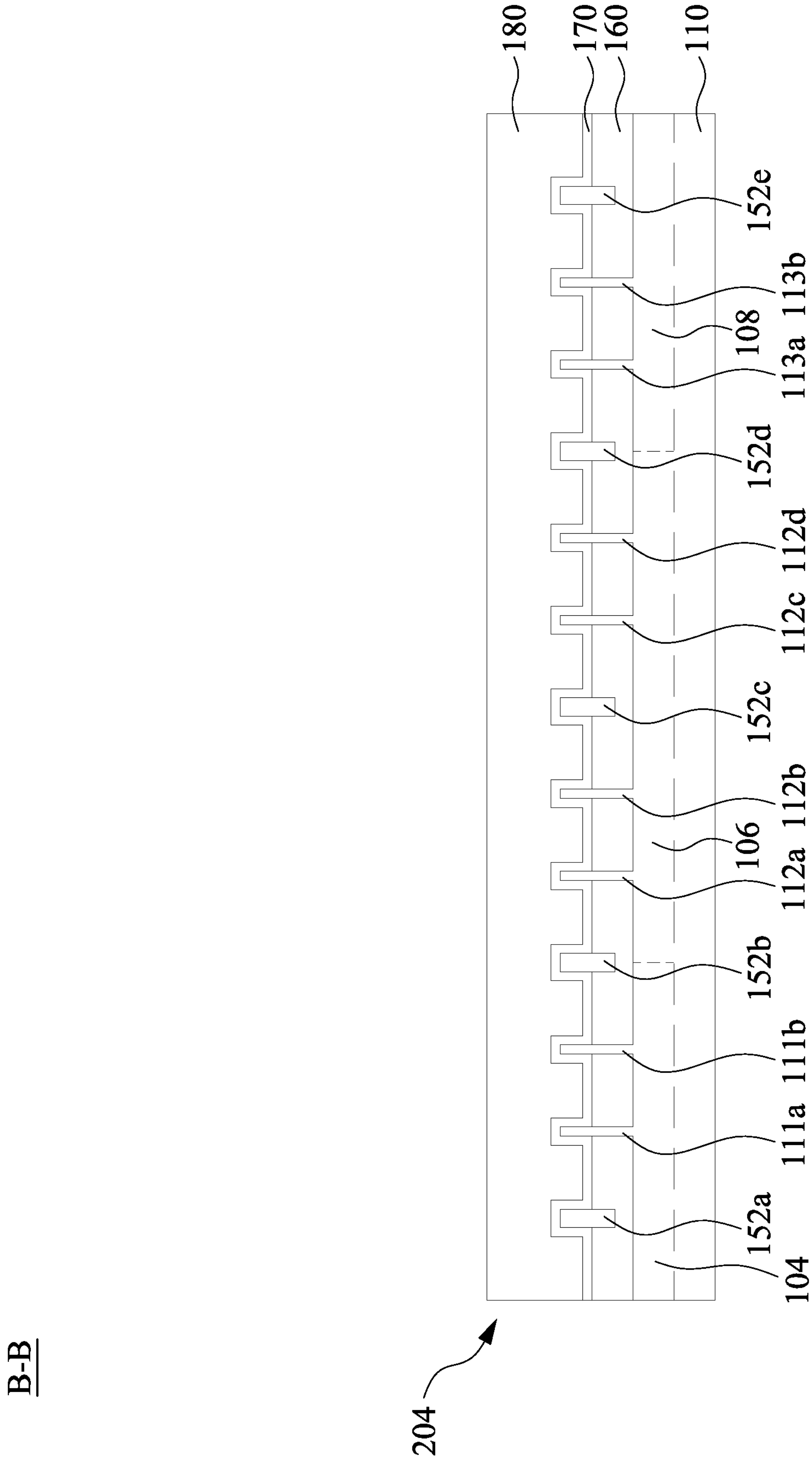
Figure 22C:
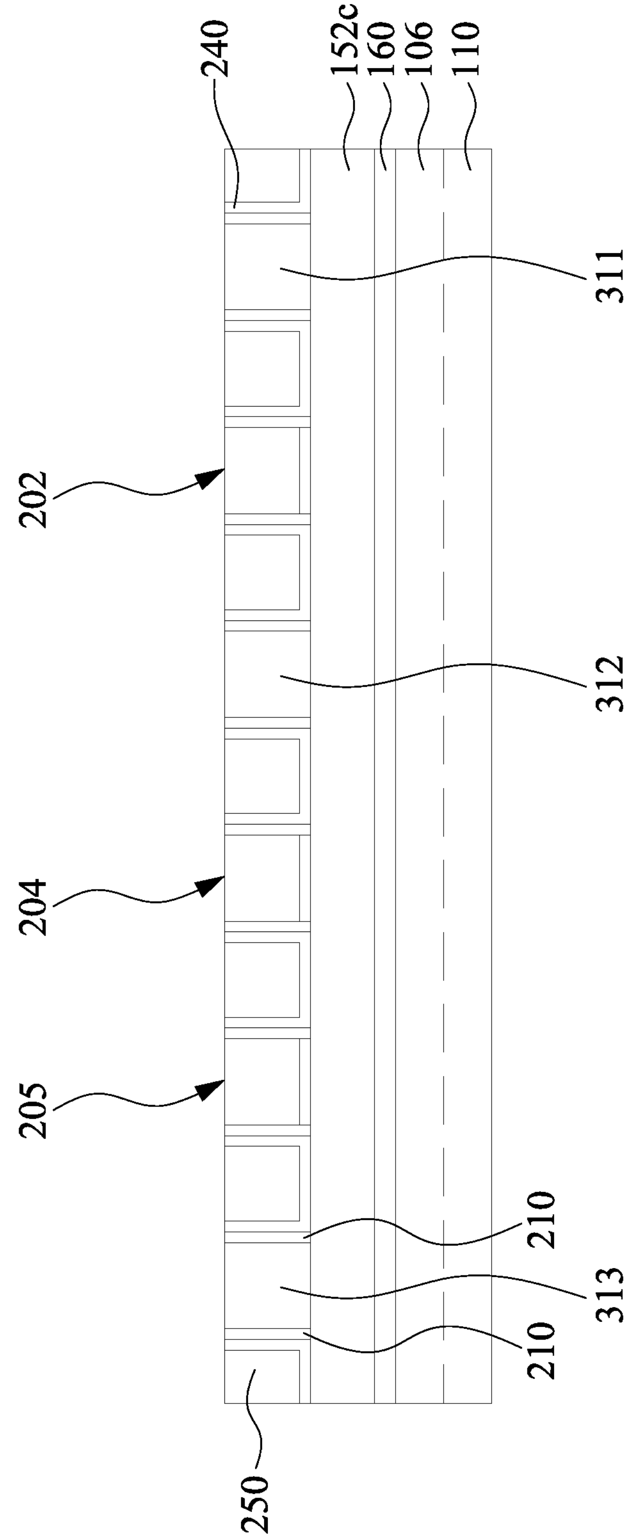
Figure 22D:
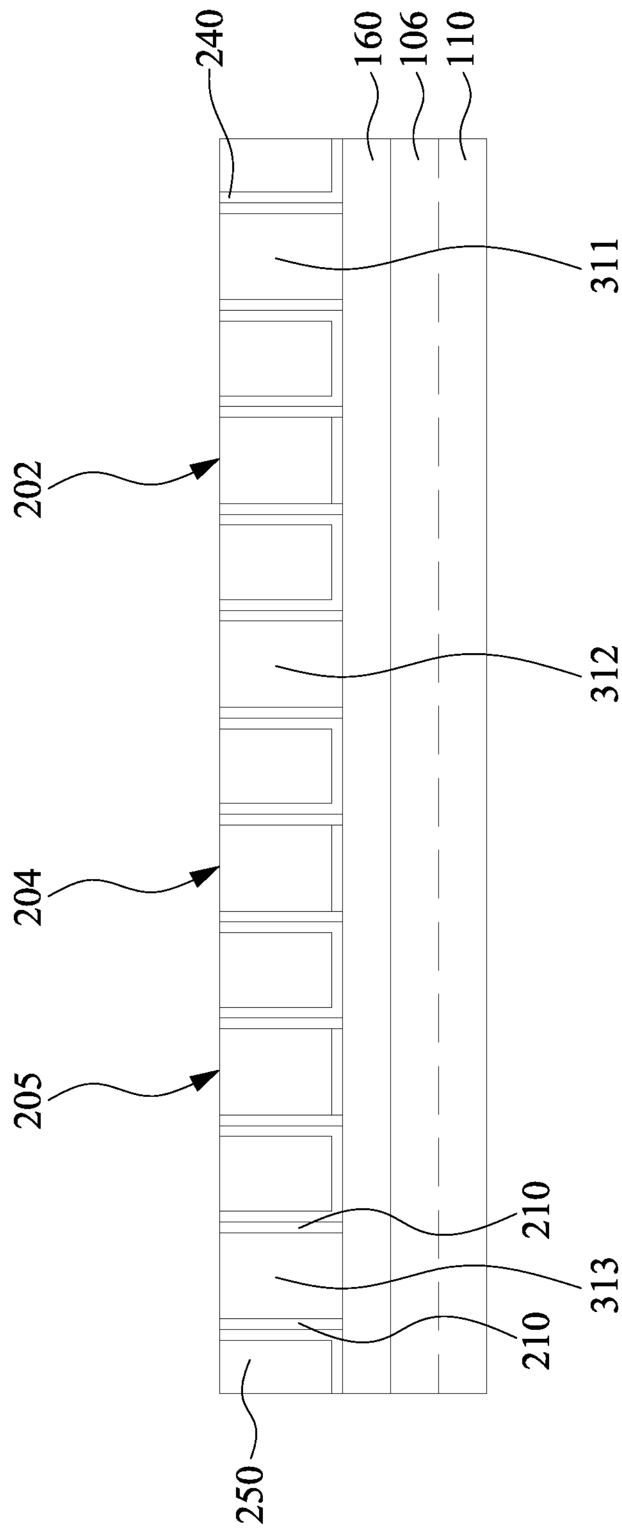
Figure 23A:
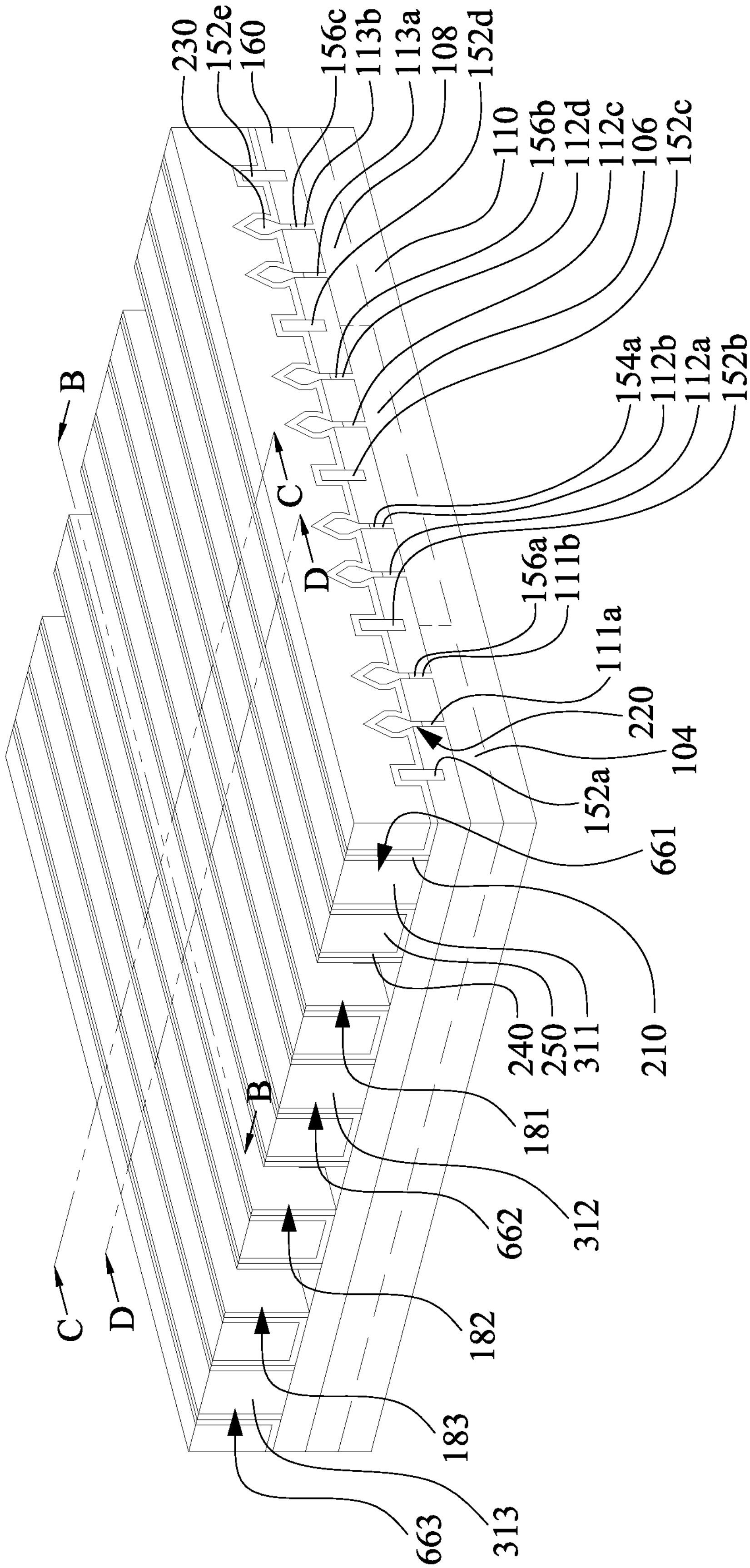
Figure 23B:
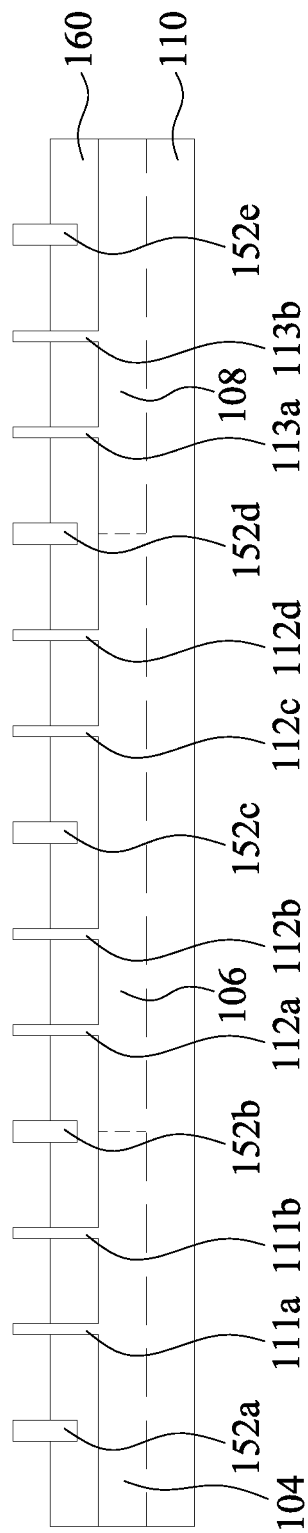
Figure 23C:
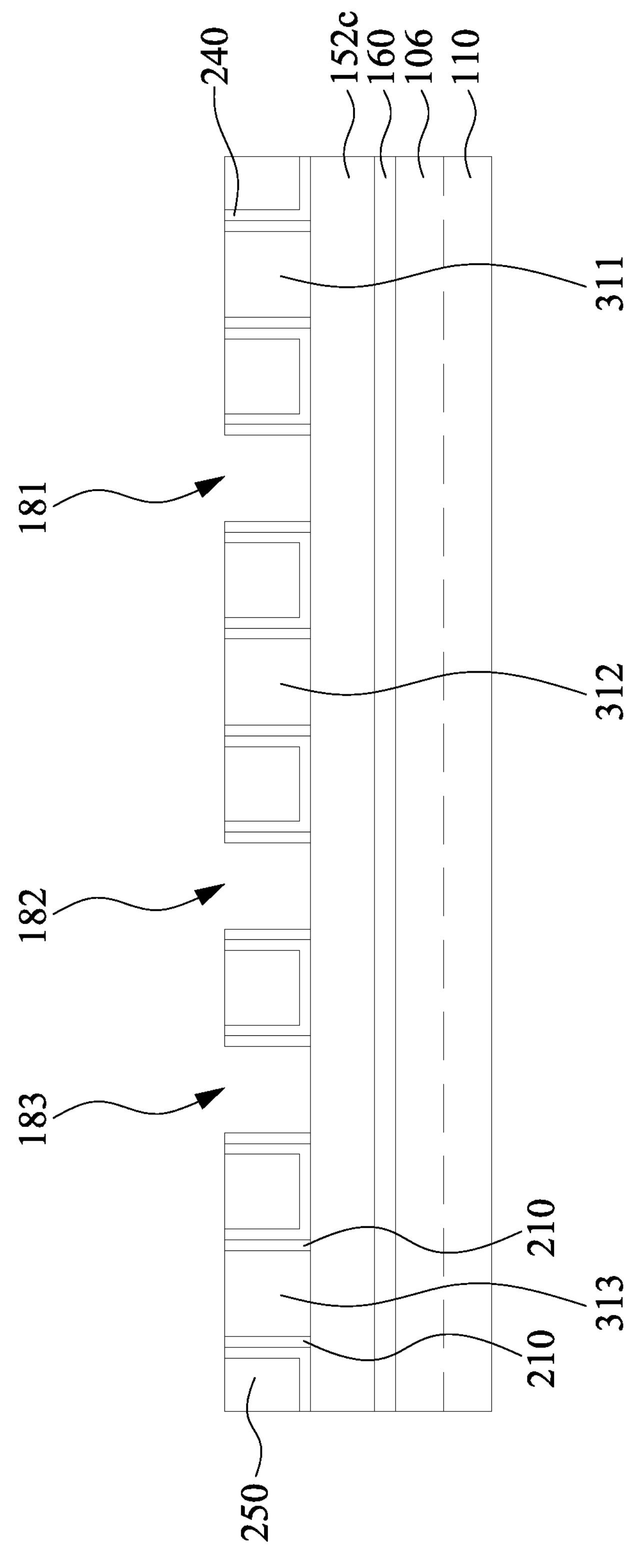
Figure 23D:
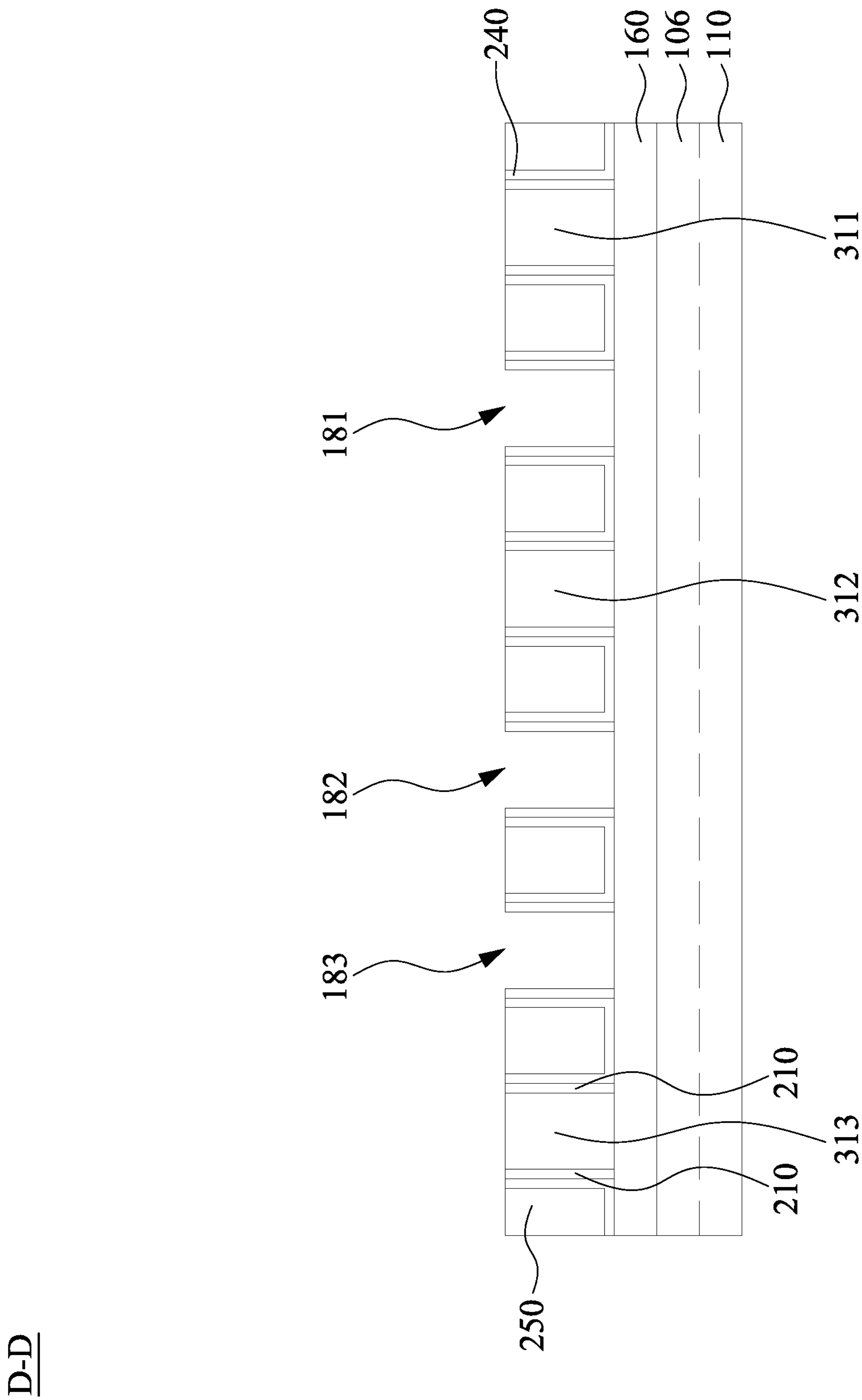
Figure 24A:
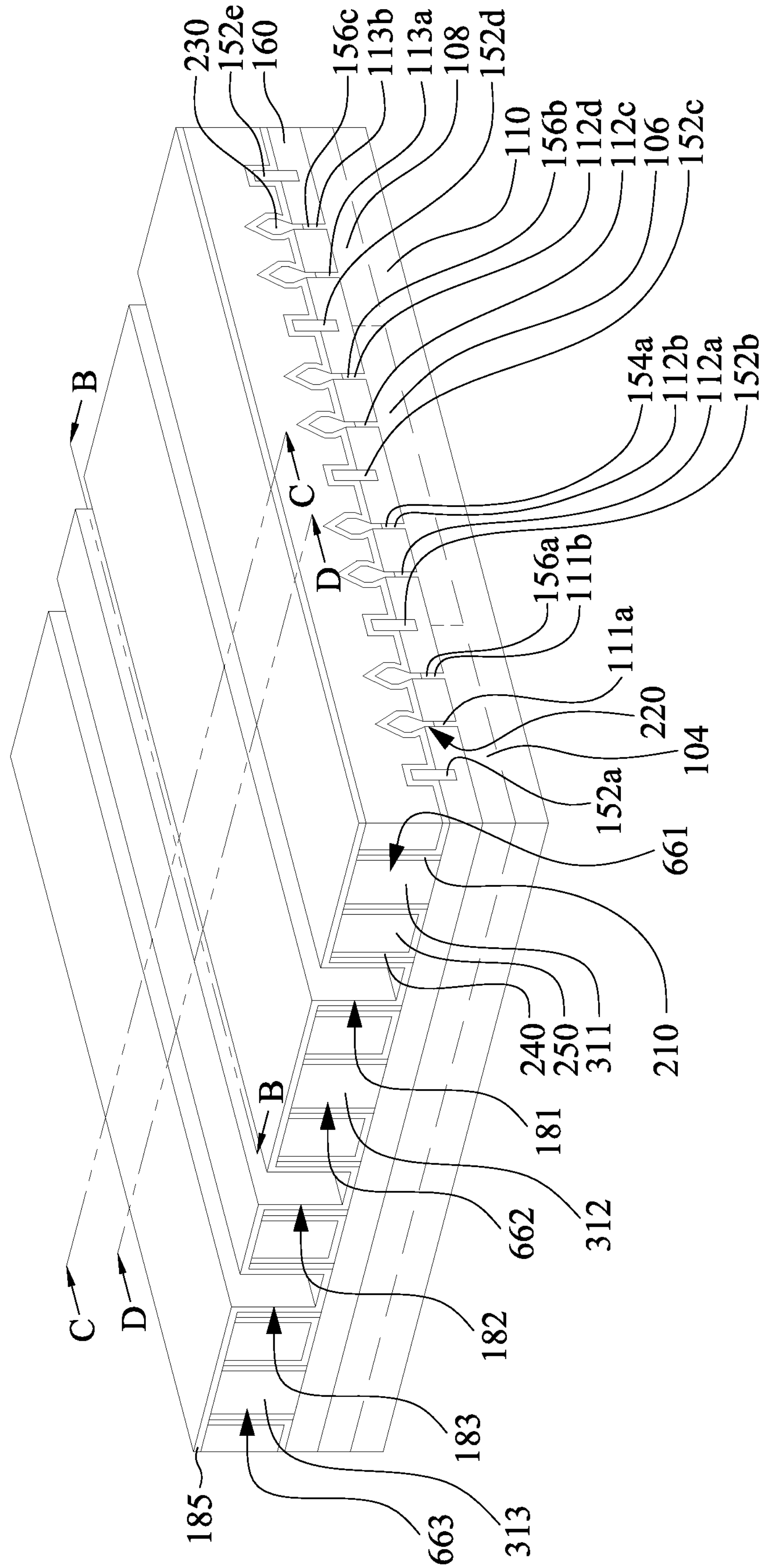
Figure 24B:
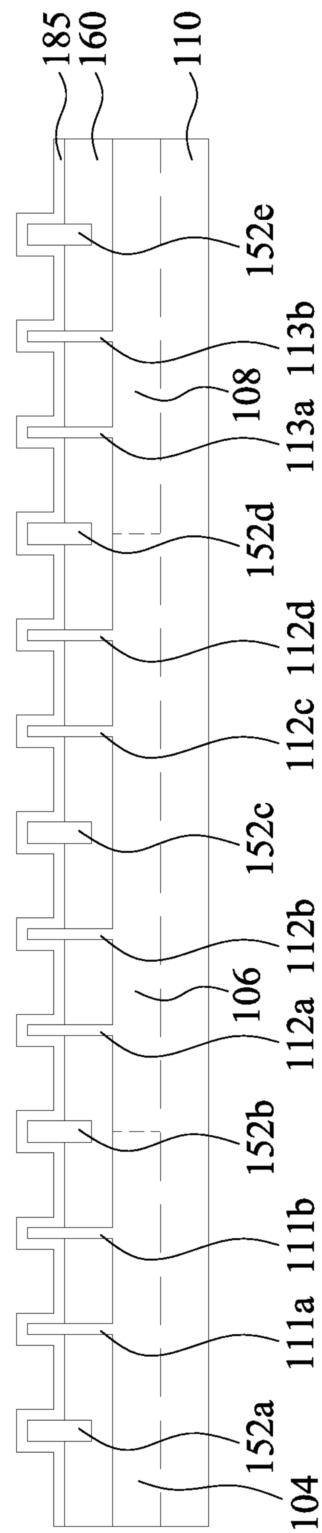
Figure 24C:
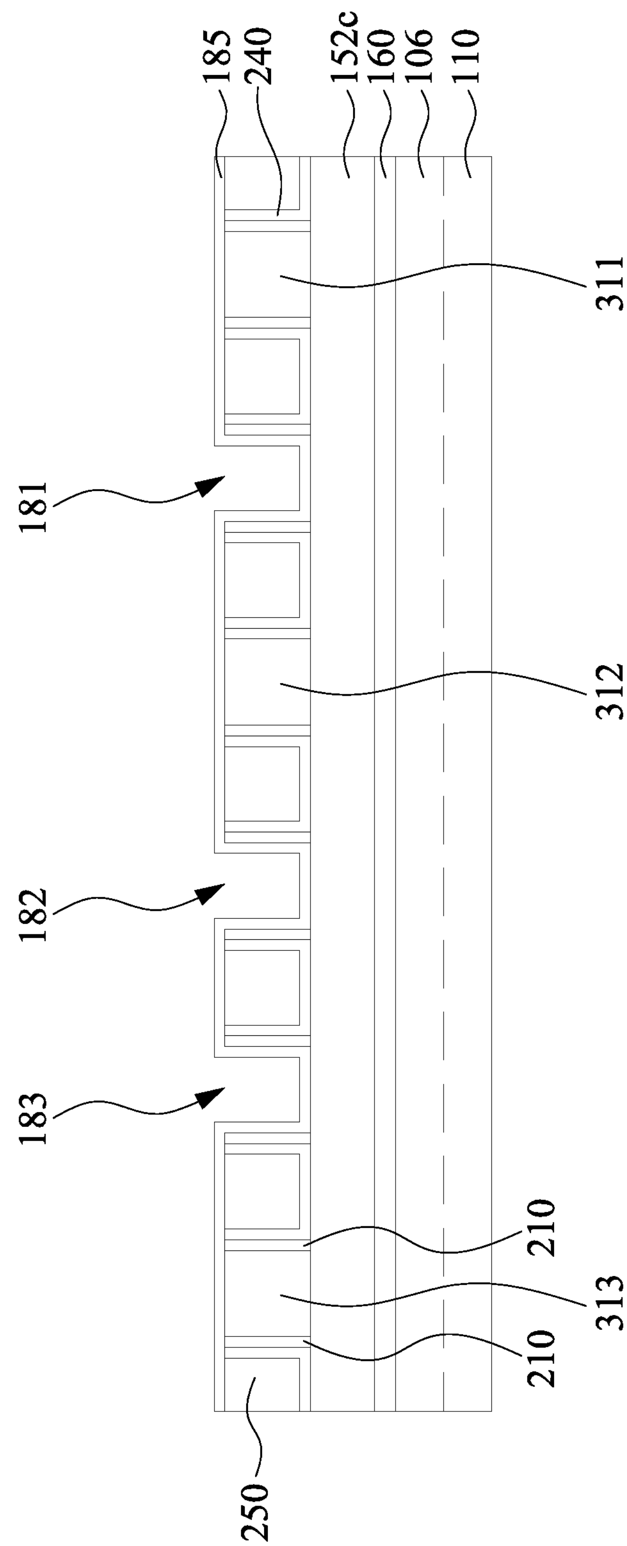
Figure 24D:
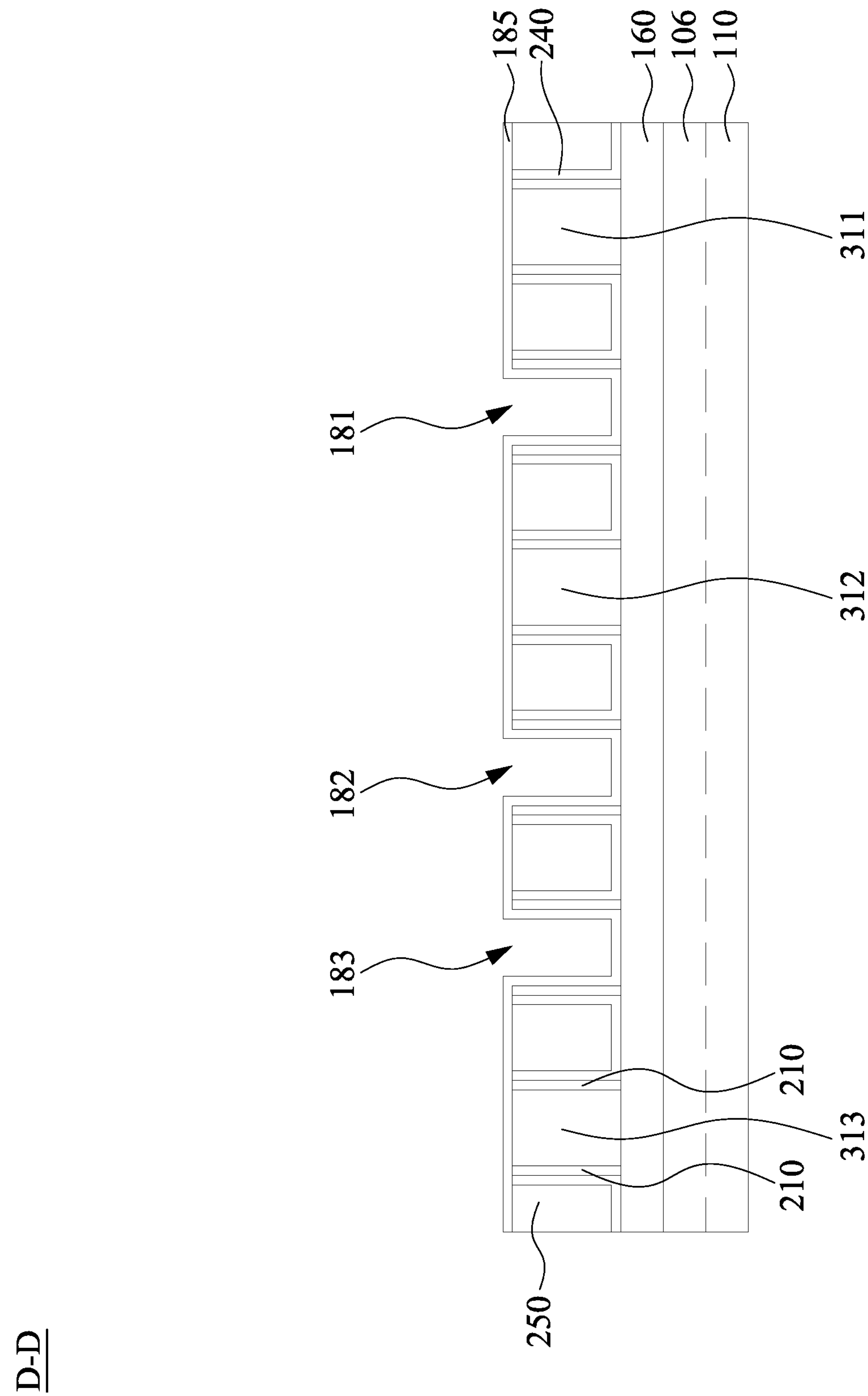
Figure 25A:
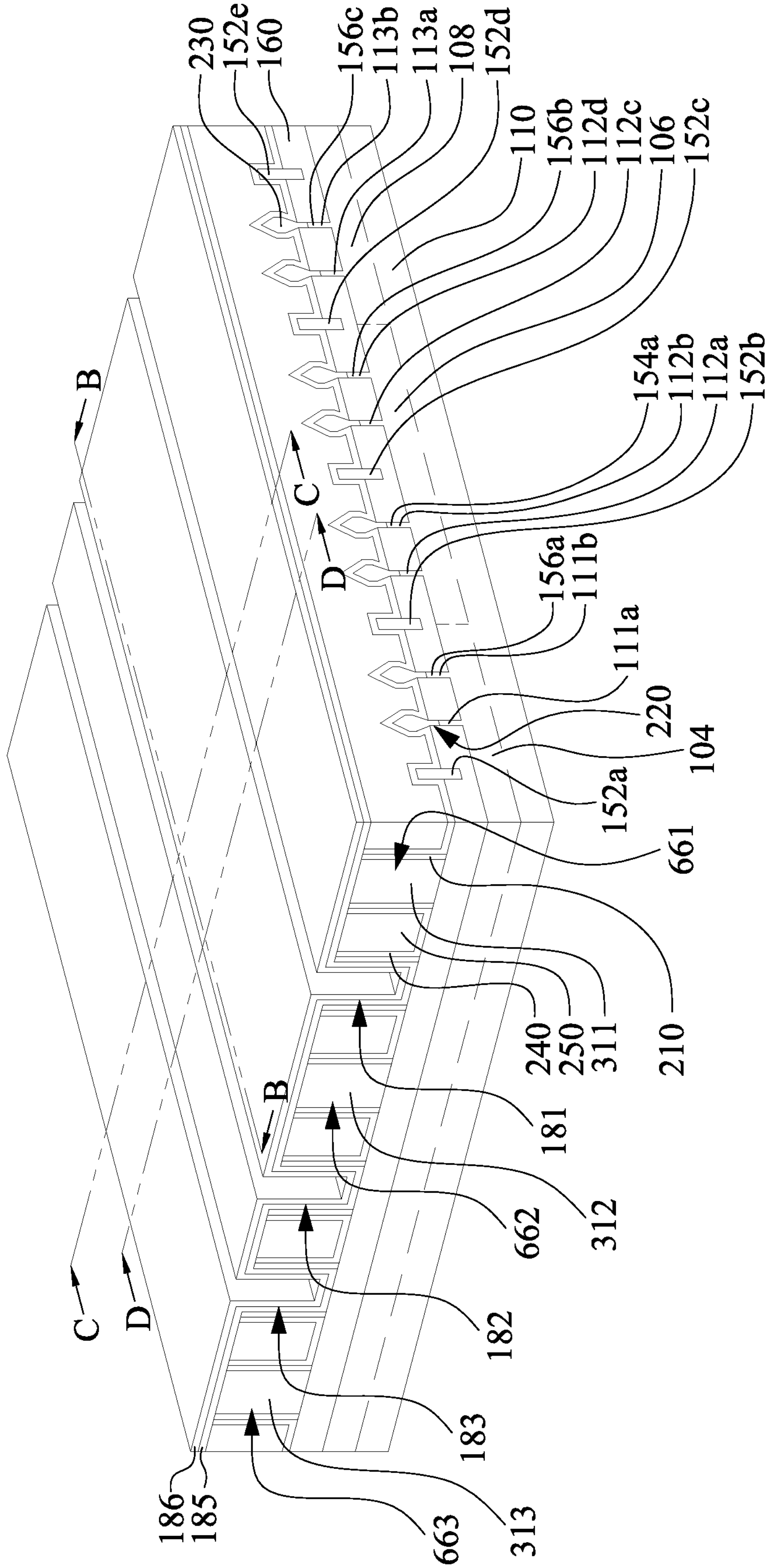
Figure 25B:
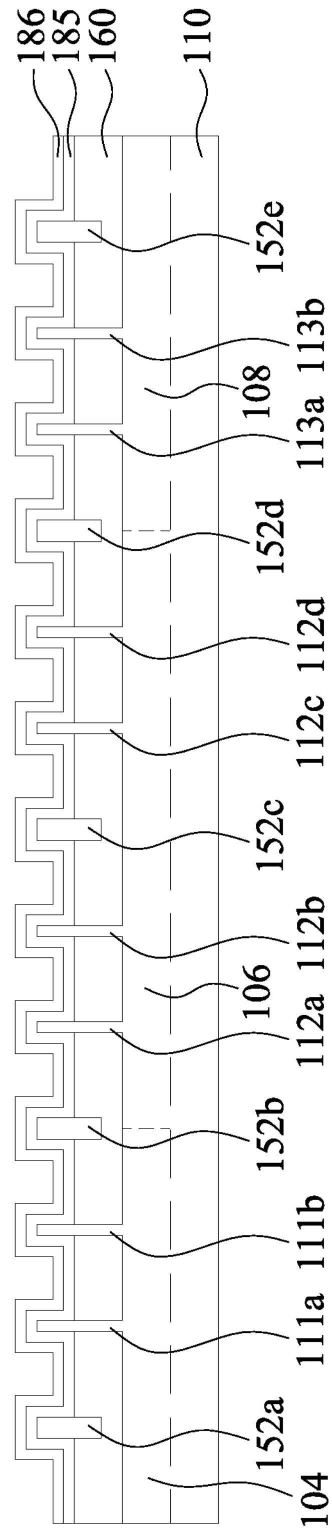
Figure 25C:
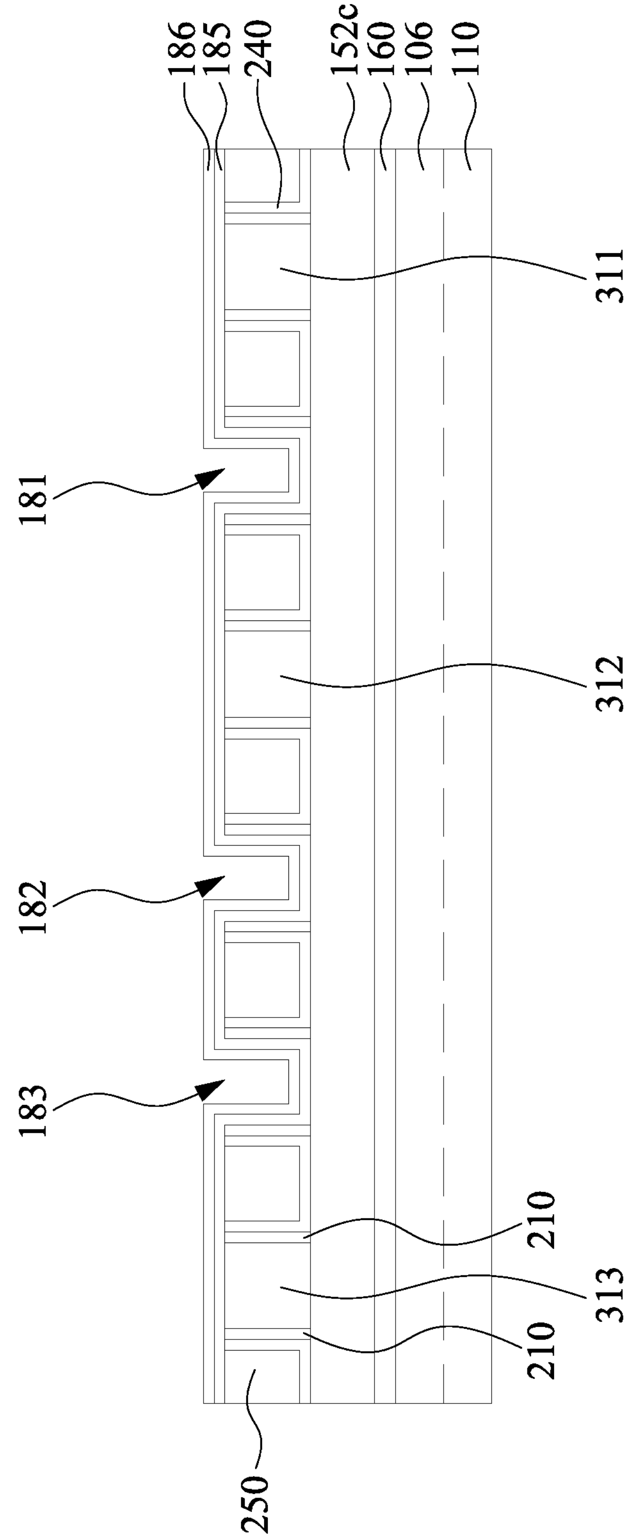
Figure 25D:
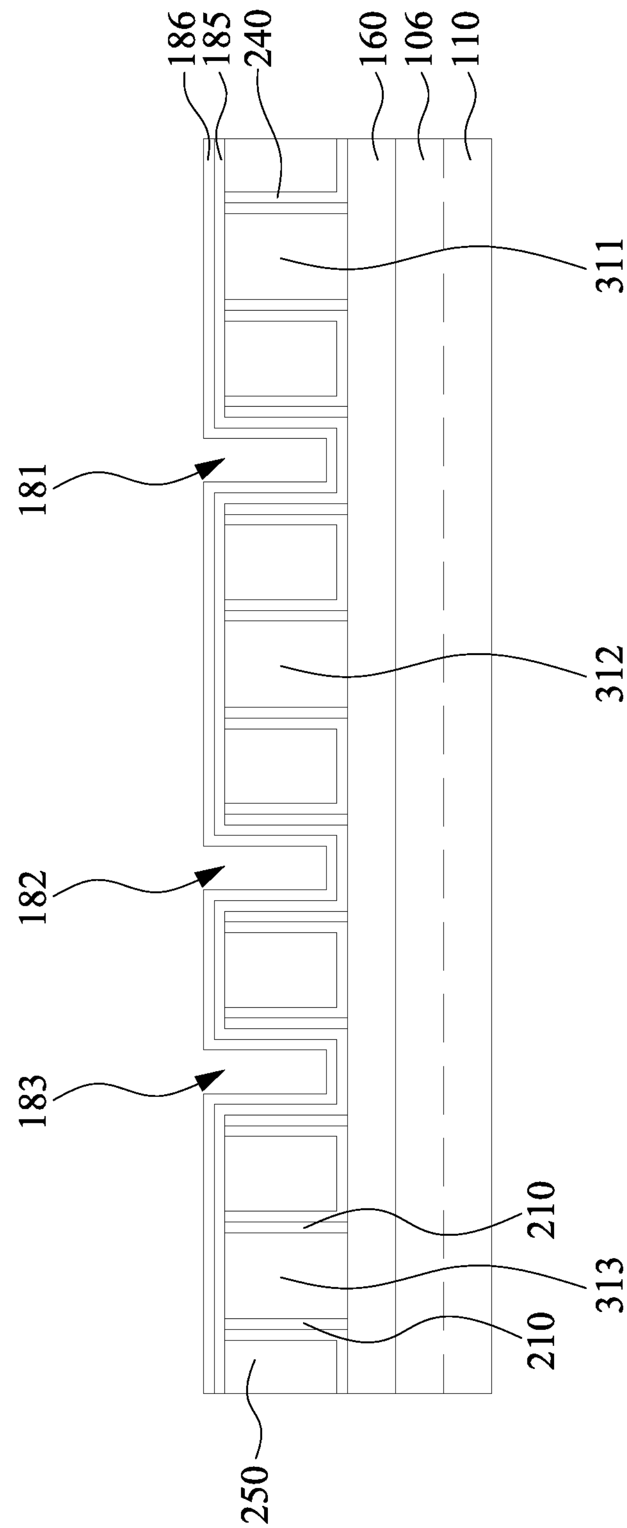
Figure 26A:
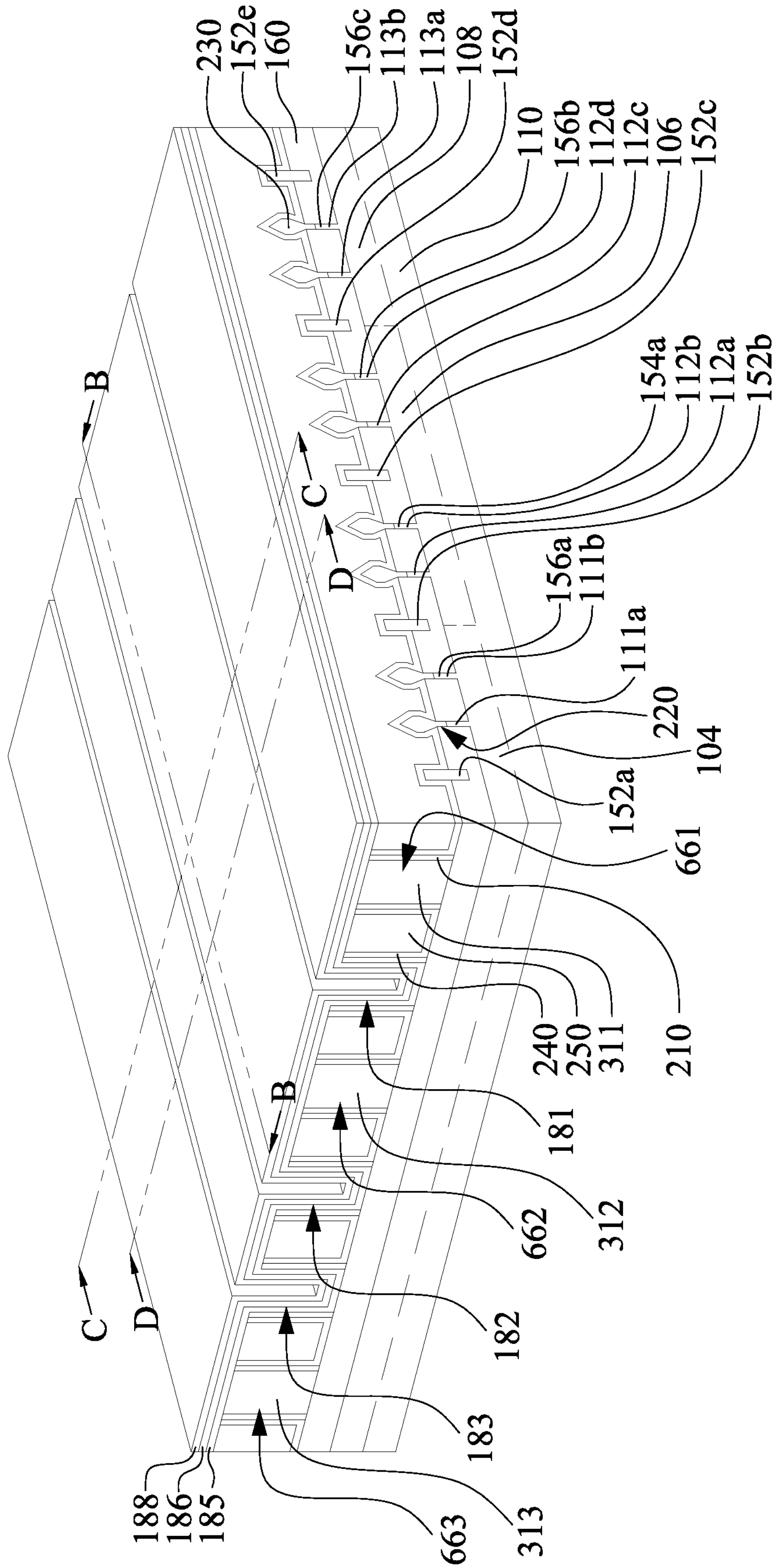
Figure 26B:
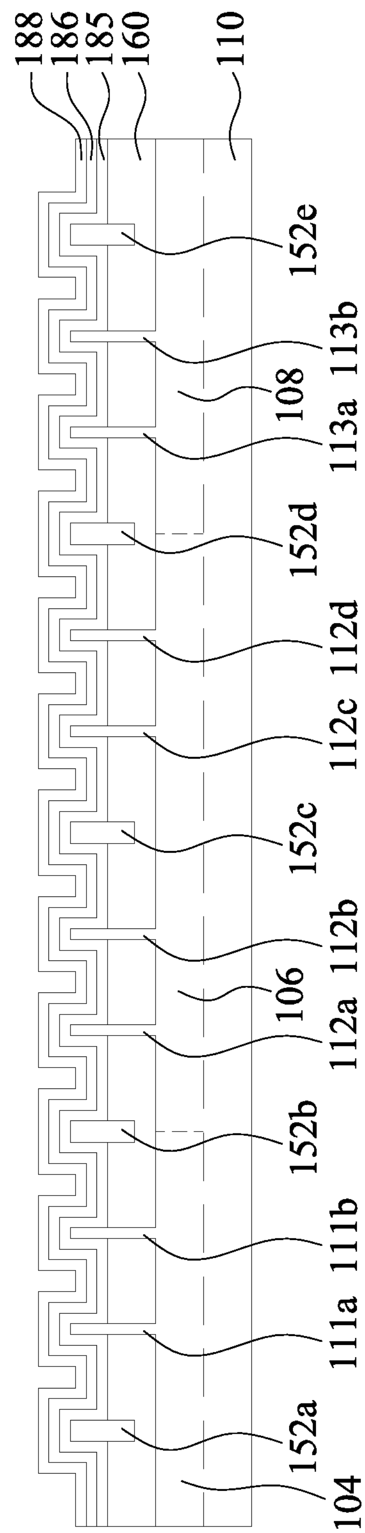
Figure 26C:
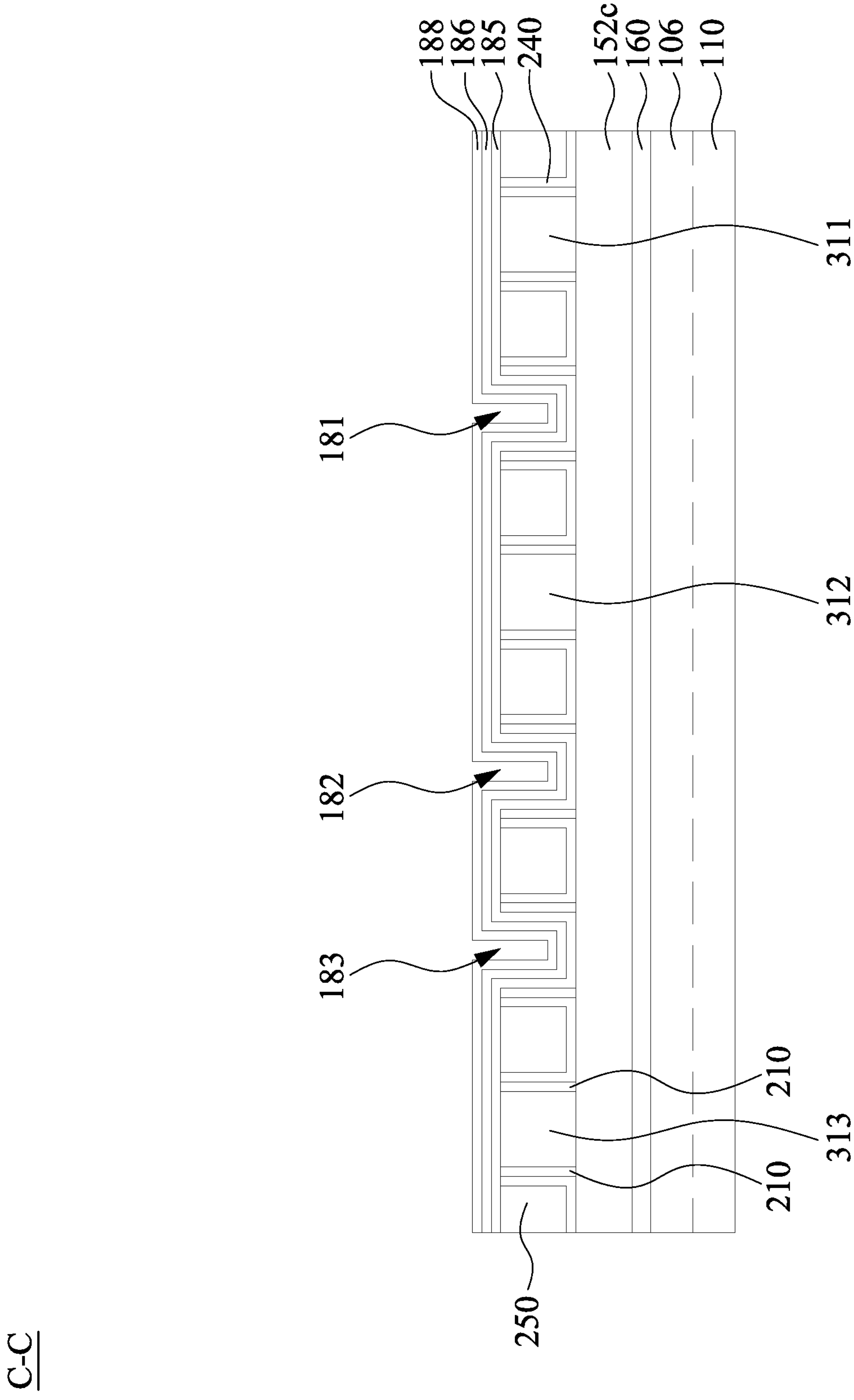
Figure 26D:
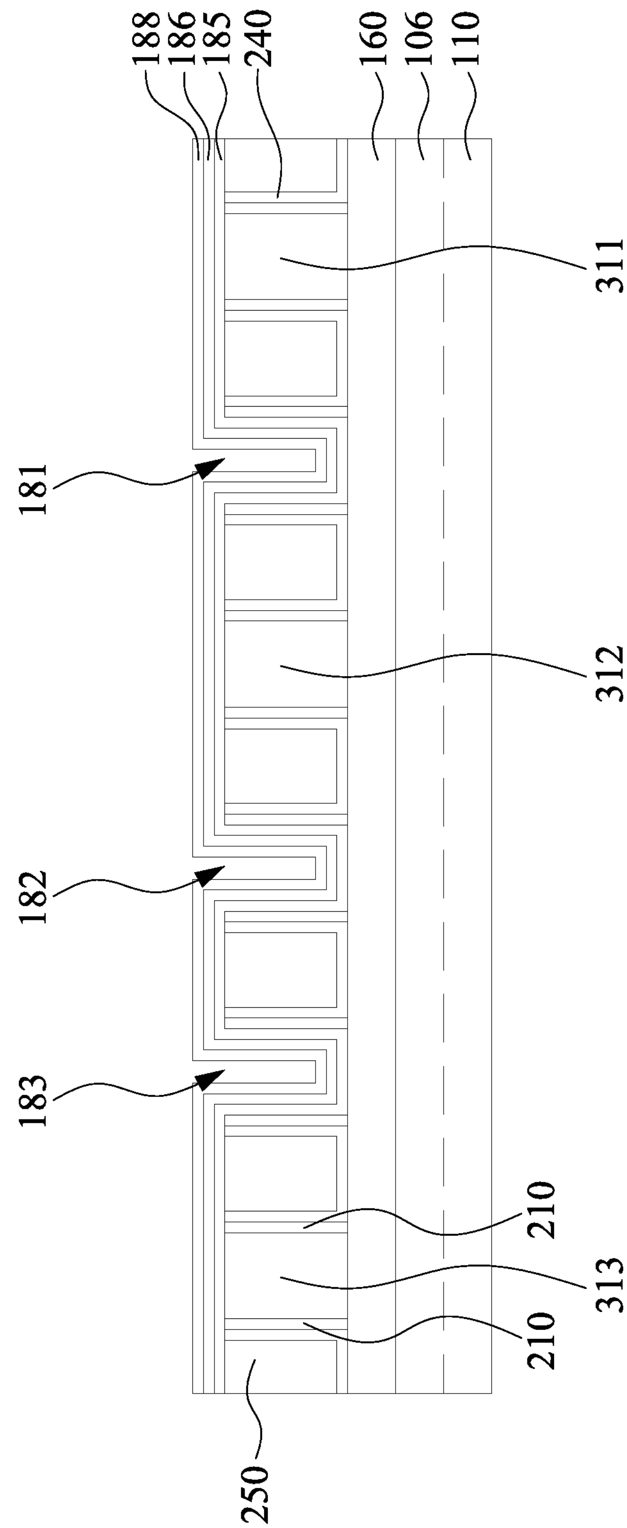
Figure 27A:
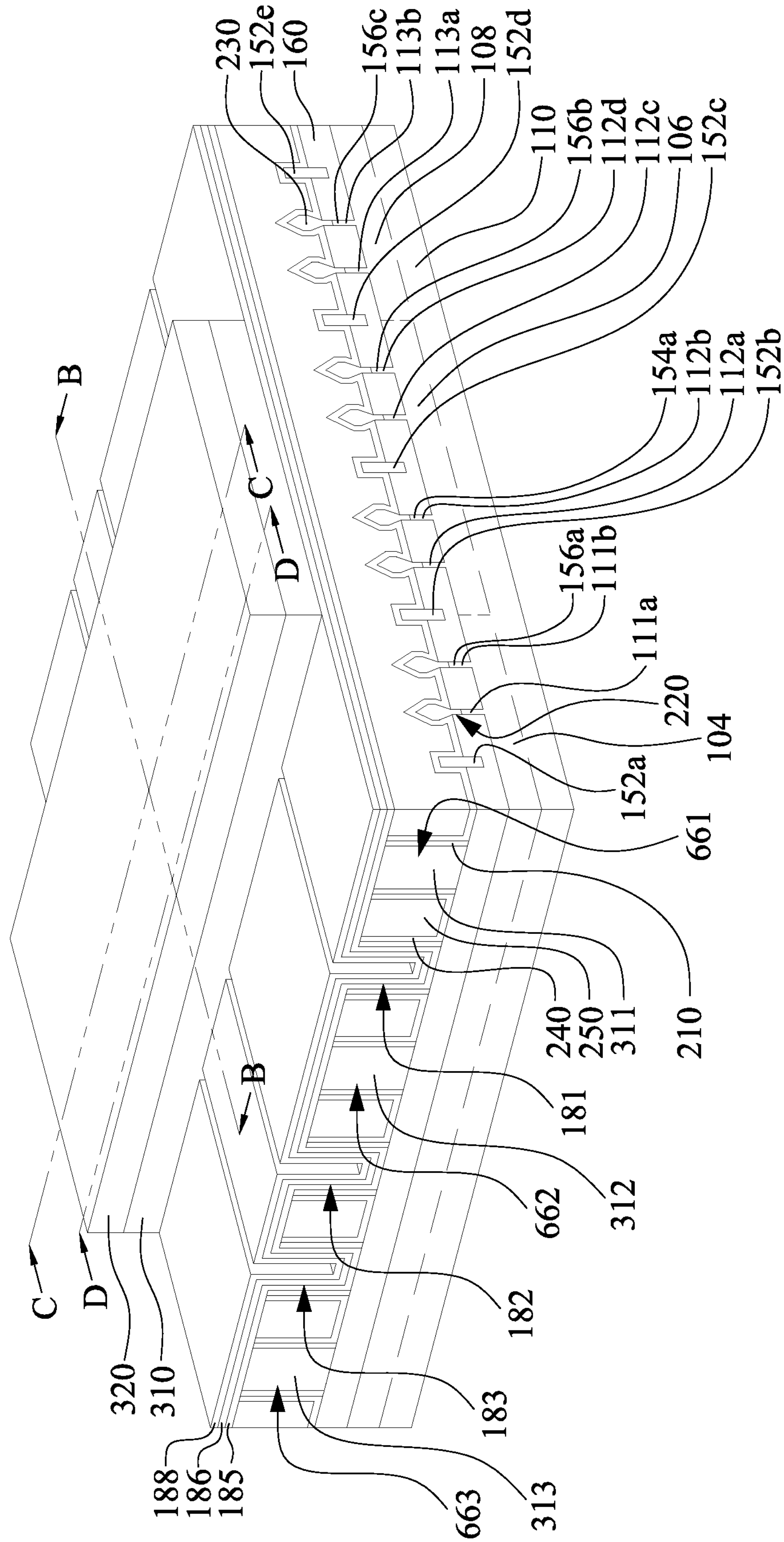
Figure 27B:
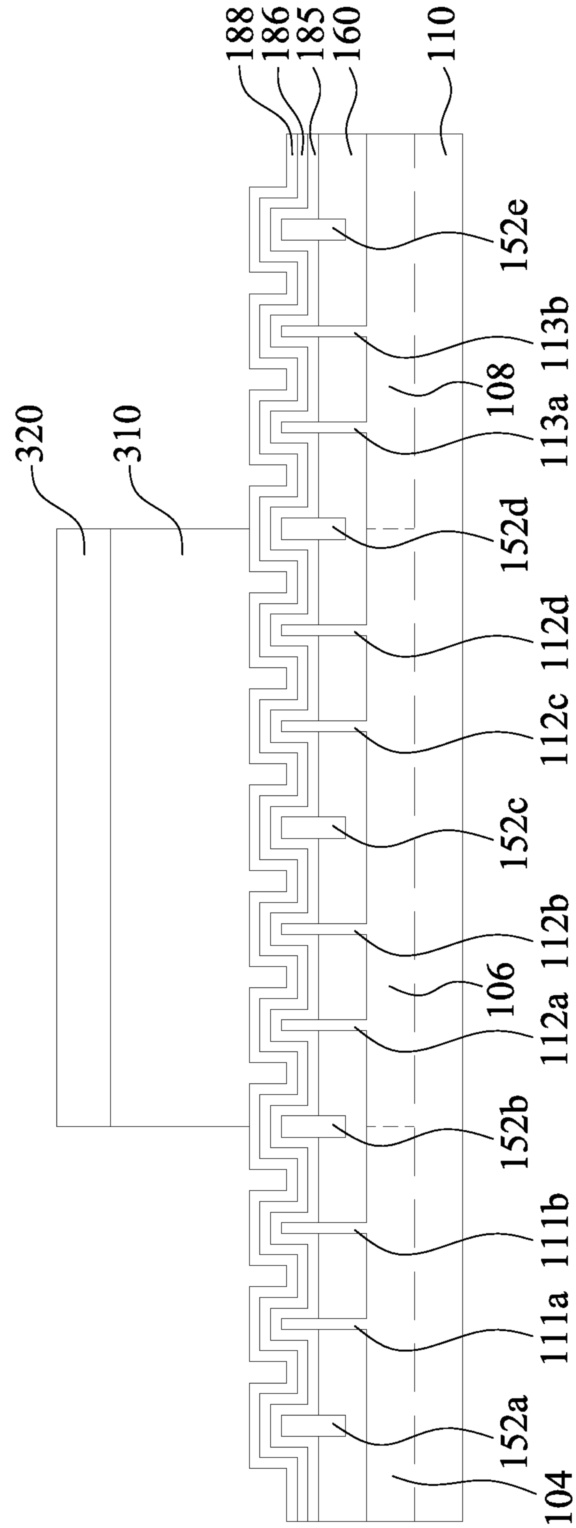
Figure 27C:
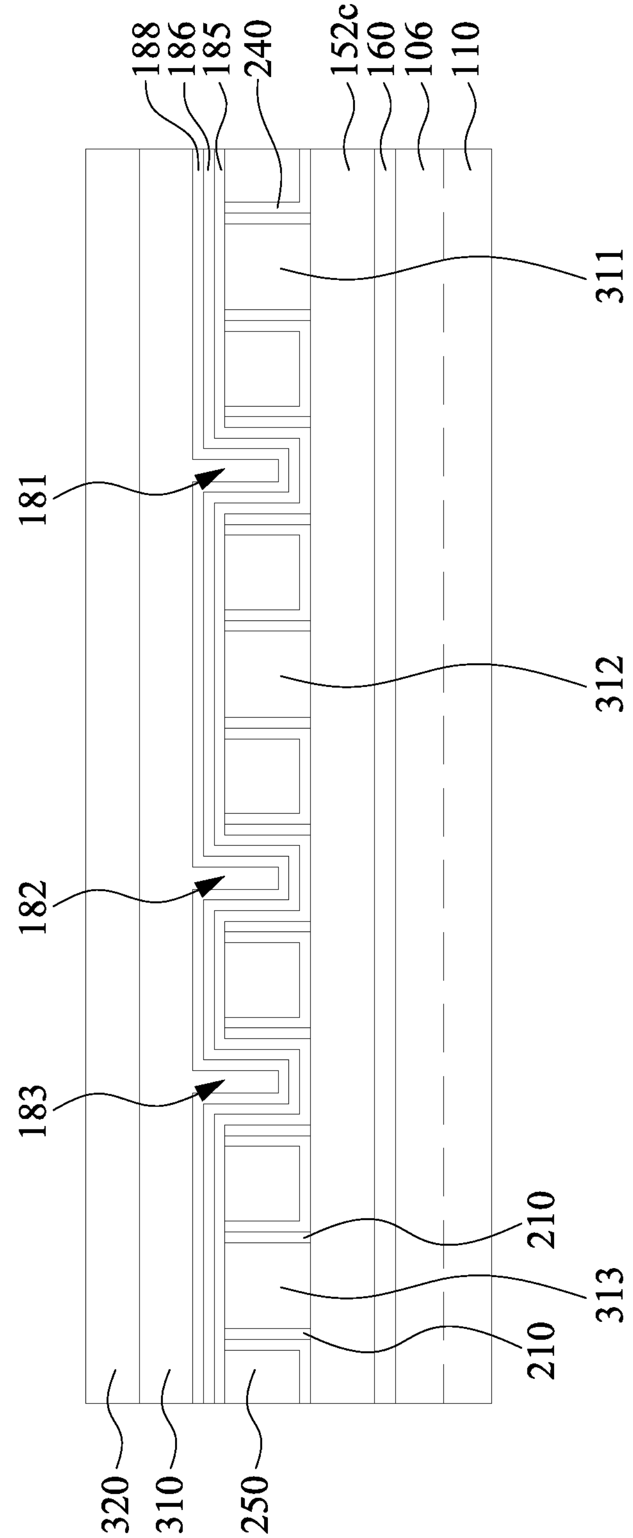
Figure 27D:
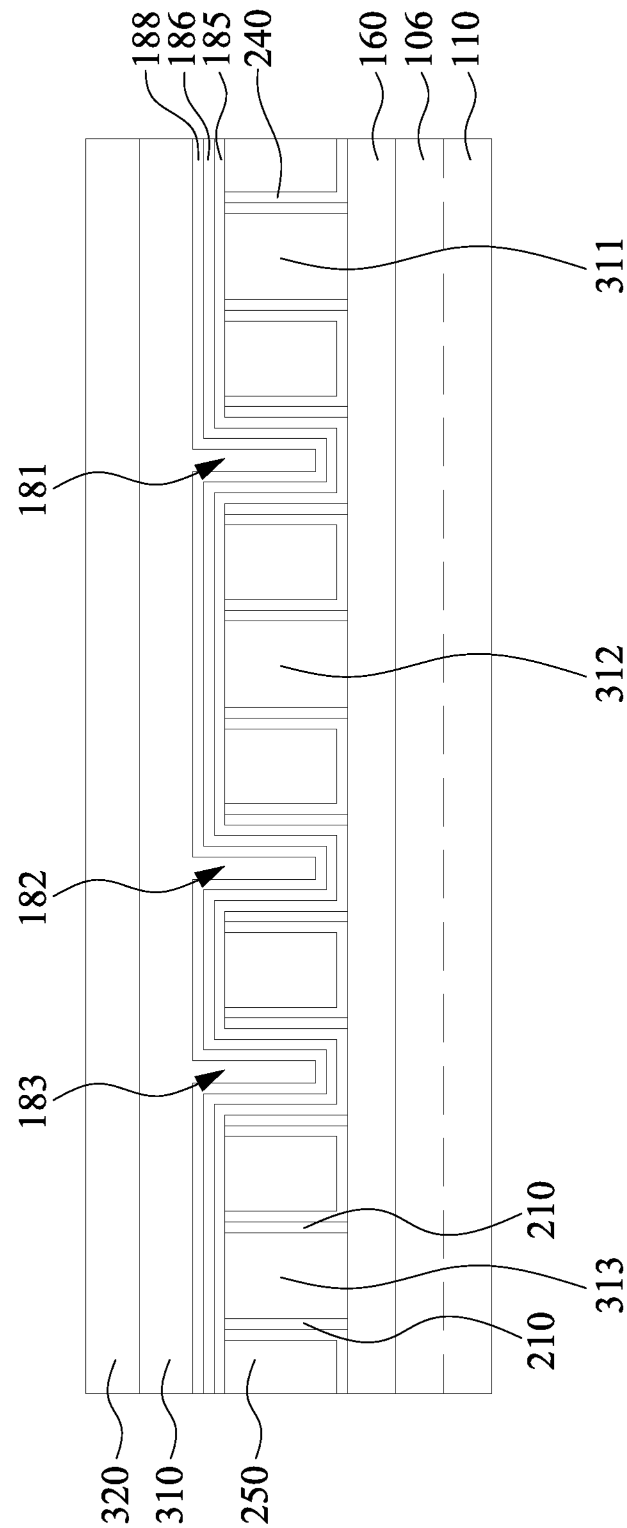
Figure 28A:
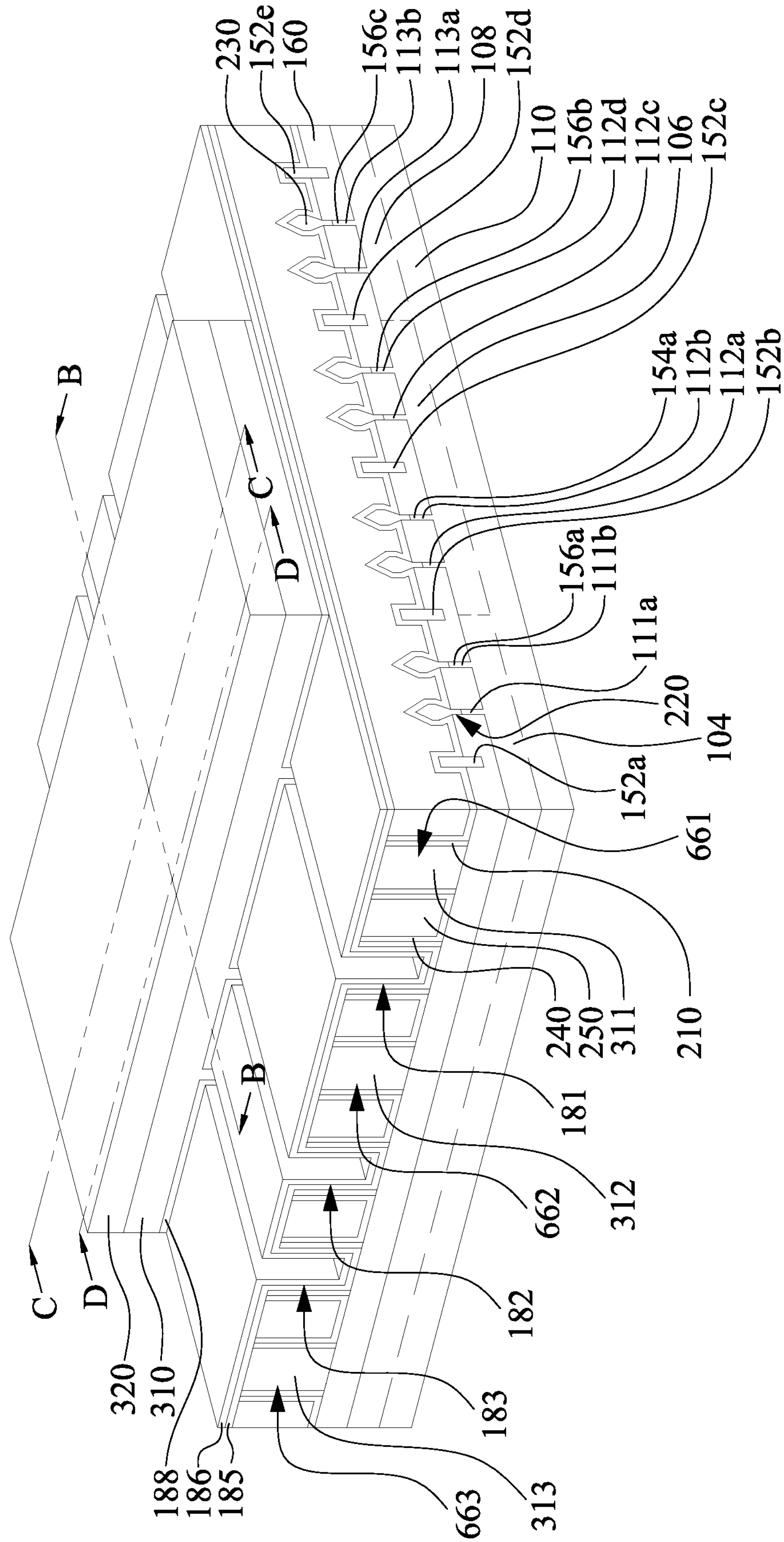
Figure 28B:
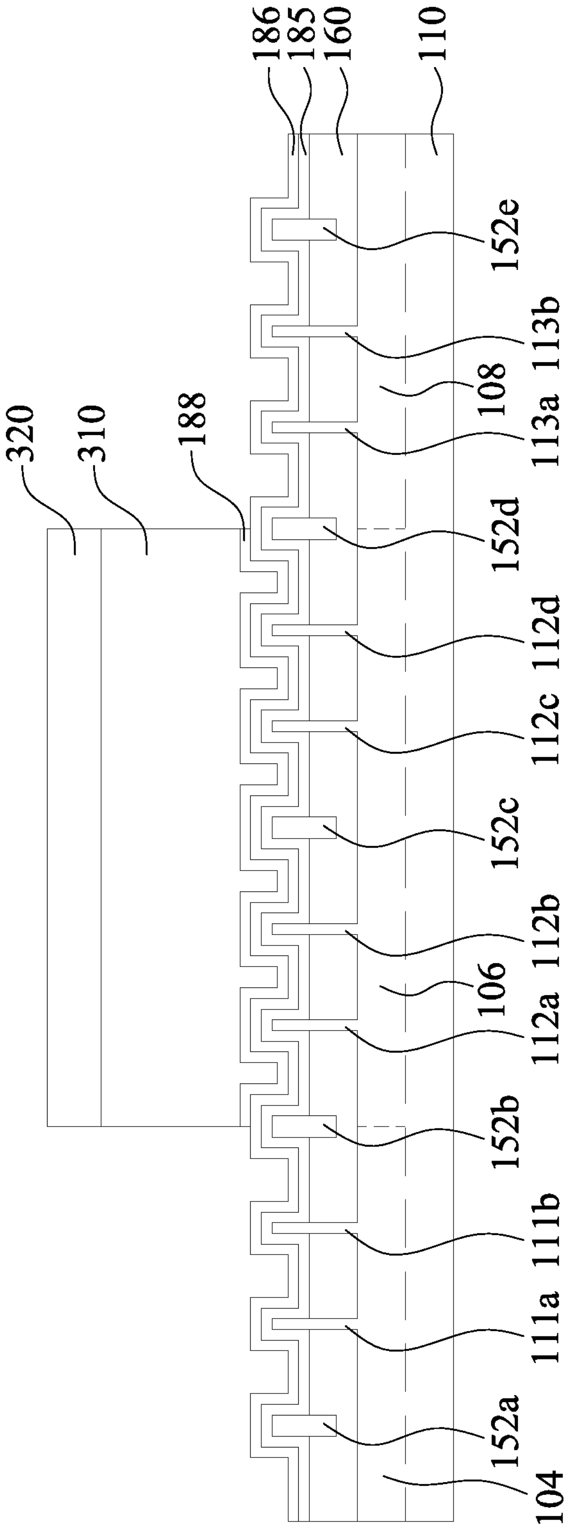
Figure 28C:
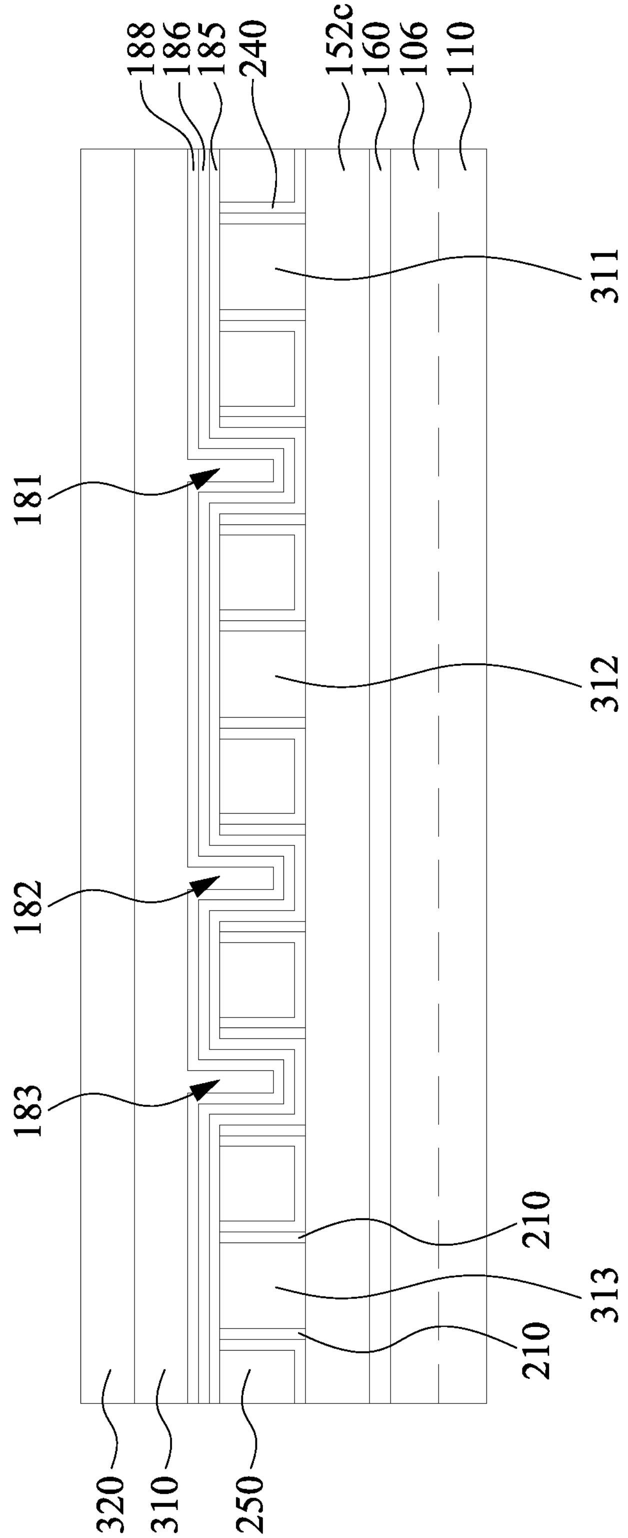
Figure 28D:
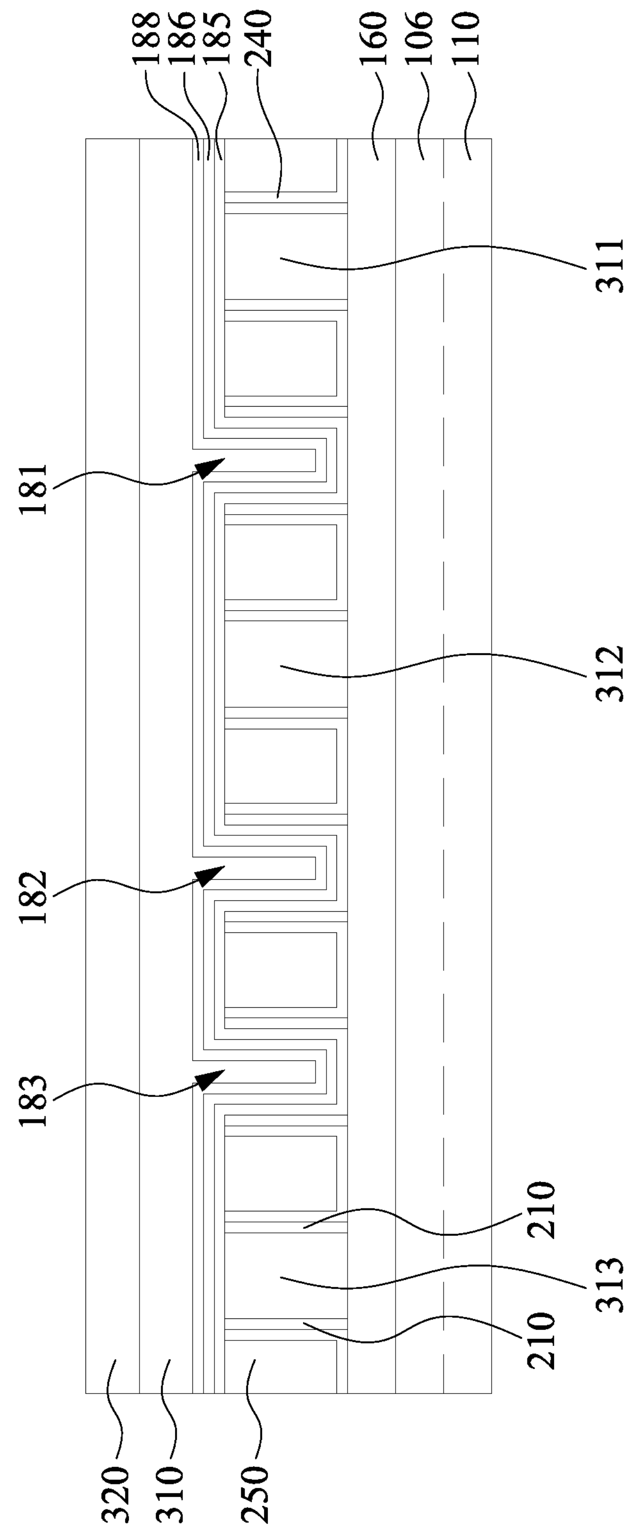
Figure 29A:
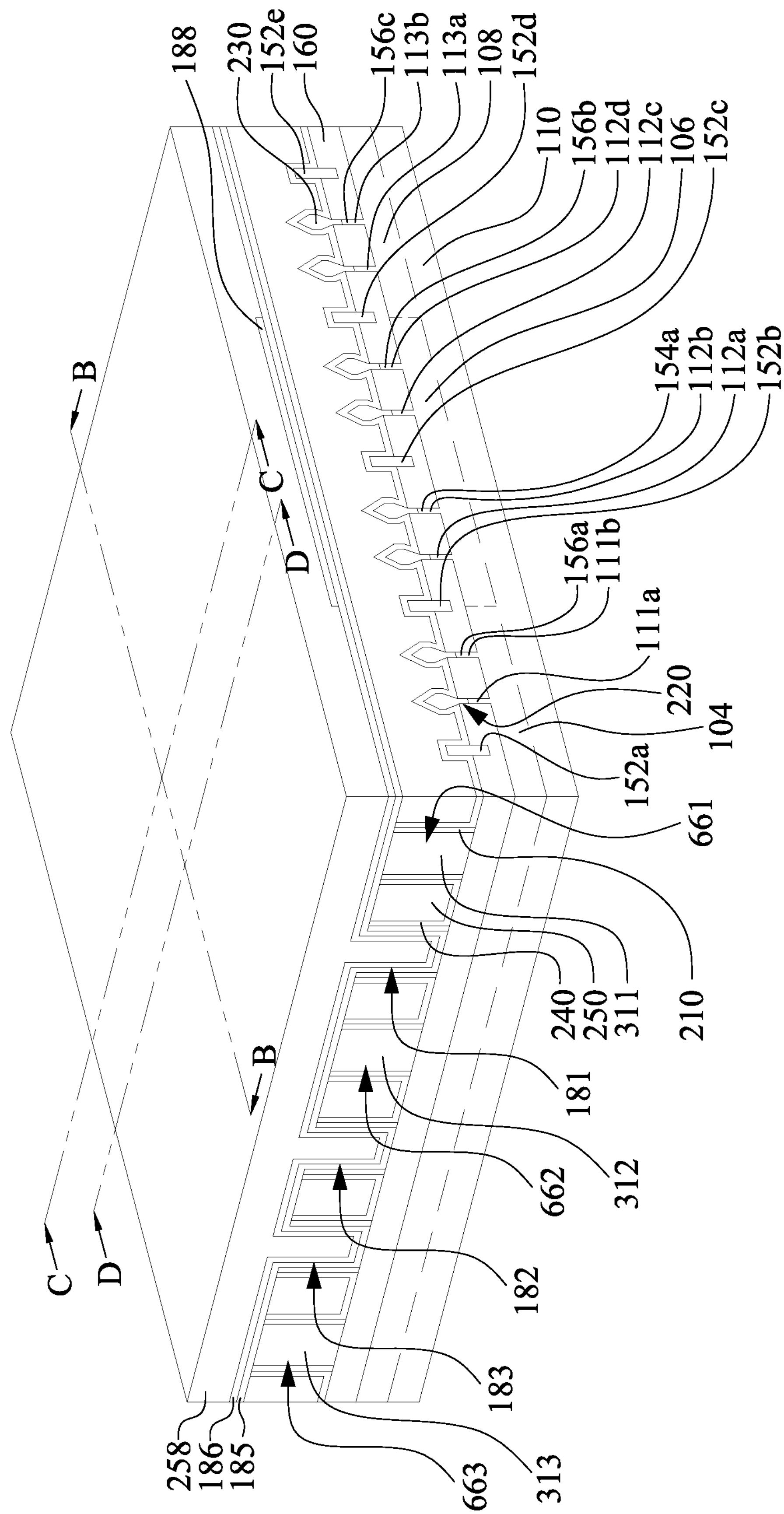
Figure 29B:
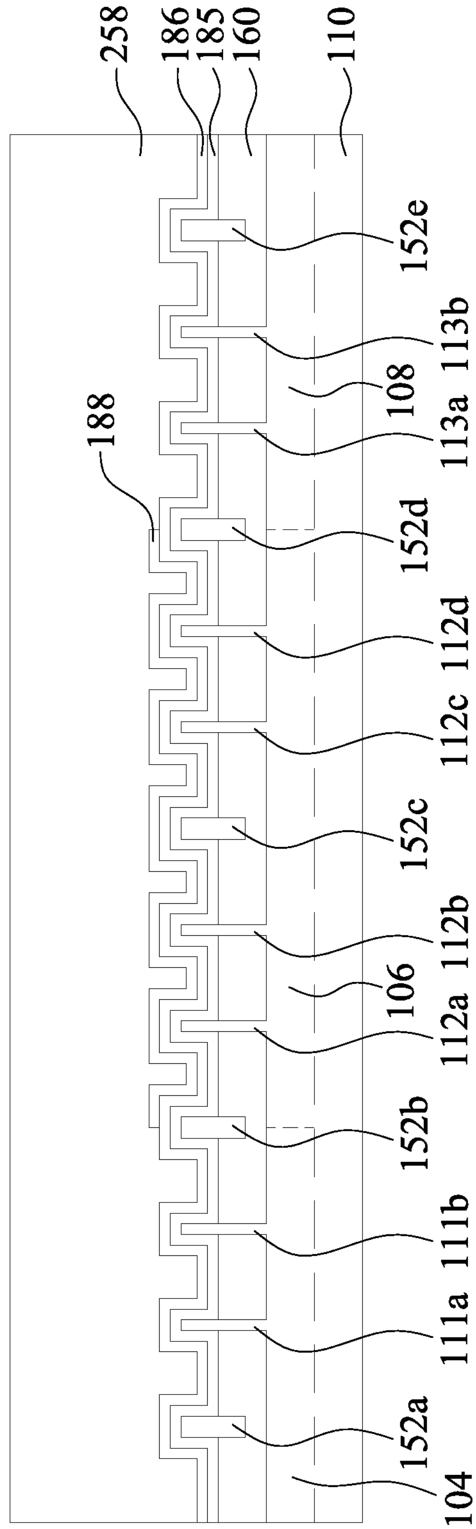
Figure 29C:
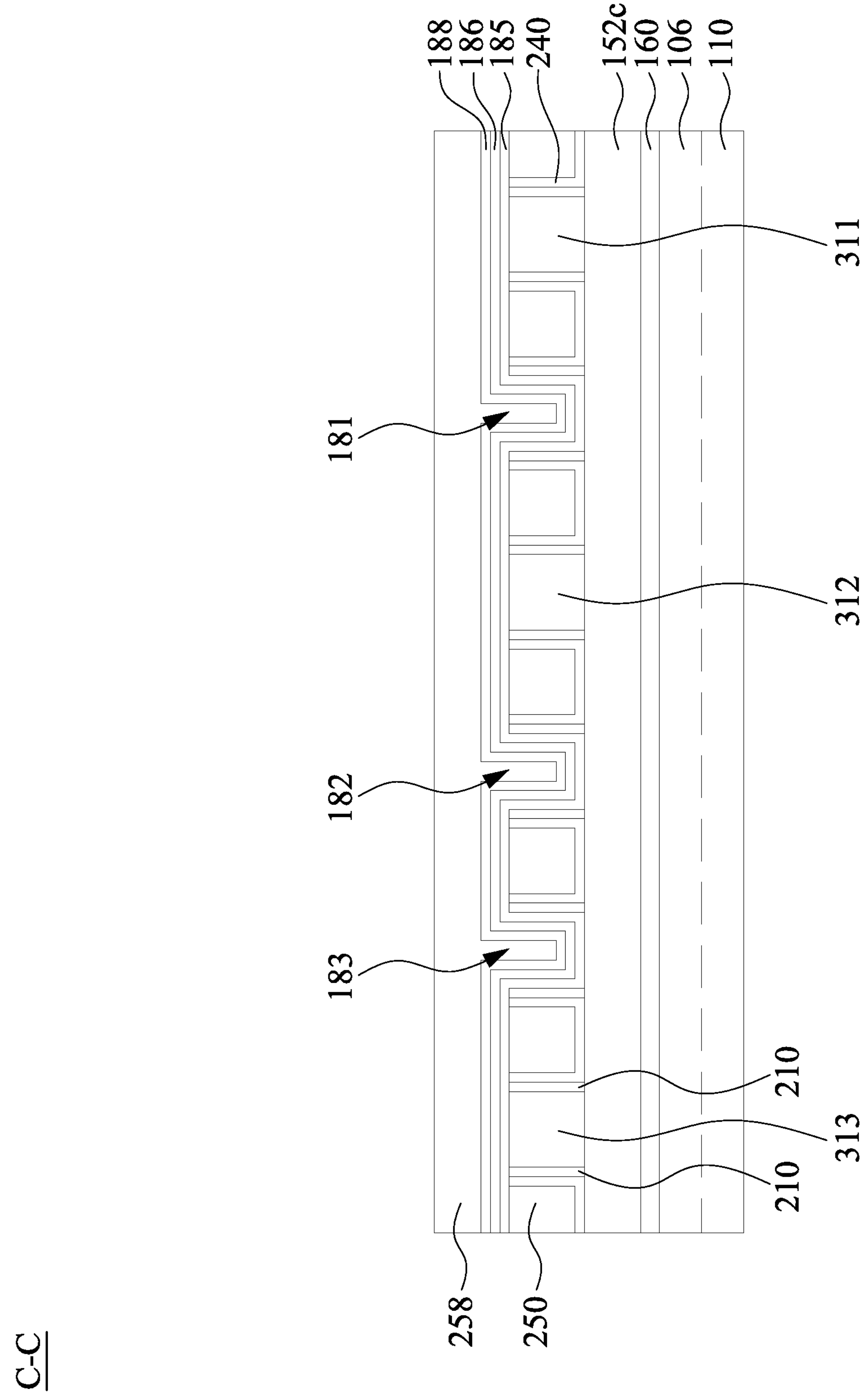
Figure 29D:
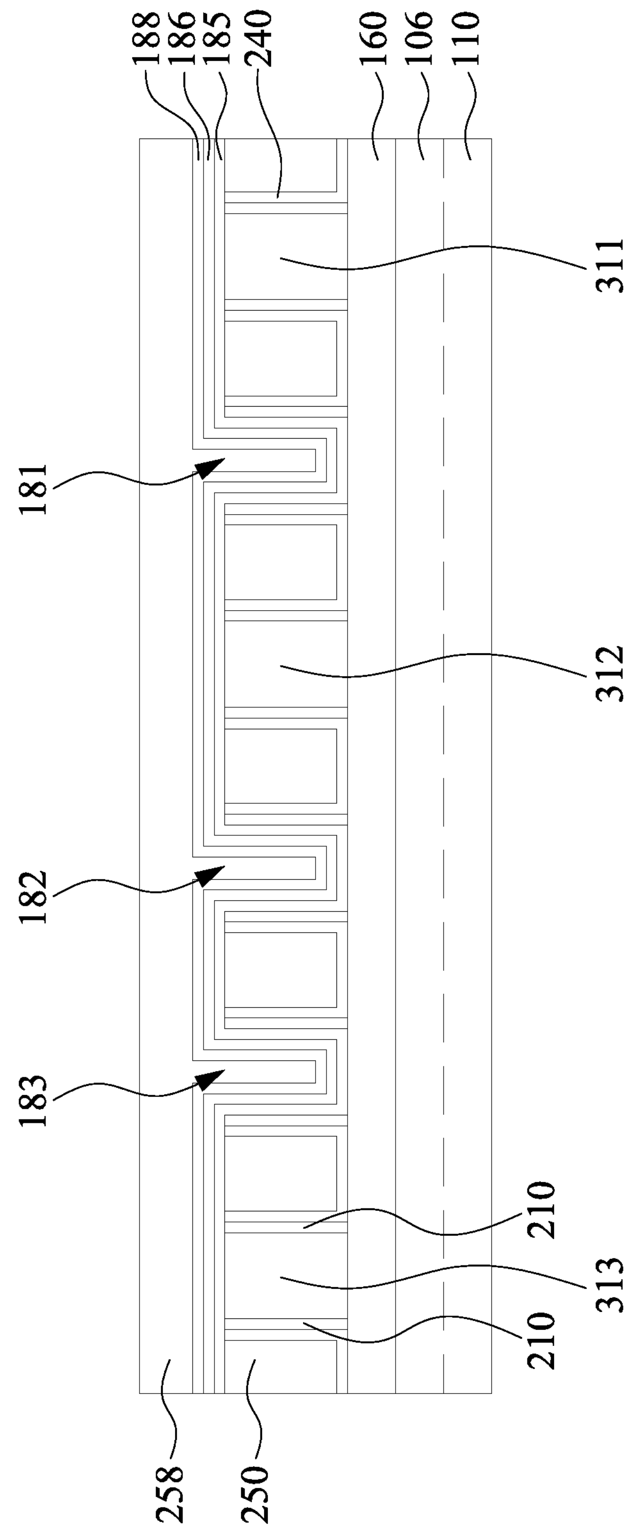

As shown in FIG. 20A to FIG. 20D, the gate dielectric layer 170 and the dummy gate electrode layer 180 in the dummy gate structure 201, 203, and 206 as shown in FIG. 19A are removed, for example, by a wet etch and/or a dry etching process, to form corresponding openings 661, 662, and 663 between the corresponding pairs of spacers. In the etching, the photoresist layer 650 shown in FIG. 19A and the ILD layer 250 are used as etching masks. In some embodiments, the gate dielectric layer 170 formed under the dummy gate electrode layer 180 in the dummy gate structure 201, 203, and 206 remain in the openings 661, 662, and 663 between the corresponding pairs of spacers. In some embodiments, the gate dielectric layer 170 formed under the dummy gate electrode layer 180 in the dummy gate structure 201, 203, and 206 are removed to expose the semiconductor fins 111*a*, 111*b*, 112*a*, 112*b*, 112*c*, 112*d*, 113*a*, and 113*b* and the isolation layer 160.

Reference is made to FIG. 21A to FIG. 22D. A dielectric material 670 shown in FIG. 21A to FIG. 21D is formed over the substrate 110 and fills in the openings 661, 662, and 663. Thereafter, a CMP process is performed to planarize the deposited dielectric material 670. The dielectric material remaining in the openings 661, 662, and 663 configure dielectric dummy gates 311, 312 and 313 respectively. The resulting structure is illustrated in FIG. 22A to FIG. 22D.

Reference is made to FIG. 23A to FIG. 23D. The gate dielectric layer 170 and the dummy gate electrode layer 180 in the dummy gate structure 202, 204, and 205 as shown in FIG. 22A to FIG. 22D are removed to form recesses 181, 182, and 183. In some embodiments, the recesses 181, 182, and 183 may also refer to as gate trenches. The gate dielectric layer 170 and the dummy gate electrode layers 180 in the dummy gate structure 202, 204, and 205 are removed in one or many etch operations including wet etch and dry etch. According to various embodiments, a hard mask is patterned over the semiconductor fins 111*a*, 111*b*, 112*a*, 112*b*, 112*c*, 112*d*, 113*a*, and 113*b* to protect the ILD layer 250, the gate spacers 210, and the CESL 240. In some embodiments, the dummy gate layer etch may stop at the gate dielectric layer 170. In some embodiments, the gate dielectric layer 170 may be removed along with the dummy gate electrode layer 180. The recesses 181, 182, and 183 are formed between the gate spacers 210 respectively.

Reference is made to FIG. 24A to FIG. 24D. A gate dielectric layer 185 can be conformally formed on the structure shown in FIG. 23A to FIG. 23D. Portions of the gate dielectric layer 185 are formed in the recesses 181, 182, and 183 and are further formed on the semiconductor fins 111*a*, 111*b*, 112*a*, 112*b*, 112*c*, 112*d*, 113*a*, and 113*b* and the isolation layer 160. The gate dielectric layer 185 can wrap the semiconductor fins 111*a*, 111*b*, 112*a*, 112*b*, 112*c*, 112*d*, 113*a*, and 113*b*.

In some embodiments, the gate dielectric layer 185 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 185 may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In some embodiments, the gate dielectric layer 185 may have a multilayer structure such as one layer of silicon oxide (e.g., interfacial layer) and another layer of high-k material. The gate dielectric layer 185 may be formed using chemical vapor deposition (CVD), physical vapor deposition (PVD), atomic layer deposition (ALD), thermal oxide, ozone oxidation, other suitable processes, or combinations thereof.

Reference is made to FIG. 25A to FIG. 25D. A work function layer 186 can be conformally formed on the structure shown in FIG. 24A to FIG. 24D. Portions of the work function layer 186 are formed in the recesses 181, 182, and 183 and wrap the semiconductor fins 111*a*, 111*b*, 112*a*, 112*b*, 112*c*, 112*d*, 113*a*, and 113*b*. In some embodiments, the work function layer 186 is in contact with the gate dielectric layer 185. The work function layer 186 can provide a suitable work function value for a gate stack of a semiconductor device, so as to benefit tuning the threshold voltage of the semiconductor device.

In some embodiments, the work function layer 186 may include tantalum nitride (TaN). In some other embodiments, an additional structure, such as a titanium nitride layer, may be formed on the gate dielectric layer 185, and the work function layer 186 is formed on the additional layer. The work function layer 186 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

Reference is made to FIG. 26A to FIG. 26D. A work function layer 188 can be conformally formed on the structure shown in FIG. 25A to FIG. 25D. Portions of the work function layer 188 are formed in the recesses 181, 182, and 183 and wrap the semiconductor fins 111*a*, 111*b*, 112*a*, 112*b*, 112*c*, 112*d*, 113*a*, and 113*b*. In some embodiments, the work function layer 186 is in contact with the work function layer 186. The work function layer 188 can provide another suitable work function value for the gate stack of the semiconductor device. In some embodiments, the work function layer 188 may include a titanium-containing material, such as, for example, titanium nitride (TiN). In some embodiments, tantalum is absent in the work function layer 188. The work function layer 188 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

Reference is made to FIG. 27A to FIG. 27D. A dielectric material 310, e.g. spin-on-glass (SOG), can be formed, covering the work function layers 186 and 188 on the N-type well 106 and the semiconductor fins 112*a*, 112*b*, 112*c*, and 112*d* and filling the recesses 181, 182, and 183, and exposing the work function layers 186 and 188 on the P-type wells 104 and 108. A photoresist 320 can be defined over the dielectric material 310. The dielectric material 310 and the photoresist 320 can be provided for patterning the work function layer 188. The dielectric material 310 and the photoresist 320 can be defined by, for example, a spin-on process, a photolithographic process, and an etching process.

Reference is made to FIG. 28A to FIG. 28D. The work function layer 188 above the P-type wells 104 and 108 and the semiconductor fins 111*a*, 111*b*, 113*a*, and 113*b* that are not covered by the dielectric material 310 and the photoresist 320 shown in FIG. 27A to FIG. 27D can be removed, so that the work function layer 188 can be patterned to remain on the semiconductor fins 112*a*, 112*b*, 112*c*, and 112*d*, but not on the semiconductor fins 111*a*, 111*b*, 113*a*, and 113*b*. After patterning the work function layer 188, the dielectric material 310 and the photoresist 320 shown in FIG. 28A to FIG. 28D can be removed by a wet etching process, a dry etching process, or combinations thereof, exposing the remained work function layer 188. After the patterning, the work function layer 186 is present on the semiconductor fins 111*a*, 111*b*, 113*a*, and 113*b* and the work function layer 188 are present on the semiconductor fins 112*a*, 112*b*, 112*c*, and 112*d*, and the dielectric material 310 and the photoresist 320 are removed.

Reference is made to FIG. 29A to FIG. 29D. Thereafter, remaining recesses 181, 182, and 183 are then filled or overfilled with a filling conductor 258. In some embodiments, the filling conductor 258 includes, for example, tungsten (W). The filling conductor 258 can be formed using ALD, PVD, CVD, or other suitable process. In some other embodiments, the filling conductor 258 includes aluminum (Al), copper (Cu) or other suitable conductive material. In some embodiments, an additional material may be formed on the work function layer 188, and the filling conductor 258 may be formed on the additional material. Such an additional material may be, for example, TiN, which may increase the adhering strength of tungsten and TiAlC.

Figure 30A:
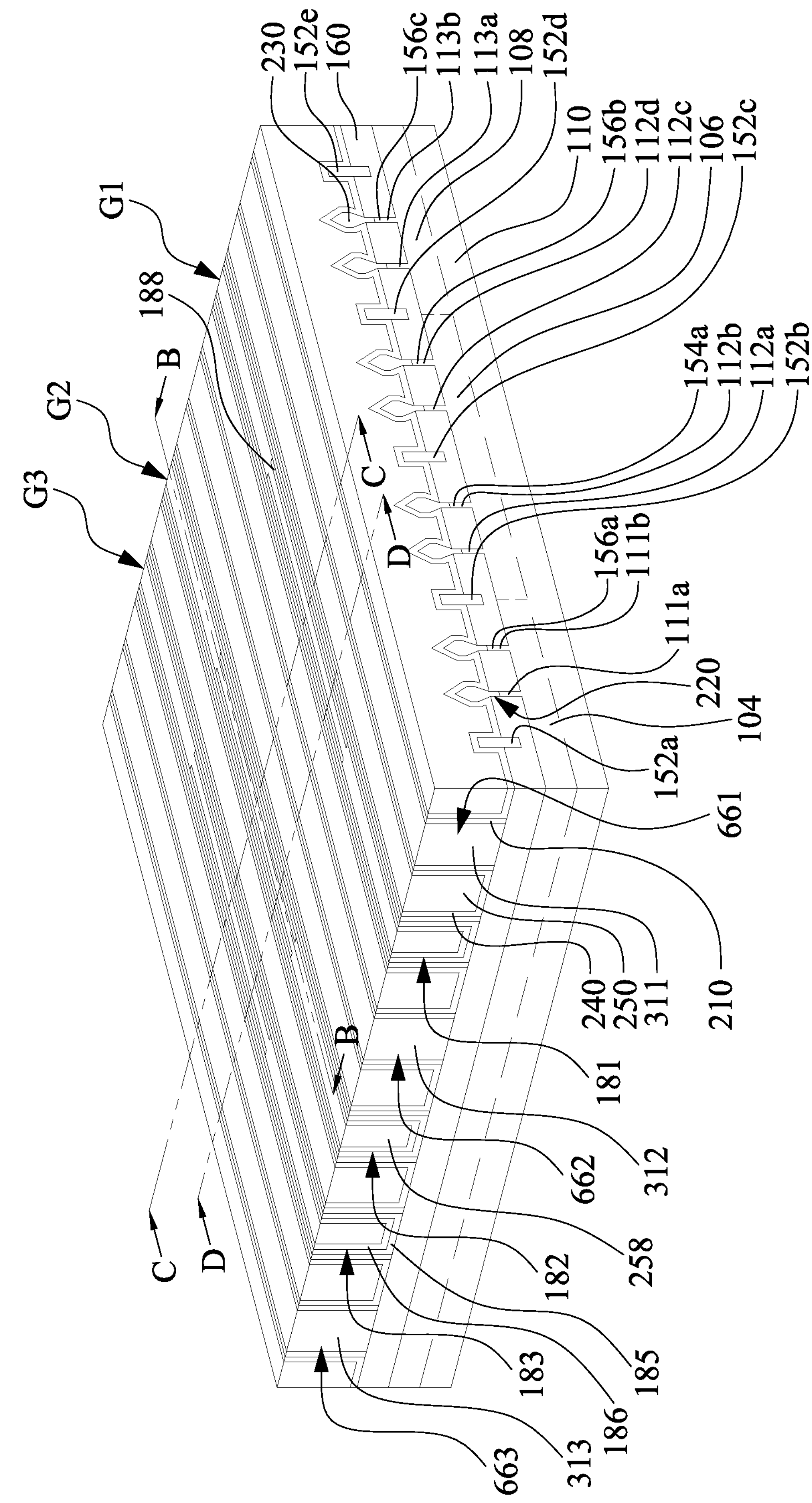
Figure 30B:
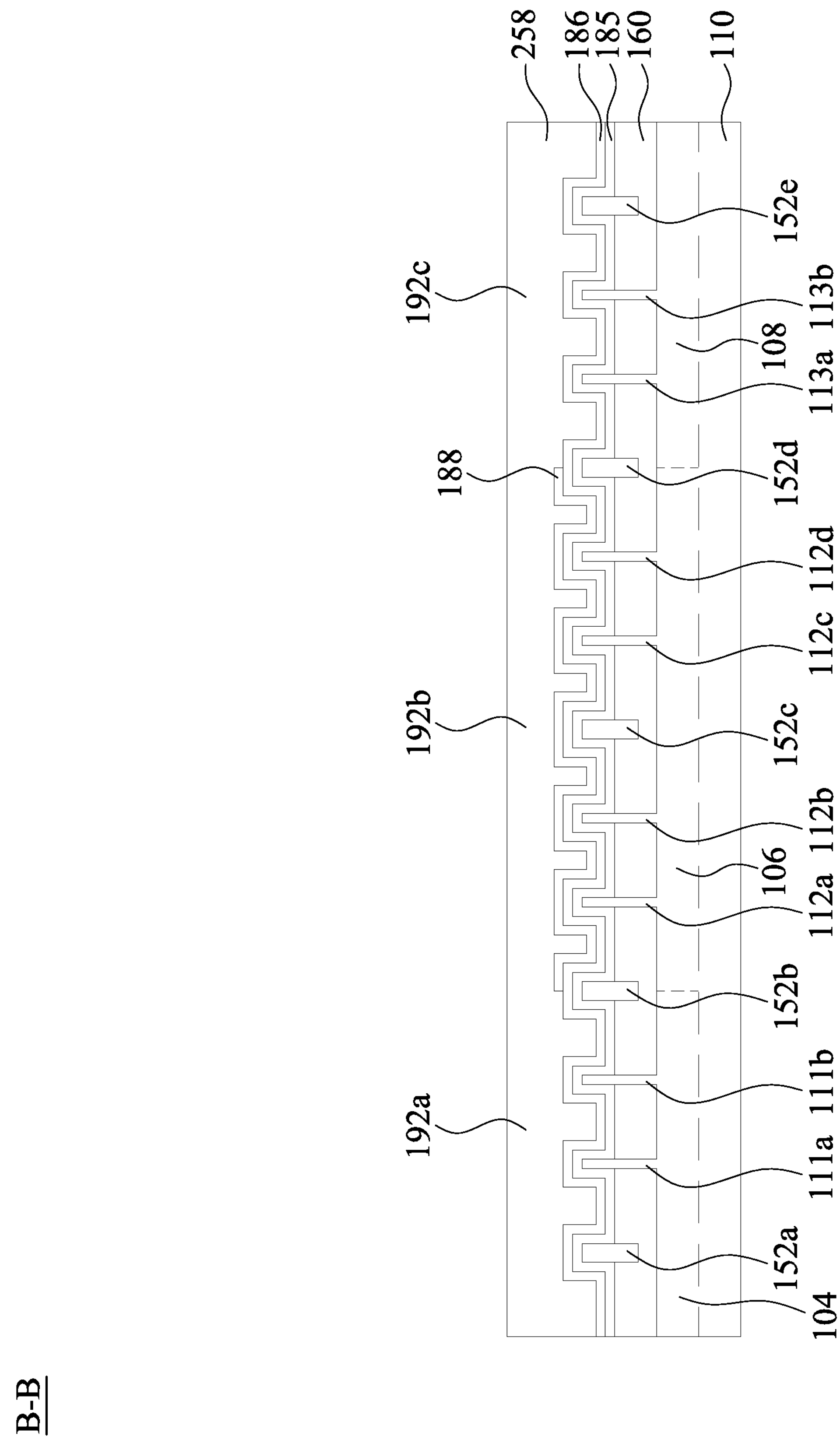
Figure 30C:
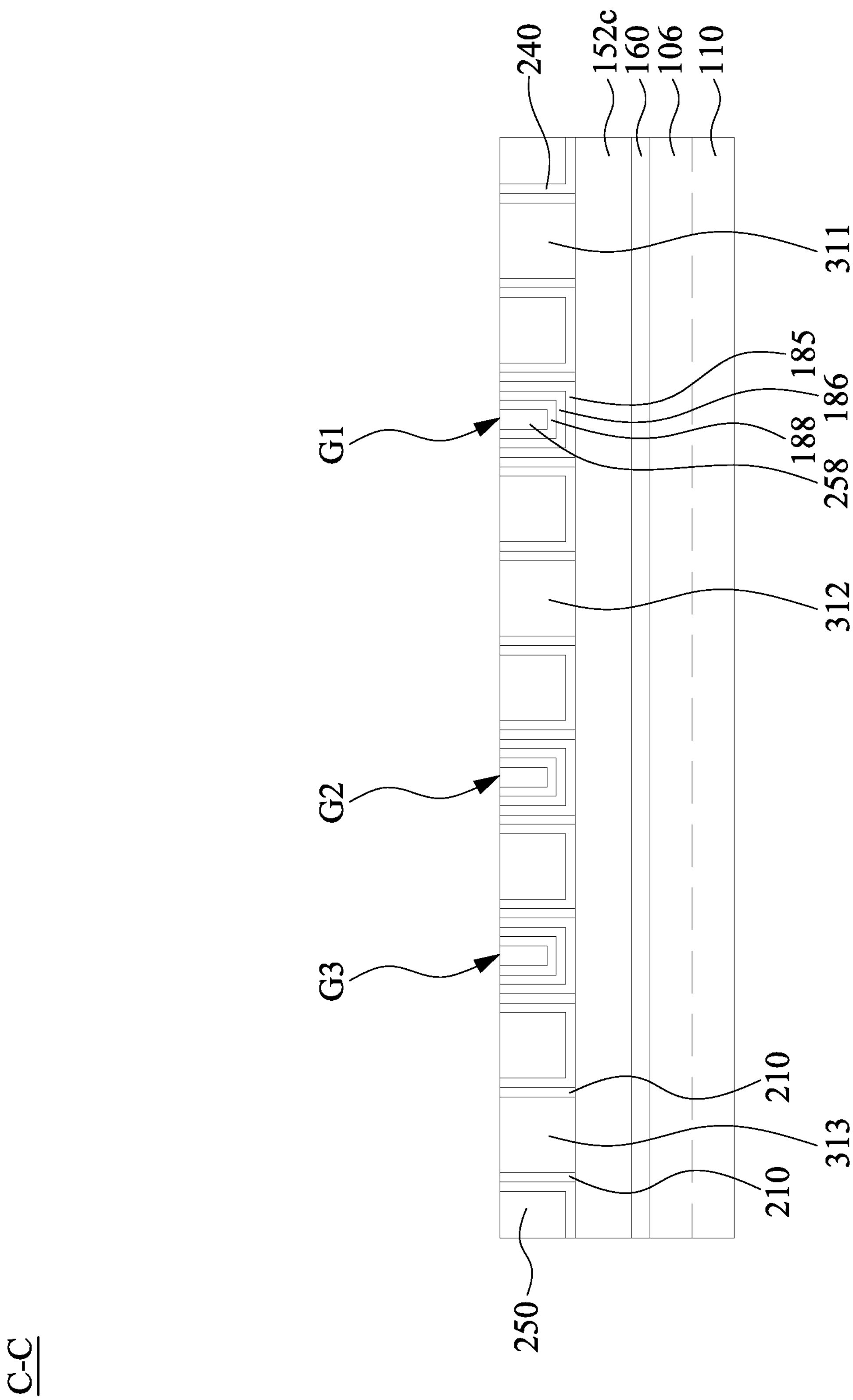
Figure 30D:
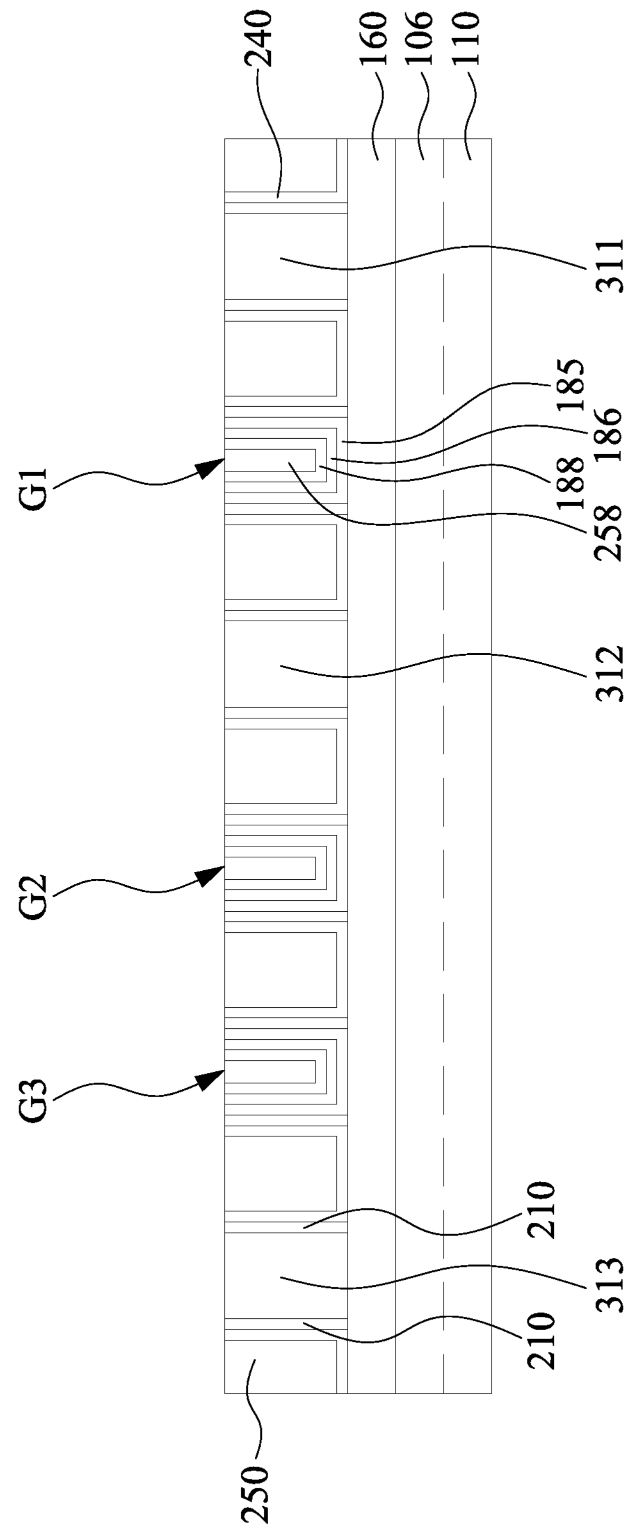
Figure 31A:
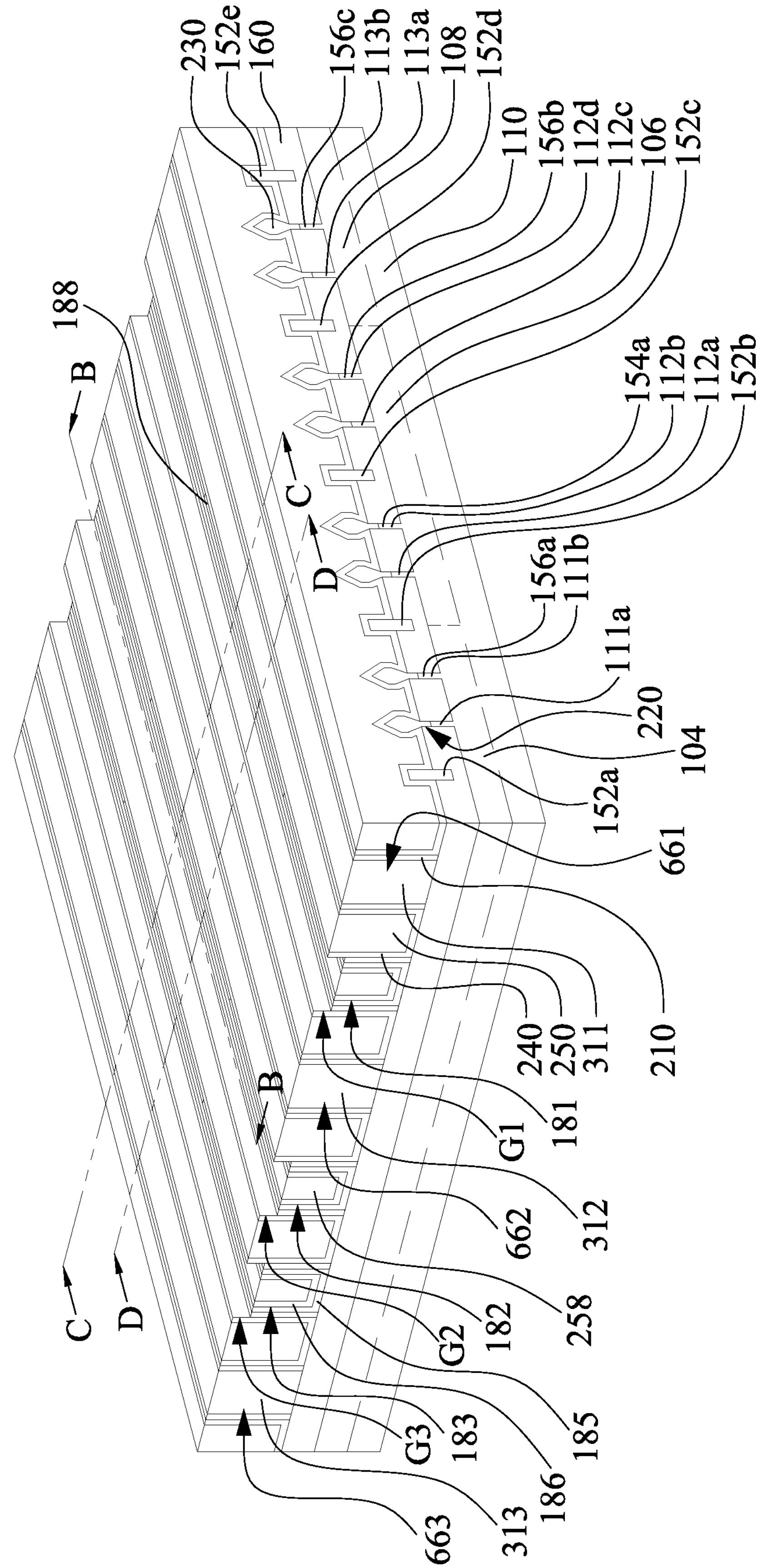
Figure 31B:
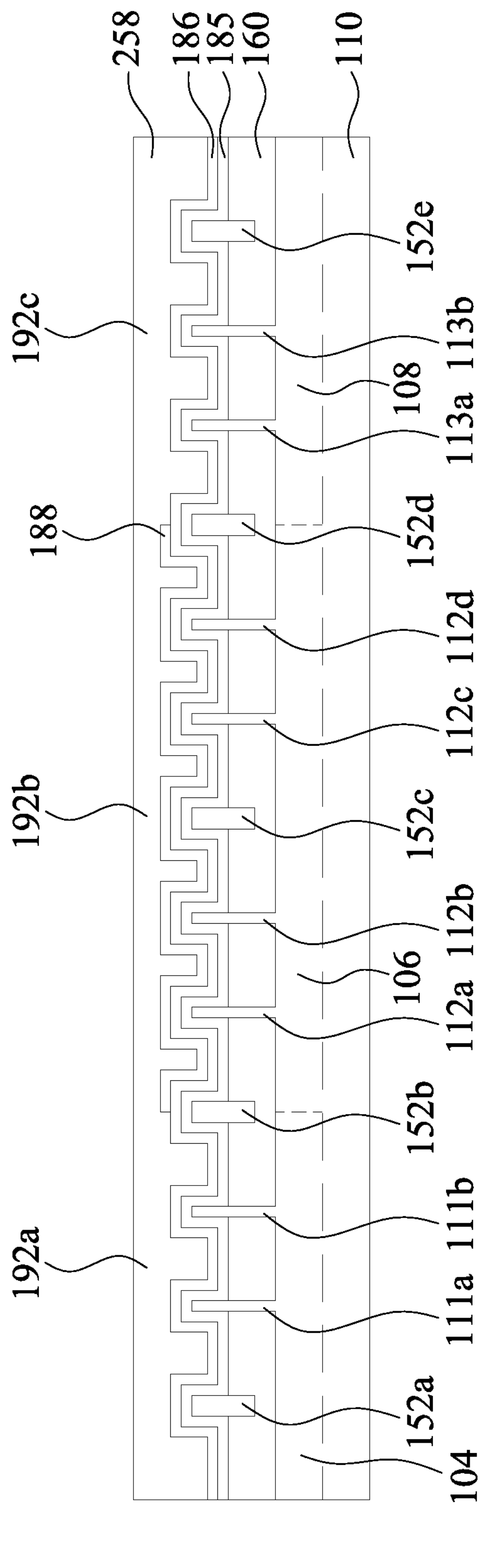
Figure 31C:
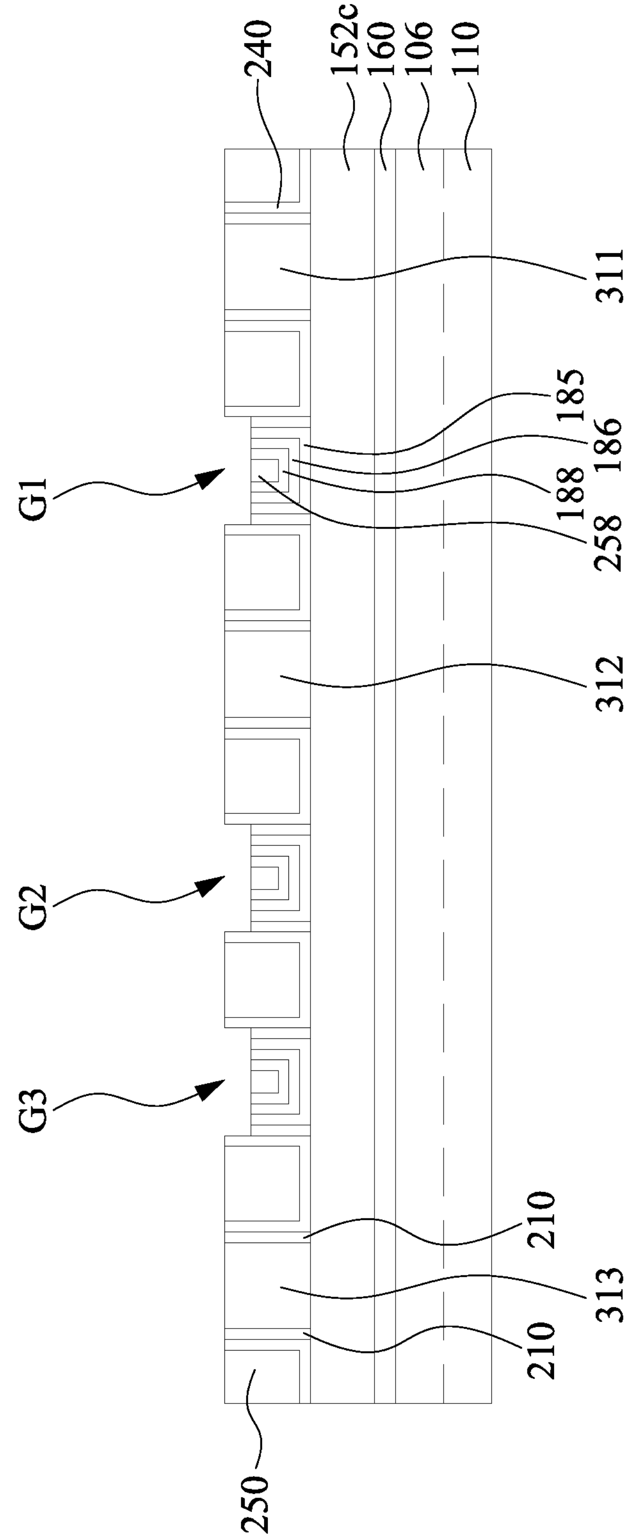
Figure 31D:
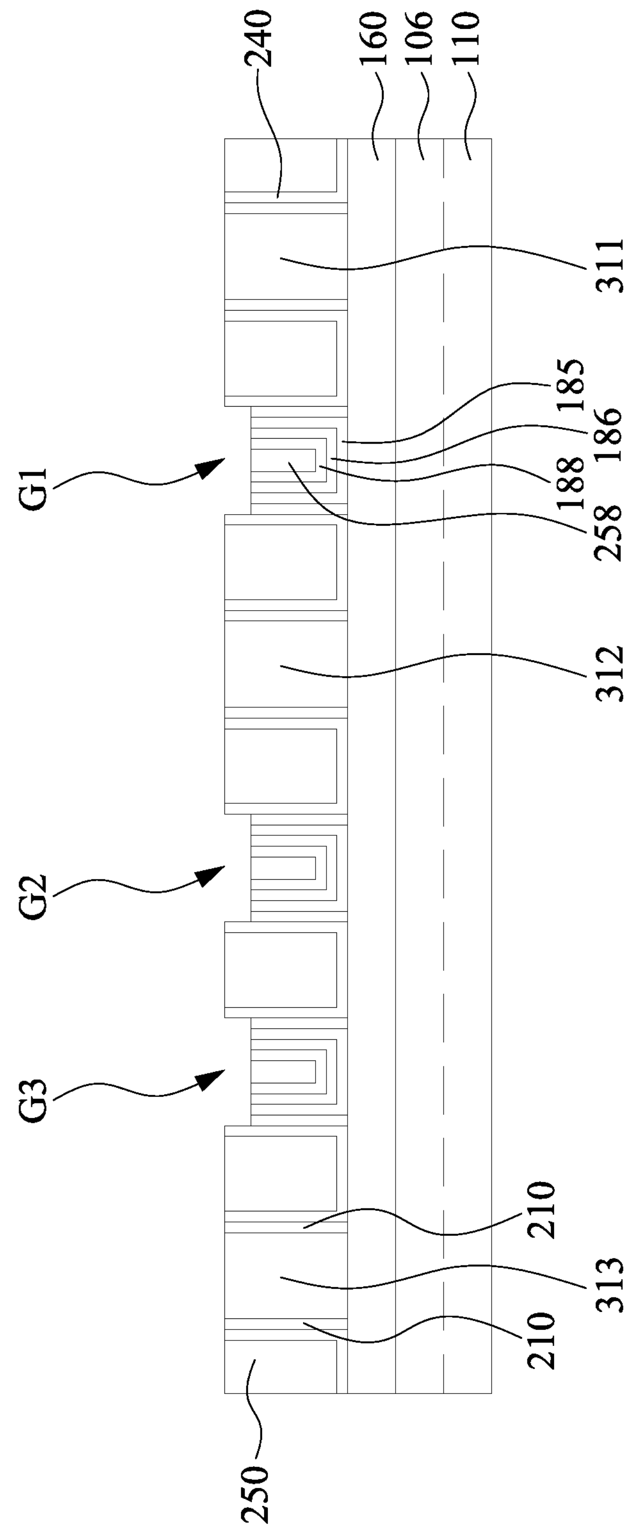
Figure 32A:
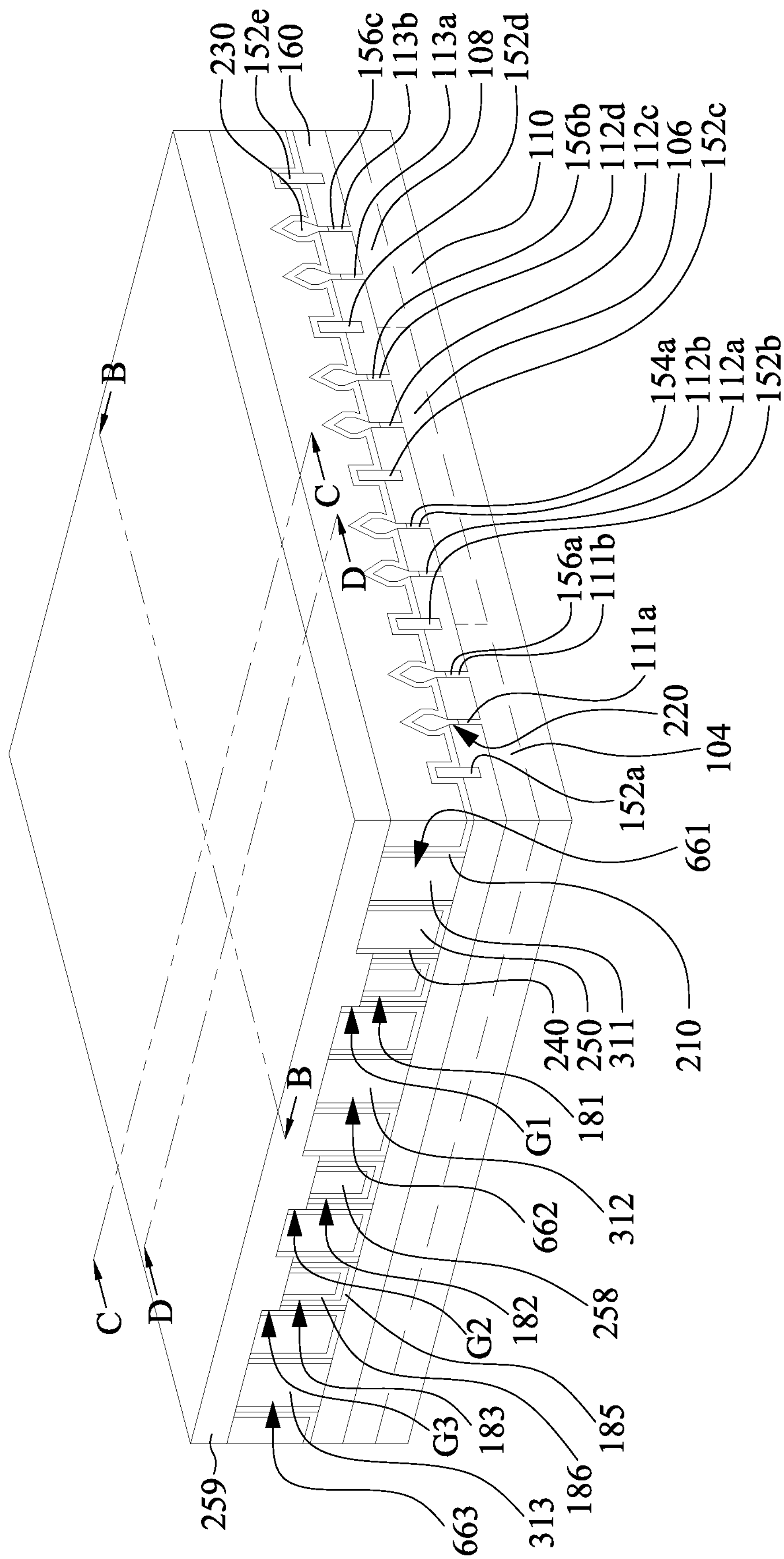
Figure 32B:
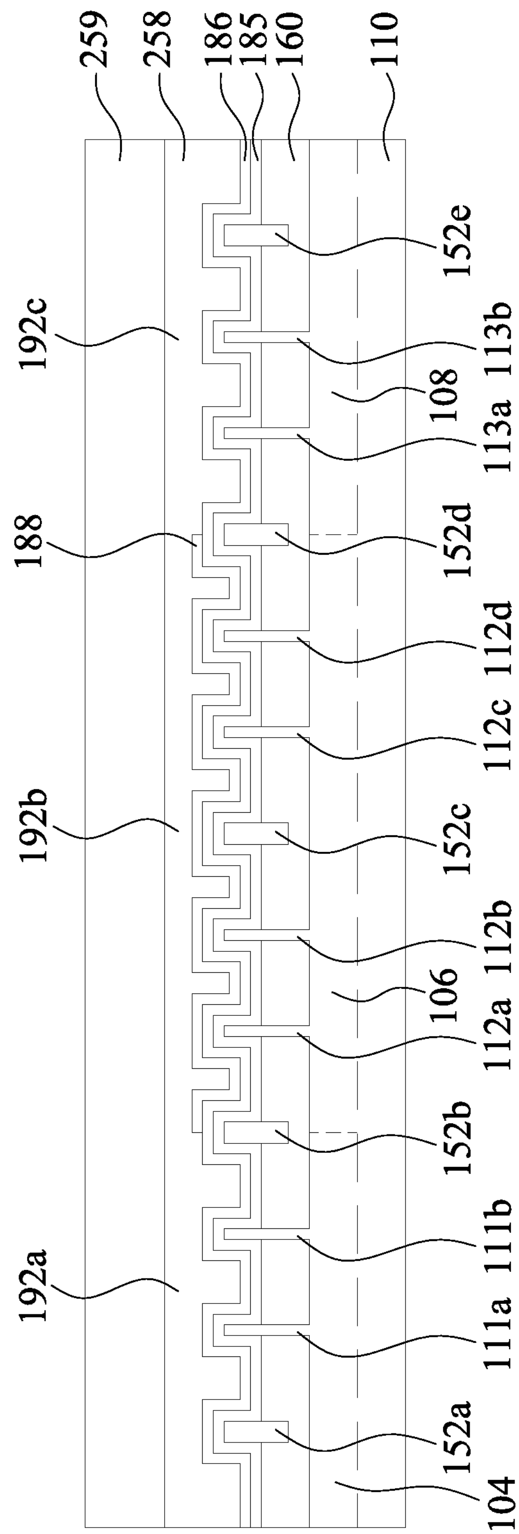
Figure 32C:
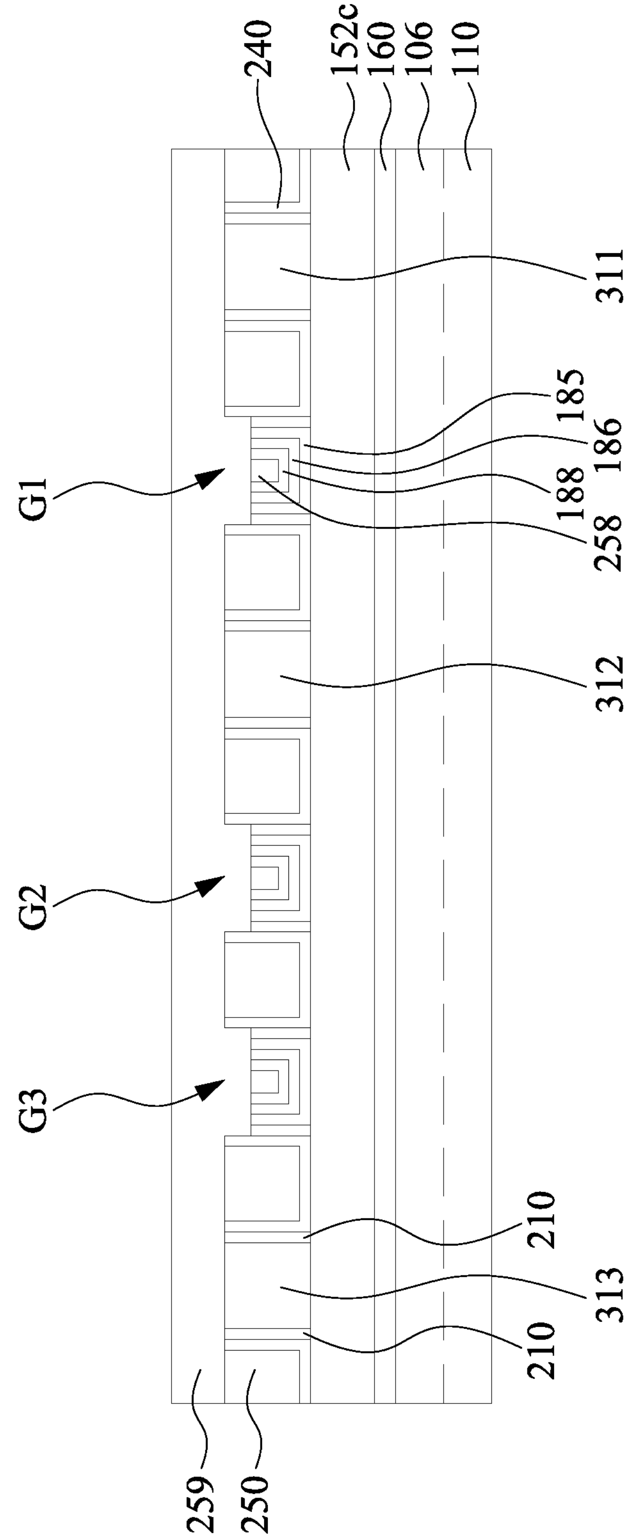
Figure 32D:
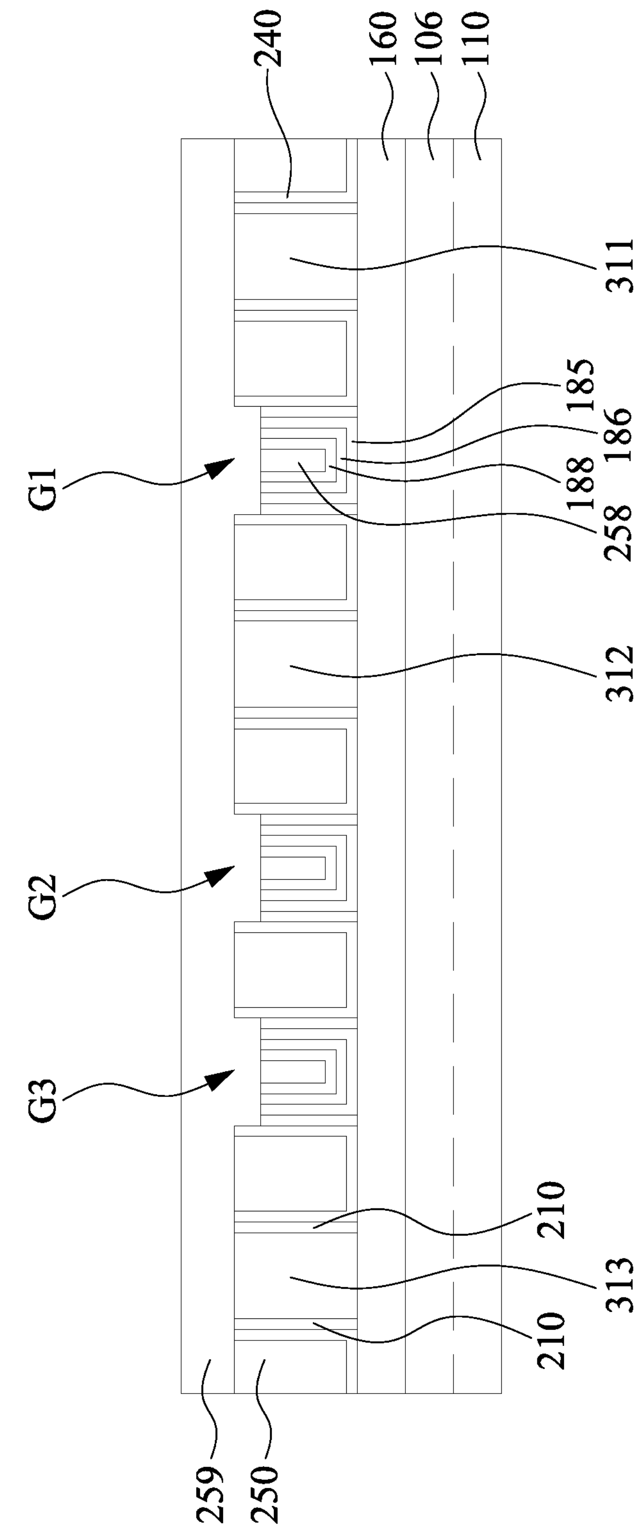
Figure 33A:
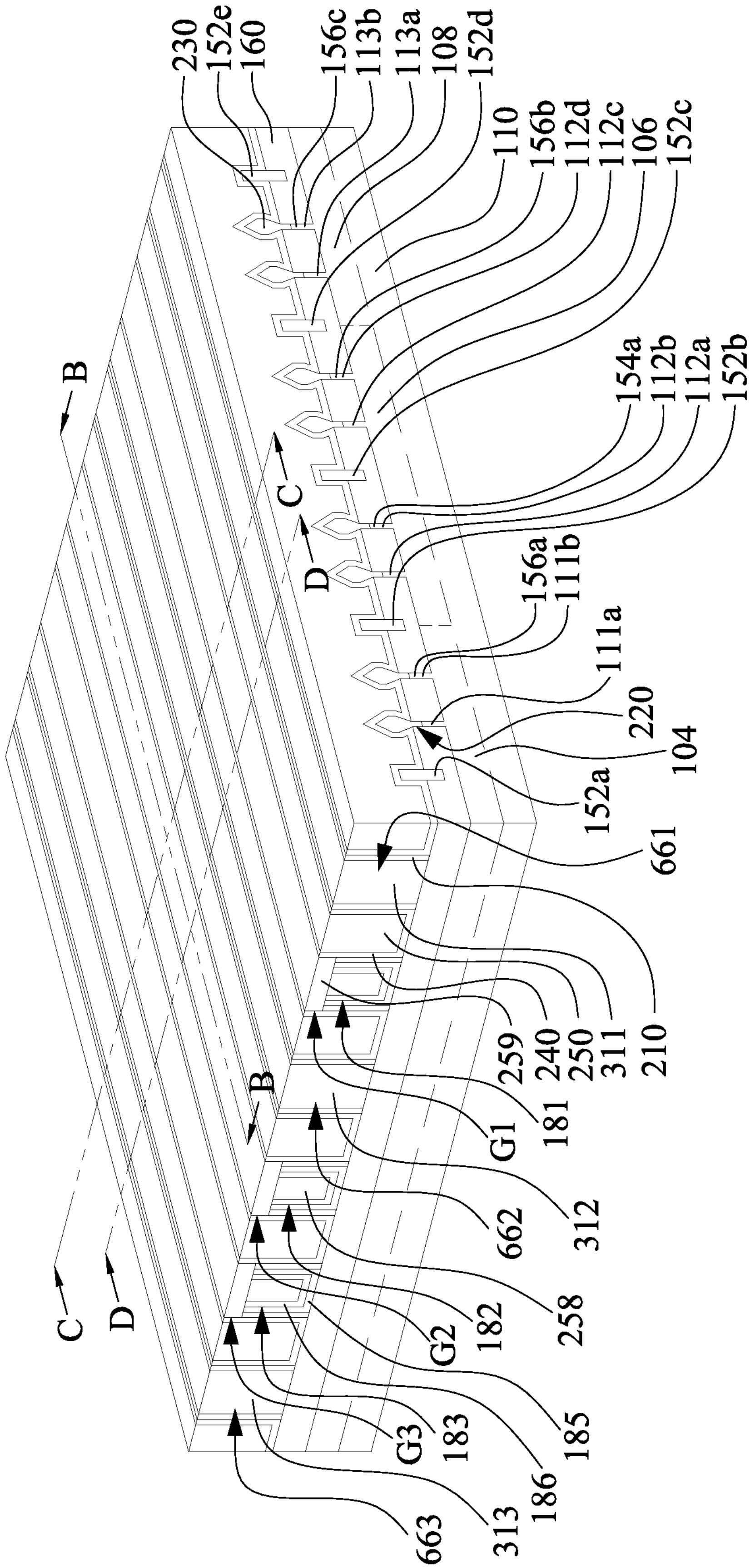
Figure 33B:
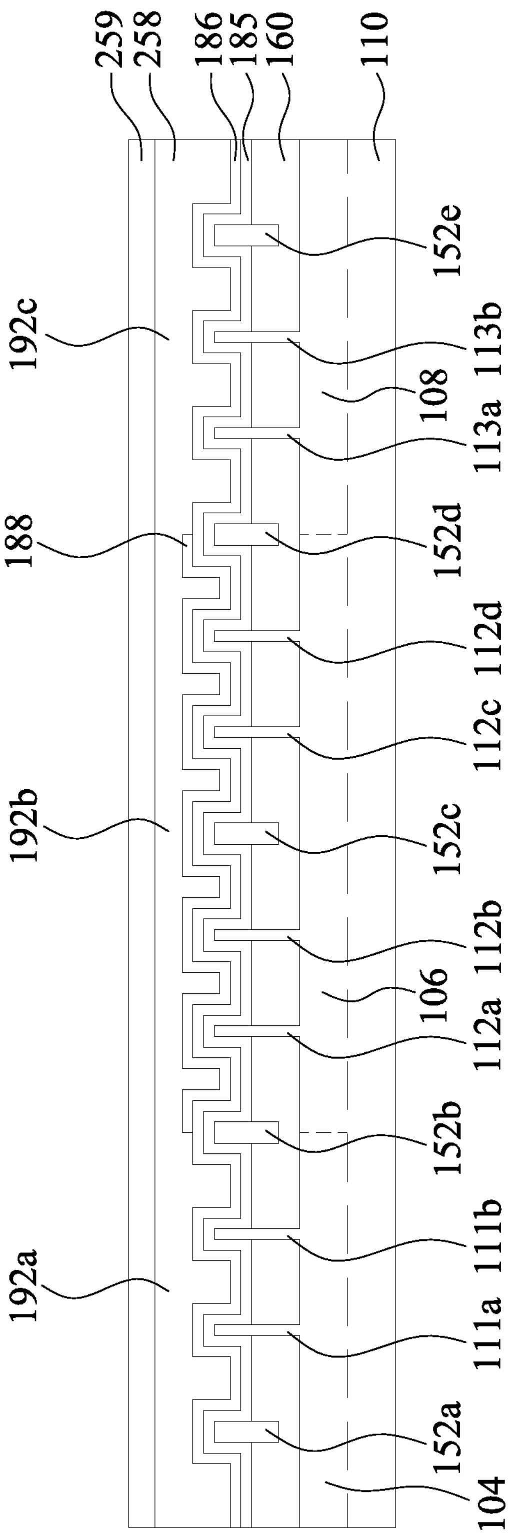
Figure 33C:
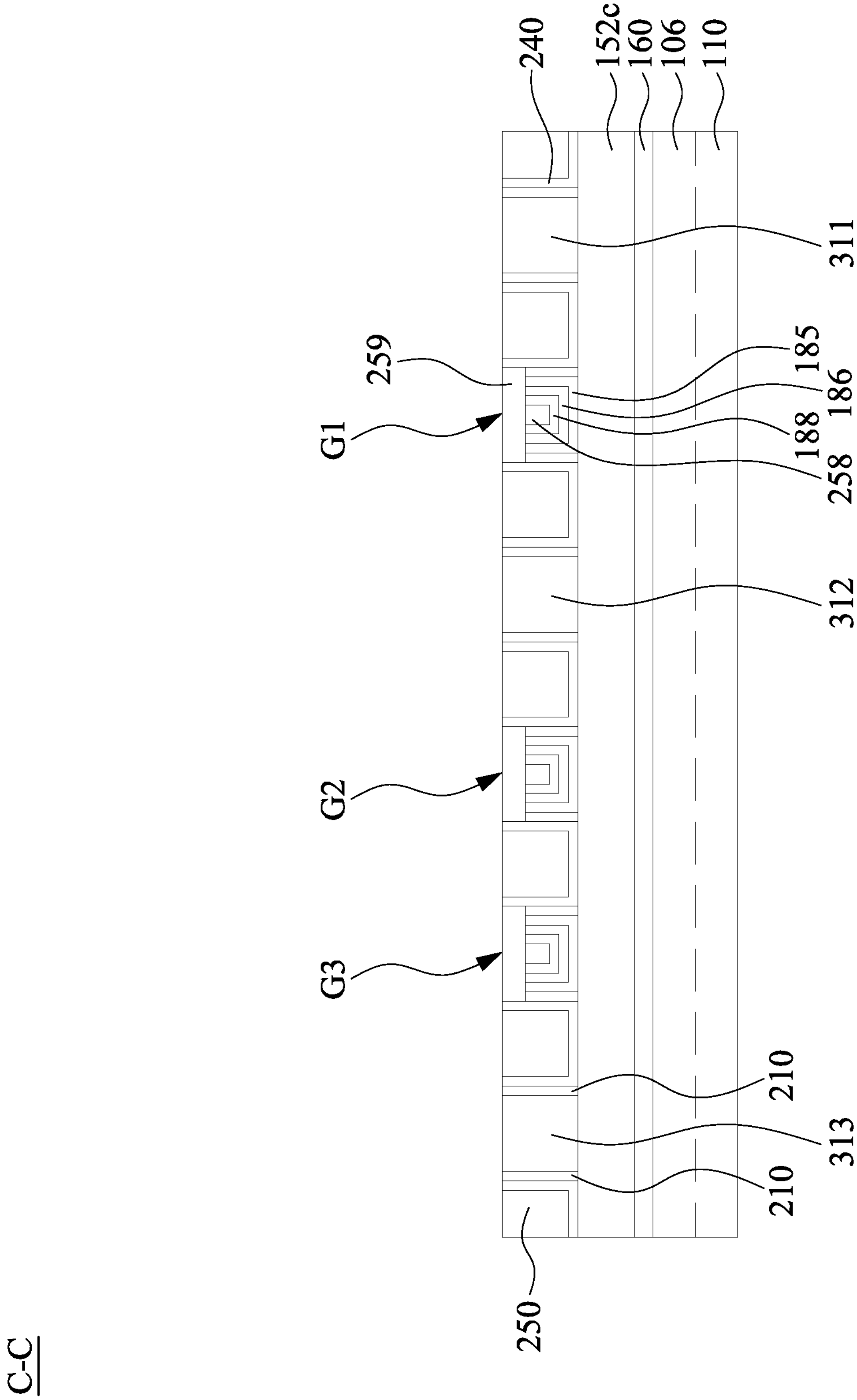
Figure 33D:
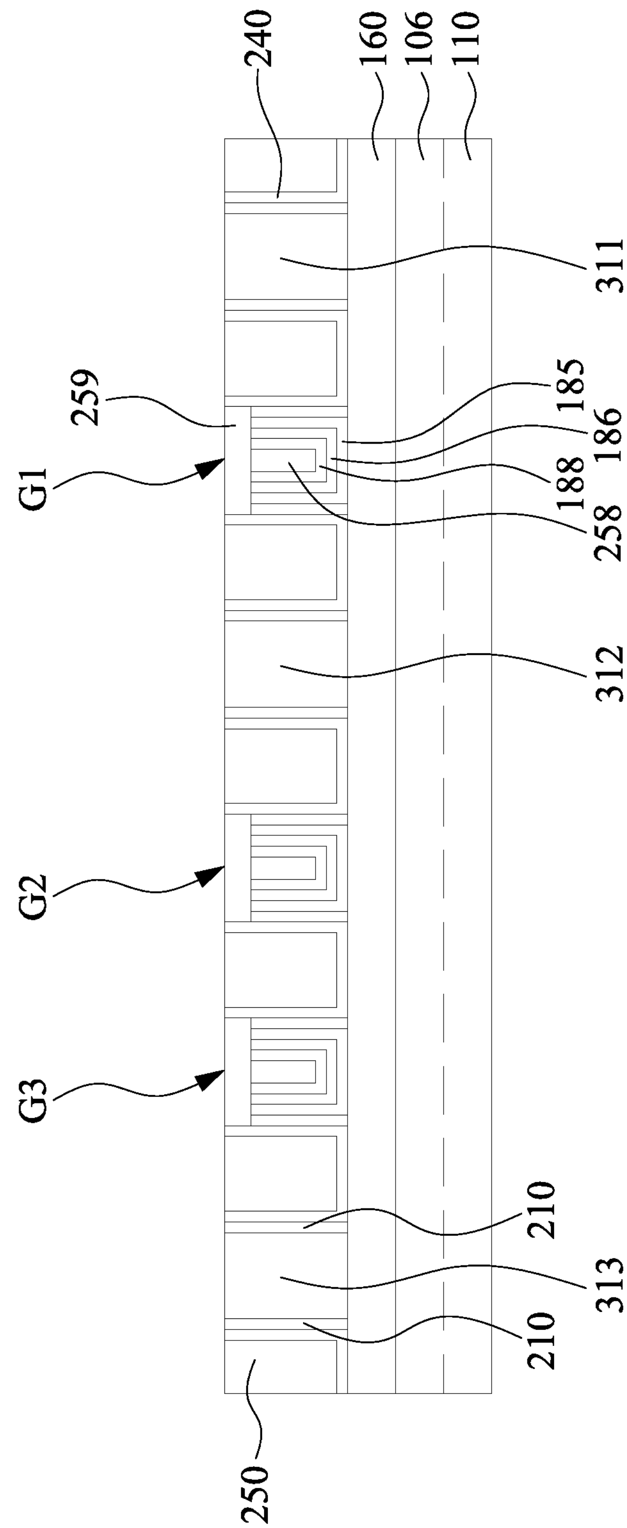

Reference is made to FIG. 30A to FIG. 30D. A chemical mechanical planarization (CMP) process is applied to remove excessive filling conductor 258, gate dielectric layer 185, and the work function layers 186 and 188 outside the recesses 181, 182, and 183 to provide a substantially planar top surface. The remaining work function layers 186 and 188 and the remaining filling conductor 258 form a gate stack G1 in the recess 181. The remaining work function layers 186 and 188 and the remaining filling conductor 258 form a gate stack G2 in the recess 182. The remaining work function layers 186 and 188 and the remaining filling conductor 258 form a gate stack G3 in the recess 183. The gate stacks G1, G2, and G3 may be referred to as metal gate electrodes in some cases. It is understood that the formation of the gate stacks G1, G2, and G3 mentioned above is illustrative, and is not limiting the present disclosure. In some embodiments, portions of the gate stack G2 above the P-type wills as shown in FIG. 30B may be referred to as NMOS metal gate electrodes 192*a* and 192*c* and another portion of the gate stack G2 above the N-type will as shown in FIG. 30B may be referred to as PMOS metal gate electrodes 192*b*.

Reference is made to FIG. 31A to FIG. 31D. An etching back is performed to remove portions of the gate stacks G1, G2, and G3 and the gate dielectric layer 185. A mask layer may be used in the etching process. Portions of the recesses 181, 182, and 183 reappear with shallower depth. Top surfaces of the gate stacks G1, G2, and G3 are no longer level with the ILD layer 250. Sidewalls of the gate spacers 210 are then exposed from the gate dielectric layer 185, the work function layers 186 and 188, and the filling conductor 258.

Reference is made to FIG. 32A to FIG. 33D. A hard mask 259 fills in the remaining of the recesses 181, 182, and 183 and over the gate spacers 210 and the ILD layer 250 as shown in FIG. 32A to FIG. 32D. A material of the hard mask 259 includes, for example, SiO, SiN, SiOC, SiON, SiOCN. In some embodiments, the hard mask 259 includes nitride base dielectric or metal oxide dielectric, For example, the hard mask 259 may include Hf oxide (e.g., $HfO_2$), Ta oxide (e.g., $Ta_2O_5$), Ti oxide (e.g., $TiO_2$), Zr oxide (e.g., $ZrO_2$), Al oxide (e.g., $Al_2O_3$), Y oxide (e.g., $Y_2O_3$), or combinations thereof. In some embodiments, an etching selectivity between the gate spacers 210 and the hard mask 259 is larger than approximately 10. In some embodiments, an etching selectivity between the ILD layer 250 and the hard mask 259 is larger than approximately 10. The hard mask 259 serve as a protection layer to its underlying components, for example, the gate dielectric layers 185 and the gate stacks G1, G2, and G3. As shown in FIG. 33A to FIG. 33D, a CMP process is applied to remove excessive hard mask 259 outside the recesses 181, 182, and 183 to provide a substantially planar top surface with the ILD layer 250. Thereafter, the remaining hard mask 259 has a thickness in range from about 2 nm to about 60 nm. In some embodiments, the hard mask 259 can be a single layer or multiple layers.

Figure 34A:
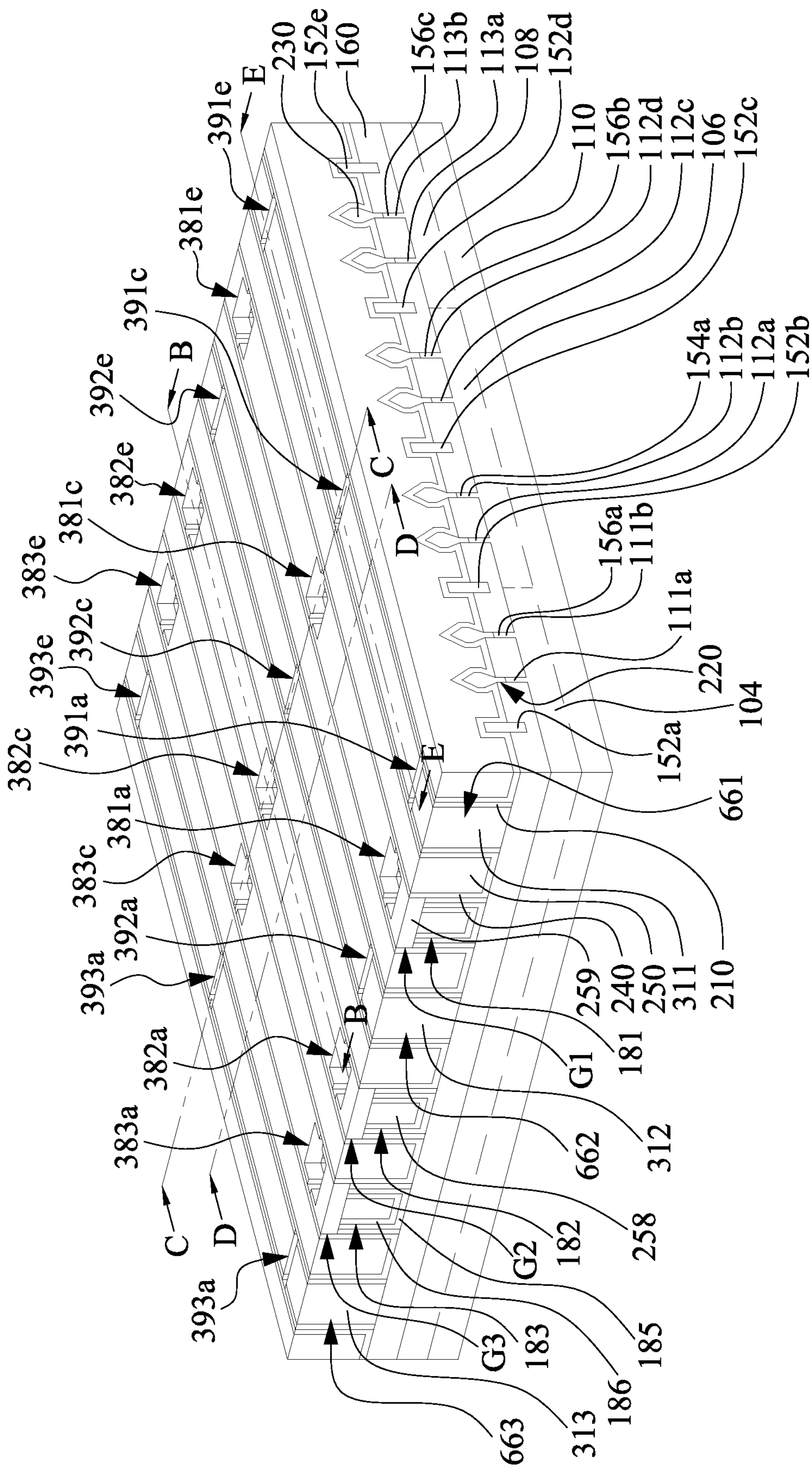
Figure 34B:
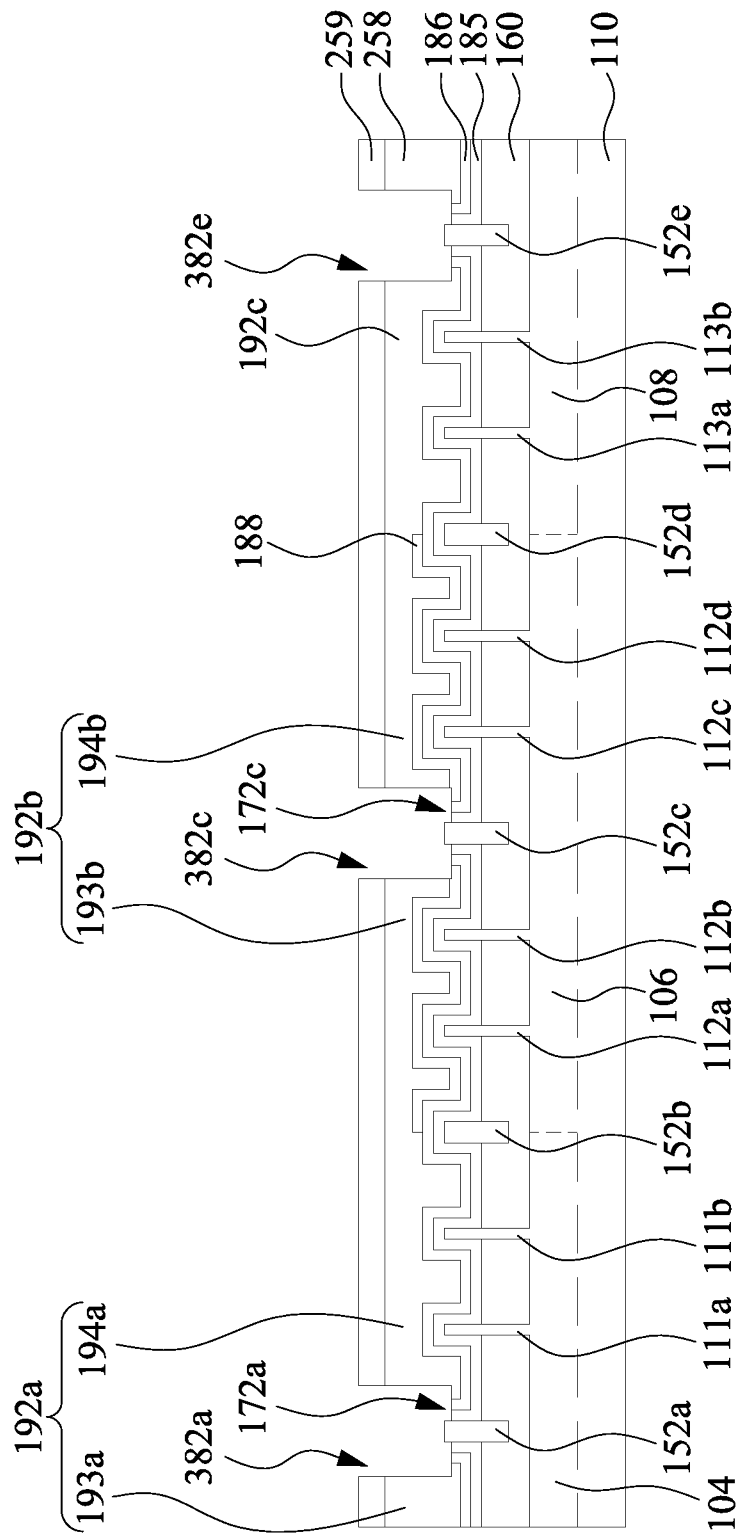
Figure 34C:
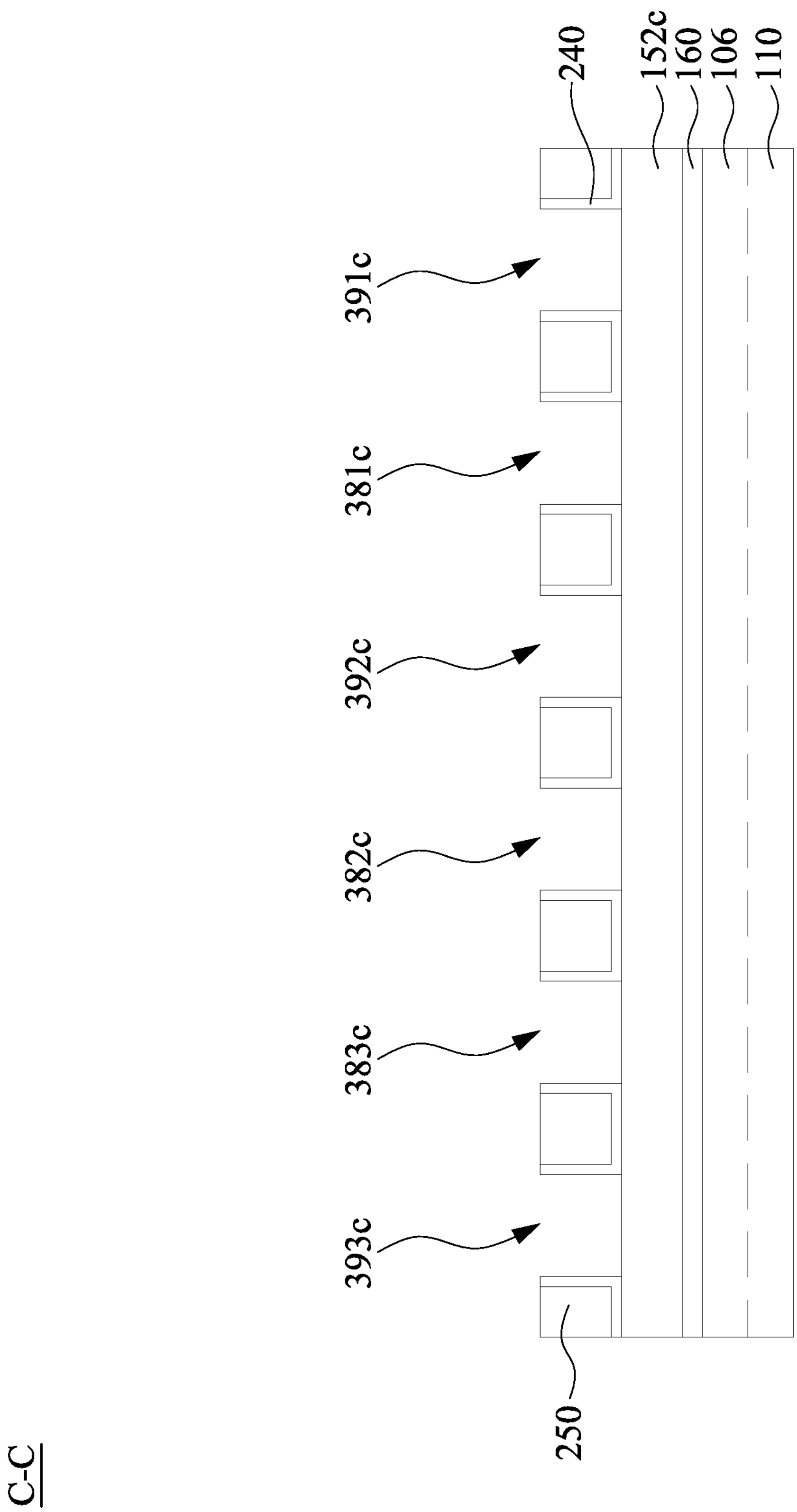
Figure 34D:
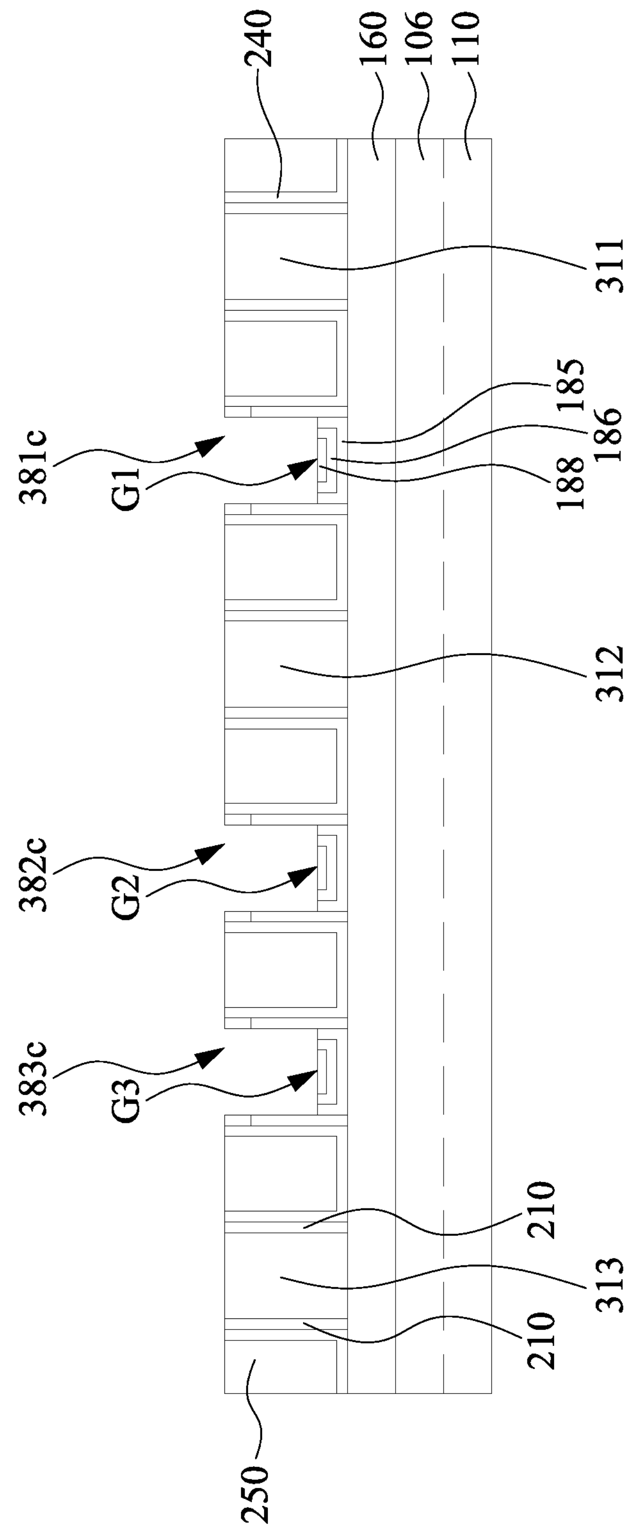
Figure 34E:
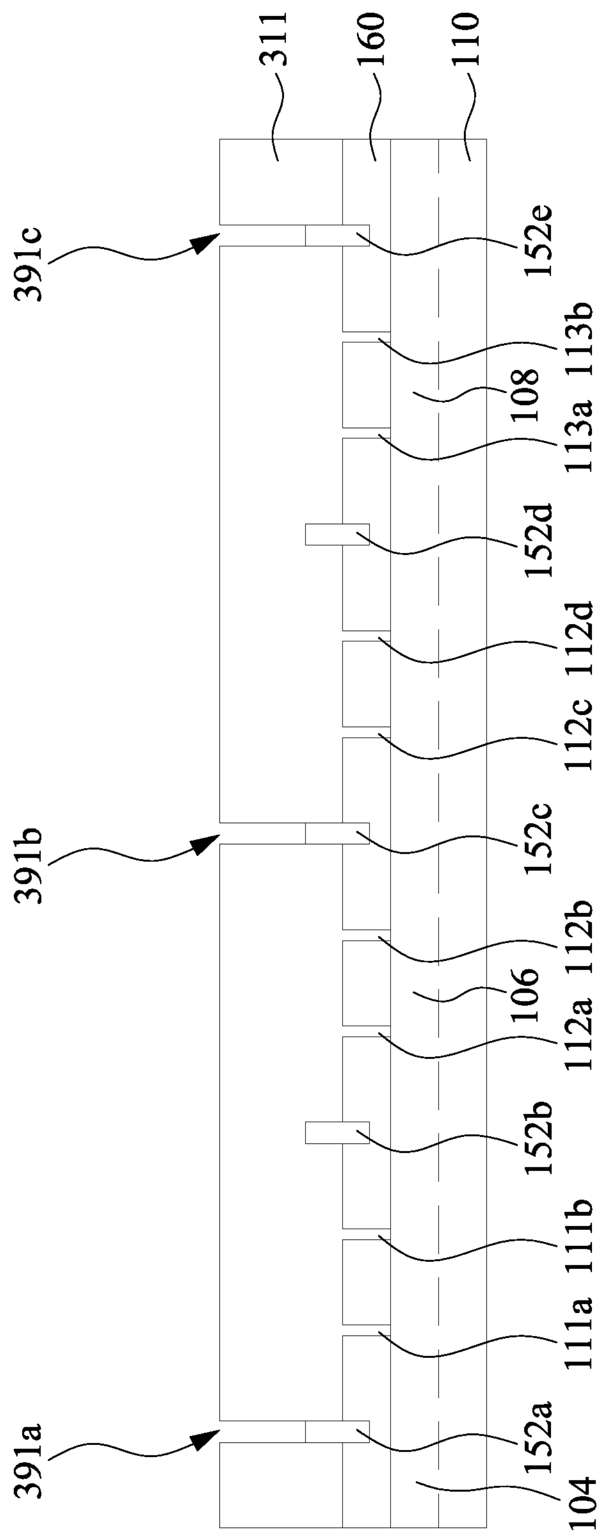
FIG. 34E illustrates cross-sectional views along line E-E in FIG. 34A.

Reference is made to FIG. 34A to FIG. 34E. In some embodiment, one or more etching processes including wet etch and dry etch is performed to remove portions of the gate spacers 210, the gate dielectric layer 185, and the gate stacks G1, G2, and G3 vertically above the dielectric fins 152*a*, 152*c*, and 152*e* as shown in FIG. 34B and FIG. 34C. In some embodiment, one or more etching processes is performed to remove portions of the gate dielectric layer 185 and the gate stacks G1, G2, and G3 on sidewalls of the dielectric fins 152*a*, 152*c*, and 152*e* as shown in FIG. 34B and FIG. 34D. In some embodiment, one or more etching processes is performed to remove portions of the dummy gate 311, 312, and 313 vertically above the dielectric fins 152*a*, 152*c*, and 152*e* as shown in FIG. 34E. Hence, openings 381*a*, 382*a*, and 383*a* are formed above the dielectric fin 152*a*, openings 381*c*, 382*c*, and 383*c* are formed above the dielectric fin 152*c*, openings 381*e*, 382*e*, and 383*e* are formed above the dielectric fin 152*e*, and openings 391*a*-393*e* are formed above the corresponding dielectric fins 152*a*, 152*c*, and 152*e*.

For example, in FIG. 34A and FIG. 34B, the dielectric fin 152*c* is exposed from a bottom of the opening 382*c*. The bottom of the opening 382*c* is lower than a top surface the dielectric fin 152*c*, not level with the top surface the dielectric fin 152*c*. The metal gate electrodes 192*b* is separated to form a first portion 193*b* and a second portion 194*b* spaced apart from the first portion 193 by the opening 382*c*. Further, a recess 172*c* is formed among a sidewall of the dielectric fin 152*c*, a sidewall of the opening 382*c*, and sidewalls of the gate spacers 210 shown in FIG. 34D. Portions of the gate spacers 210 vertically above the dielectric fin 152*c* are removed as shown in FIG. 34C, but other portions of the gate spacers 210 vertically above the recess 172*c* are remained as shown in FIG. 34D.

Similarly, in FIG. 34A and FIG. 34B, the dielectric fin 152*a* is exposed from a bottom of the opening 382*a*. The bottom of the opening 382*a* is lower than a top surface the dielectric fin 152*a*, not level with the top surface the dielectric fin 152*a*. The metal gate electrodes 192*a* is separated to form a first portion 193*a* and a second portion 194*a* spaced apart from the first portion 193*a* by the opening 382*a*. Further, a recess 172*a* is formed between a sidewall of the dielectric fin 152*a*, a sidewall of the opening 382*a*, and sidewalls of the gate spacers 210. Portions of the gate spacers 210 vertically above the dielectric fin 152*a* are removed as shown in FIG. 34C, but other portions of the gate spacers 210 vertically above the recess 172*a* are remained as shown in FIG. 34D.

Reference is made to FIG. 35A to FIG. 35E. For example, a high-k dielectric material is filled in the openings 381*a*, 381*e*, 382*a*, 382*e*, 383*a*, 383*e* above the P-type wells 104 and 108 to form dielectric plugs 390, filled in the openings 381*c*, 382*c*, 383*c* above the N-type well 106 to form dielectric plugs 392. Thicknesses of the dielectric plugs 390 and 392 are greater than a thickness of the hard mask 259. In some embodiments, at least one of the dielectric plugs 390 and 392 has a thickness greater than the thickness of the hard mask at least about 2 nm. Top surfaces of the dielectric plugs 390 and 392 are flush with a top surface of the hard mask 259. In some embodiments, a high-k dielectric material is filled in the openings 391*a*, 391*c*, 391*e*, 392*a*, 392*c*, 392*e*, 393*a*, 393*c*, and 393*e* within the dummy gates 311, 312, and 313 to form dielectric plugs 394.

As shown in FIG. 35B, the dielectric plug 392 runs through the hard mask 259 to straddle the dielectric fin 152*c*, is in contact with the sidewalls and a top surface of the dielectric fin 152*c*, and further embedded in the recess 172*c*. In some embodiments, the dielectric plug 392 is interposed between the first and second portions 193*b* and 194*b* of the PMOS metal gate electrodes 192*b* so as to act as an isolator between two active devices. On the other hands, the PMOS metal gate electrodes 192*b* is in contact with a sidewall and a bottom surface of the dielectric plug 392.

In some embodiment, the dielectric plug 392 has a first portion landing on the dielectric fin 152*c* as shown in FIG. 35C and has a second portion landing on the metal gate electrode 192*b* as shown in FIG. 35D. The first portion of the dielectric plug 392 has a width W3 wider than a width W4 of the second portion thereof.

In some embodiment, in FIG. 35B, a bottom surface of the dielectric plug 392 is in contact with portions of gate dielectric layer 185 and work function layers 186 and 188 that cover the sidewalls of the dielectric fin 152*c*. A top surface of the gate dielectric layer 185 in contact with the dielectric plug 392 is lower than a topmost surface of the gate dielectric layer 185 between the work function layer 186 and the semiconductor fins 112*a*-112*d*. In FIG. 35C, a sidewall of the dielectric plug 390 is in contact with the CESL 240. In FIG. 35D, a sidewall of the dielectric plug 390 is in contact with the gate spacer 210 and the hard mask 259 atop the gate spacer 210.

Similarly, in FIG. 35B, the dielectric plug 390 runs through the hard mask 259 to straddle the dielectric fin 152*a*, is in contact with the sidewalls and a top surface of the dielectric fin 152*a*, and further embedded in the recess 172*a*. In some embodiments, the dielectric plug 390 is interposed between the first and second portions 193*a* and 194*a* of the NMOS metal gate electrodes 192*a* so as to act as an isolator between two active devices. On the other hands, the NMOS metal gate electrodes 192*a* is in contact with a sidewall and a bottom surface of the dielectric plug 390. As shown in FIG. 3 and FIG. 35B, the dielectric plug 390 has a first portion landing on the dielectric fin 152*a* and has a second portion landing on the metal gate electrode 192*b*. The first portion of the dielectric plug 390 has a width wider than that of the second portion thereof.

In some embodiment, in FIG. 35B, a bottom surface of the dielectric plug 390 is in contact with portions of gate dielectric layer 185 and work function layer 186 that cover the sidewalls of the dielectric fin 152*a*. A top surface of the gate dielectric layer 185 in contact with the dielectric plug 390 is lower than a topmost surface of the gate dielectric layer 185 between the work function layer 186 and the semiconductor fins 111*a* and 111*b*.

Due to the formation of the dielectric plugs 390 and 392, a space between the gate electrodes on opposite sides of the dielectric plugs 390 or 392 can narrow with excellent gate-end CD (critical dimension) uniformity control. For example, a distance between the first and second portions 193*a* and 194*a* of the gate electrodes 192*a* can be in a range from about 2 nm to about 50 nm. Further, due to the formation of the dielectric plugs 390 and 392, an isolation margin between the source/drain via to the gate electrode for both yield and reliability can be improved, and an isolation margin concern between a self-aligned contact and an end of the gate electrode corner shape region can be resolved.

In some embodiments, at least one of the dielectric plugs 390, 392, and 394 has a thickness in a range from about 4 nm to about 60 nm. In some embodiments, at least one of the dielectric plugs 390, 392, and 394 is made of a material different from that of the hard mask 259. In some embodiments, at least one of the dielectric plugs 390, 392, and 394 is made of a material substantially the same as that of the hard mask 259.

In some embodiments, the dielectric plugs 390, 392, and 394 may include high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, a material of the dielectric plugs 390, 392, and 394 include, for example, SiO, SiN, SiOC, SiON, SiOCN. In some embodiments, the hard mask 259 includes nitride base dielectric or metal oxide dielectric, For example, the hard mask 259 may include Hf oxide (e.g., $HfO_2$), Ta oxide (e.g., $Ta_2O_5$), Ti oxide (e.g., $TiO_2$), Zr oxide (e.g., $ZrO_2$), Al oxide (e.g., $Al_2O_3$), Y oxide (e.g., $Y_2O_3$), or combinations thereof. The dielectric plugs 390, 392, and 394 may be formed by a deposition processes, such as chemical vapor deposition (CVD), physical vapor deposition (PVD), atomic layer deposition (ALD), plasma enhanced CVD (PECVD) or other suitable techniques. Other processes and materials may be used.

Reference is made to FIG. 36A to FIG. 36C. For example, in FIG. 36A, an interlayer dielectric (ILD) layer 440 and the source vias 241, 242, and 243 embedded in the ILD layer 440 are formed over the hard mask 259 and the dielectric plugs 390 and 392. Thereafter, the conductive lines 358-370 are formed on the ILD layer 440 and electrically connected to the corresponding vias. For example, the conductive line 358 is electrically connected to the source via 241, the conductive line 364 is electrically connected to the source via 242, and the conductive line 370 is electrically connected to the source via 243. On the other hands, the source vias 241, 242, and 243 shown in FIG. 3 extend along a direction perpendicular to a lengthwise direction of the gate electrodes G1, G2, or G3 when viewed from above the gate vias. As shown in FIG. 36A, the source vias 241, 242, and 243 land on the corresponding dielectric plugs 390 and 392. Widths of the source vias 241 and 242 along a longitudinal side of the gate electrode G1, G2, or G3 are less than the dielectric plugs 390 and 392, respectively, and are spaced apart from the hard mask 259. As shown in FIG. 36A and FIG. 36C, the source via 242 and 145 passes through the gate electrodes G1, G2, or G3 underlying thereof. In FIG. 36A, the top surface 390*t* of the dielectric plug 390 (may be also referred to as a high-k dielectric layer) is higher than the top surface 194*t* of the second portion 194*a* of metal gate electrodes 192*a*. The portion 194*p* of the second portion 194*a* of metal gate electrodes 192*a* is vertically between the dielectric plug 390 and the substrate 110.

Due to the formation of the source vias 241, 242, and 243, Rc/Rs of a connection between the source via and the contact will be promoted. In addition, the source via can be served as a power mesh line and combined with metal layer M1 to improve both Rs and metal EM reliability.

In FIGS. 36B and 36C, the source contact 142, 145, and 149 each replaces CESL 240 and the ILD layer 250 between the dielectric plugs 390 and 392, passes through the dielectric fin 152*c* underlying thereof, and is connected to the source via 242 and the conductive line 364 between the ILD layer 440 and an MID layer 442. In FIG. 36C, the source contact 142 and 145 each further passes through the isolation layer 160 underlying thereof. Example materials of the ILD layer 440 and/or the IMD layer 189 may include, but are not limited to, SiNx, SiOx, SiON, SiC, SiBN, SiCBN, or combinations thereof.

Figure 37A:
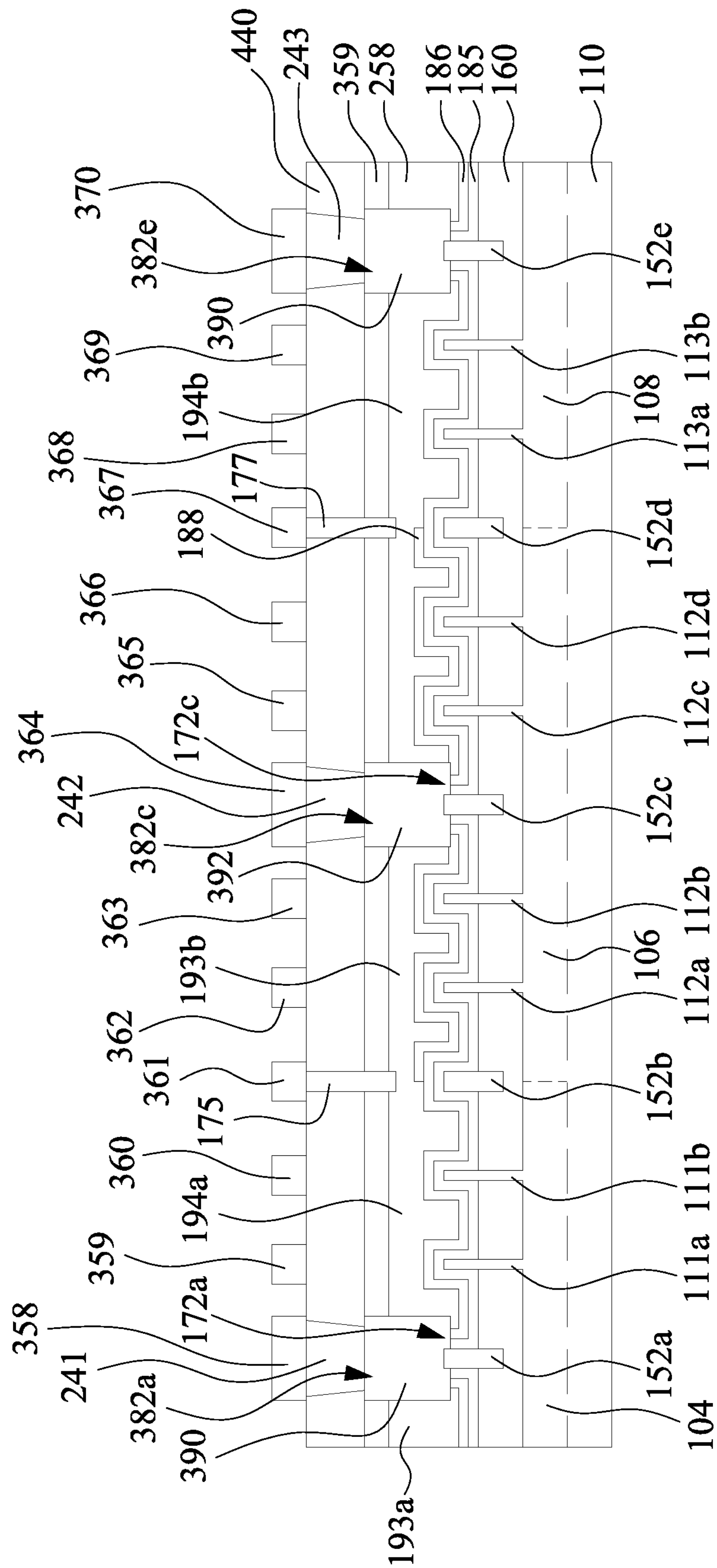
FIG. 37A to FIG. 37C illustrate cross-sectional views as illustrated in FIG. 36A to FIG. 36C respectively for manufacturing a semiconductor device at a stage in accordance with some embodiments of the present disclosure.
Figure 37B:
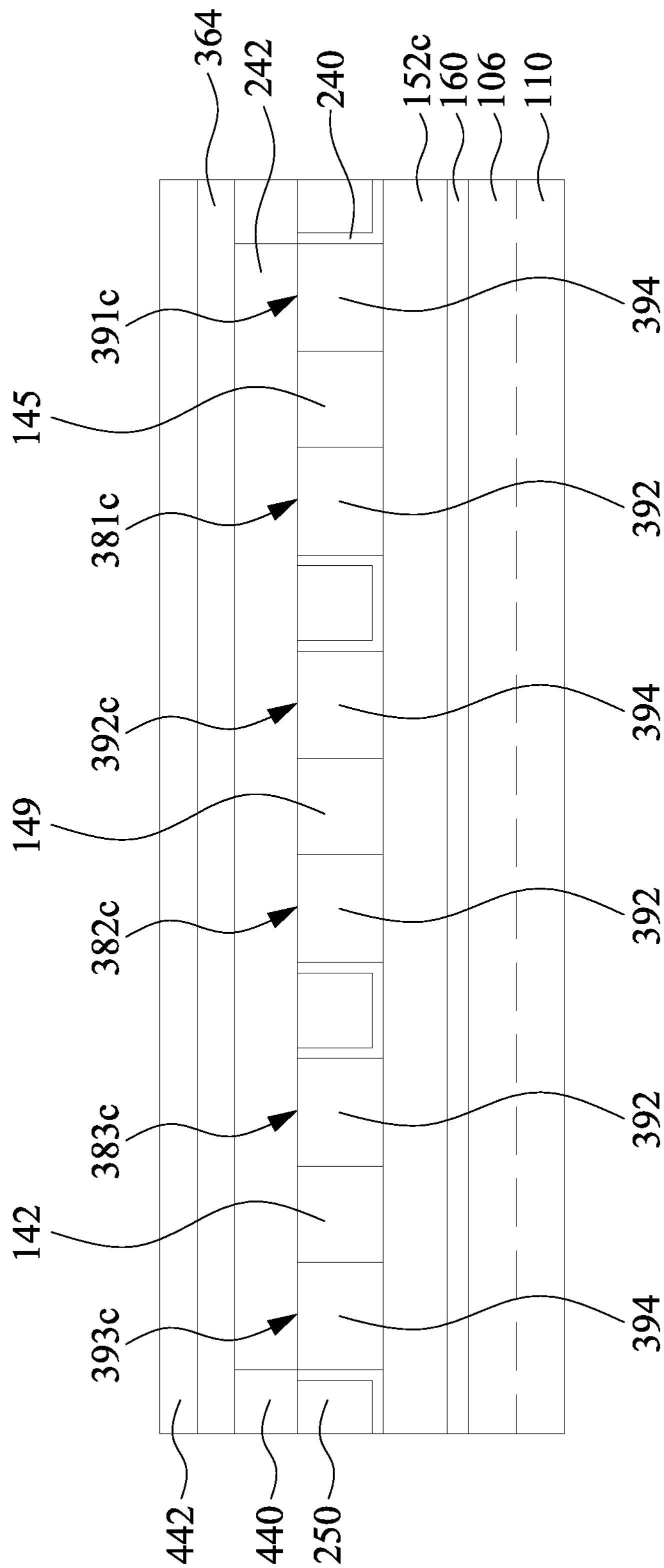
Figure 37C:
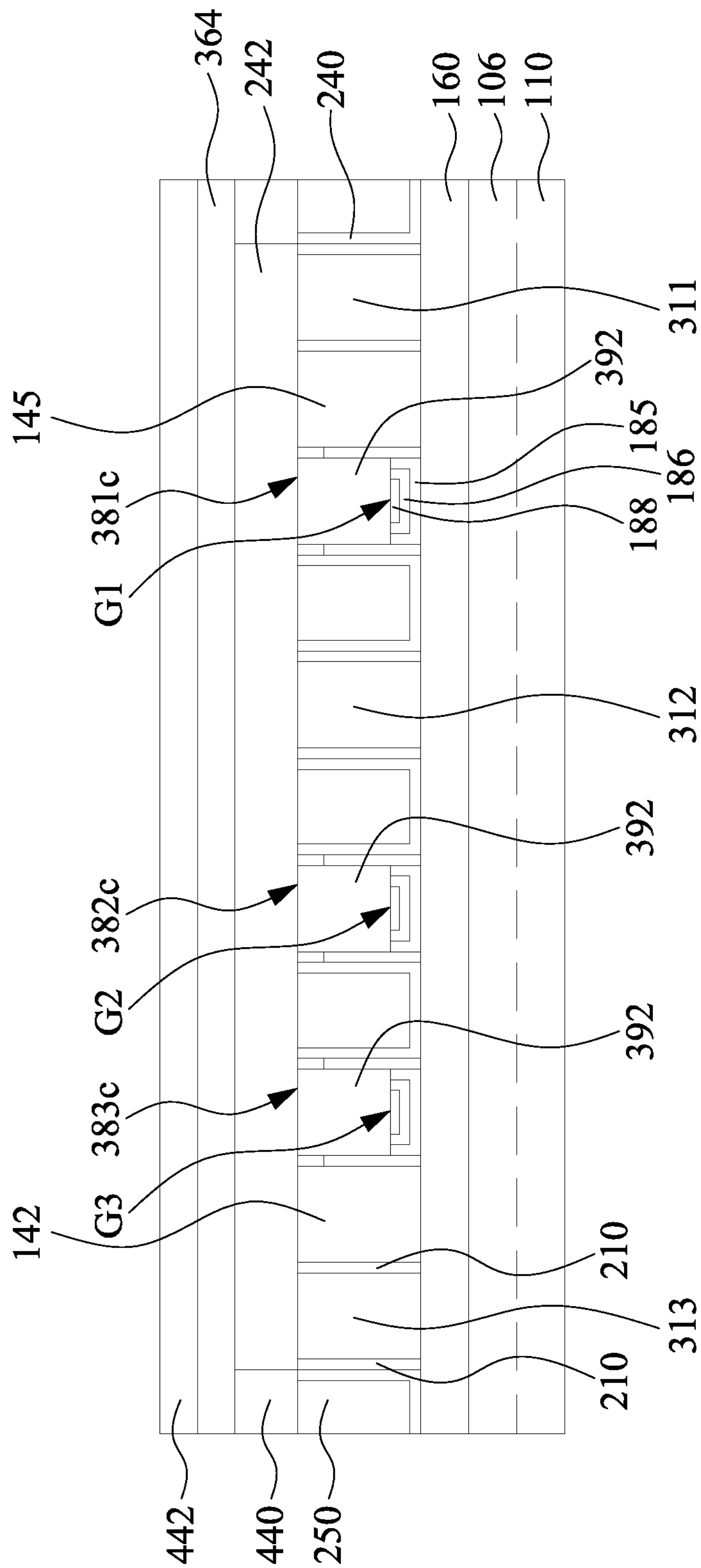

Reference is made to FIG. 37A to FIG. 37C. FIG. 37A to FIG. 37C illustrate cross-sectional views as illustrated in FIG. 36A to FIG. 36C respectively for manufacturing a semiconductor device at a stage in accordance with some embodiments of the present disclosure. As shown in FIG. 37A to FIG. 37C, the structure and function of the components and their relationships in the semiconductor device are substantially the same as that shown in FIG. 36A to FIG. 36C, and the related detailed descriptions may refer to the foregoing paragraphs, and are not described again herein.

It is noted that, the difference between the present embodiment and the embodiment in FIGS. 36A to 36C is in that the hard mask 259 as shown in FIG. 36A is replaced by a hard mask 359 that includes a high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. The hard mask 359 may be formed by a deposition processes, such as chemical vapor deposition (CVD), physical vapor deposition (PVD), atomic layer deposition (ALD), plasma enhanced CVD (PECVD) or other suitable techniques.

Figure 38:
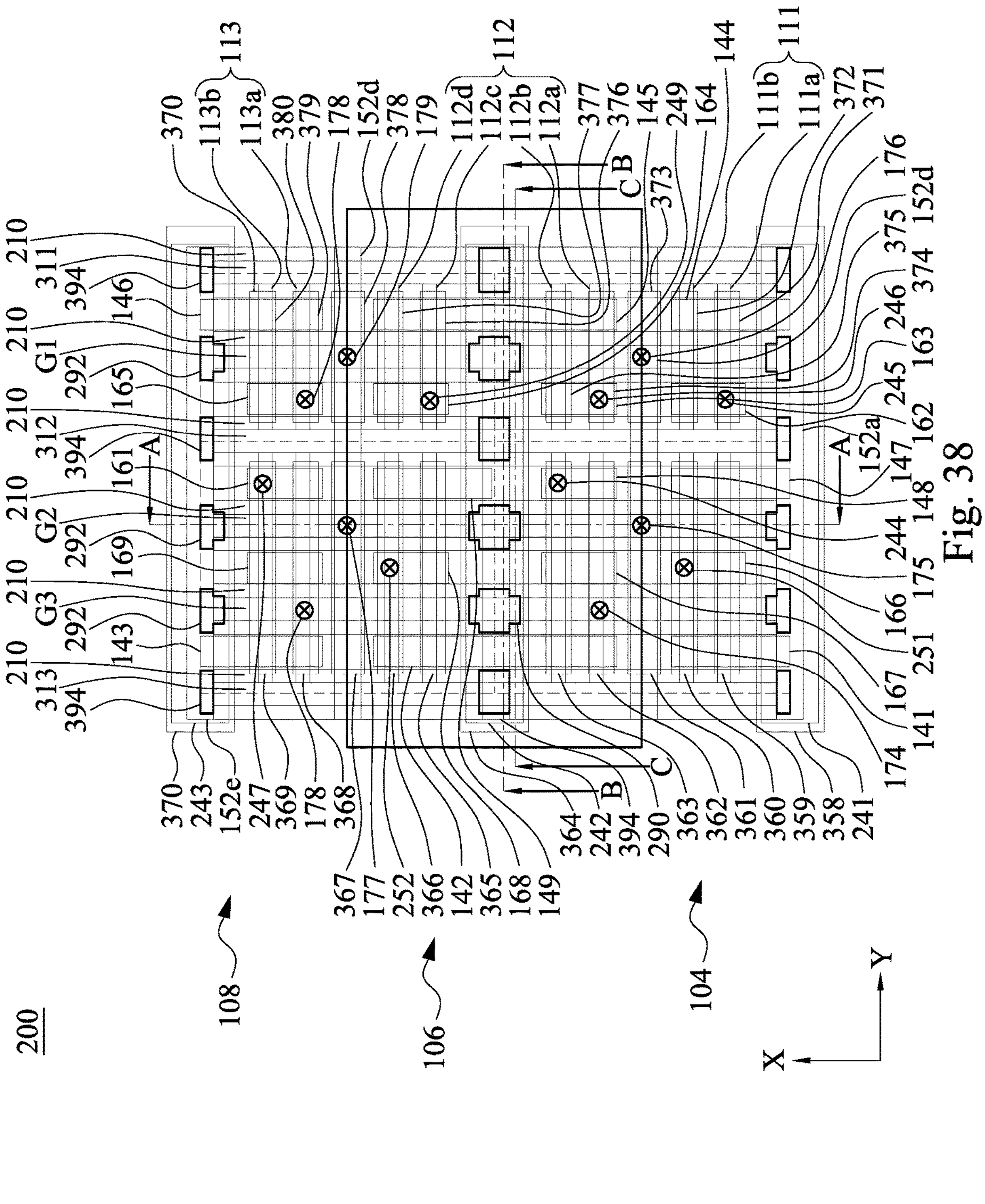
FIG. 38 illustrates a top view of another layout according to some embodiments of the present disclosure.

Reference is made to FIG. 38. FIG. 38 illustrates a top view of a layout 200 according to some embodiments of the present disclosure. As shown in 38, the structure and function of the components and their relationships in the layout 200 are substantially the same as the layout 100 shown in FIG. 3, and the related detailed descriptions may refer to the foregoing paragraphs, and are not described again herein. It is noted that, the difference between the present embodiment and the embodiment in FIG. 3 is in that the dielectric plugs 390 and 392 as shown in FIG. 3 are replaced by a plurality of dielectric plugs 290 and 292, respectively.

Figure 39A:
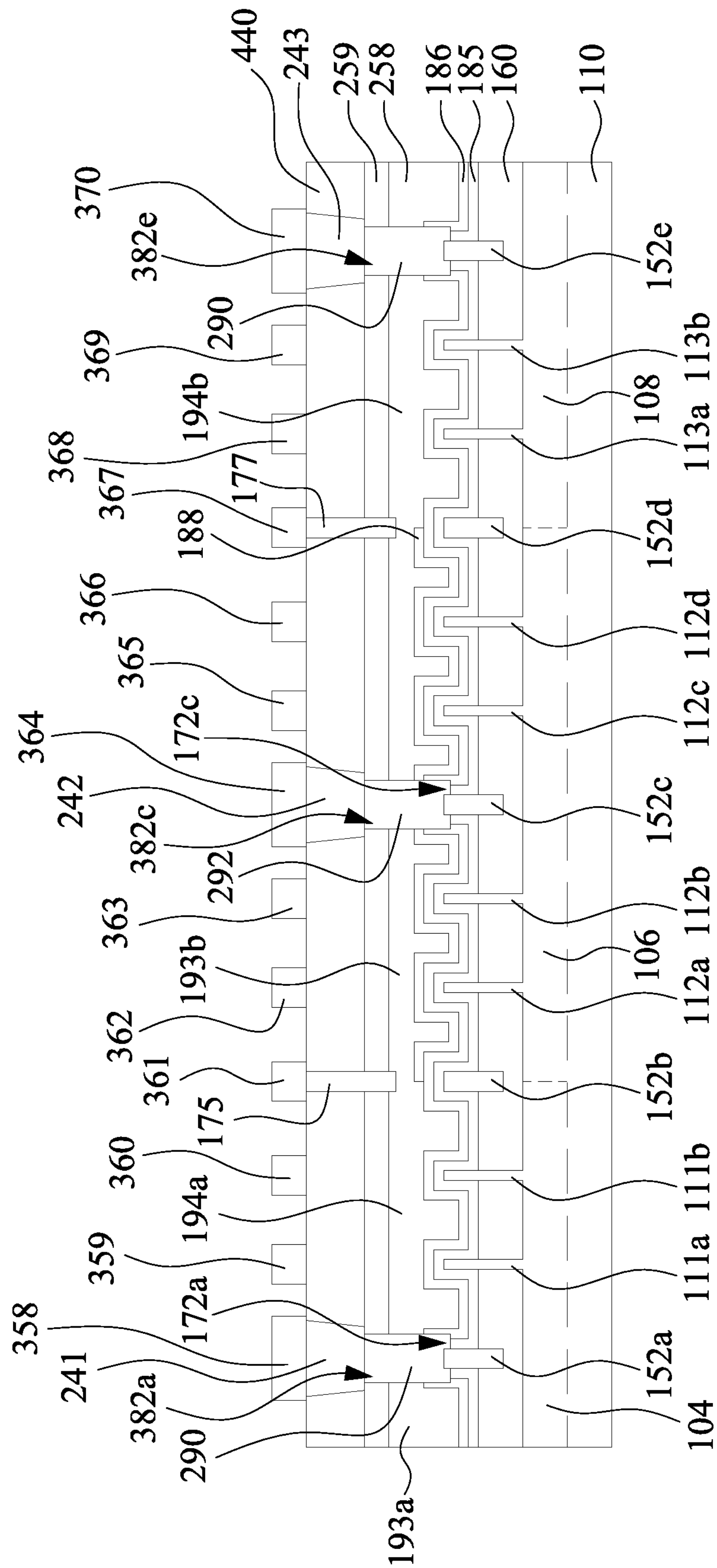
FIG. 39A to FIG. 39C illustrate cross-sectional views corresponding to the line A-A, line B-B, and line C-C as illustrated in FIG. 38 respectively for manufacturing another semiconductor device at a stage in accordance with some embodiments of the present disclosure.
Figure 39B:
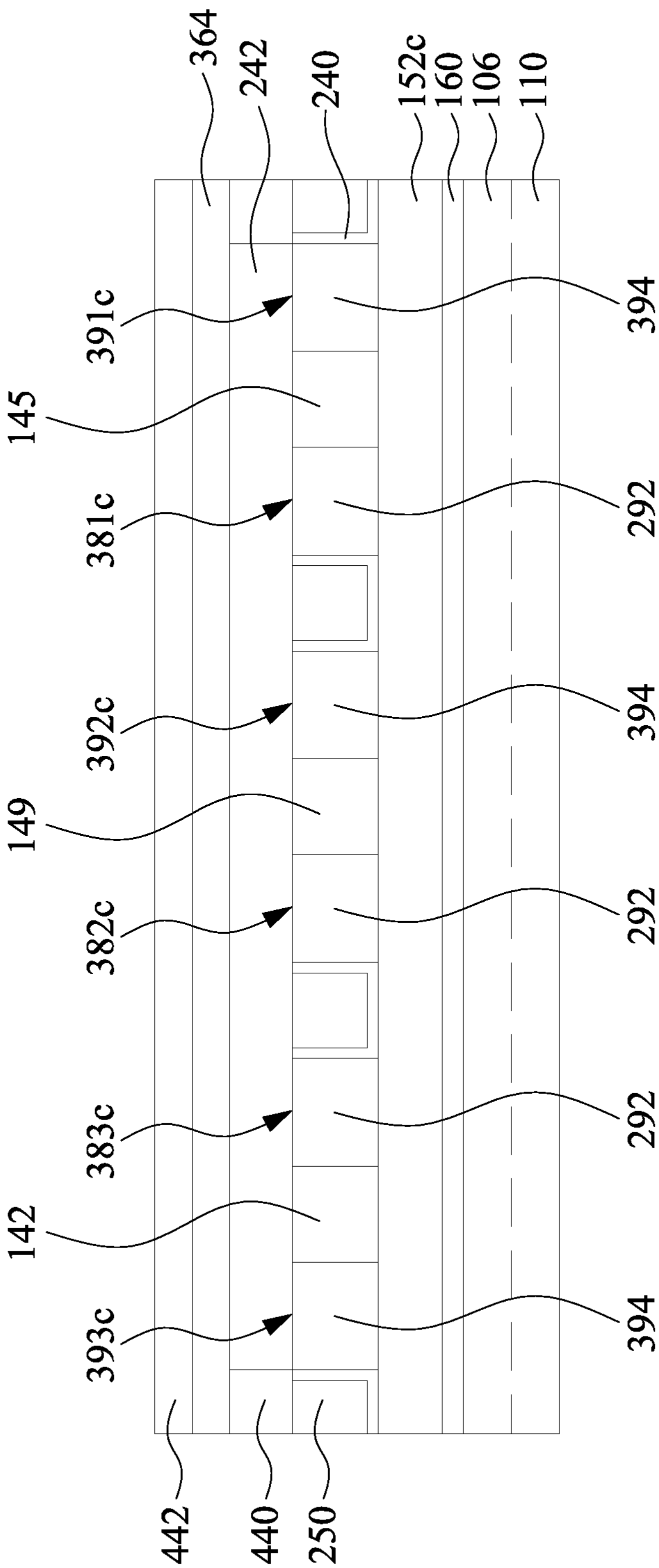
Figure 39C:
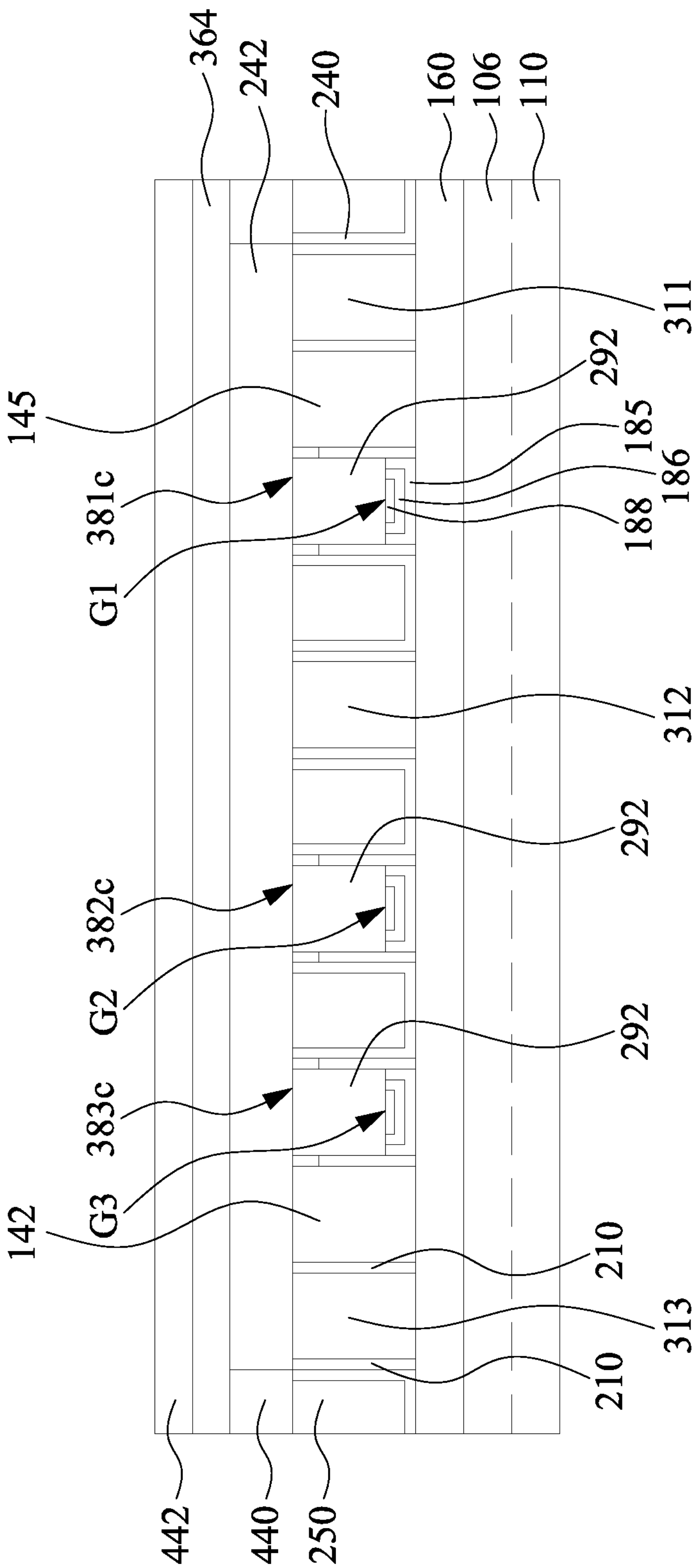

Reference is made to FIG. 39A to 39C. FIG. 39A to FIG. 39C illustrate cross-sectional views corresponding to the line A-A, line B-B, and line C-C as illustrated in FIG. 38 respectively for manufacturing another semiconductor device at a stage in accordance with some embodiments of the present disclosure. As shown in FIG. 39A, widths of the dielectric plugs 290 and 292 along longitudinal side of the gate electrode G1, G2, or G3 are less than the source vias 241 and 242, respectively, and the source vias 241 and 242 as shown in FIG. 39A are in contact with the hard mask 259.

Figure 40A:
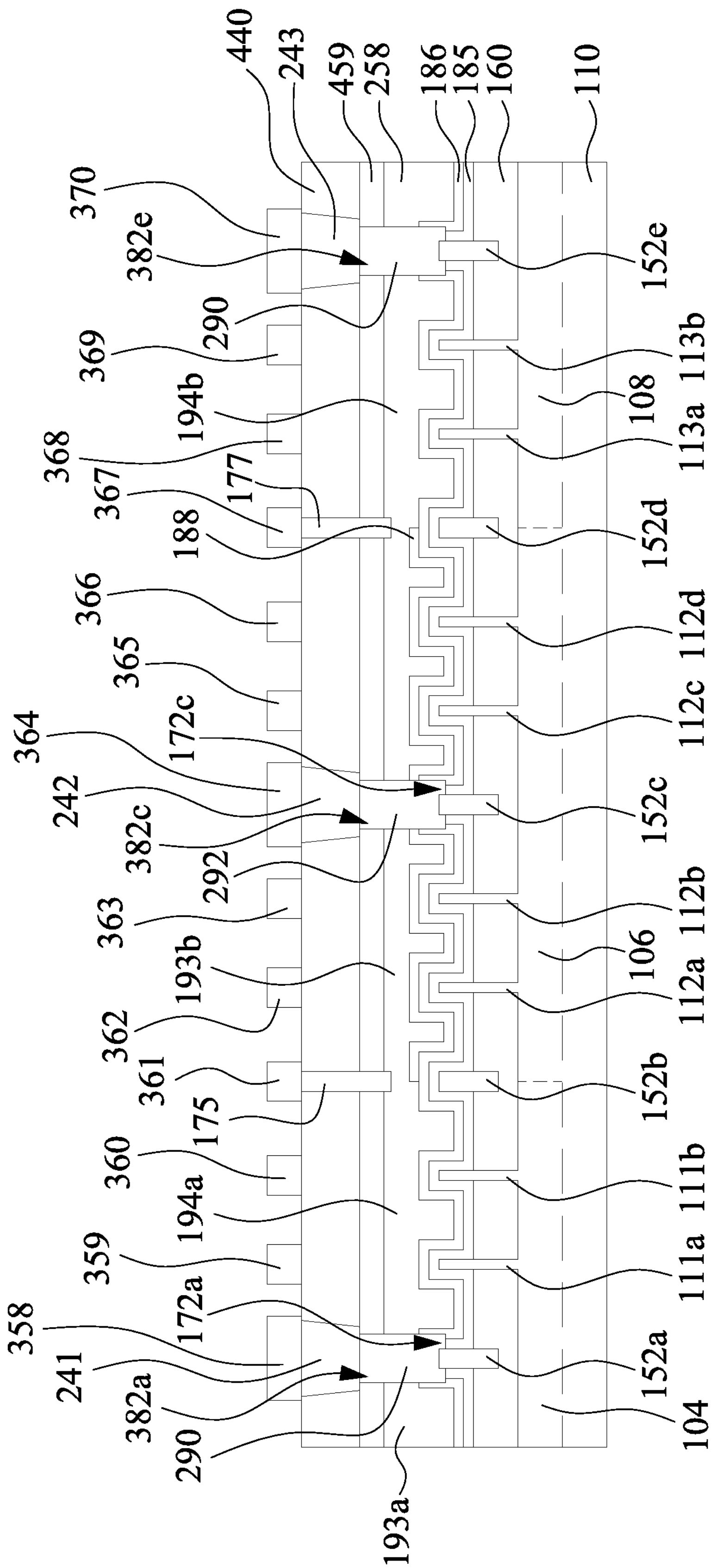
FIG. 40A to FIG. 40C illustrate cross-sectional views corresponding to the line A-A, line B-B, and line C-C as illustrated in FIG. 39A to FIG. 39C respectively for manufacturing another semiconductor device at a stage in accordance with some embodiments of the present disclosure.
Figure 40B:
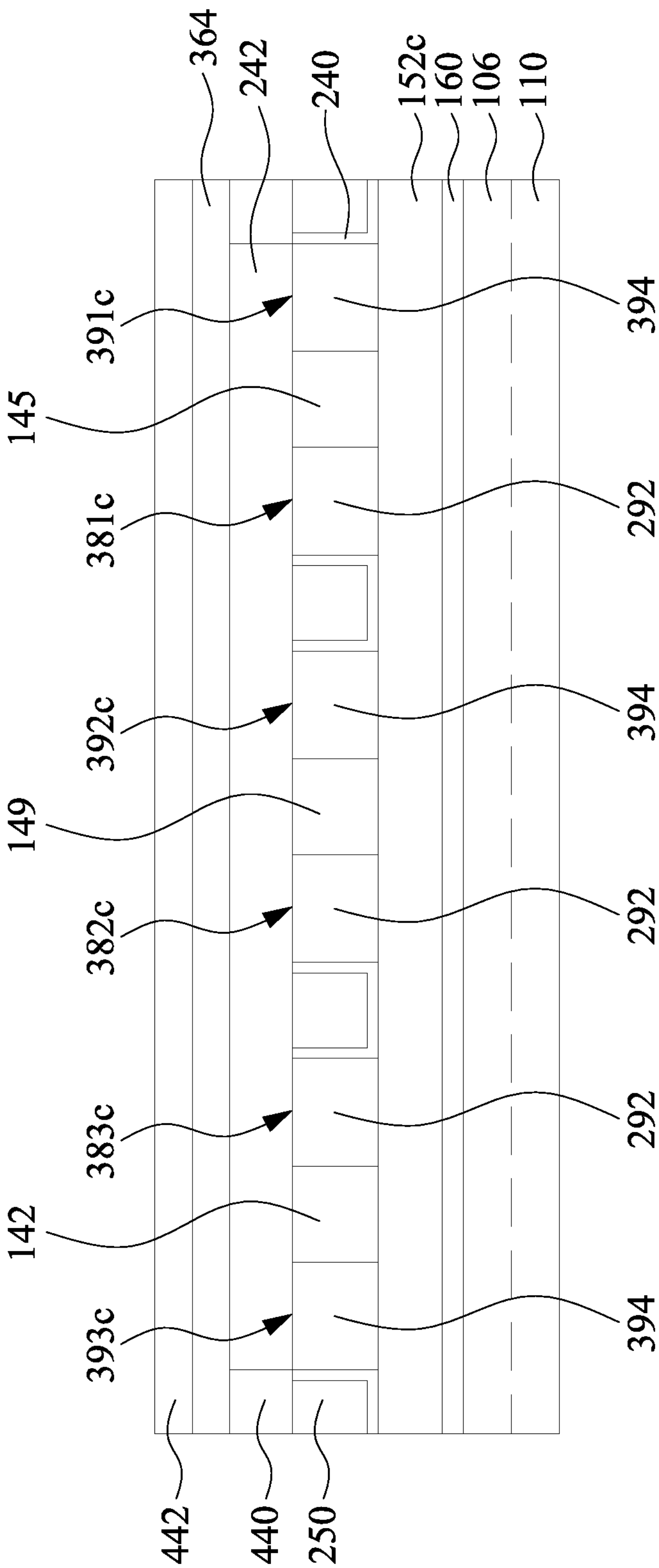
Figure 40C:
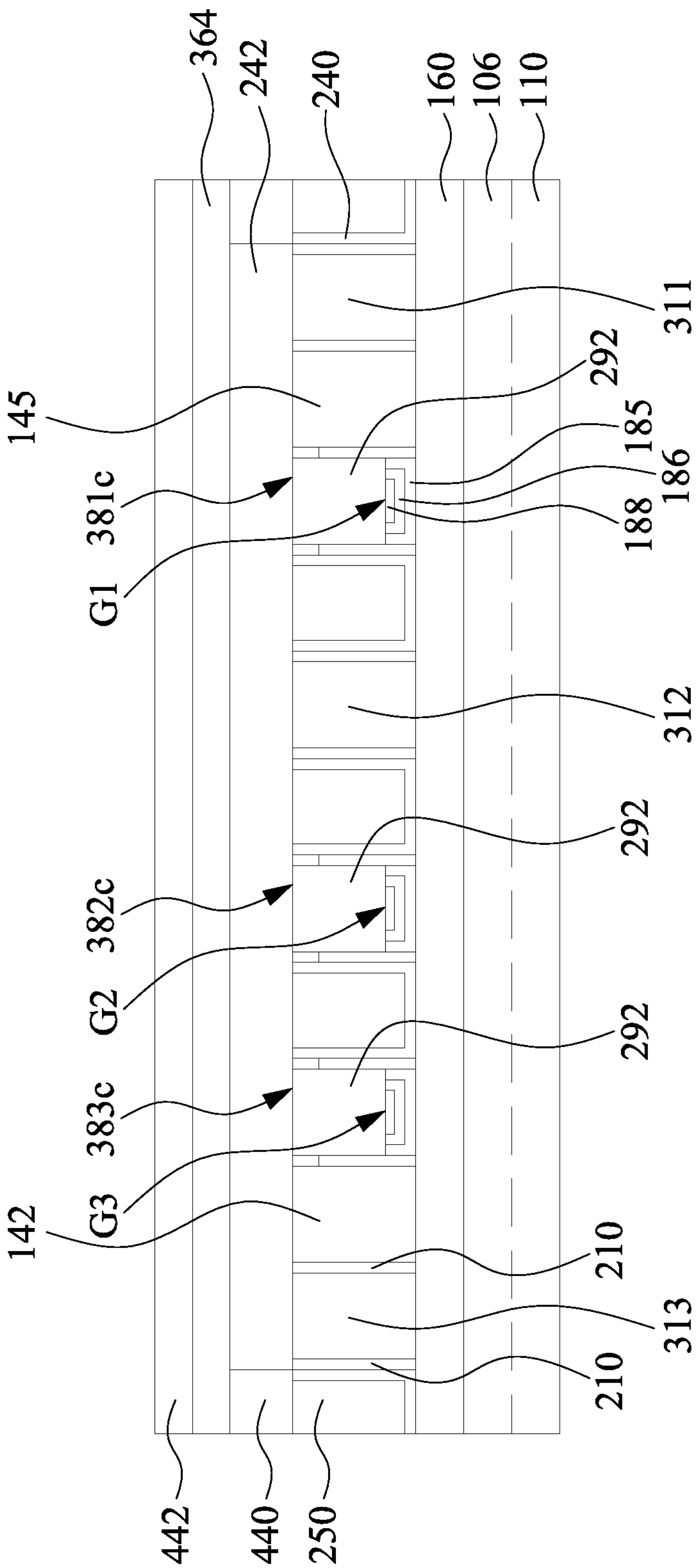

Reference is made to FIG. 40A to 40C. FIG. 40A to FIG. 40C illustrate cross-sectional views corresponding to the line A-A, line B-B, and line C-C as illustrated in FIG. 39A to FIG. 39C respectively for manufacturing another semiconductor device at a stage in accordance with some embodiments of the present disclosure. As shown in FIG. 40A to FIG. 40C, the structure and function of the components and their relationships in the semiconductor device are substantially the same as that shown in FIG. 39A to 39C, and the related detailed descriptions may refer to the foregoing paragraphs, and are not described again herein.

It is noted that, the difference between the present embodiment and the embodiment in FIGS. 39A to 39C is in that the hard mask 259 as shown in FIG. 39A is replaced by a hard mask 459 that includes a high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. The hard mask 359 may be formed by a deposition processes, such as chemical vapor deposition (CVD), physical vapor deposition (PVD), atomic layer deposition (ALD), plasma enhanced CVD (PECVD) or other suitable techniques.

Figure 42:
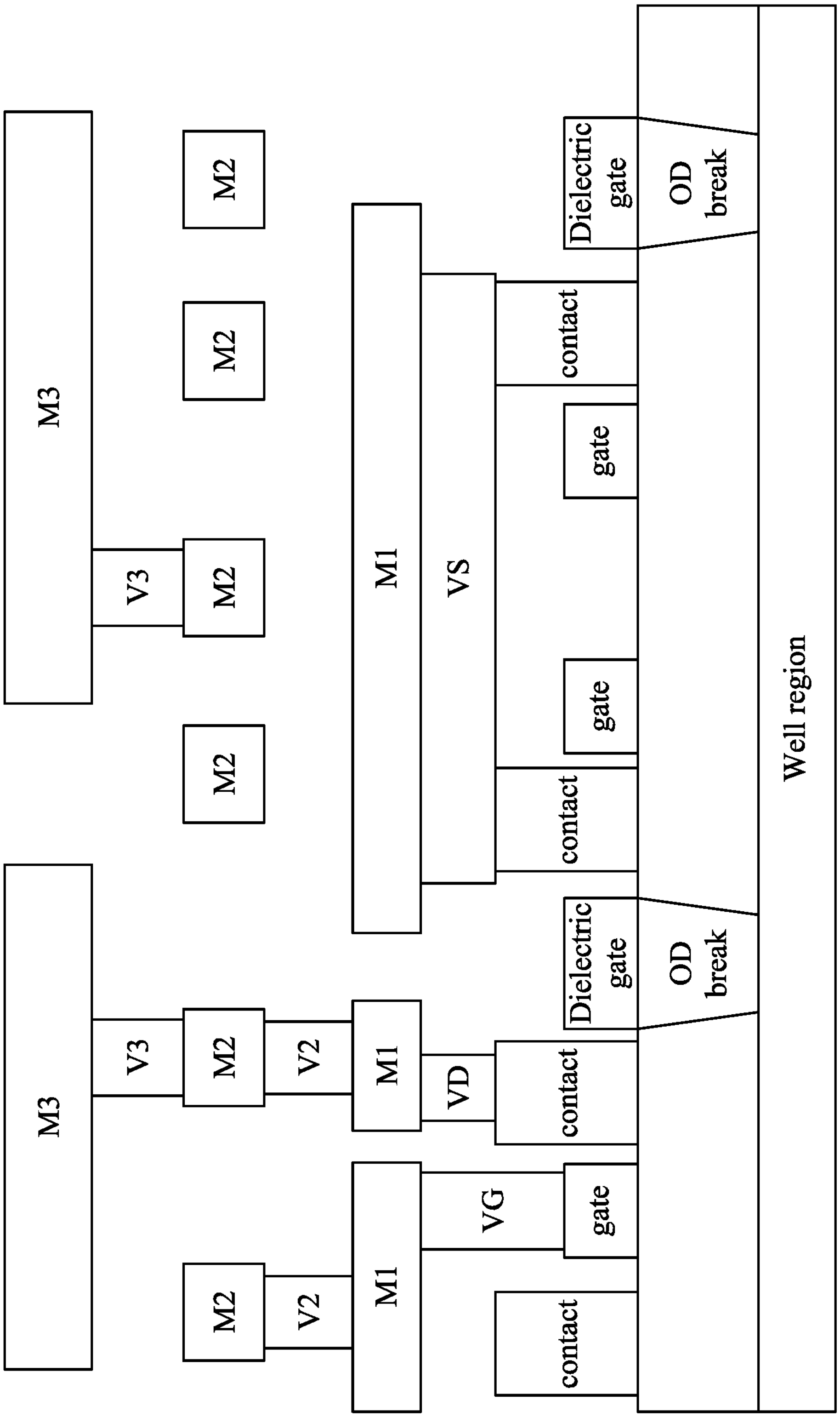
FIG. 42 illustrates a schematic diagram of a metal stack and a FinFET device.

Reference is made to FIG. 42. FIG. 42 illustrates a schematic diagram of a metal stack and a FinFET device. In FIG. 42, the dielectric gate, which can be also referred to as a dummy gate, is a gate that does not act as a gate of a transistor. Source and drain contacts are adjacent to gates. Source and drain vias and gate via are connected to the gate the source and drain contacts and the gate. In some embodiment, the source via VS is above and passes through the plurality of gate electrodes. The source and drain vias and gate via are connected to corresponding metal layers M1, M2, and M3 through the corresponding vias V2 and V3.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a gate-end CD uniformity control can be enhanced by disposing a high-k dielectric layer between two gate electrodes. Another advantage is that the source/drain via can be prevented from being in contact with the gate electrode by the high-k dielectric layer therebetween, such that an isolation margin between the source/drain via to the gate electrode for both yield and reliability can be improved. Yet another advantage is that Rc/Rs of a connection between the source via and the contact will be promoted.

In some embodiments, a semiconductor device includes a substrate, a dielectric fin, a gate electrode, and a high-k dielectric layer. The dielectric fin is on the substrate and extending along a first direction. The gate electrode is above the substrate and extends in a second direction that intersects the first direction. The high-k dielectric layer is vertically above the dielectric fin. The gate electrode is over a sidewall and a bottom surface of the high-k dielectric layer.

In some embodiments, a semiconductor device includes a substrate, a dielectric fin, a gate electrode, and a high-k dielectric layer. The dielectric fin is above the substrate and extending along a first direction. The gate electrode above the substrate extends in a second direction that intersects the first direction. The high-k dielectric layer is over the gate electrode and over a top surface of the dielectric fin.

In some embodiments, a method of manufacturing a semiconductor device includes: forming a dielectric fin above a substrate; forming a gate strip across the dielectric fin; removing a portion of the gate strip above the dielectric fin to form a first gate electrode and a second gate electrode separated from the first gate electrode by the dielectric fin; and forming a high-k dielectric material above and in contact with the dielectric fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
- a substrate;
- a dielectric fin above the substrate and extending along a first direction;
- a gate electrode above the substrate and extending in a second direction that intersects the first direction; and
- a high-k dielectric layer wrapping around a top surface and opposite sidewalls of the dielectric fin, wherein the gate electrode is in direct contact with a sidewall and a portion of a bottom surface of the high-k dielectric layer.

2. The semiconductor device of claim 1, wherein the high-k dielectric layer is in contact with the dielectric fin.

3. The semiconductor device of claim 1, wherein the high-k dielectric layer straddles the dielectric fin.

4. The semiconductor device of claim 1, wherein a width of the high-k dielectric layer is greater than a width of the gate electrode along the first direction.

5. The semiconductor device of claim 1, wherein a top surface of the high-k dielectric layer is higher than a top surface of the gate electrode.

6. The semiconductor device of claim 1, wherein a portion of the gate electrode is vertically between the high-k dielectric layer and the substrate.

7. The semiconductor device of claim 1, further comprising a gate dielectric layer between the gate electrode and the substrate and in contact with the bottom surface of the high-k dielectric layer.

8. The semiconductor device of claim 1, further comprising a hard mask above the gate electrode and in contact with the sidewall of the high-k dielectric layer.

9. The semiconductor device of claim 8, wherein a top surface of the high-k dielectric layer is coplanar with a top surface of the hard mask.

10. The semiconductor device of claim 8, wherein the high-k dielectric layer comprises a material different from that of the hard mask.

11. The semiconductor device of claim 8, wherein the high-k dielectric layer comprises a material that is substantially the same as a material of the hard mask.

12. A semiconductor device, comprising:

a substrate;

a semiconductor fin extending upwardly from the substrate;

a dielectric fin extending upwardly above the substrate and along a lengthwise direction of the semiconductor fin;

a high-k dielectric layer over the dielectric fin, wherein the dielectric fin has a top portion embedded in the high-k dielectric layer;

a gate electrode extending across the semiconductor fin to reach the dielectric fin and over a sidewall and a portion of a bottom surface of the high-k dielectric layer; and a gate dielectric layer sandwiched between the semiconductor fin and the gate electrode and having a longitudinal end below the bottom surface of the high-k dielectric layer and in contact with a sidewall of the dielectric fin.

13. The semiconductor device of claim 12, wherein the high-k dielectric layer is in contact with a sidewall of the dielectric fin.

14. The semiconductor device of claim 12, wherein a width of the high-k dielectric layer is greater than a width of the dielectric fin along a lengthwise direction of the gate electrode.

15. The semiconductor device of claim 12, wherein the bottom surface of the high-k dielectric layer is lower than a top surface of the semiconductor fin.

16. The semiconductor device of claim 12, wherein the gate dielectric layer that has a first portion vertically between the substrate and the gate electrode and has a second portion vertically between the substrate and the high-k dielectric layer.

17. The semiconductor device of claim 12, further comprising a source/drain via in contact with a top surface of the high-k dielectric layer.

18. A semiconductor device, comprising:

a substrate;

a semiconductor fin extending upwardly from the substrate;

a shallow trench isolation laterally surrounding the semiconductor fin;

a dielectric fin partially embedded in the shallow trench isolation, extending along a lengthwise direction of the semiconductor fin, having a topmost end in a position level with a topmost end of the semiconductor fin, and a bottommost end spaced apart from the substrate;

a high-k dielectric layer straddling the dielectric fin and spaced apart from the shallow trench isolation; and a gate electrode extending across the semiconductor fin and over a sidewall and a portion of a bottom surface of the high-k dielectric layer, wherein the gate electrode has a stepped sidewall structure having a lower sidewall contacting a sidewall of the dielectric fin, and an upper sidewall laterally set back from the lower sidewall, and the upper sidewall contacts a sidewall of the high-k dielectric layer.

19. The semiconductor device of claim 18, wherein a greatest dimension of the high-k dielectric layer is greater than a width of the dielectric fin in a lengthwise direction of the gate electrode from a top view.

20. The semiconductor device of claim 18, wherein a first portion of the high-k dielectric layer above the dielectric fin has a width greater than a second portion of the high-k dielectric layer above the gate electrode along the lengthwise direction of the semiconductor fin from a top view.

* * * * *